US010950803B2

(12) United States Patent
Xia et al.

(10) Patent No.: US 10,950,803 B2
(45) Date of Patent: Mar. 16, 2021

(54) COMPOUNDS AND USES IN DEVICES

(71) Applicant: Universal Display Corporation, Ewing, NJ (US)

(72) Inventors: Chuanjun Xia, Ewing, NJ (US); Ting-Chih Wang, Ewing, NJ (US); Chun Lin, Ewing, NJ (US)

(73) Assignee: UNIVERSAL DISPLAY CORPORATION, Ewing, NJ (US)

(*) Notice: Subject to any disclaimer, the term of this patent is extended or adjusted under 35 U.S.C. 154(b) by 1229 days.

(21) Appl. No.: 14/838,874

(22) Filed: Aug. 28, 2015

(65) Prior Publication Data

US 2016/0104847 A1 Apr. 14, 2016

Related U.S. Application Data

(60) Provisional application No. 62/062,989, filed on Oct. 13, 2014.

(51) Int. Cl.

*H01L 51/00* (2006.01)
*C09K 11/06* (2006.01)
*H01L 51/50* (2006.01)

(52) U.S. Cl.

CPC .......... *H01L 51/0084* (2013.01); *C09K 11/06* (2013.01); *H01L 51/006* (2013.01); (Continued)

(58) Field of Classification Search

CPC ............ C09K 11/06; C09K 2211/1007; C09K 2211/1011; C09K 2211/1088; H01L 51/0052; H01L 51/0054; H01L 51/0055; H01L 51/0056; H01L 51/0057; H01L 51/0058; H01L 51/006; H01L 51/0061; H01L 51/0067; H01L 51/0072; H01L 51/0073; H01L 51/0074; H01L 51/0085; H01L 51/0086; H01L 51/0087; H01L 51/0094; H01L 51/5016; H01L 51/5028; H01L 51/0084

See application file for complete search history.

(56) References Cited

U.S. PATENT DOCUMENTS 4,769,292 A 9/1988 Tang et al.
5,061,569 A 10/1991 VanSlyke et al.
(Continued)

FOREIGN PATENT DOCUMENTS

CN 1535089 10/2004
CN 1547597 11/2004
(Continued)

OTHER PUBLICATIONS

Baldo et al., "Highly Efficient Phosphorescent Emission from Organic Electroluminescent Devices," Nature, vol. 395, 151-154, (1998).

(Continued)

*Primary Examiner* — Dawn L Garrett
(74) *Attorney, Agent, or Firm* — Riverside Law LLP

(57) ABSTRACT

This invention discloses a novel multicomponent system or a single compound that is capable of performing triplet-triplet annihilation up conversion process. (TTA-UC) A solution or solid film that comprises this TTA-UC system or compound is provided. This system or compound can be used in an optical or optoelectronic device.

20 Claims, 7 Drawing Sheets

(52) U.S. Cl.
CPC ...... *H01L 51/0052* (2013.01); *H01L 51/0054* (2013.01); *H01L 51/0055* (2013.01); *H01L 51/0056* (2013.01); *H01L 51/0057* (2013.01); *H01L 51/0058* (2013.01); *H01L 51/0061* (2013.01); *H01L 51/0067* (2013.01); *H01L 51/0072* (2013.01); *H01L 51/0073* (2013.01); *H01L 51/0074* (2013.01); *H01L 51/0085* (2013.01); *H01L 51/0086* (2013.01); *H01L 51/0087* (2013.01); *H01L 51/0094* (2013.01); *C09K 2211/1007* (2013.01); *C09K 2211/1011* (2013.01); *C09K 2211/1088* (2013.01); *H01L 51/5016* (2013.01); *H01L 51/5028* (2013.01); *Y02E 10/549* (2013.01)

(56) References Cited

U.S. PATENT DOCUMENTS 5,247,190 A 9/1993 Friend
5,281,489 A * 1/1994 Mori .................... C09K 11/06 313/498
5,703,436 A 12/1997 Forrest et al.
5,707,745 A 1/1998 Forrest et al.
5,834,893 A 11/1998 Bulovic et al.
5,844,363 A 12/1998 Gu et al.
5,917,280 A * 6/1999 Burrows ............ H01L 27/3209 313/503
6,013,982 A 1/2000 Thompson et al.
6,087,196 A 7/2000 Sturm et al.
6,091,195 A 7/2000 Forrest et al.
6,097,147 A 8/2000 Baldo et al.
6,294,398 B1 9/2001 Kim et al.
6,303,238 B1 10/2001 Thompson et al.
6,337,102 B1 1/2002 Forrest et al.
6,392,250 B1 * 5/2002 Aziz .................. H01L 51/5012 257/144
6,468,819 B1 10/2002 Kim et al.
6,528,187 B1 3/2003 Okada
6,687,266 B1 2/2004 Ma et al.
6,835,469 B2 12/2004 Kwong et al.
6,921,915 B2 7/2005 Takiguchi et al.
7,087,321 B2 8/2006 Kwong et al.
7,090,928 B2 8/2006 Thompson et al.
7,154,114 B2 12/2006 Brooks et al.
7,250,226 B2 7/2007 Tokito et al.
7,279,704 B2 10/2007 Walters et al.
7,332,232 B2 2/2008 Ma et al.
7,338,722 B2 3/2008 Thompson et al.
7,393,599 B2 7/2008 Thompson et al.
7,396,598 B2 7/2008 Takeuchi et al.
7,431,968 B1 10/2008 Shtein et al.
7,445,855 B2 11/2008 Mackenzie et al.
7,534,505 B2 5/2009 Lin et al.
7,968,146 B2 6/2011 Wanger et al.
8,268,456 B2 * 9/2012 Koyama ............... C09K 11/06 257/40
2002/0034656 A1 3/2002 Thompson et al.
2002/0134984 A1 9/2002 Igarashi
2002/0158242 A1 10/2002 Son et al.
2003/0091862 A1 5/2003 Tokito et al.
2003/0138657 A1 7/2003 Li et al.
2003/0152802 A1 8/2003 Tsuboyama et al.
2003/0162053 A1 8/2003 Marks et al.
2003/0175553 A1 9/2003 Thompson et al.
2003/0230980 A1 12/2003 Forrest et al.
2004/0036077 A1 2/2004 Ise
2004/0137267 A1 7/2004 Igarashi et al.
2004/0137268 A1 7/2004 Igarashi et al.
2004/0137270 A1 7/2004 Seo et al.
2004/0174116 A1 9/2004 Lu et al.
2004/0232830 A1 * 11/2004 Hieda ................ H01L 51/5212 313/504
2005/0025993 A1 2/2005 Thompson et al.
2005/0112407 A1 5/2005 Ogasawara et al.
2005/0238919 A1 10/2005 Ogasawara
2005/0244673 A1 11/2005 Satoh et al.
2005/0260441 A1 11/2005 Thompson et al.
2005/0260449 A1 11/2005 Walters et al.
2006/0008670 A1 1/2006 Lin et al.
2006/0202194 A1 9/2006 Jeong et al.
2006/0240279 A1 10/2006 Adamovich et al.
2006/0251923 A1 11/2006 Lin et al.
2006/0263635 A1 11/2006 Ise
2006/0280965 A1 12/2006 Kwong et al.
2007/0190359 A1 8/2007 Knowles et al.
2007/0278938 A1 12/2007 Yabunouchi et al.
2008/0015355 A1 1/2008 Schafer et al.
2008/0018221 A1 1/2008 Egen et al.
2008/0106190 A1 5/2008 Yabunouchi et al.
2008/0124572 A1 5/2008 Mizuki et al.
2008/0220265 A1 9/2008 Xia et al.
2008/0297033 A1 12/2008 Knowles et al.
2009/0008605 A1 1/2009 Kawamura et al.
2009/0009065 A1 1/2009 Nishimura et al.
2009/0017330 A1 1/2009 Iwakuma et al.
2009/0030202 A1 1/2009 Iwakuma et al.
2009/0039776 A1 2/2009 Yamada et al.
2009/0045730 A1 2/2009 Nishimura et al.
2009/0045731 A1 2/2009 Nishimura et al.
2009/0101870 A1 4/2009 Prakash et al.
2009/0108737 A1 4/2009 Kwong et al.
2009/0115316 A1 5/2009 Zheng et al.
2009/0165846 A1 7/2009 Johannes et al.
2009/0167162 A1 7/2009 Lin et al.
2009/0179554 A1 7/2009 Kuma et al.
2010/0270539 A1 * 10/2010 Nishimura ............ C09K 11/06 257/40
2011/0175031 A1 * 7/2011 Matsunami ............ B01B 1/005 252/301.16
2012/0181922 A1 * 7/2012 Kawamura ......... H01L 51/0052 313/504
2013/0026452 A1 1/2013 Kottas et al.
2013/0087778 A1 * 4/2013 Konuma ............... C09K 11/06 257/40
2013/0119354 A1 5/2013 Ma et al.
2014/0151646 A1 * 6/2014 Xia ......................... H01L 51/52 257/40
2014/0272398 A1 * 9/2014 Hakii ...................... B32B 15/04 428/336
2014/0326985 A1 * 11/2014 Mizuki .................. C09K 11/06 257/40
2014/0358198 A1 * 12/2014 Buchholz .............. C09K 11/06 607/88

FOREIGN PATENT DOCUMENTS

CN 1610472 4/2005
EP 650955 5/1995
EP 1238981 9/2002
EP 1 437 395 A2 * 7/2004
EP 1725079 11/2006
EP 2034538 3/2009
JP 200511610 1/2005
JP 2007123392 5/2007
JP 2007254297 10/2007
JP 2008074939 10/2009
JP 2010/135467 6/2010
WO 2001039234 5/2001
WO 2002002714 1/2002
WO 215645 2/2002
WO 2003040257 5/2003
WO 2003060956 7/2003
WO 2004093207 10/2004
WO 2004/111066 12/2004
WO 2004107822 12/2004
WO 2005014551 2/2005
WO 5019373 3/2005
WO 2005030900 4/2005
WO 2005089025 9/2005
WO 2005123873 12/2005
WO 2006009024 1/2006
WO 6056418 6/2006

(56) References Cited

FOREIGN PATENT DOCUMENTS

| | | |
|---|---|---|
| WO | 2006/072002 | 7/2006 |
| WO | 2006082742 | 8/2006 |
| WO | 6100298 | 9/2006 |
| WO | 2006098120 | 9/2006 |
| WO | 2006103874 | 10/2006 |
| WO | 2006114966 | 11/2006 |
| WO | 2006132173 | 12/2006 |
| WO | 2007/002683 | 1/2007 |
| WO | 2007004380 | 1/2007 |
| WO | 2007063754 | 6/2007 |
| WO | 2007063796 | 6/2007 |
| WO | 2008/044723 | 4/2008 |
| WO | 2008057394 | 5/2008 |
| WO | 8101842 | 8/2008 |
| WO | 8132085 | 11/2008 |
| WO | 9000673 | 12/2008 |
| WO | 2009/003898 | 1/2009 |
| WO | 2009/008311 | 1/2009 |
| WO | 2009/018009 | 2/2009 |
| WO | 9050290 | 4/2009 |
| WO | 2008/056746 | 5/2009 |
| WO | 2009/021126 | 5/2009 |
| WO | 2009/062578 | 5/2009 |
| WO | 2009/063833 | 5/2009 |
| WO | 2009/066778 | 5/2009 |
| WO | 2009/066779 | 5/2009 |
| WO | 2009/086028 | 7/2009 |
| WO | 9100991 | 8/2009 |
| WO | 2010011390 | 1/2010 |
| WO | 2010/111175 | 9/2010 |

OTHER PUBLICATIONS

Baldo et al., "Very high-efficiency green organic light-emitting devices based on electrophosphorescence," Appl, Phys. Lett., vol. 75, No. 1, 4-6 (1999).

U.S. Appl. No. 13/193,221, filed Jul. 28, 2011.

U.S. Appl. No. 13/296,806, filed Nov. 15, 2011.

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," *Adv. Mater.*, 6(9):677-679 (1994).

Paulose, Betty Marie Jennifer S. et al., "First Examples of Alkenyl Pyridines as Organic Ligands for Phosphorescent Iridium Complexes," *Adv. Mater.*, 16(22):2003-2007 (2004).

Tung, Yung-Liang et al., "Organic Light-Emitting Diodes Based on Charge-Neutral Ru" PHosphorescent Emitters," Adv. Mater., 17(8):1059-1064 (2005).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," *Adv. Mater.*, 19:739-743 (2007).

Wong, Wai-Yeung, "Multifunctional Iridium Complexes Based on Carbazole Modules as Highly Efficient Electrophosphors," *Angew. Chem. Int. Ed.*, 45:7800-7803 (2006).

Tang, C.W. and VanSlyke, S.A., "Organic Electroluminescent Diodes," *Appl. Phys. Lett.*, 51(12):913-915 (1987).

Adachi, Chihaya et al., "Organic Electroluminescent Device Having a Hole Conductor as an Emitting Layer," *Appl. Phys. Lett.*, 55(15):1489-1491 (1989).

Ma, Yuguang et al., "Triplet Luminescent Dinuclear-Gold(/) Complex-Based Light-Emitting Diodes with Low Turn-On voltage," *Appl. Phys. Lett.*, 74(10):1361-1363 (1999).

Gao, Zhiqiang et al., "Bright-Blue Electroluminescence From a Silyl-Substituted ter-(phenylene-vinylene) derivative," *Appl. Phys. Lett.*, 74(6):865- 867 (1999).

Lee, Chang-Lyoul et al., "Polymer Phosphorescent Light-Emitting Devices Doped with Tris(2-phenylpyridine) Iridium as a Triplet Emitter," *Appl. Phys. Lett.*, 77(15):2280-2282 (2000).

Hung, L.S. et al., "Anode Modification in Organic Light-Emitting Diodes by Low-Frequency Plasma Polymerization of $CHF_3$," *Appl. Phys. Lett.*, 78(5):673-675 (2001).

Ikai, Masamichi and Tokito, Shizuo, "Highly Efficient Phosphorescence From Organic Light-Emitting Devices with an Exciton-Block Layer," *Appl. Phys. Lett.*, 79(2):156-158 (2001).

Wang, Y. et al., "Highly Efficient Electroluminescent Materials Based on Fluorinated Organometallic Iridium Compounds," *Appl. Phys. Lett.*, 79(4):449-451 (2001).

Kwong, Raymond C. et al., "High Operational Stability of Electrophosphorescent Devices," *Appl. Phys. Lett.*, 81(1):162-164 (2002).

Holmes, R.J. et al., "Blue Organic Electrophosphorescence Using Exothermic Host-Guest Energy Transfer," *Appl. Phys. Lett.*, 82(15):2422-2424 (2003).

Sotoyama, Wataru et al., "Efficient Organic Light-Emitting Diodes with Phosphorescent Platinum Complexes Containing NCN-Coordinating Tridentate Ligand," *Appl. Phys. Lett.*, 86:153505-1-153505-3 (2005).

Okumoto, Kenji et al., "Green Fluorescent Organic Light-Emitting Device with External Quantum Efficiency of Nearly 10%," *Appl. Phys. Lett.*, 89:063504-1-063504-3 (2006).

Kanno, Hiroshi et al., "Highly Efficient and Stable Red Phosphorescent Organic Light-Emitting Device Using bis[2-(2-benzothiazoyl)phenolato]zinc(II) as host material," *Appl. Phys. Lett.*, 90:123509-1-123509-3 (2007).

Aonuma, Masaki et al., "Material Design of Hole Transport Materials Capable of Thick-Film Formation in Organic Light Emitting Diodes," *Appl. Phys. Lett.*, 90:183503-1-183503-3 (2007).

Sun, Yiru and Forrest, Stephen R., "High-Efficiency White Organic Light Emitting Devices with Three Separate Phosphorescent Emission Layers," *Appl. Phys. Lett.*, 91:263503-1-263503-3 (2007).

Adachi, Chihaya et al., "High-Efficiency Red Electrophosphorescence Devices," *Appl. Phys. Lett.*, 78(11):1622-1624 (2001).

Wong, Keith Man-Chung et al., A Novel Class of Phosphorescent Gold(III) Alkynyl-Based Organic Light-Emitting Devices with Tunable Colour, *Chem. Commun.*, 2906-2908 (2005).

Hamada, Yuji et al., "High Luminance in Organic Electroluminescent Devices with Bis(10-hydroxybenzo[h]quinolinato)beryllium as an Emitter," *Chem. Lett.*, 905-906 (1993).

Nishida, Jun-ichi et al., "Preparation, Characterization, and Electroluminescence Characteristics of $\alpha$-Diimine-type Platinum(II) Complexes with Perfluorinated Phenyl Groups as Ligands," *Chem. Lett.*, 34(4):592-593 (2005).

Mi, Bao-Xiu et al., "Thermally Stable Hole-Transporting Material for Organic Light-Emitting Diode: an Isoindole Derivative," *Chem. Mater.*, 15(16):3148-3151 (2003).

Huang, Wei-Sheng et al., "Highly Phosphorescent Bis-Cyclometalated Iridium Complexes Containing Benzoimidazole-Based Ligands," *Chem. Mater.*, 16(12):2480-2488 (2004).

Niu, Yu-Hua et al., "Highly Efficient Electrophosphorescent Devices with Saturated Red Emission from a Neutral Osmium Complex," *Chem. Mater.*, 17(13):3532-3536 (2005).

Lo, Shih-Chun et al., "Blue Phosphorescence from Iridium(III) Complexes at Room Temperature," *Chem. Mater*, 18(21):5119-5129 (2006).

Takizawa, Shin-ya et al., "Phosphorescent Iridium Complexes Based on 2-Phenylimidazo[1,2- $\alpha$]pyridine Ligands: Tuning of Emission Color toward the Blue Region and Application to Polymer Light-Emitting Devices," *Inorg. Chem.*, 46(10):4308-4319 (2007).

Lamansky, Sergey et al., "Synthesis and Characterization of Phosphorescent Cyclometalated Iridium Complexes," *Inorg. Chem.*, 40(7):1704-1711 (2001).

Ranjan, Sudhir et al., "Realizing Green Phosphorescent Light-Emitting Materials from Rhenium(I) Pyrazolato Diimine Complexes," *Inorg. Chem.*, 42(4):1248-1255 (2003).

Noda, Tetsuya and Shirota,Yasuhiko, "5,5'-Bis(dimesitylbory1)-2,2"-bithiophene and 5,5"-Bis(dimesitylboryl)-2,2':5',2"-terthiophene as a Novel Family of Electron-Transporting Amorphous Molecular Materials," *J. Am. Chem. Soc.*, 120 (37):9714-9715 (1998).

(56) References Cited

OTHER PUBLICATIONS

Sakamoto, Youichi et al., "Synthesis, Characterization, and Electron-Transport Property of Perfluorinated Phenylene Dendrimers," *J. Am. Chem. Soc.*, 122(8):1832-1833 (2000).
Adachi, Chihaya et al., "Nearly 100% Internal Phosphorescence Efficiency in an Organic Light Emitting Device," *J. Appl. Phys.*, 90(10):5048-5051 (2001).
Shirota, Yasuhiko et al., "Starburst Molecules Based on p-Electron Systems as Materials for Organic Electroluminescent Devices," *Journal of Luminescence*, 72-74:985-991 (1997).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," *J. Mater. Chem.*, 3(3):319-320 (1993).
Kido, Junji et al., 1,2,4-Triazole Derivative as an Electron Transport Layer in Organic Electroluminescent Devices, *Jpn. J. Appl. Phys.*, 32:L917-L920 (1993).
Van Slyke, S. A. et al., "Organic Electroluminescent Devices with Improved Stability," *Appl. Phys. Lett.*, 69(15 ):2160-2162 (1996).
Guo, Tzung-Fang et al., "Highly Efficient Electrophosphorescent Polymer Light-Emitting Devices," *Organic Electronics*, 1:15-20 (2000).
Palilis, Leonidas C., "High Efficiency Molecular Organic Light-Emitting Diodes Based on Silole Derivatives and Their Exciplexes," *Organic Electronics*, 4:113-121 (2003).
Ikeda, Hisao et al., "P-185: Low-Drive-Voltage OLEDs with a Buffer Layer Having Molybdenum Oxide," *SID Symposium Digest*, 37:923-926 (2006).
T. Östergård et al., "Langmuir-Blodgett Light-Emitting Diodes of Poly(3-Hexylthiophene): Electro-Optical Characteristics Related to Structure," *Synthetic Metals*, 87:171-177 (1997).
Hu, Nan-Xing et al., "Novel High $T_g$ Hole-Transport Molecules Based on Indolo[3,2-b]carbazoles for Organic Light-Emitting Devices," *Synthetic Metals*, 111-112:421-424 (2000).
Salbeck, J. et al., "Low Molecular Organic Glasses for Blue Electroluminescence," *Synthetic Metals*, 91:209-215 (1997).
Turshatov et al, "Synergetic Effect in Triplet—Triplet Annihilation Upconversion: Highly Efficient Multi-Chromophore Emitter," ChemPhysChem, 13, 3112-3115 (2012).

* cited by examiner

COMPOUNDS AND USES IN DEVICES

CROSS-REFERENCE TO RELATED APPLICATIONS

This application claims priority from U.S. Provisional Patent Application Ser. No. 62/062,989, filed Oct. 13, 2014, the entire contents of which is incorporated herein by reference.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to a novel mixture of compounds useful for performing triplet-triplet annihilation upconversion and devices, such as organic light emitting diodes, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

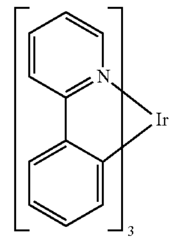

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

Photon up conversion based on triplet-triplet annihilation (TTA) emerges as a promising wavelength-shifting technology. The sensitized TTA mechanism allows the use of low power noncoherent continuous-wave excitation sources. In the sensitized TTA process, the triplet sensitizers first absorb lower energy light. The sensitizers then transfer the energy to the triplet states of the acceptor molecules. Two triplets can collide and produce a higher energy excited singlet state and the corresponding ground-state species. The excited singlet state can undergo radiative decay, giving out a photon that is significantly higher in energy than the exciting light. Castellano and others have introduced various heavy metal-containing sensitizers such as iridium and platinum complexes. Red to green, red to blue, and green to blue up conversion have been achieved using different systems. Photon up conversion using TTA has been demonstrated in both dilute solutions and solid films.

To date almost all the TTA-UC systems consist of one sensitizer and one acceptor. The acceptor functions as the emitter. Baluschev et al reported a one-sensitizer-two-acceptor TTA-UC system. (Chem. Eur. J. 2011, 17, 9560-9564). In this system, the authors intended to improve the triplet-triplet energy transfer (TTT) by introducing two acceptors. meso-tetraphenyl-tetrabenzoporphyrin Palladium (PdTBP) was used as the sensitizer. 3-(4-tert-butylphenyl) perylene (phenyl perylene, E1) and 1,3,5,7-tetramethyl-8-phenyl-2,6-diethyl dipyrromethane•BF2 (BODIPY, E2) were used as the acceptors. The two acceptors had the same concentration in the TTA-UC system. There was no energy transfer between the two acceptors. Therefore, this multi-component system relies on the TTA-UC of individual acceptor and works essentially as a one-acceptor system.

It is critical for TTA-UC to have high efficiency to warrant any practical applications. Theory has predicted only 11% of upconversion efficiency. However, experimental results have shown higher numbers than the theoretical limit. There are several limitations for the conventional TTA-UC system. For example, the system works well in dilute solution; but it has much reduced efficiency in the solid state. Solid state films were normally fabricated by dispersing the sensitizer and acceptor in an inert matrix. The concentration of the acceptor cannot be too high since it will reduce the PLQY. However, the TTA process relies on the collision of two acceptor triplets; the distance between the molecules cannot be far away, i.e. the concentration should not be too low. There is a need in the art for novel compounds that can overcome the problems presented by the conventional TTA-UC system. The present invention addresses this unmet need.

SUMMARY OF THE INVENTION

According to an embodiment, the invention includes a formulation comprising a mixture of:

a sensitizer;

an acceptor; and an emitter;

wherein the acceptor has a first triplet energy lower than a first triplet energy of the sensitizer;

wherein the emitter has a first singlet energy lower than a first singlet energy of the acceptor, and wherein the sensitizer, the acceptor, and the emitter are jointly capable of performing triplet-triplet annihilation upconversion of light incident on the formulation to emit a luminescent radiation comprising a radiation component from the first singlet energy of the emitter.

In one embodiment, the emitter has a first triplet energy higher than the first triplet energy of the acceptor. In another embodiment, the emitter has the first triplet energy higher than the first triplet energy of the sensitizer; and the emitter has the first singlet energy higher than the first singlet energy of the sensitizer.

In one embodiment, the sensitizer is selected from the group consisting of: an iridium complex, an osmium complex, a platinum complex, a palladium complex, a rhenium complex, a ruthenium complex, and a gold complex. In another embodiment, the sensitizer is selected from the group of compounds described herein.

In one embodiment, the acceptor comprises a fused aromatic group. In another embodiment, the acceptor comprises a group selected from the group consisting of: naphthalene, anthracene, tetracene, pyrene, chrysene, perylene, and combinations thereof. In another embodiment, the acceptor is selected from the group of compounds described herein. In another embodiment, the acceptor comprises at least 50 wt % of the total mass of the mixture of the sensitizer, the acceptor, and the emitter.

In one embodiment, the emitter comprises a group selected from the group consisting of: fluoranthene, pyrene, triarylamine, and combinations thereof. In another embodiment, the emitter is selected from the group of compounds described herein.

In one embodiment, the formulation further comprises an inert binder. The binder comprises a polymer. The polymer can be PMMA, polystyrene, and polyethylene oxide.

In one embodiment, the formulation further comprises a solvent. The solvent is an organic solvent. The solvent can be THF, toluene, dichloromethane, xylene, tetralene, DMF, and DMSO.

In one embodiment, the first device includes a first organic layer, the first organic layer comprising a mixture of:

a sensitizer;

an acceptor; and an emitter;

wherein the acceptor has a first triplet energy lower than a first triplet energy of the sensitizer;

wherein the emitter has a first singlet energy lower than a first singlet energy of the acceptor; and wherein the first device are capable of performing triplet-triplet annihilation upconversion of light incident on the first organic layer to emit a luminescent radiation comprising a radiation component from the first singlet energy of the emitter.

In one embodiment, the emitter has a first triplet energy higher than the first triplet energy of the acceptor. In another embodiment, the emitter has a first singlet energy between 400 nm to 500 nm. In another embodiment, the first device has an upconversion efficiency of at least 10%. In another embodiment, the first organic layer only contains the sensitizer, the acceptor, and the emitter. In another embodiment, the acceptor in the first organic layer comprises at least 50 wt % of the total mass of the mixture of the sensitizer, the acceptor, and the emitter.

In one embodiment, the first device includes an organic light emitting device comprising an emissive material having an emissive spectrum, and the first organic layer is disposed adjacent to the organic light emitting device such that light emitted by the organic light emitting device is incident on the first organic layer. In another embodiment, the light emitted by the organic light emitting device is selected from the group consisting of red, green, and yellow, and the first device emits white light. In another embodiment, light emitted by the organic light emitting device has a peak wavelength of 500 nm to 700 nm, and the first device emits light having CIE coordinates of within a seven step McAdam ellipse centered on the black body curve with a correlated color temperature (CCT) in the range of 2500-7000K. In another embodiment, the first organic layer is a solution or a solid film.

According to another embodiment, the present invention includes a compound for triplet-triplet annihilation upconversion comprising:

a sensitizer group;

an acceptor group; and an emitter group;

wherein the sensitizer group, the acceptor group, and the emitter group are connected together through covalent bonds by a plurality of spacer groups;

wherein the acceptor group has a first triplet energy lower than a first triplet energy of the sensitizer group;

wherein the emitter group has a first singlet energy lower than a first singlet energy of the acceptor group; and wherein the compound is capable of performing triplet-triplet annihilation upconversion of light incident on the compound to emit a luminescent radiation comprising a radiation component from the first singlet energy of the emitter group.

In one embodiment, the emitter group has a first triplet energy higher than the first triplet energy of the acceptor group. In another embodiment, the spacer groups are non-conjugated organic groups. In another embodiment, the spacer groups are selected from the group consisting of: alkyl, cycloalkyl, heteroalkyl, arylalkyl, alkoxy, aryloxys, amino, silyl, alkenyl, cycloalkenyl, heteroalkenyl, alkynyl, aryl, heteroaryl, acyl, carbonyl, ester, and combinations thereof. In another embodiment, the sensitizer group is selected from the group consisting of: an iridium complex, an osmium complex, a platinum complex, a palladium complex, a rhenium complex, a ruthenium complex, and a gold complex. In another embodiment, the sensitizer group is selected from the group of compounds described herein. In another embodiment, the acceptor group comprises a fused aromatic group. In another embodiment, the acceptor group comprises a group selected from the group consisting of naphthalene, anthracene, tetracene, pyrene, chrysene, perylene, and combination thereof. In another embodiment, the acceptor group is selected from the group of compounds described herein. In another embodiment, the emitter group comprises a group selected from the group consisting of: fluoranthene, pyrene, triarylamine, and combinations thereof. In another embodiment, the emitter group is selected from the group of compounds described herein. In another embodiment, the acceptor group in the compound is at least 50 wt % of the total molecular weight of the compound. In another embodiment, the compound has a plurality of acceptor groups. In another embodiment, the compound has a plurality of emitter groups. In another embodiment, the plurality of spacer groups substantially surrounds the sensitizer group. In another embodiment, the plurality of spacer groups substantially surrounds the acceptor group. In another embodiment, the plurality of spacer groups substantially surrounds the emitter group.

In one embodiment, the compound is selected from the group consisting of:

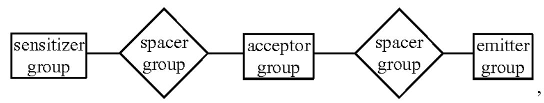

,

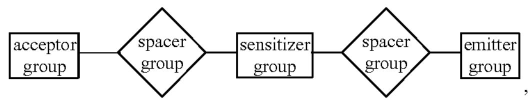

, and

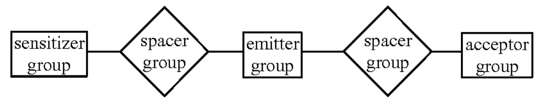

.

In one embodiment, the compound is selected from the group consisting of Compounds 1-7.

In one embodiment, the invention includes a device comprising a layer, the layer comprising a compound of the invention.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 which is incorporated by reference in its entirety.

Figure 1:
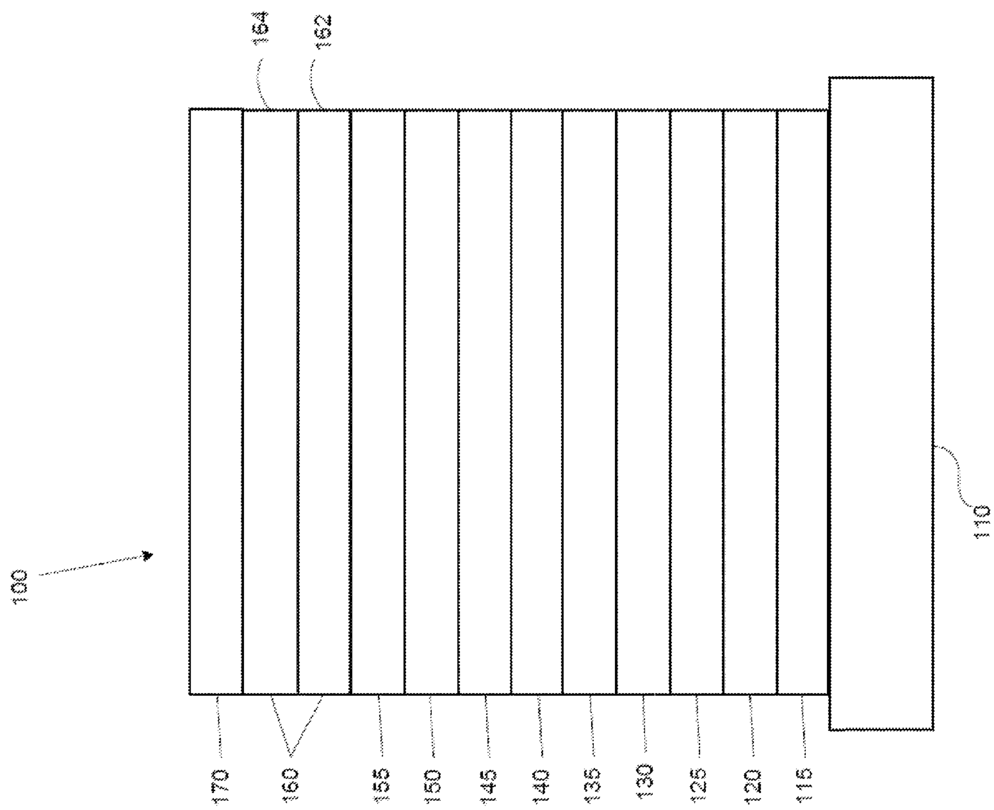
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 which is incorporated by reference in its entirety.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
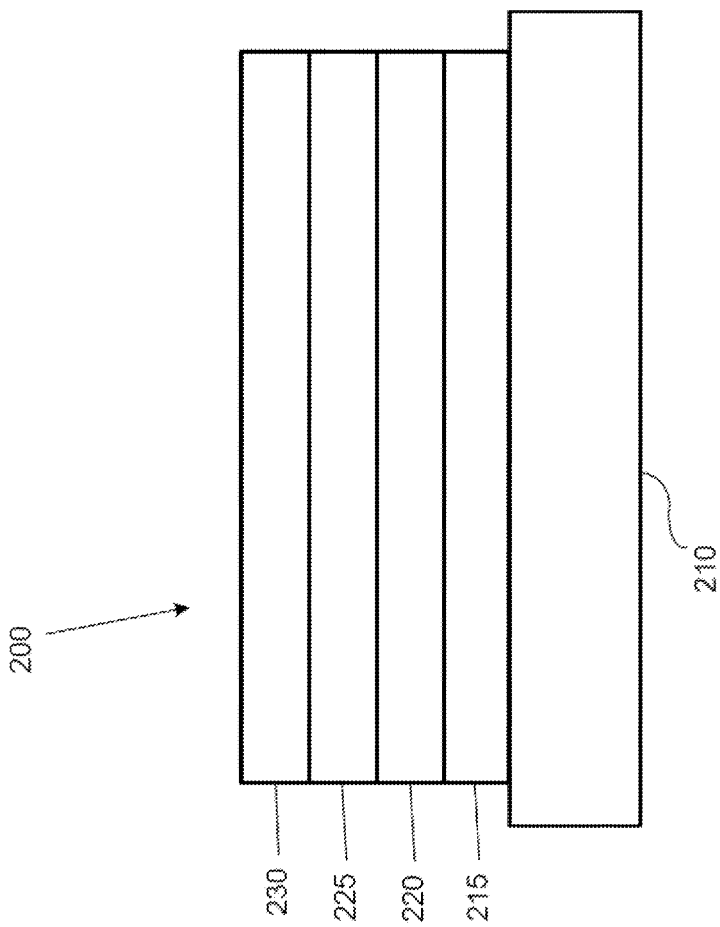
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The term "halo," "halogen," or "halide" as used herein includes fluorine, chlorine, bromine, and iodine.

The term "alkyl" as used herein contemplates both straight and branched chain alkyl radicals. Preferred alkyl groups are those containing from one to fifteen carbon atoms and includes methyl, ethyl, propyl, isopropyl, butyl, isobutyl, tert-butyl, and the like. Additionally, the alkyl group may be optionally substituted.

The term "cycloalkyl" as used herein contemplates cyclic alkyl radicals. Preferred cycloalkyl groups are those containing 3 to 7 carbon atoms and includes cyclopropyl, cyclopentyl, cyclohexyl, and the like. Additionally, the cycloalkyl group may be optionally substituted.

The term "alkenyl" as used herein contemplates both straight and branched chain alkene radicals. Preferred alkenyl groups are those containing two to fifteen carbon atoms. Additionally, the alkenyl group may be optionally substituted.

The term "alkynyl" as used herein contemplates both straight and branched chain alkyne radicals. Preferred alkynyl groups are those containing two to fifteen carbon atoms. Additionally, the alkynyl group may be optionally substituted.

The terms "aralkyl" or "arylalkyl" as used herein are used interchangeably and contemplate an alkyl group that has as a substituent an aromatic group. Additionally, the aralkyl group may be optionally substituted.

The term "heterocyclic group" as used herein contemplates aromatic and non-aromatic cyclic radicals. Heteroaromatic cyclic radicals also means heteroaryl. Preferred hetero-non-aromatic cyclic groups are those containing 3 or 7 ring atoms which includes at least one hetero atom, and includes cyclic amines such as morpholino, piperidino, pyrrolidino, and the like, and cyclic ethers, such as tetrahydrofuran, tetrahydropyran, and the like. Additionally, the heterocyclic group may be optionally substituted.

The term "aryl" or "aromatic group" as used herein contemplates single-ring groups and polycyclic ring systems. The polycyclic rings may have two or more rings in which two carbons are common to two adjoining rings (the rings are "fused") wherein at least one of the rings is aromatic, e.g., the other rings can be cycloalkyls, cycloalkenyls, aryl, heterocycles, and/or heteroaryls. Additionally, the aryl group may be optionally substituted.

The term "heteroaryl" as used herein contemplates single-ring hetero-aromatic groups that may include from one to three heteroatoms, for example, pyrrole, furan, thiophene, imidazole, oxazole, thiazole, triazole, pyrazole, pyridine, pyrazine and pyrimidine, and the like. The term heteroaryl also includes polycyclic hetero-aromatic systems having two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. Additionally, the heteroaryl group may be optionally substituted.

The alkyl, cycloalkyl, alkenyl, alkynyl, aralkyl, heterocyclic group, aryl, and heteroaryl may be optionally substituted with one or more substituents selected from the group consisting of hydrogen, deuterium, halogen, alkyl, cycloalkyl, heteroalkyl, arylalkyl, alkoxy, aryloxy, amino, cyclic amino, silyl, alkenyl, cycloalkenyl, heteroalkenyl, alkynyl, aryl, heteroaryl, acyl, carbonyl, carboxylic acid, ether, ester, nitrile, isonitrile, sulfanyl, sulfinyl, sulfonyl, phosphino, and combinations thereof.

As used herein, "substituted" indicates that a substituent other than H is bonded to the relevant position, such as carbon. Thus, for example, where $R^1$ is mono-substituted, then one $R^1$ must be other than H. Similarly, where $R^1$ is di-substituted, then two of $R^1$ must be other than H. Similarly, where $R^1$ is unsubstituted, $R^1$ is hydrogen for all available positions.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

Figure 3:
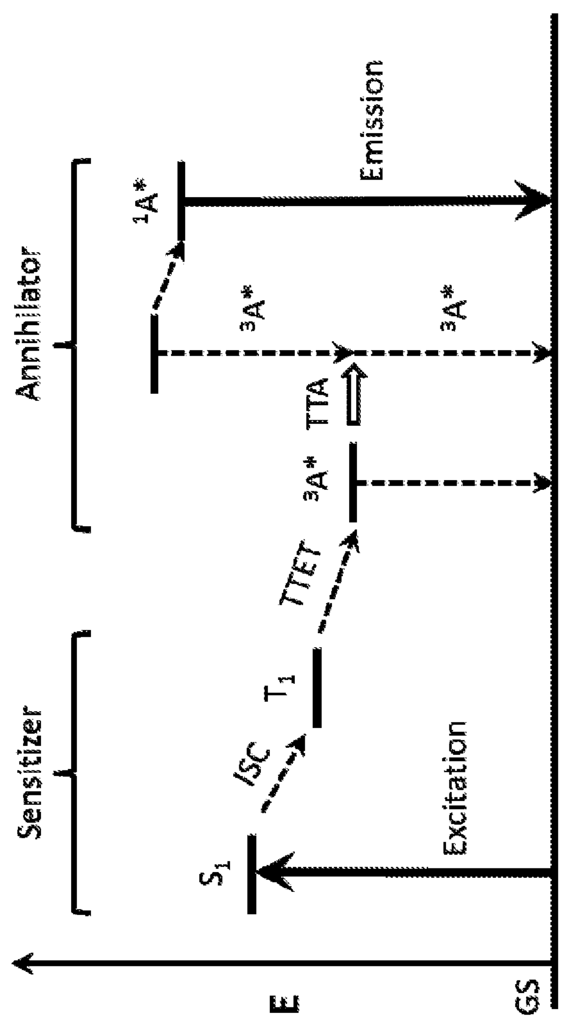
FIG. 3 shows a schematic drawing of the mechanism of a conventional TTA-UC system.
Figure 4:
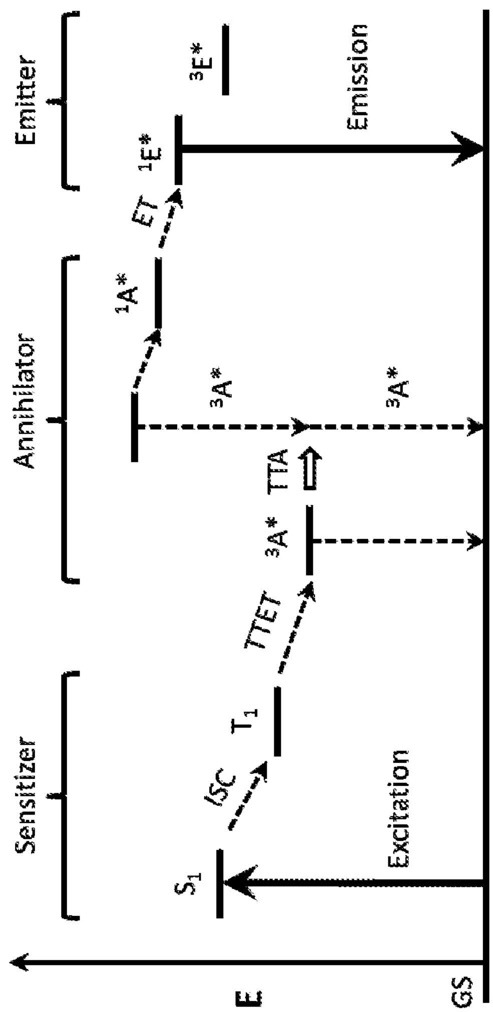
FIG. 4 shows a schematic drawing of the mechanism of a multi-component TTA-UC system.

The present invention provides a novel TTA-UC system to overcome the problems presented by the conventional TTA-UC system. The mechanism of this system is very different from previously reported TTA-UC systems. In the known sensitized TTA mechanism, low power noncoherent continuous-wave excitation sources are used. In the sensitized TTA process, the triplet sensitizers first absorb lower energy light. The sensitizers then transfer the energy to the triplet states of the acceptor molecules. Two triplets can collide and produce a higher energy excited singlet state and the corresponding ground-state species. The excited singlet state can undergo radiative decay, giving out a photon that is significantly higher in energy than the exciting light. The schematic drawing of the TTA-UC process is shown in FIG. 3. The use of upconversion film together with OLED has been described in PCT Application Publication No. WO 2011156793, which is herein incorporated by reference in its entirety. In contrast, the novel TTA-UC system described herein comprises an emitter in addition to the sensitizer and acceptor (annihilator). The triplet sensitizers first absorb lower energy light. The sensitizers then transfer the energy to the triplet states of the acceptor molecules. TTA occurs through the collision of the triplets of the acceptor molecules and generates the singlet excited states. Instead of giving out light by the acceptor (annihilator) in a conventional TTA-UC system, the excited state energy is further transferred to the emitter and the emitter eventually emits light. The schematic drawing is shown in FIG. 4.

The novel system described herein offers several advantages over the conventional system. For example, it is much easier to tune the emission wavelength from the system by changing the emitter without affecting the triplet sensitizer and acceptor. Modifications of the acceptor molecular structure to change emission color will impact the up conversion efficiency, requiring re-optimized of the entire system. More importantly, the current invention provides a system that works in the solid state without an inert polymer matrix. In one aspect, the acceptor can serve as both the matrix and the annihilator in the solid state. In one embodiment, the TTA-UC film comprises a triplet sensitizer, an acceptor, and an emitter. In one embodiment, the acceptor (annihilator) has high enough concentration to perform efficient TTA, whereas the emitter has low enough concentration to emit light with high PLQY. In one embodiment, the film is fabricated by vacuum evaporation process or solution methods. In another aspect, this new TTA-UC system can be used in optoelectronic devices such as LEDs, OLEDs, and photovoltaic devices.

In one aspect, the present invention includes a formulation comprising a mixture of:

a sensitizer;

an acceptor; and an emitter;

wherein the acceptor has a first triplet energy lower than a first triplet energy of the sensitizer;

wherein the emitter has a first singlet energy lower than a first singlet energy of the acceptor, and wherein the sensitizer, the acceptor, and the emitter are jointly capable of performing triplet-triplet annihilation upconversion of light incident on the formulation to emit a luminescent radiation comprising a radiation component from the first singlet energy of the emitter.

As would be understood by one of ordinary skill in the art, the triplet sensitizer needs to have a very efficient inter system crossing to generate triplets once it absorbs light. The triplet energy level of the acceptor needs to be lower than the sensitizer, which will enable efficient triplet energy transfer from the sensitizer to the acceptor (annihilator). The singlet excited state energy of the emitter needs to be lower than that of the acceptor to enable efficient energy transfer for light emission from the emitter.

In one embodiment, the emitter has a first triplet energy higher than the first triplet energy of the acceptor. When the triplet energy of the emitter compound is higher than the acceptor, it does not quench the triplets of the triplet acceptor. In another embodiment, the emitter has the first triplet energy higher than the first triplet energy of the sensitizer, and the emitter has the first singlet energy higher than the first singlet energy of the sensitizer. The triplet energies or singlet energies of the sensitizer, emitter, and acceptor may be measured using any method known in the art. In one embodiment, the emitter has a first singlet energy between 400 nm to 500 nm.

The total mass of each of the sensitizer, acceptor, and emitter within the mixture may be modified as necessary, as would be understood by one of ordinary skill in the art. In one embodiment, the acceptor comprises at least 50 wt % of the total mass of the mixture of the sensitizer, the acceptor, and the emitter. In another embodiment, the acceptor comprises at least 60 wt % of the total mass of the mixture of the sensitizer, the acceptor, and the emitter. In another embodiment, the acceptor comprises at least 70 wt % of the total mass of the mixture of the sensitizer, the acceptor, and the emitter.

In one embodiment, the formulation further comprises an inert binder. The binder comprises a polymer. The polymer can be PMMA, polystyrene, and polyethylene oxide.

In one embodiment, the formulation further comprises a solvent. The solvent is an organic solvent. The solvent can be THF, toluene, dichloromethane, xylene, tetralene, DMF, and DMSO.

Compounds of the Invention:

The compounds of the present invention may be synthesized using techniques well-known in the art of organic synthesis. The starting materials and intermediates required for the synthesis may be obtained from commercial sources or synthesized according to methods known to those skilled in the art.

In one aspect, the invention includes a triplet sensitizer. As used herein, the terms "triplet sensitizer" or "sensitizer" are used interchangeably and refer to a compound that can absorb photon energy and undergo efficient intersystem crossing to generate triplet states. Any compound that is capable of absorbing photon energy and undergoing efficient intersystem crossing to generate triplet states is contemplated by the present invention. Examples of triplet sensitizers include, but are not limited to, heavy metal containing complexes and certain classes of pure organic compounds. In some embodiments, Cu, Ru, Rh, Pd, Re, Os, Ir, Pt, and Au containing metal complexes can be used as the triplet sensitizer. In one embodiment, the sensitizer is selected from the group consisting of: an iridium complex, an osmium complex, a platinum complex, a palladium complex, a rhenium complex, a ruthenium complex, and a gold complex.

In one embodiment, the triplet sensitizer is selected from the group consisting of:

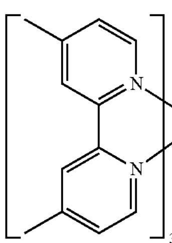

,

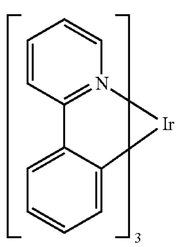

,

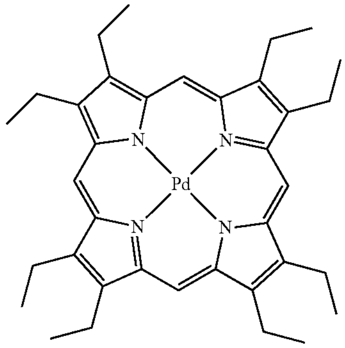

,

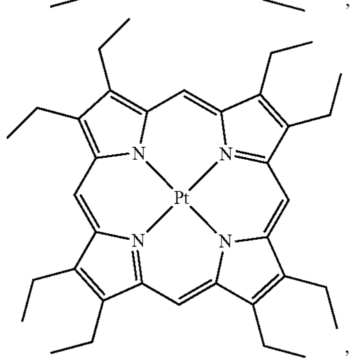

,

-continued

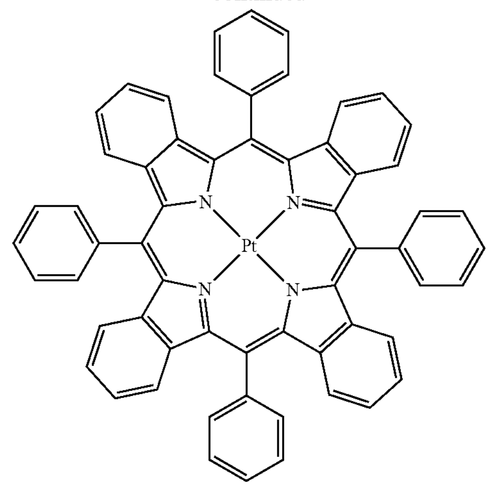

,

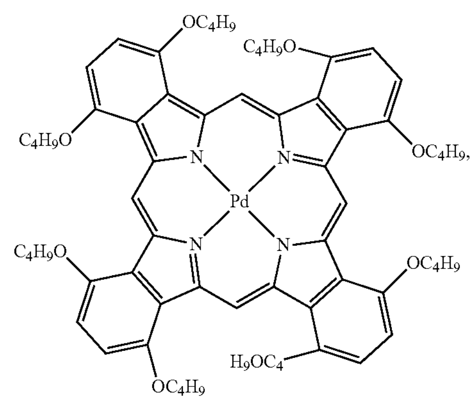

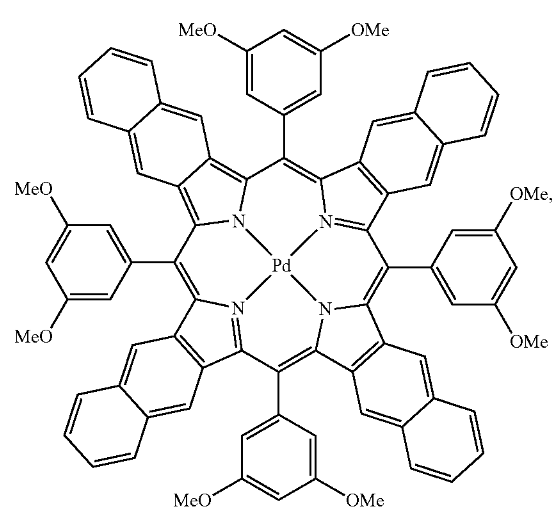

-continued

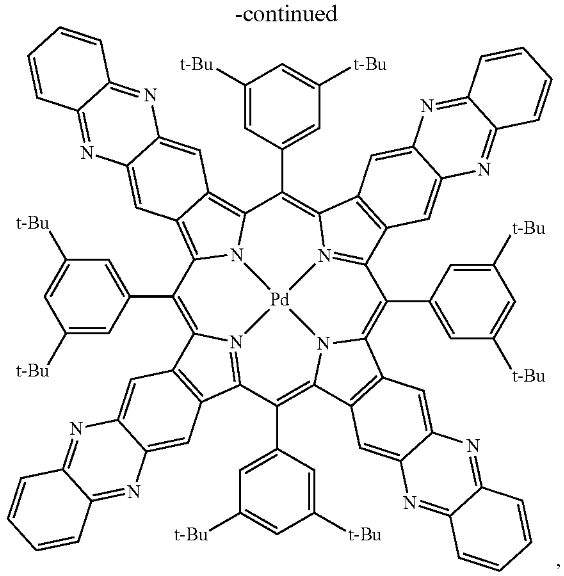

,

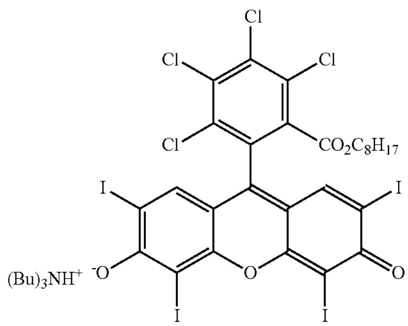

, and

-continued

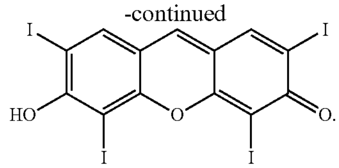

In another aspect, the invention includes a triplet acceptor. As used herein, the terms "triplet acceptor," "acceptor," and "annihilator" are used interchangeably and refer to a compound that can accept the triplet energy from the sensitizer and undergo TTA. Any compound that is capable of accepting the triplet energy from the sensitizer and undergoing TTA is contemplated by the present invention. Non-limiting examples of triplet acceptors include certain classes of aromatic compounds such as anthracene, pyrene, perrylene, and tetracene containing compounds. In one embodiment, the acceptor comprises a fused aromatic group. In another embodiment, the acceptor comprises a group selected from the group consisting of: naphthalene, anthracene, tetracene, pyrene, chrysene, perylene, and combinations thereof.

In one embodiment, the triplet acceptor is selected from the group consisting of:

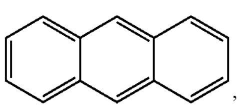
,
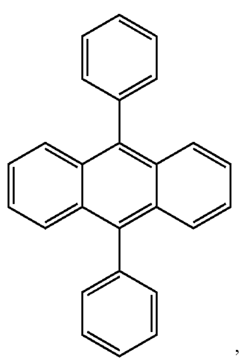
,
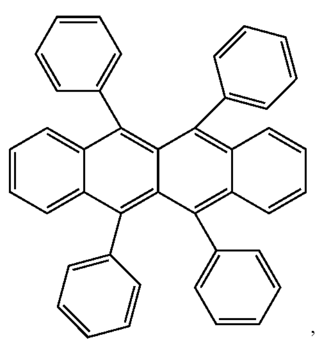
,
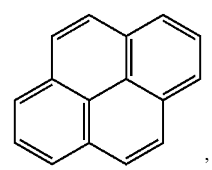
,
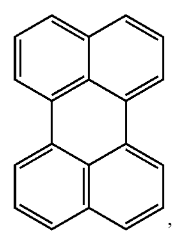
,

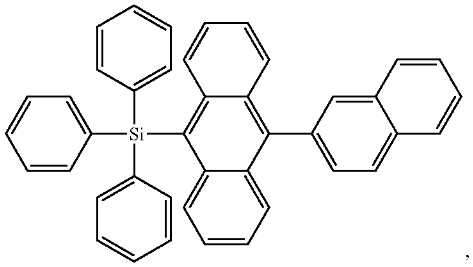

,
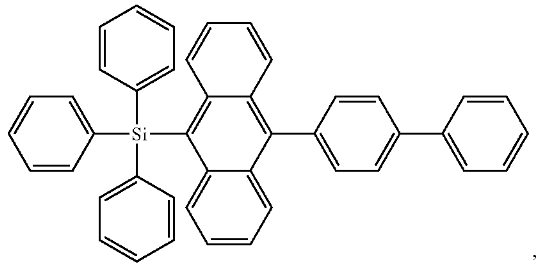

,

-continued
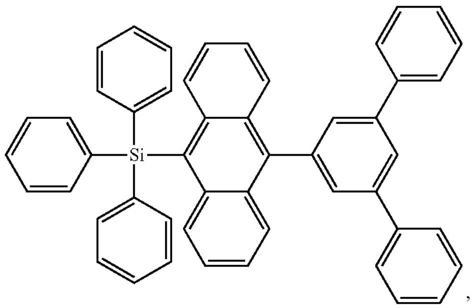
,
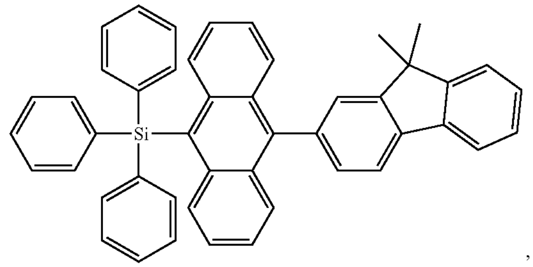
,
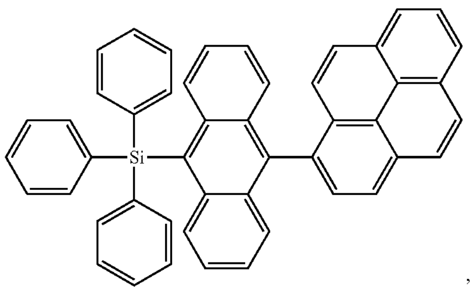
,
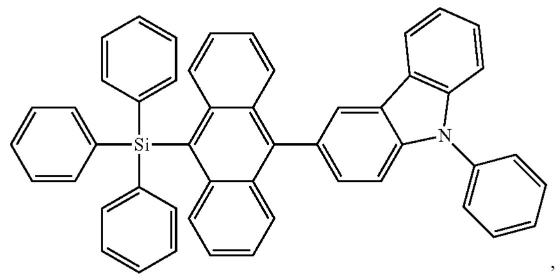
,
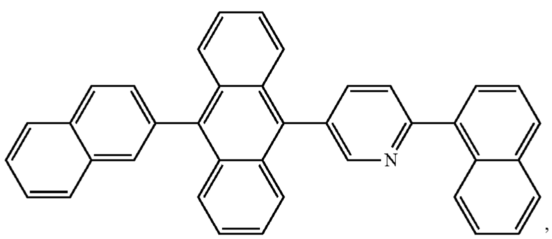
,
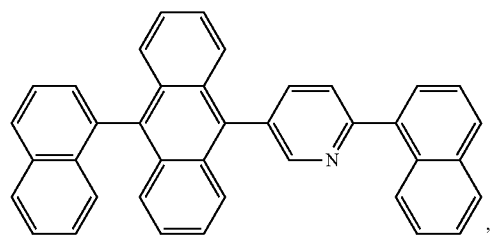
,
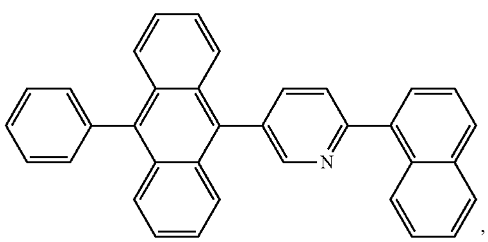
,
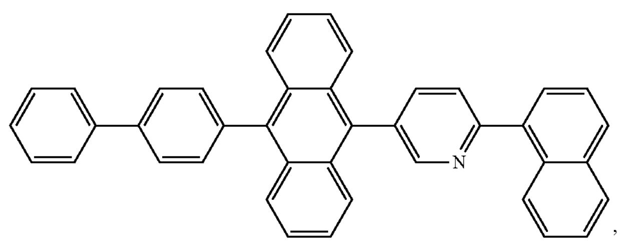
,
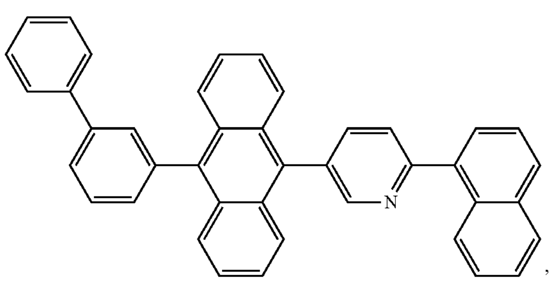
,
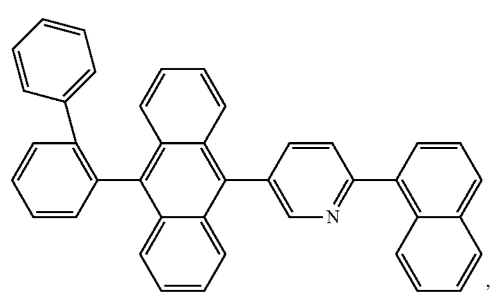
,
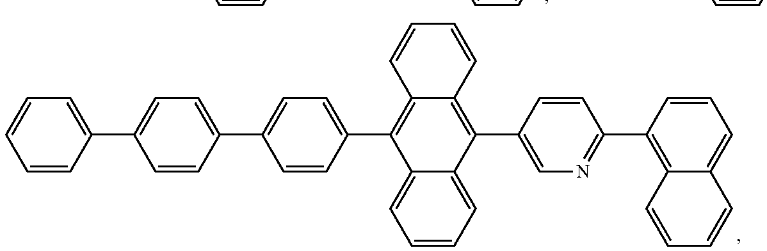
, -continued
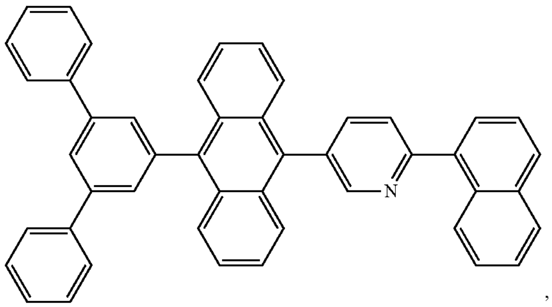
,
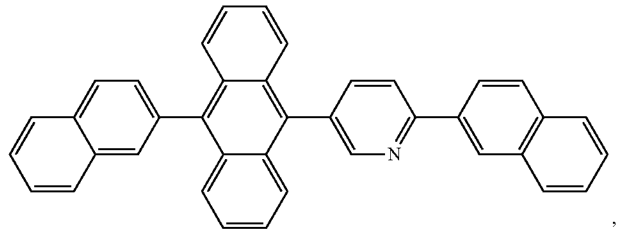
,
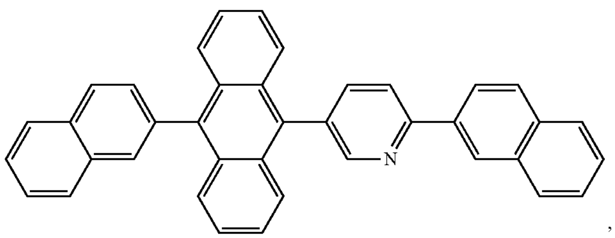
,
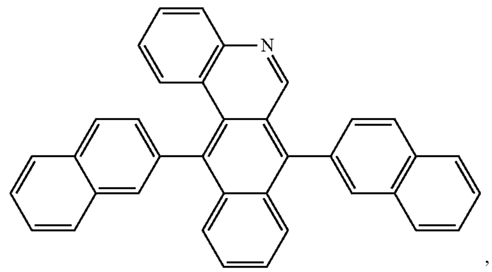
,
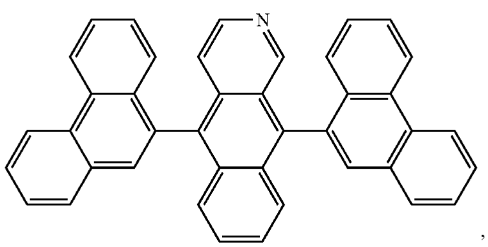
,
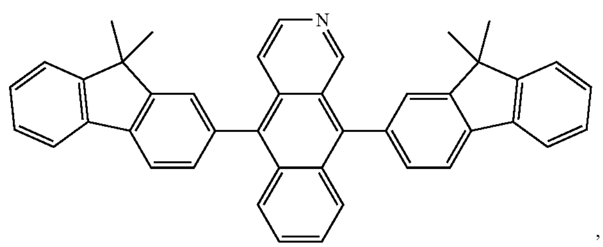
,
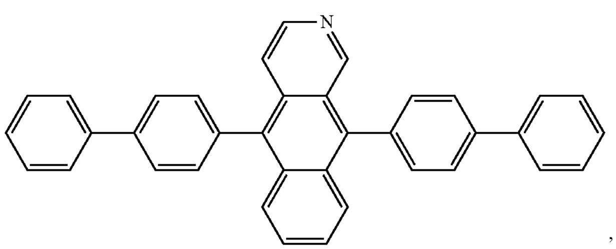
,
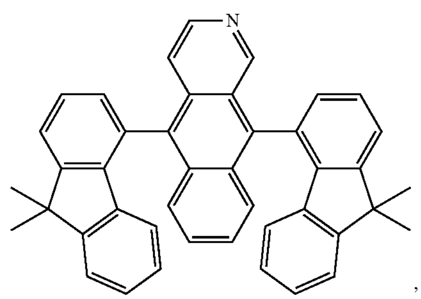
,
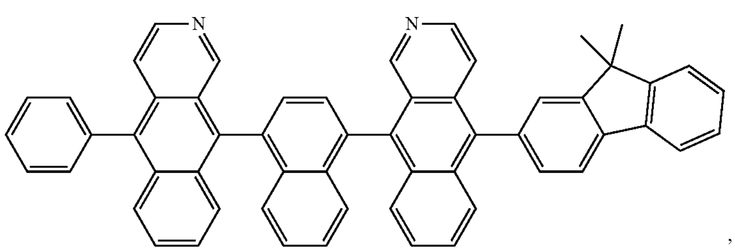
,
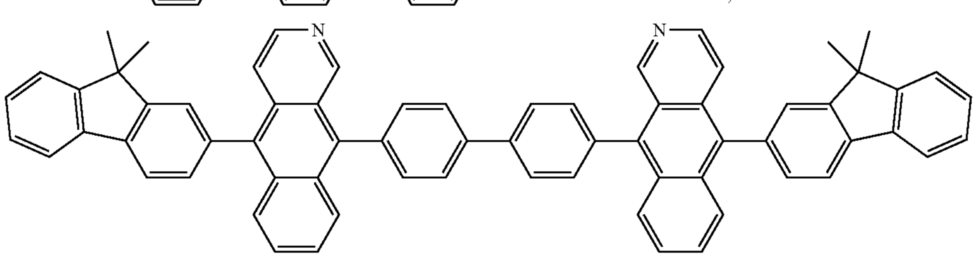
, -continued
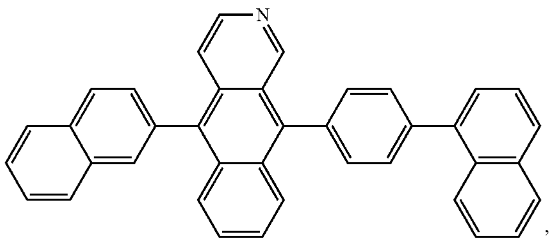
,
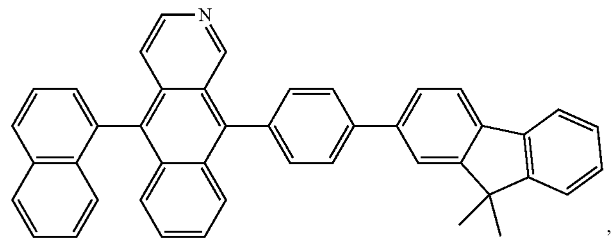
,
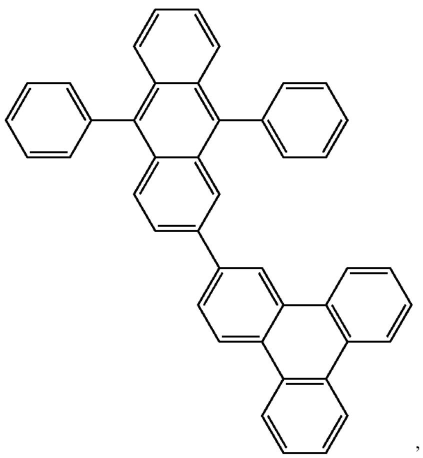
,
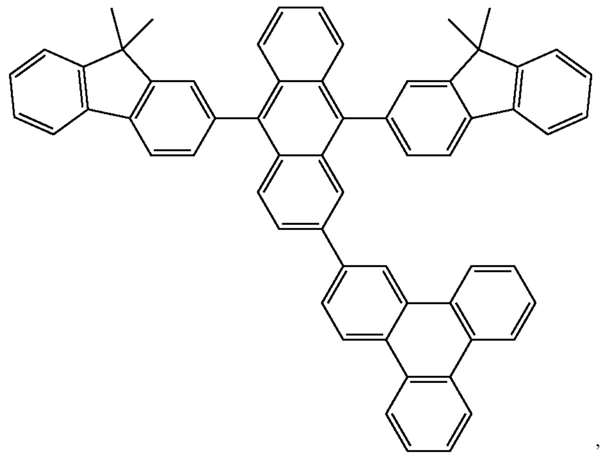
,
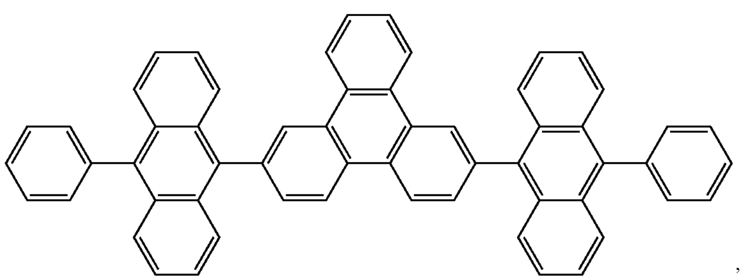
,
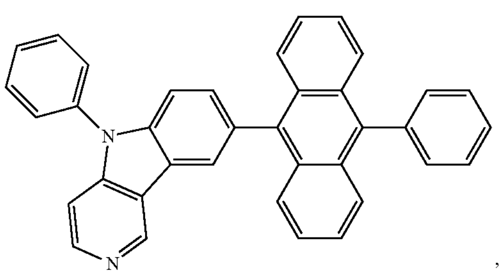
,
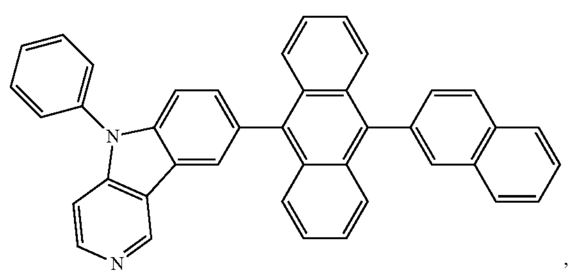
,
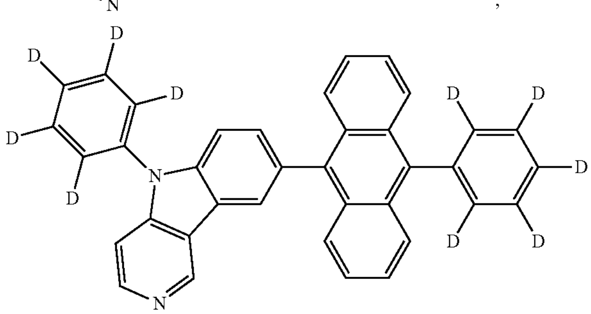
, -continued
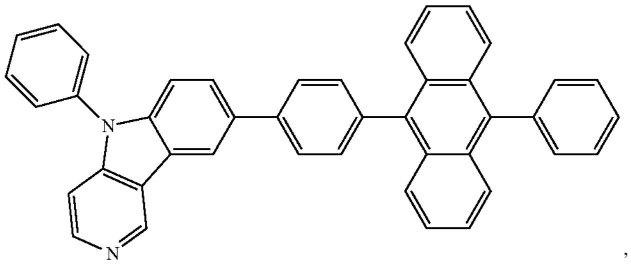
,
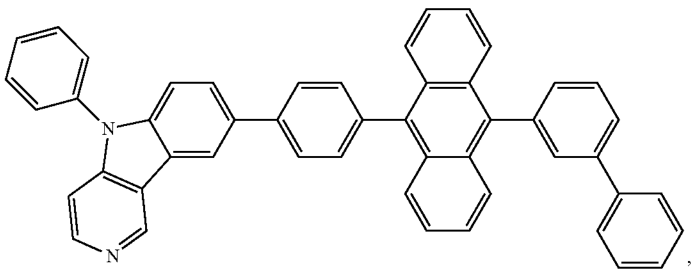
,
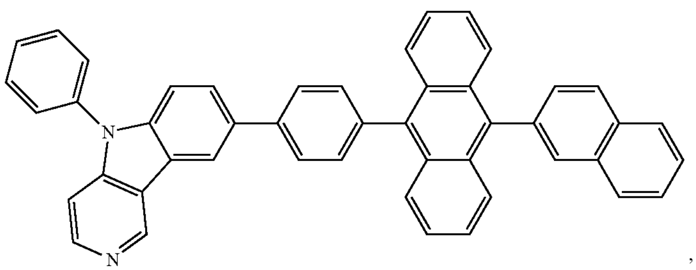
,
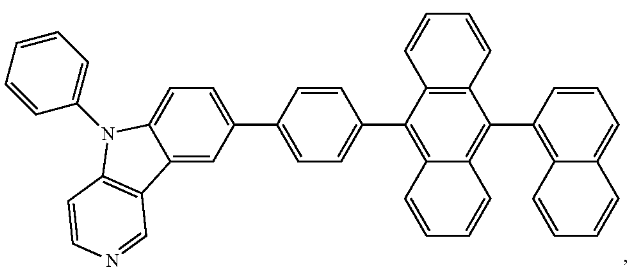
,
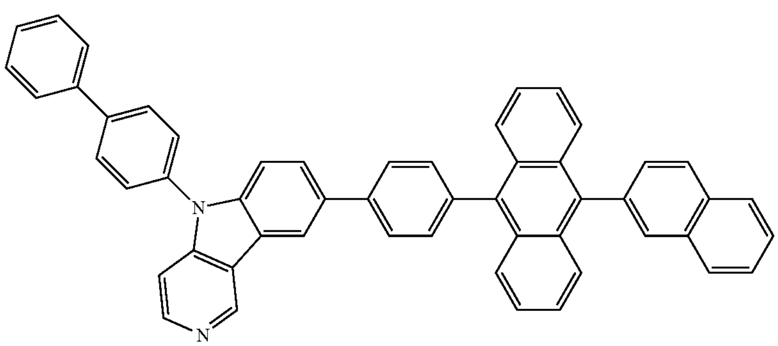
,
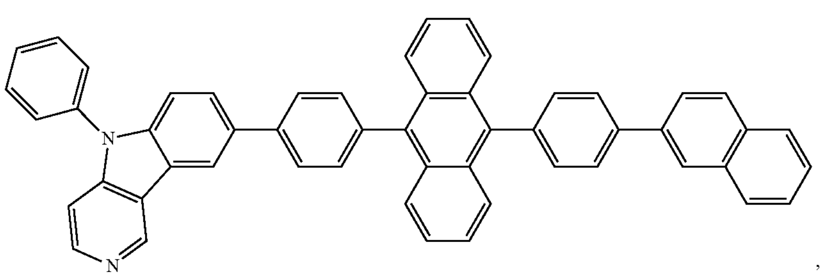
, -continued
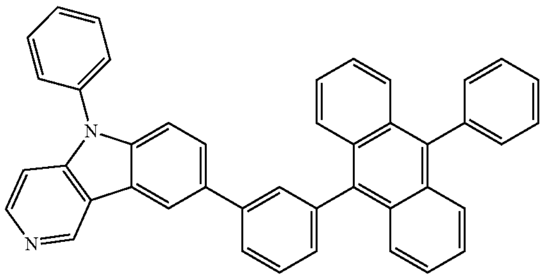
,
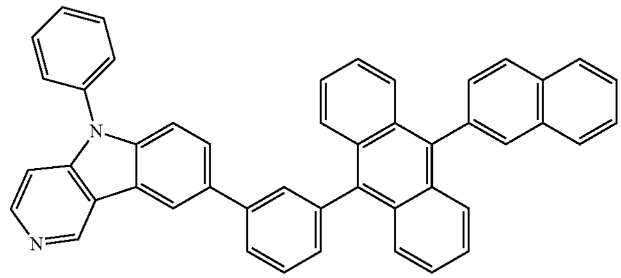
,
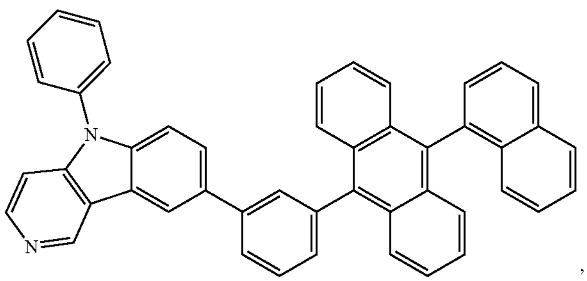
,
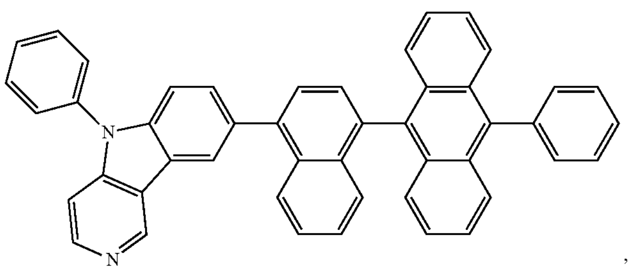
,
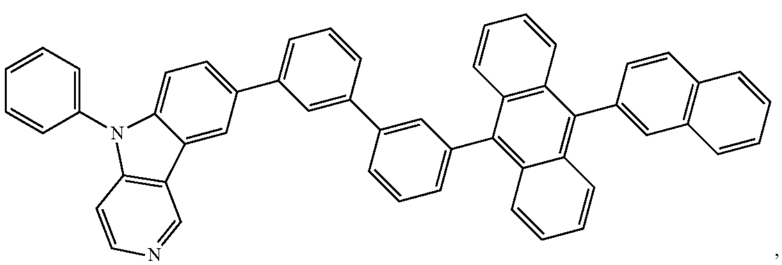
,
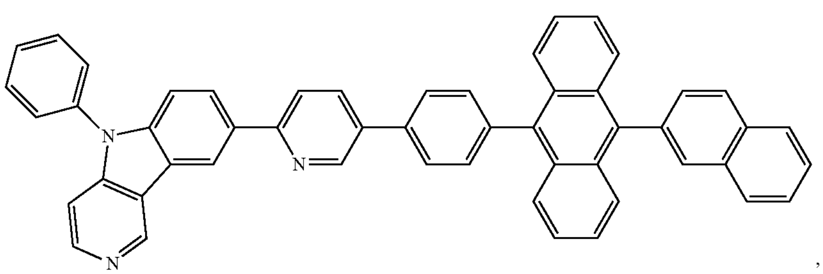
,
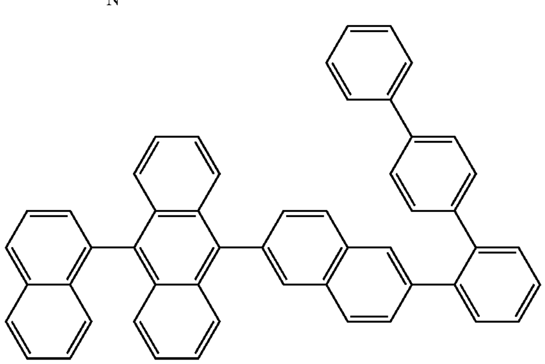
,
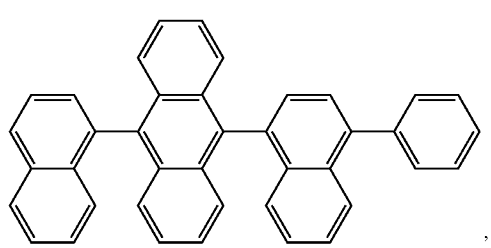
, -continued
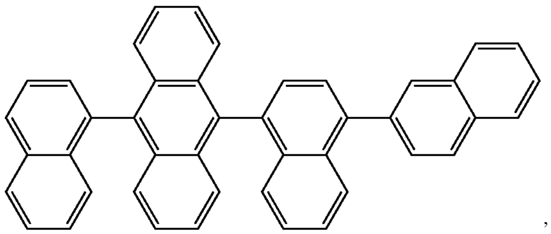
,
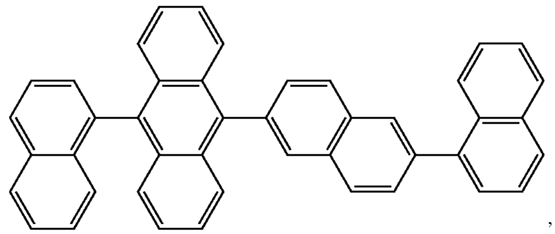
,
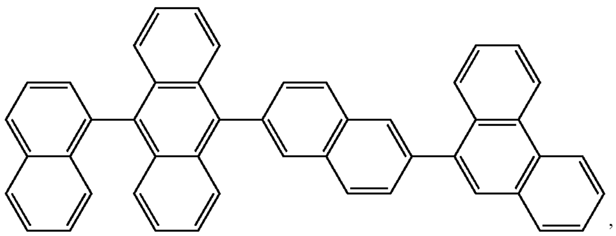
,
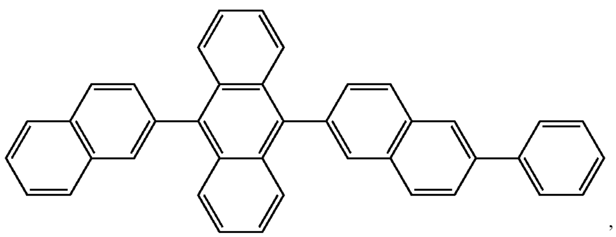
,
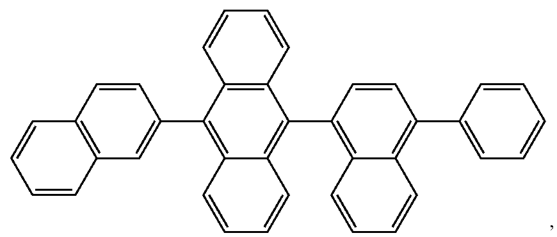
,
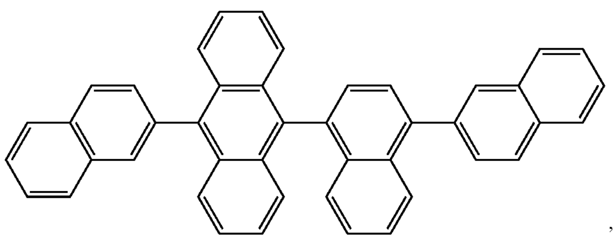
,
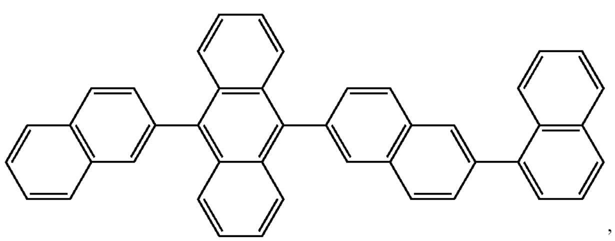
,
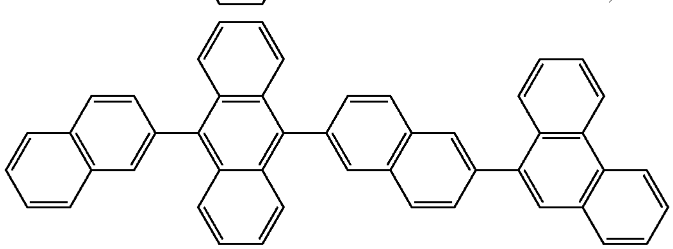
,
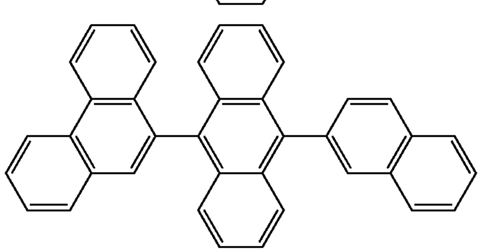
,
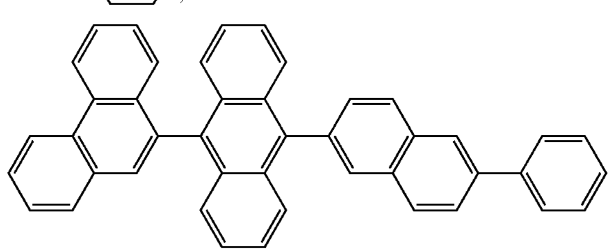
, -continued
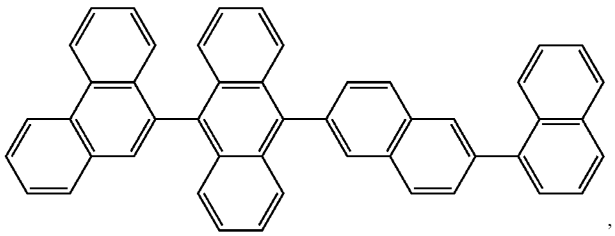
,
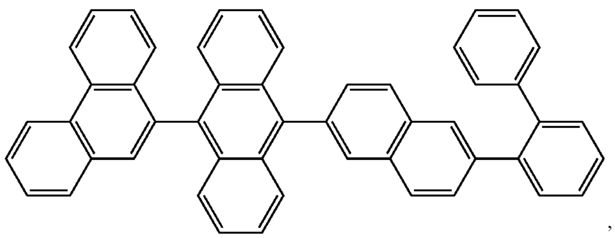
,
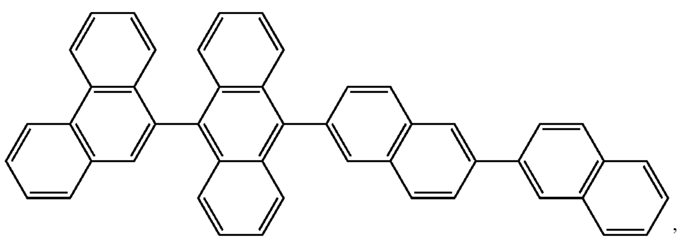
,
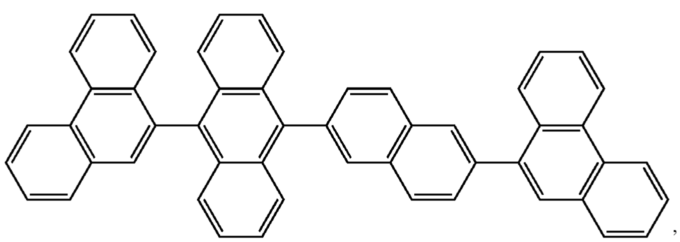
,
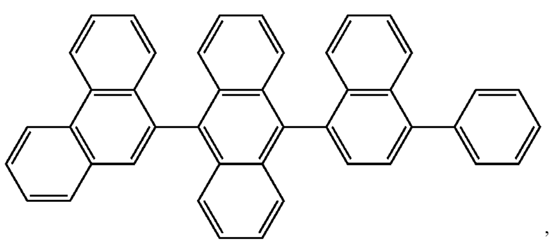
,
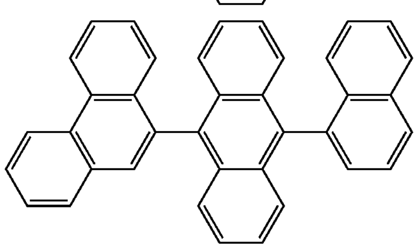
,
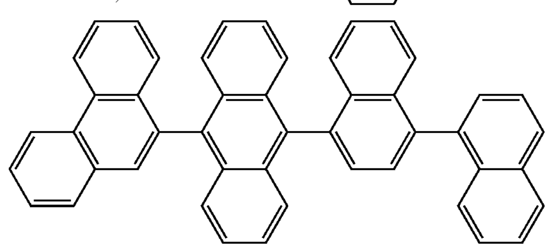
,
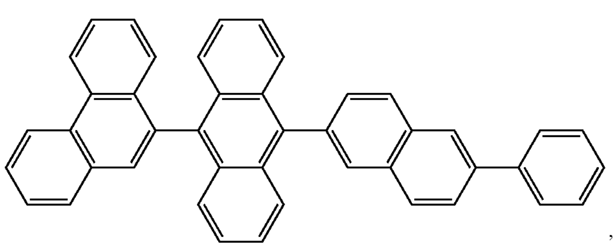
,
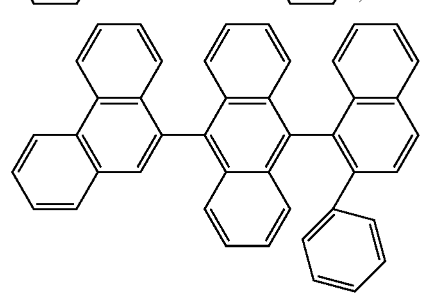
,
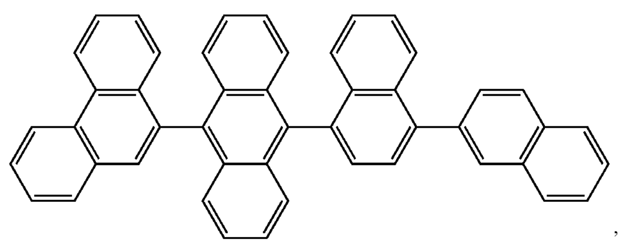
, -continued
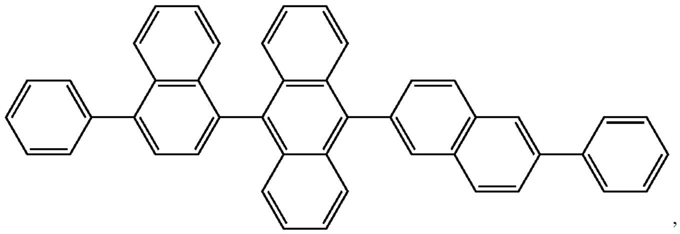
,
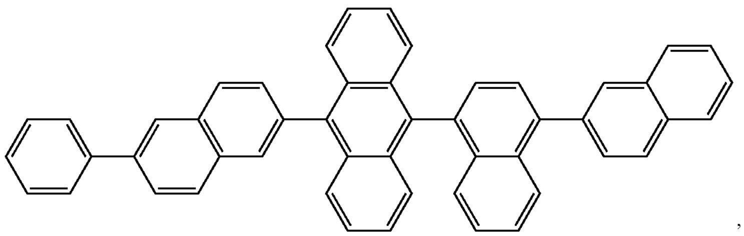
,
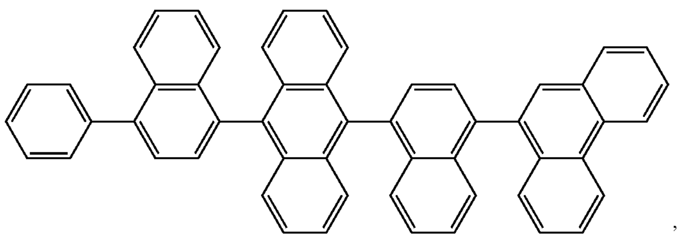
,
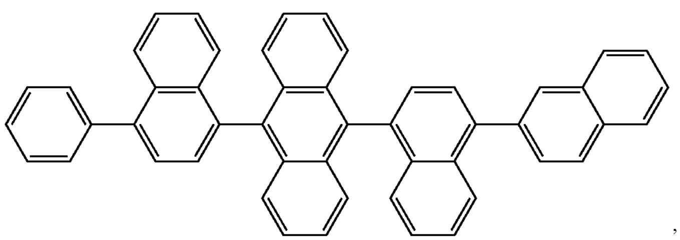
,
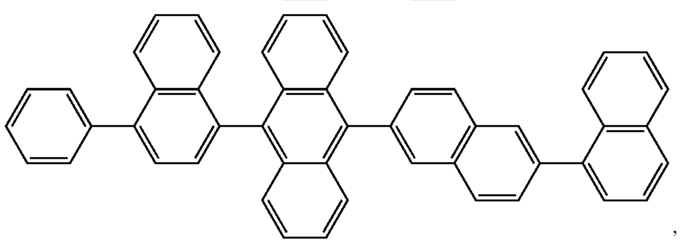
,
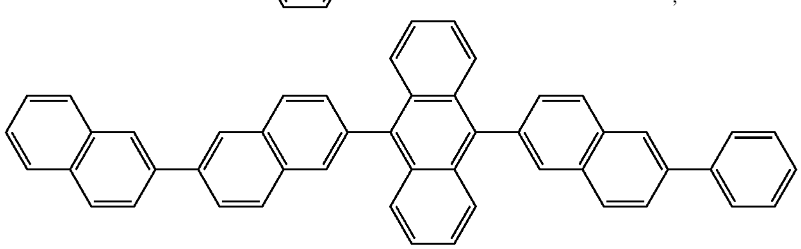
,
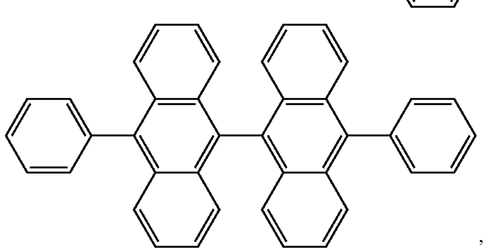
, -continued
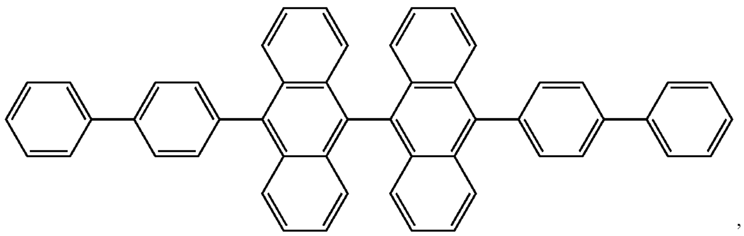
,
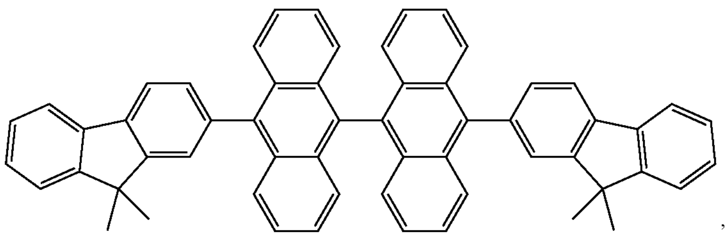
,
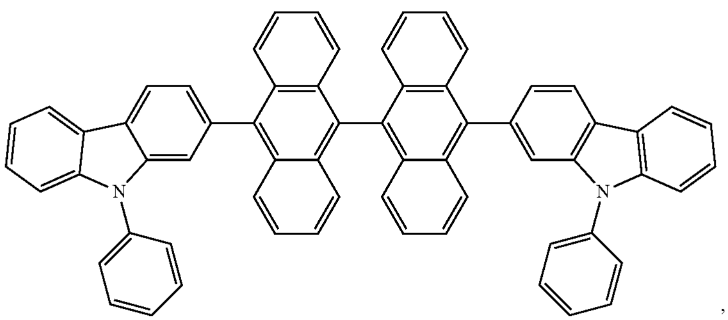
,
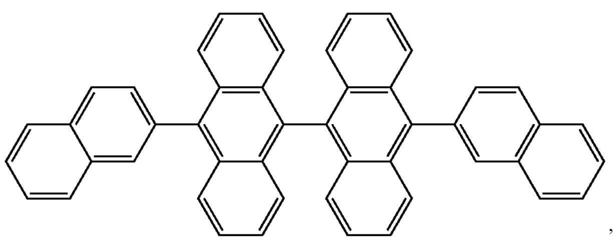
,
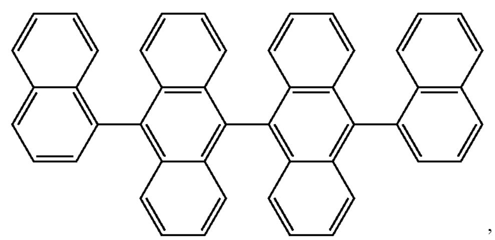
,
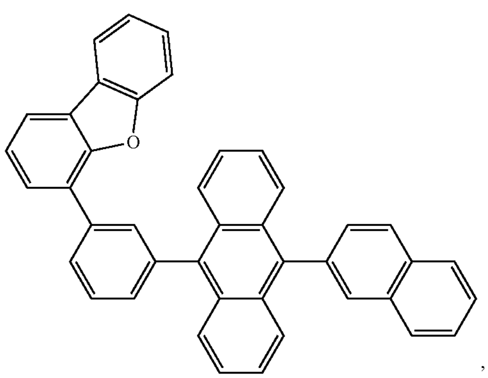
,
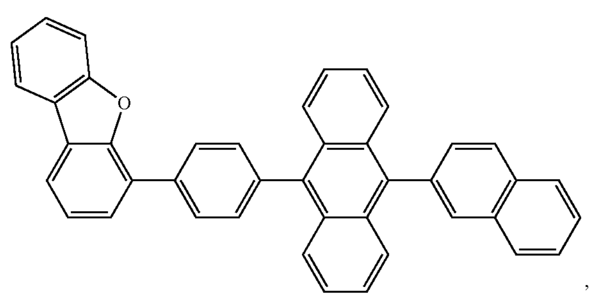
,
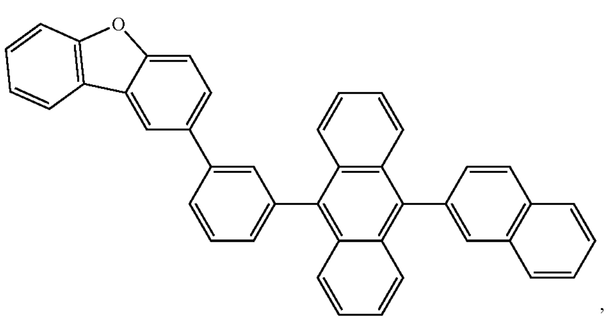
, -continued
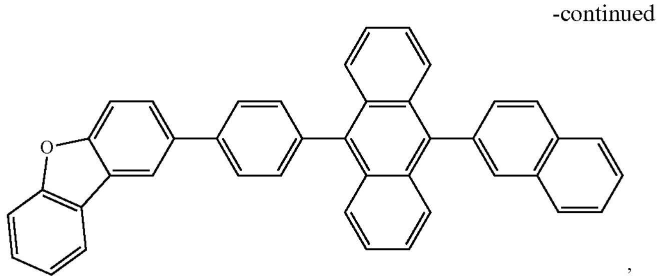
,
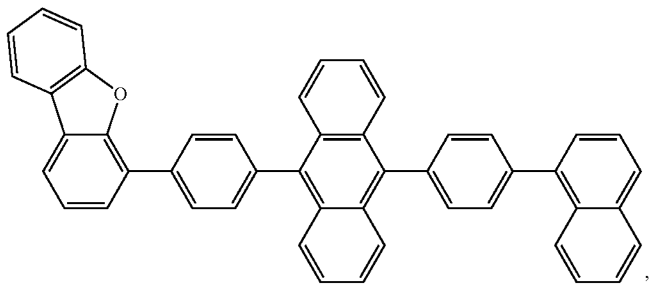
,
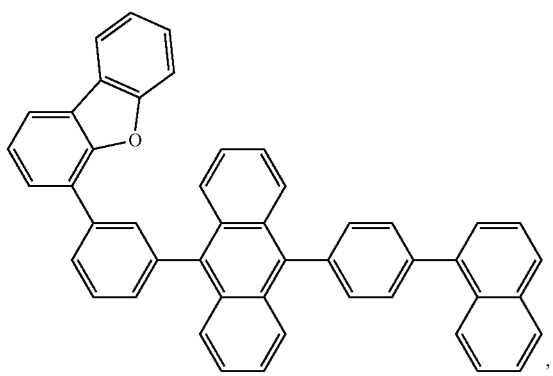
,
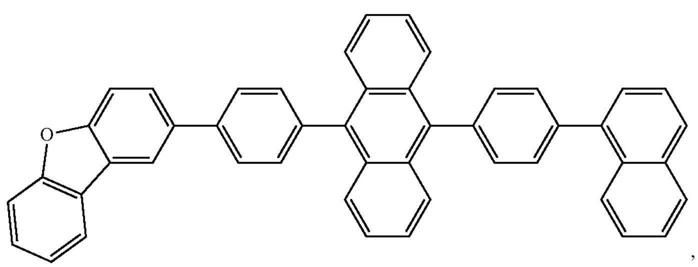
,
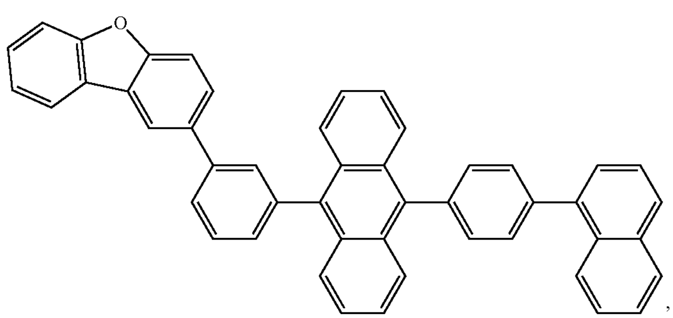
, -continued
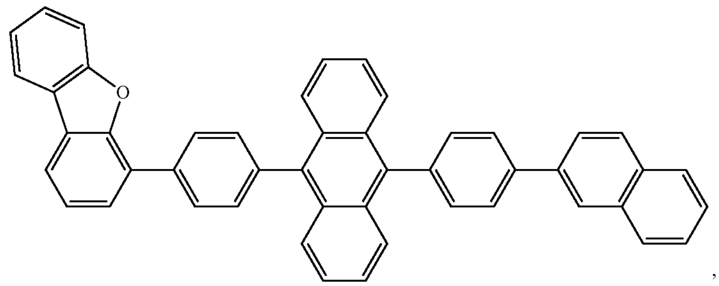
,
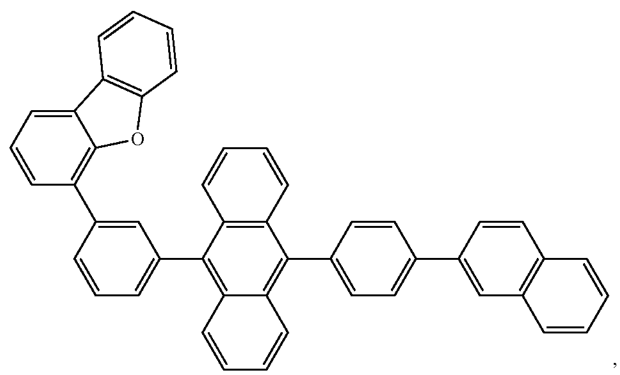
,
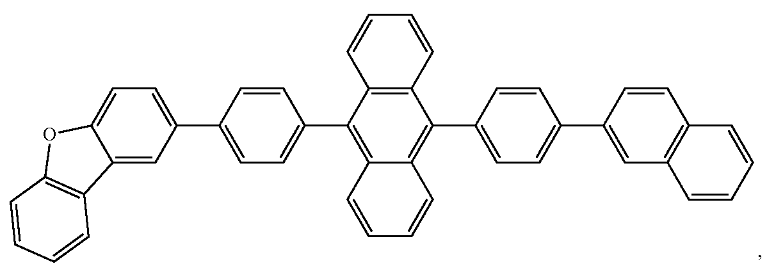
,
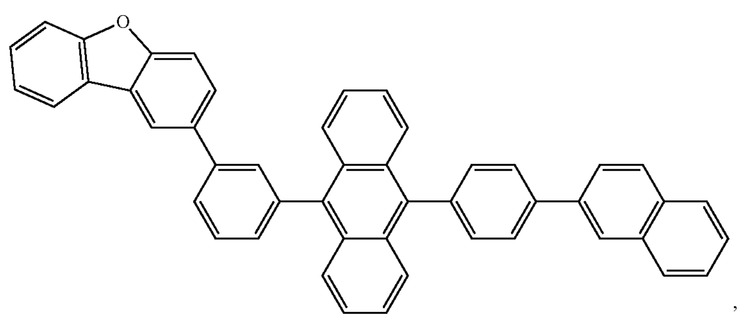
,
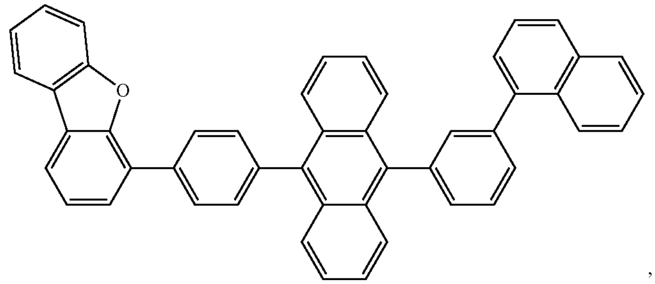
, -continued
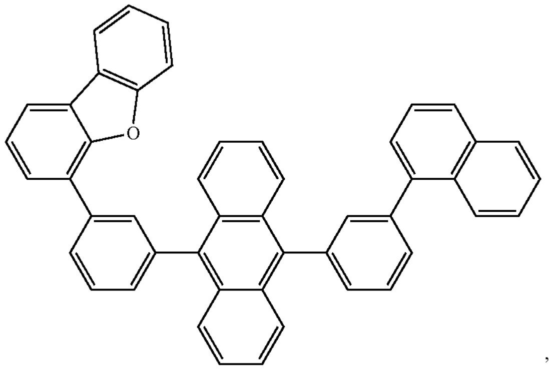
,
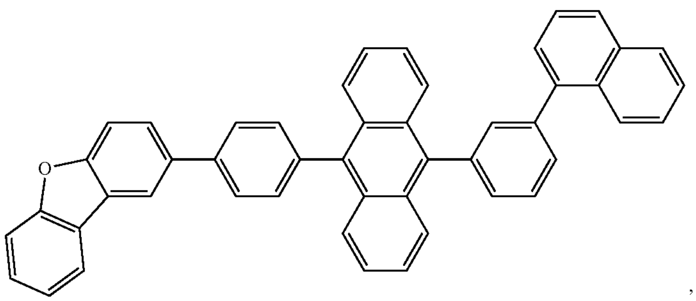
,
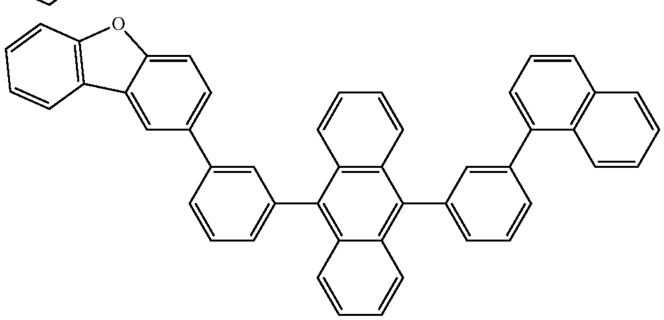
,
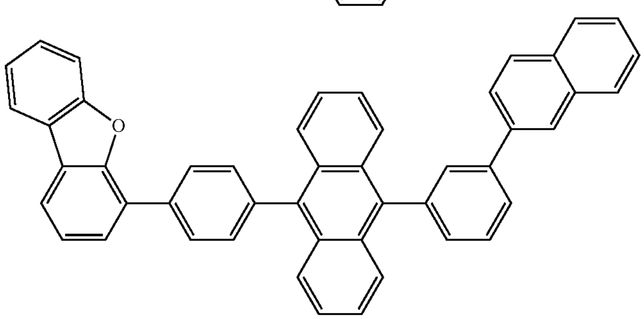
,
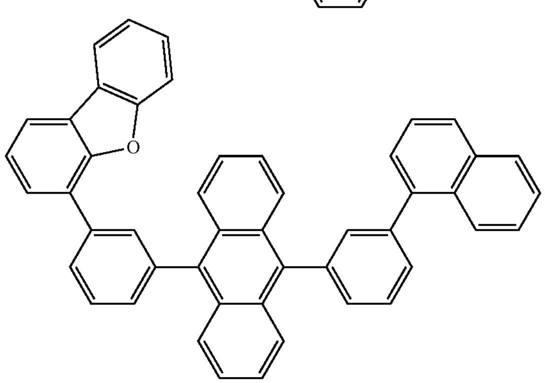
, -continued
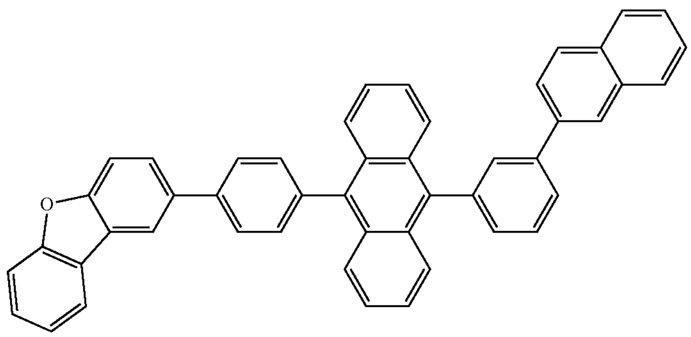
,
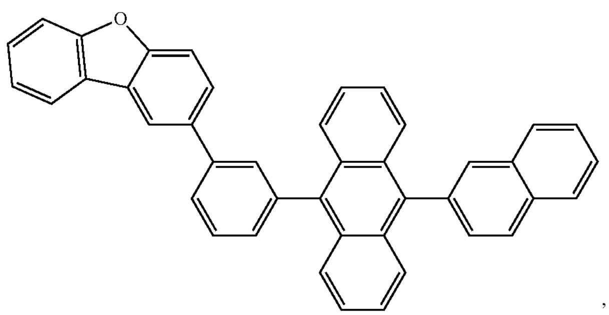
,
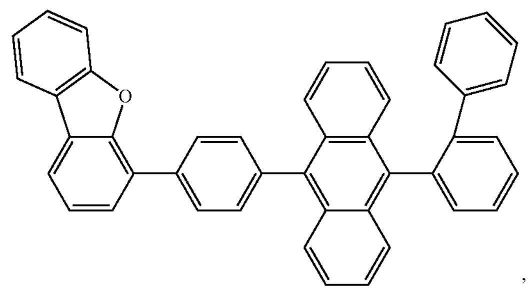
,
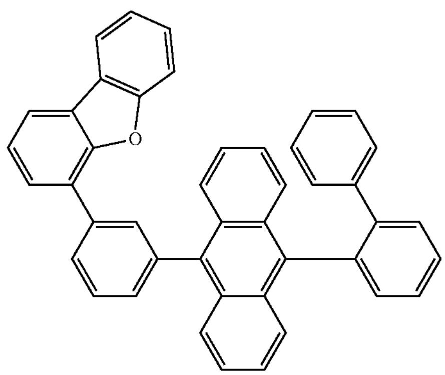
,
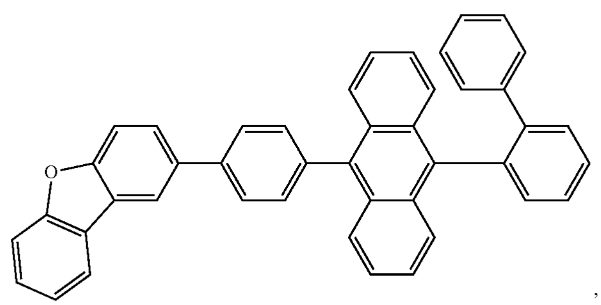
,
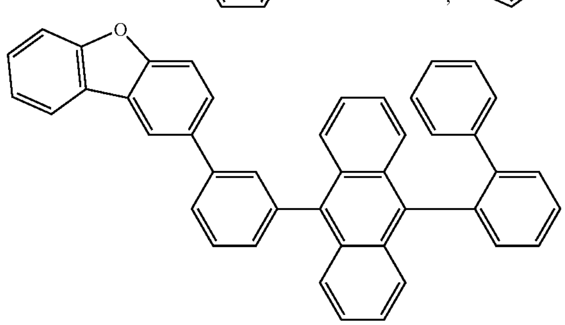
,
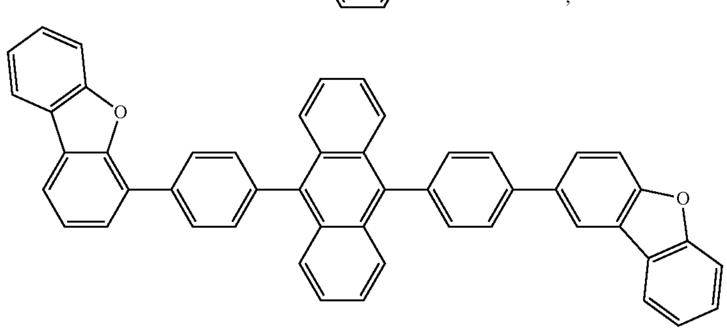
, -continued
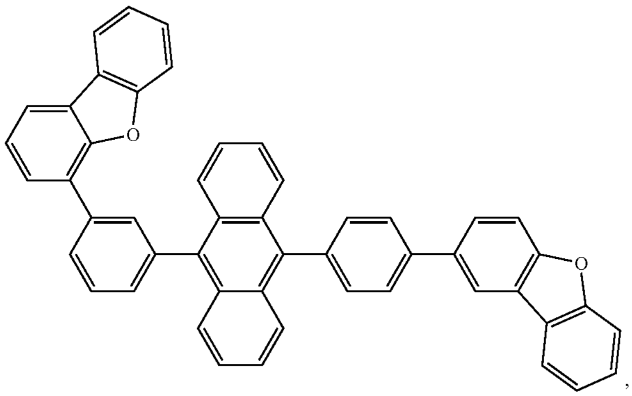
,
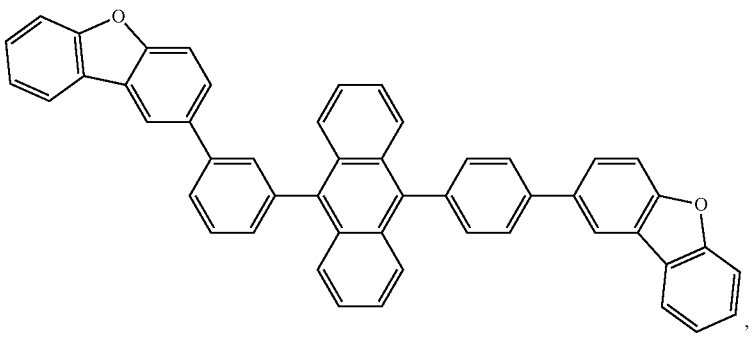
,
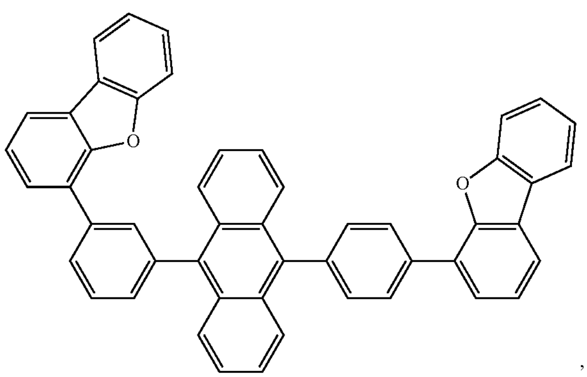
,
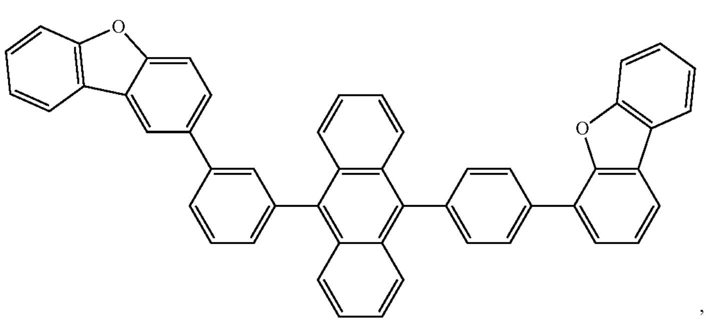
, -continued
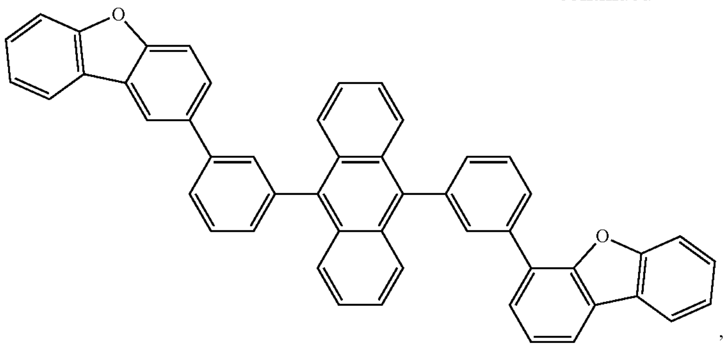
,
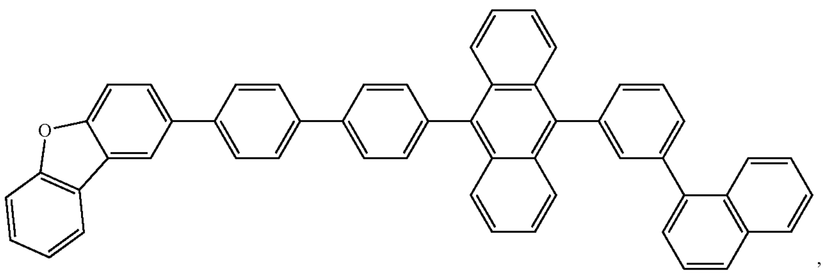
,
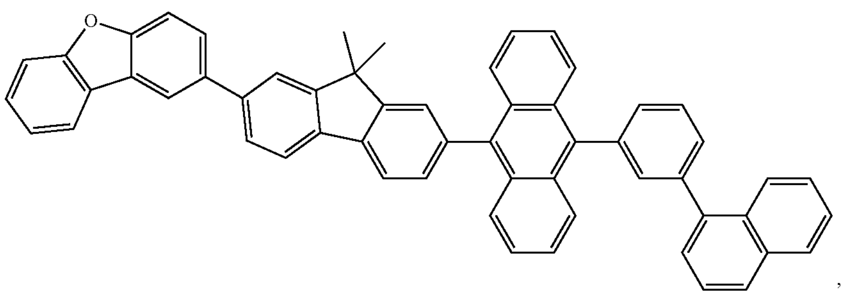
,
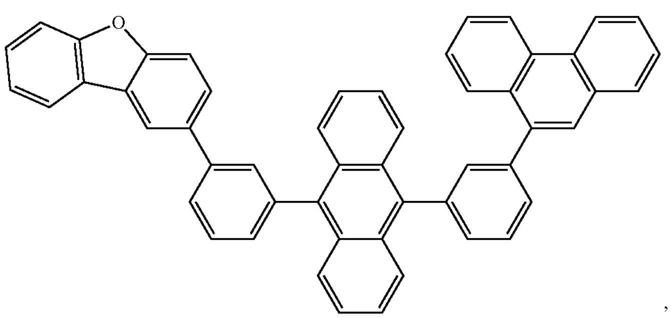
,
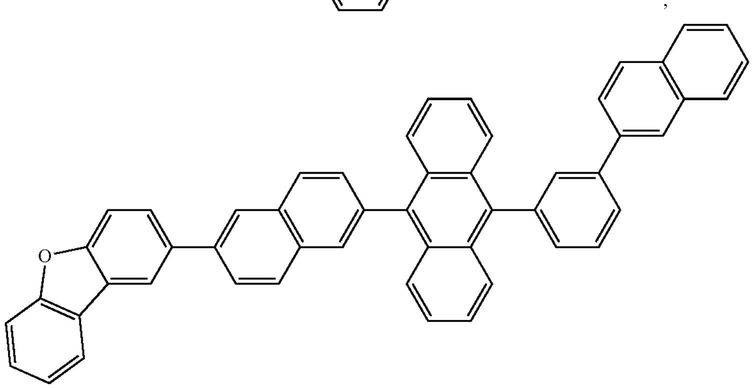
,
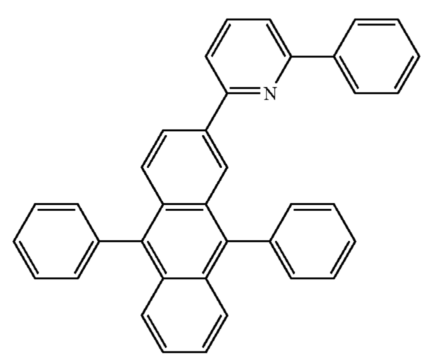
, -continued
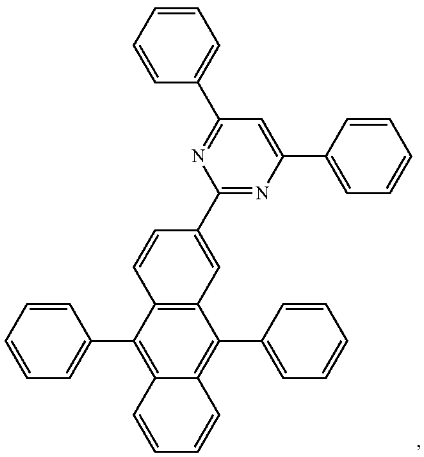
,
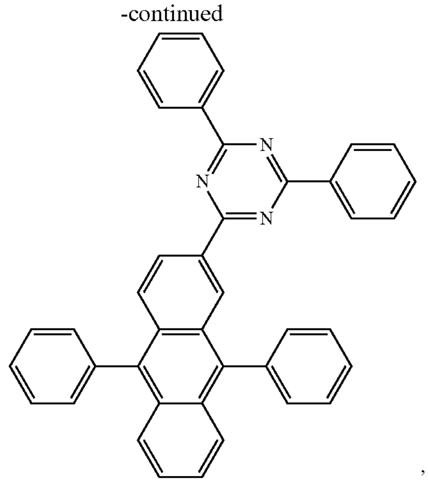
,
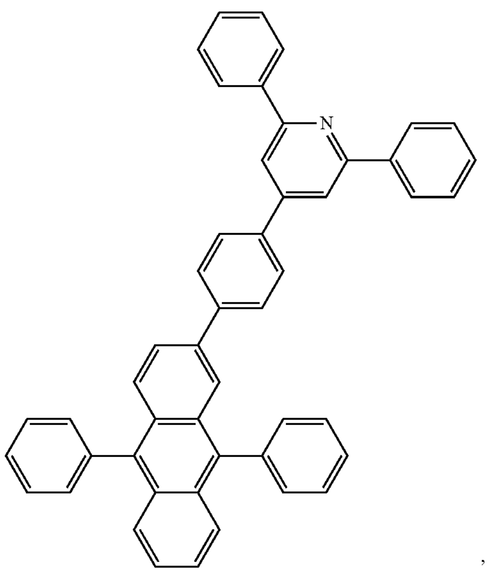
,
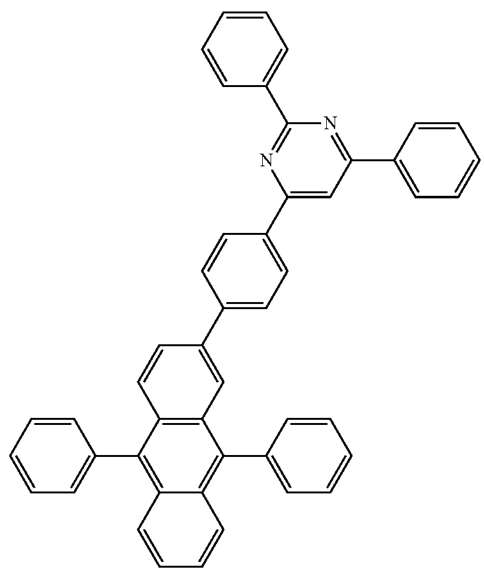
,
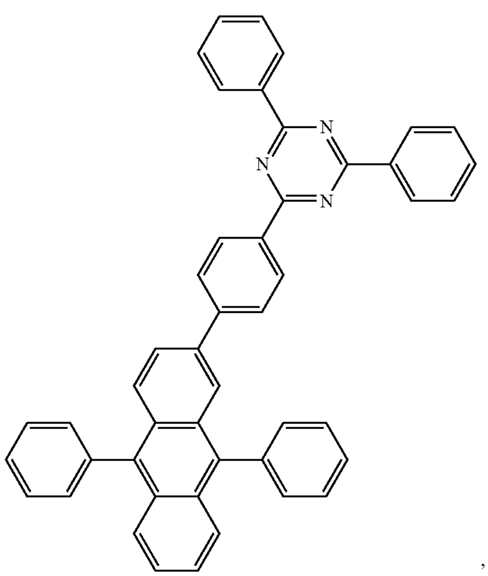
, -continued
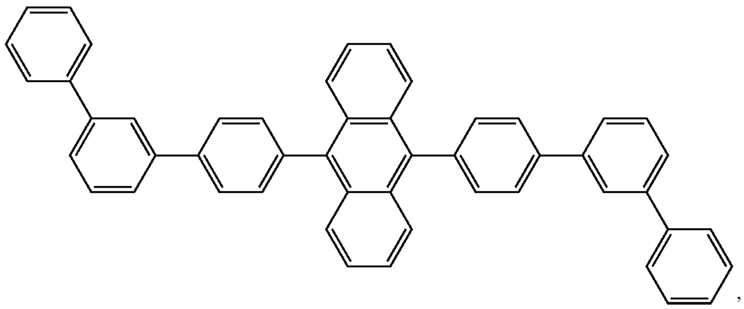
,
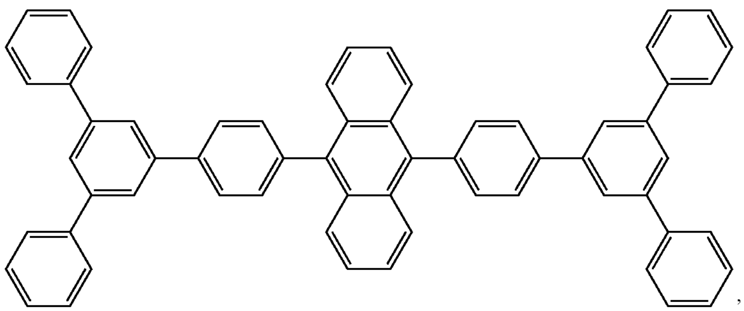
,
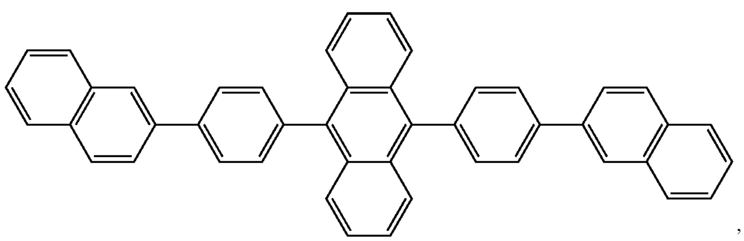
,
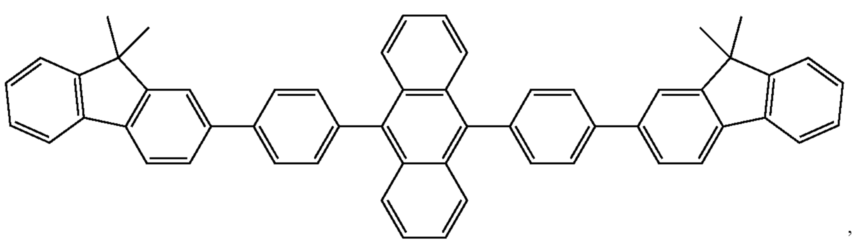
,
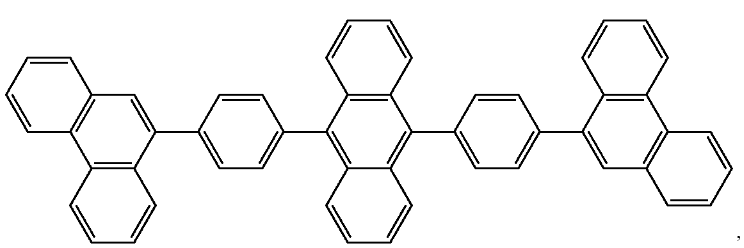
,
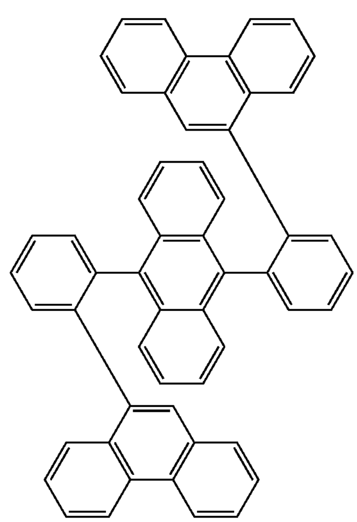
, -continued
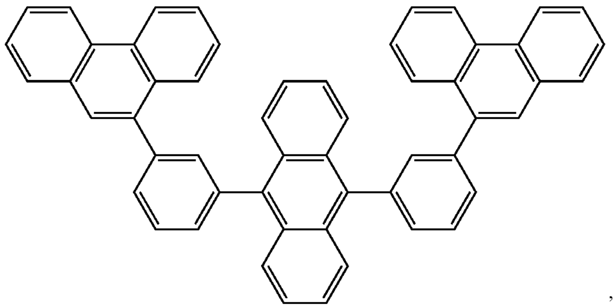
,
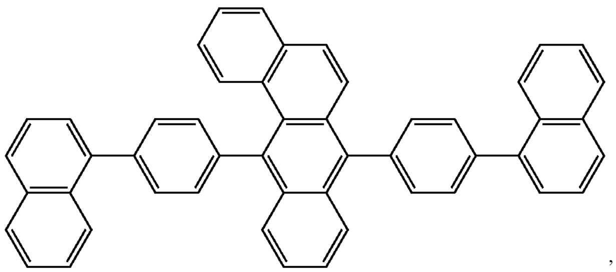
,
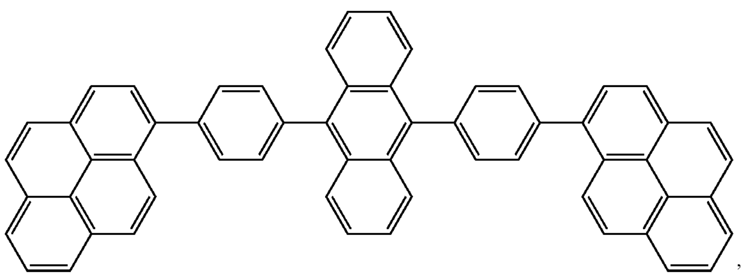
,
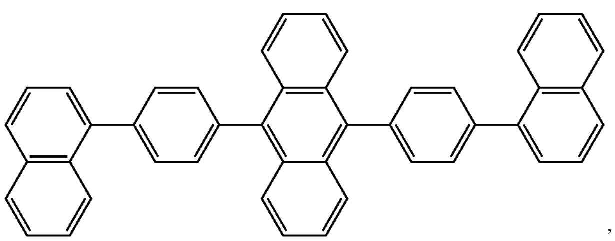
,
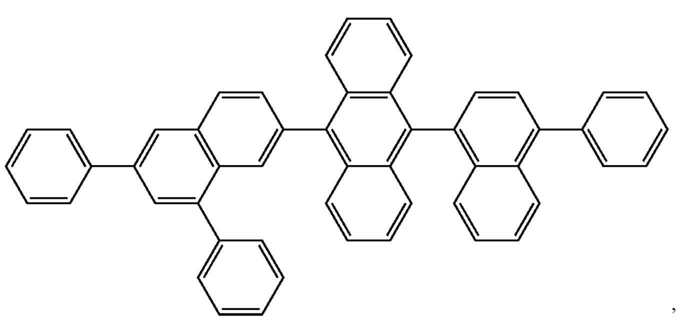
,
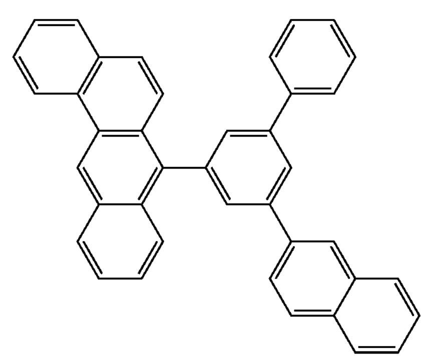
, -continued
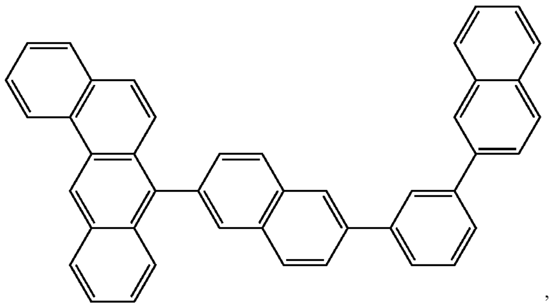
,
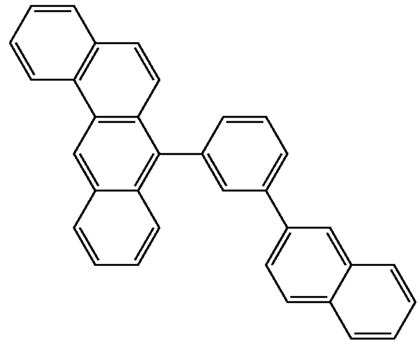
,
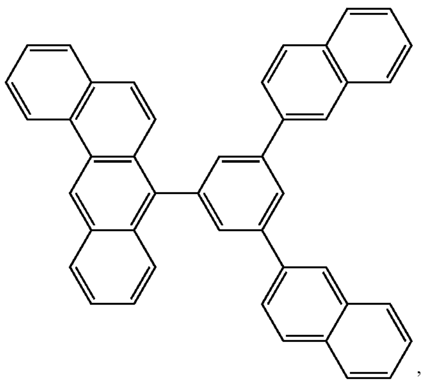
,
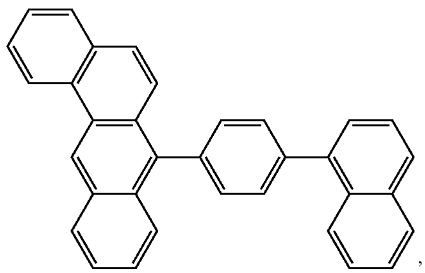
,
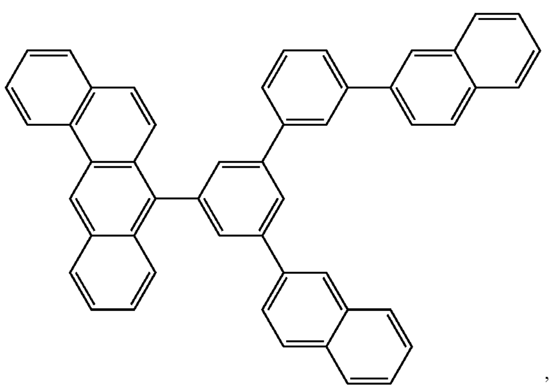
,
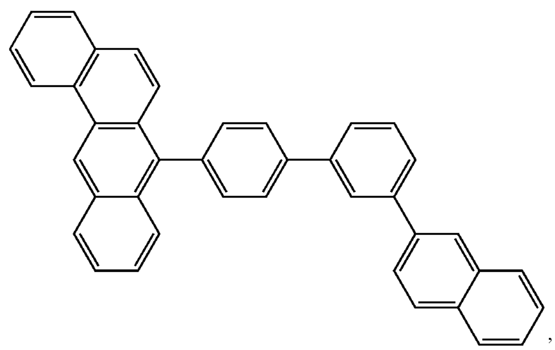
,
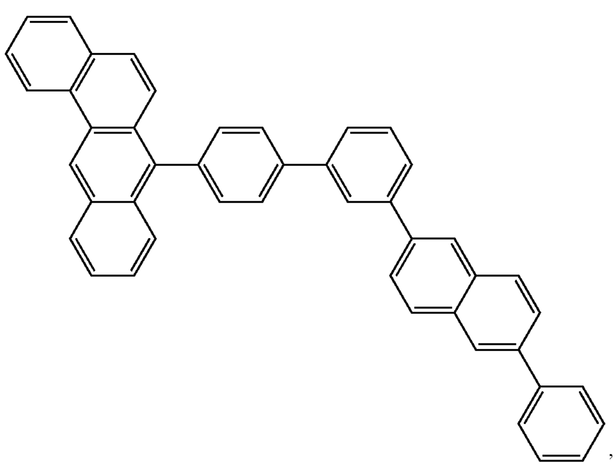
,
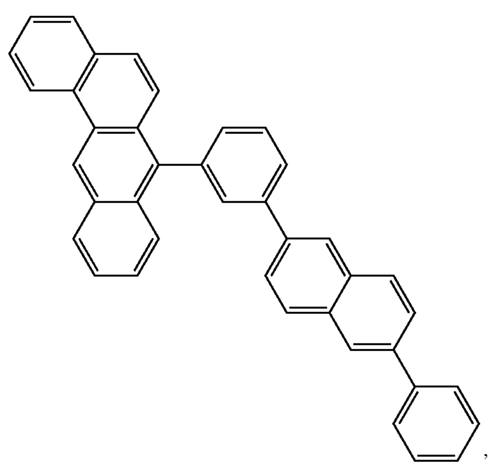
, -continued
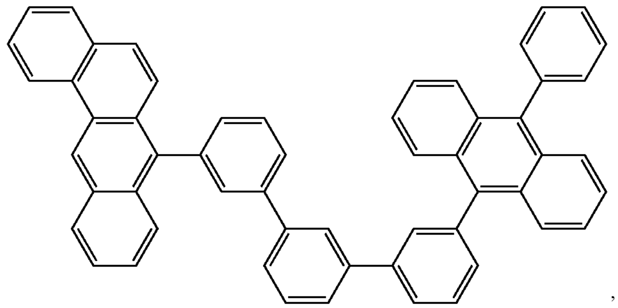
,
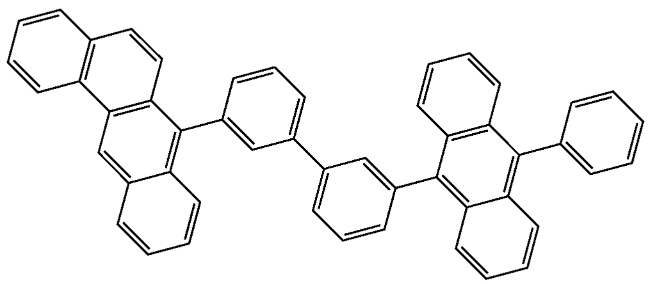
,
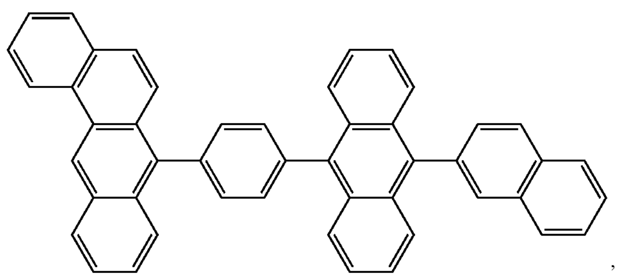
,
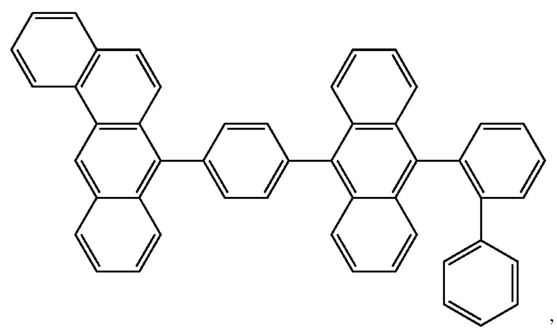
,
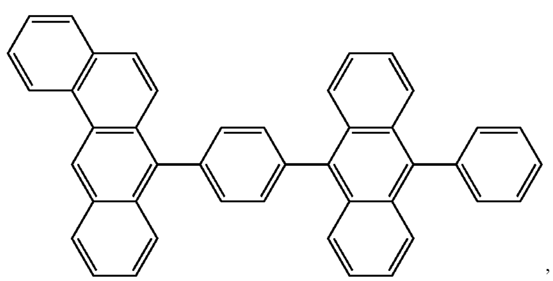
,
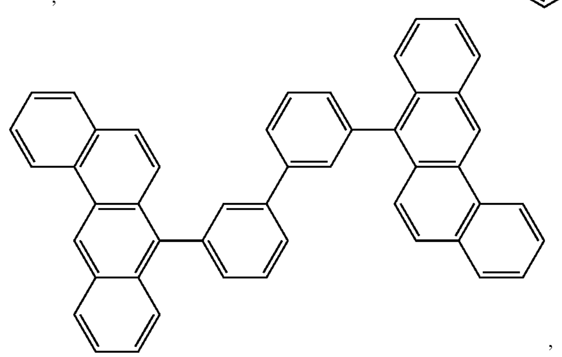
,
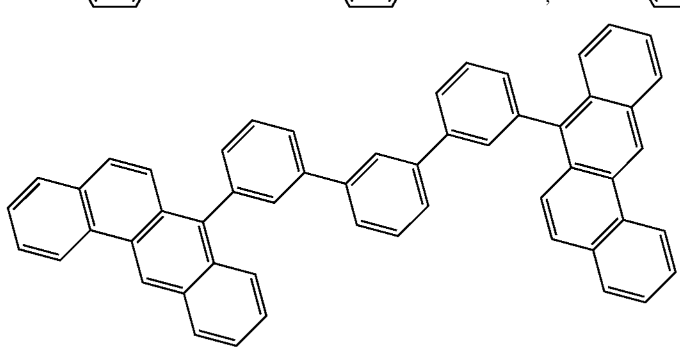
,
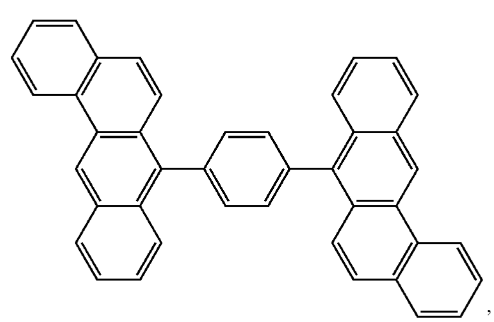
, -continued
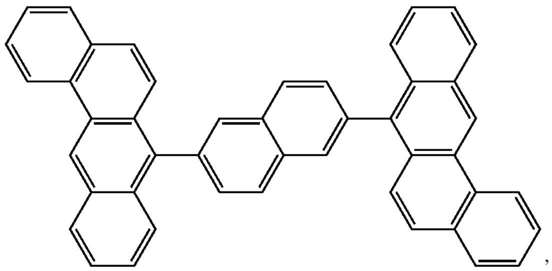
,
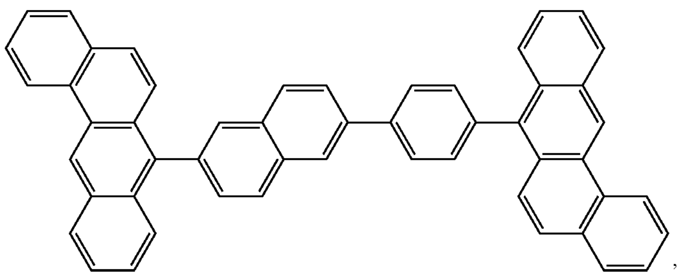
,
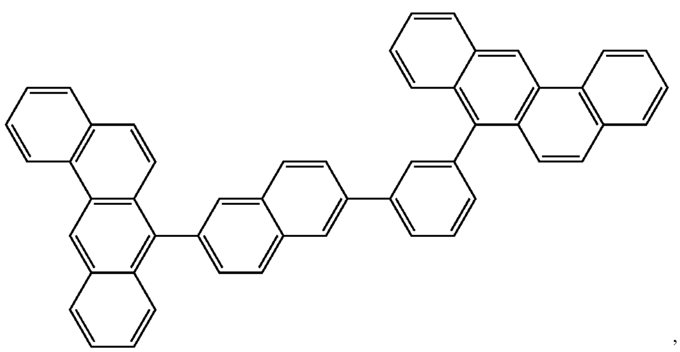
,
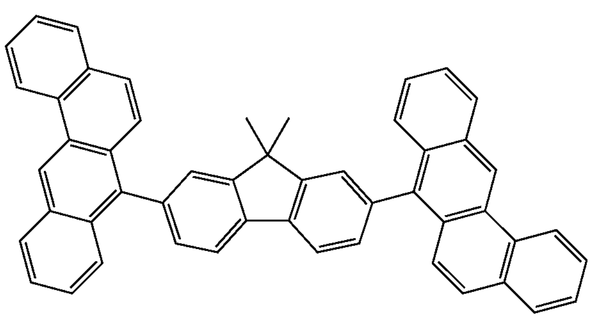
,
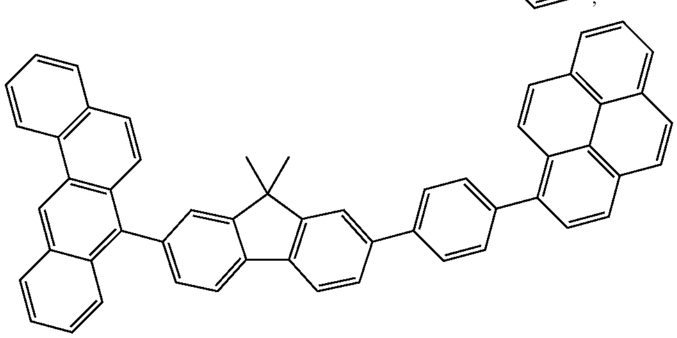
, -continued
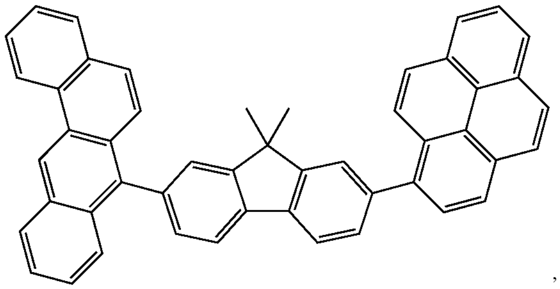
,
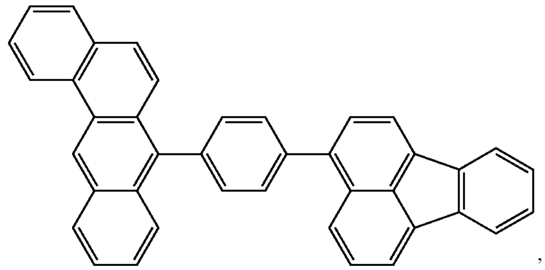
,
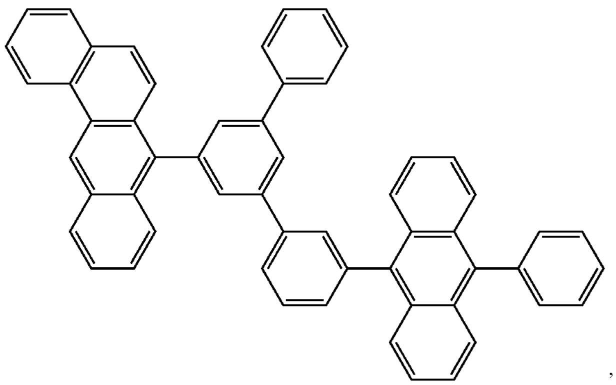
,
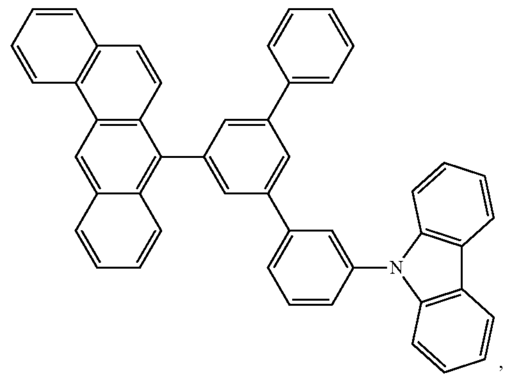
,
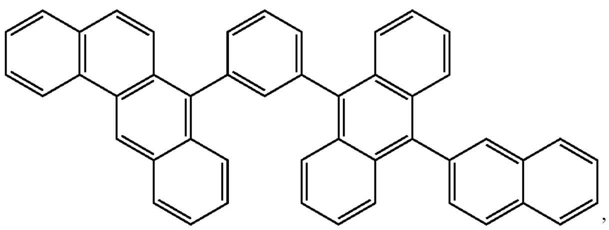
,
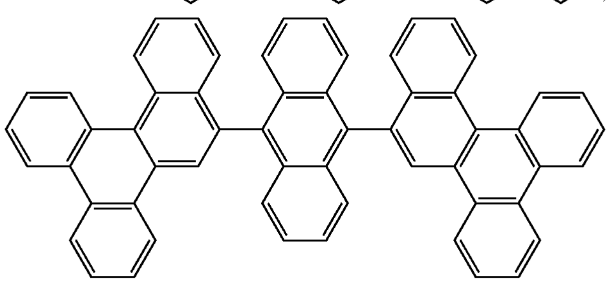
,
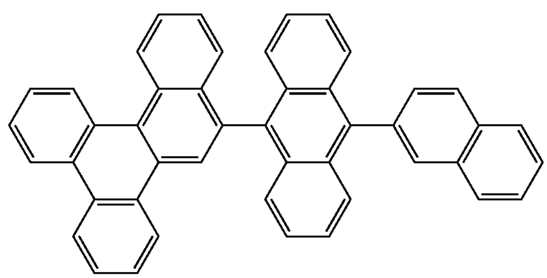
,
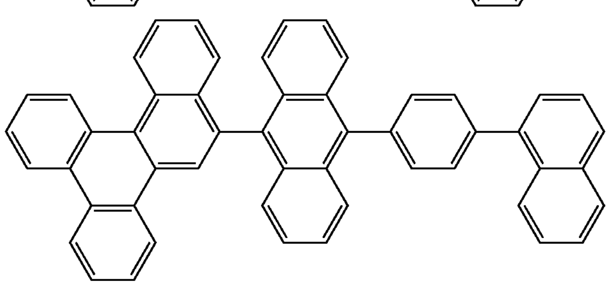
,
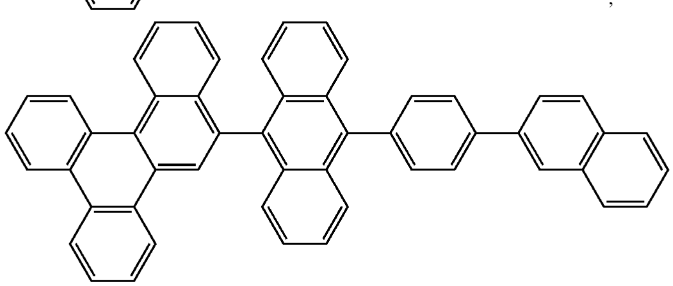
, -continued
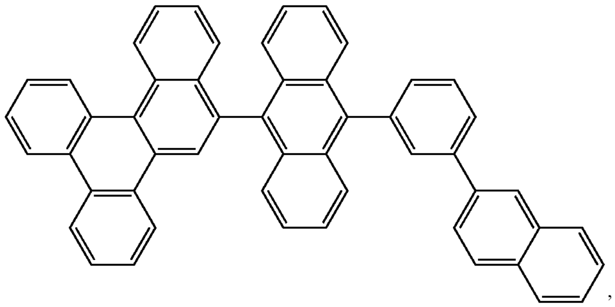
,
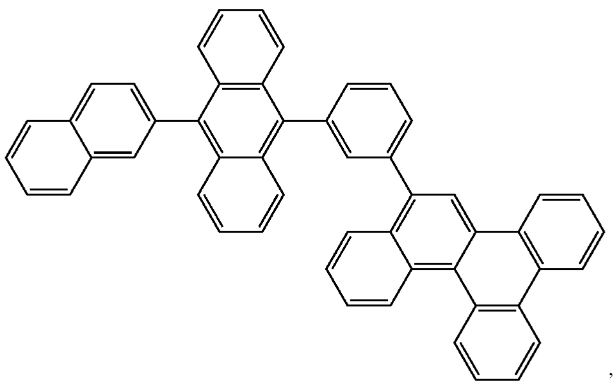
,
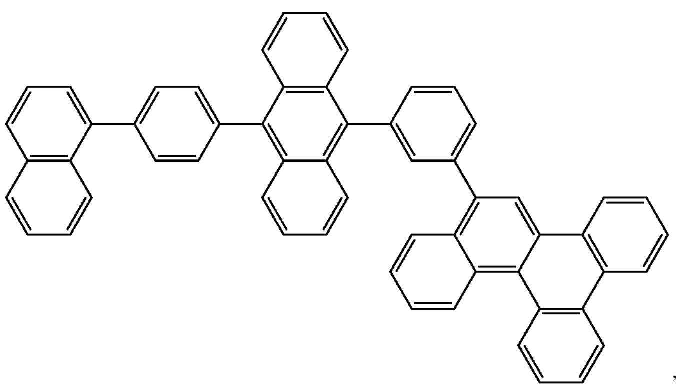
,
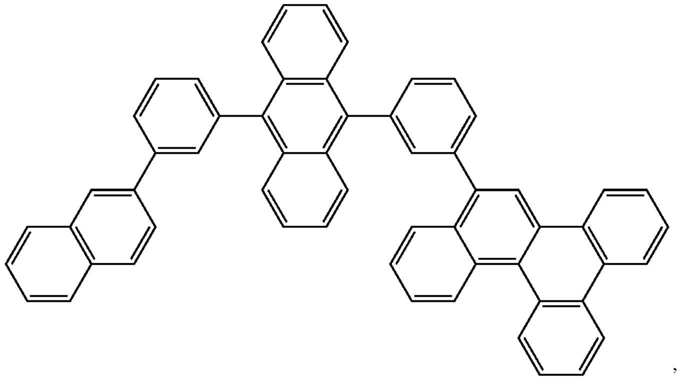
, -continued
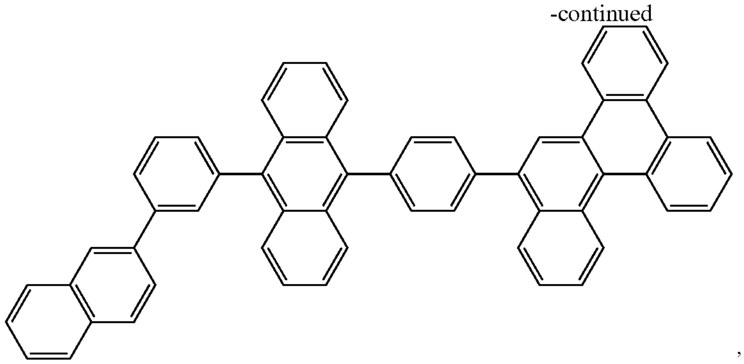
,
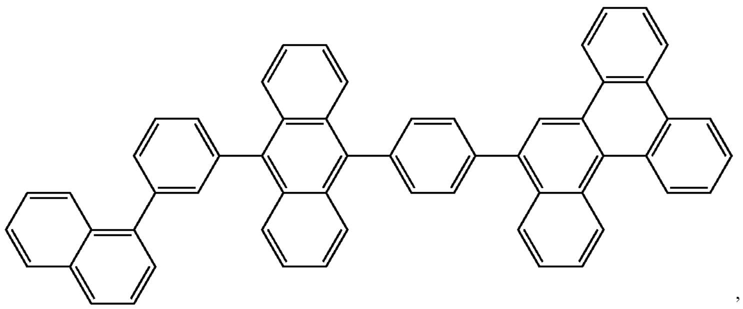
,
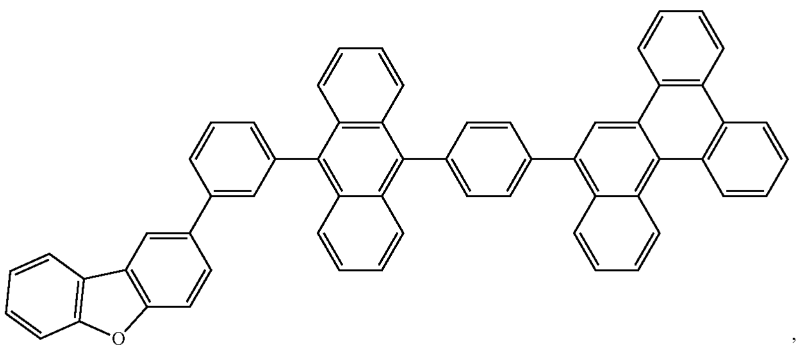
,
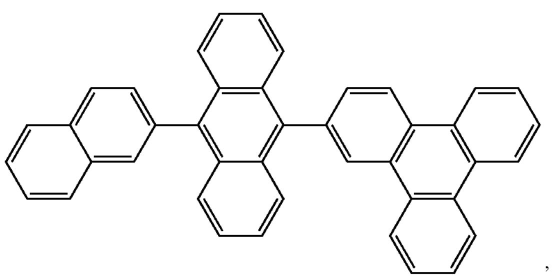
,
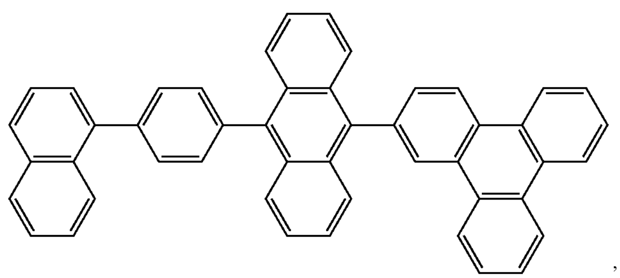
,
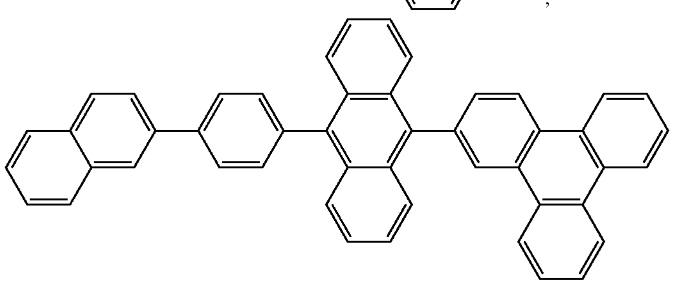
, -continued
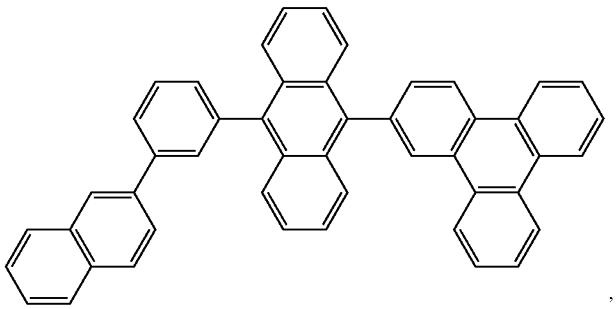
,
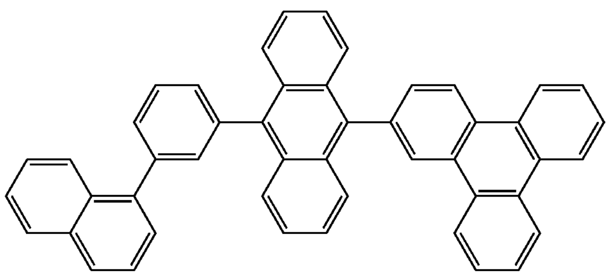
,
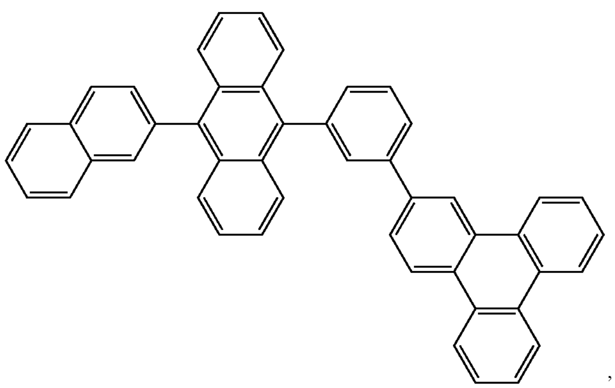
,
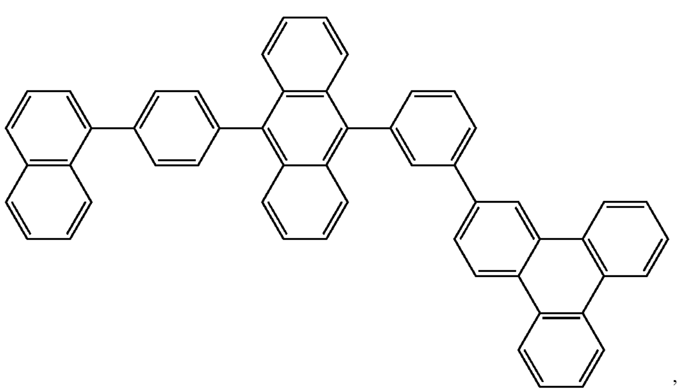
, -continued
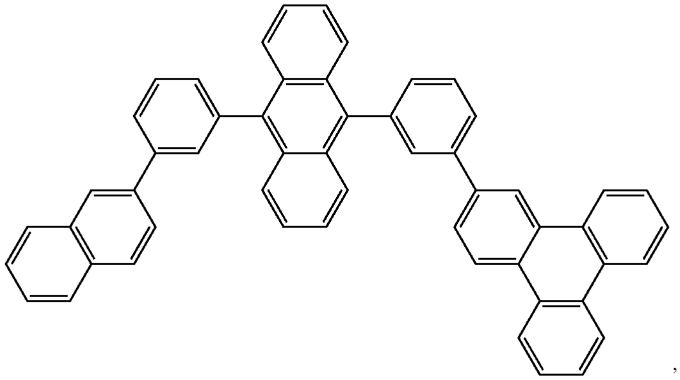
,
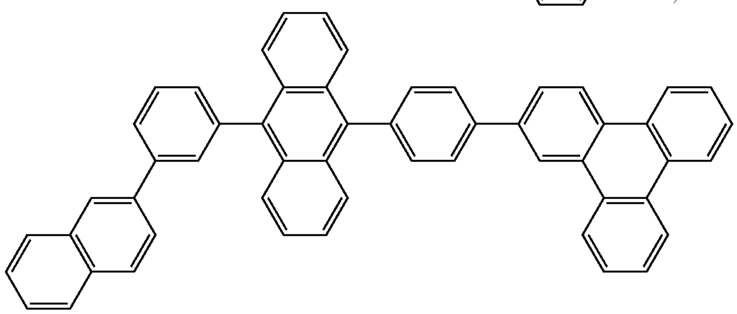
,
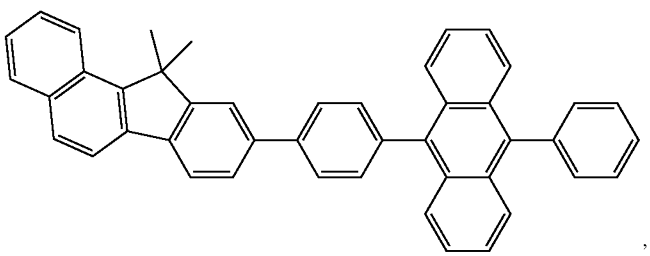
,
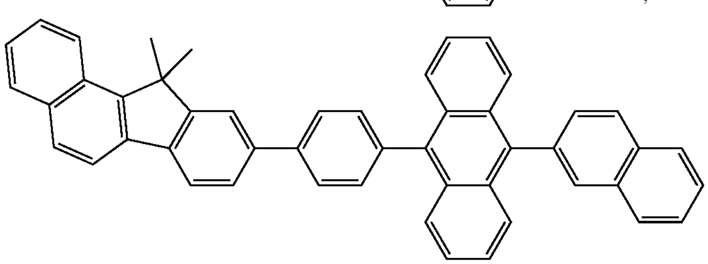
,
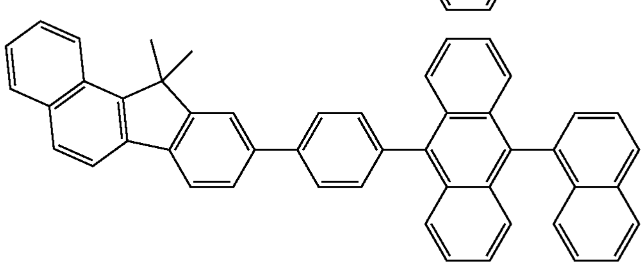
,
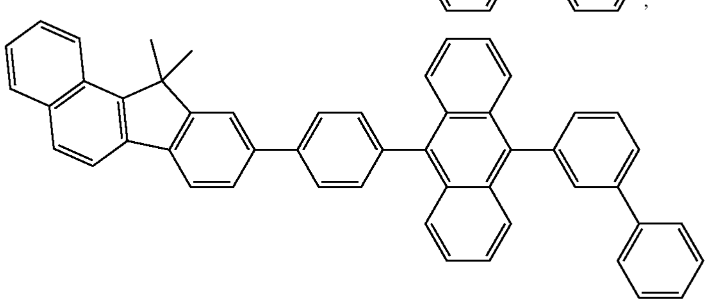
, -continued
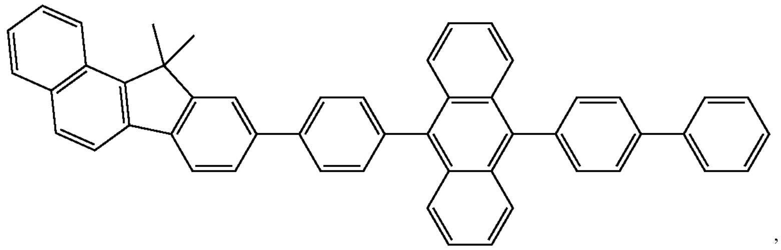
,
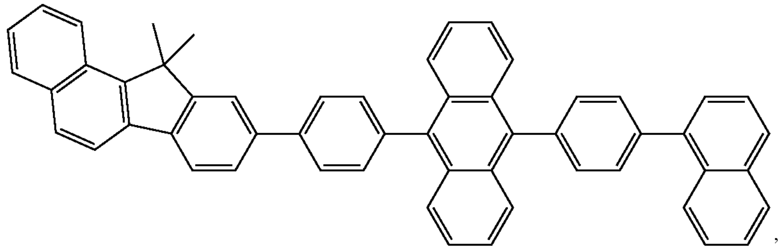
,
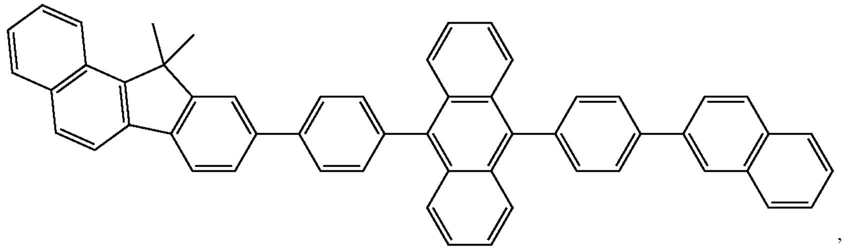
,
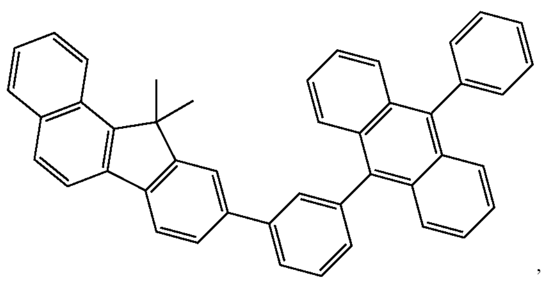
,
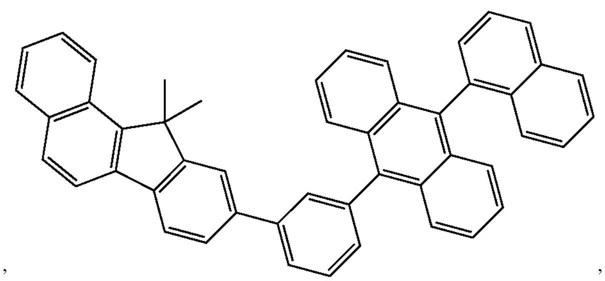
,
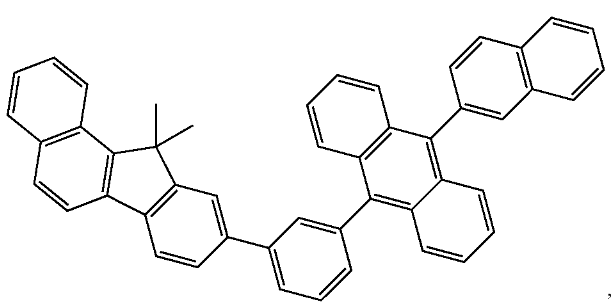
,
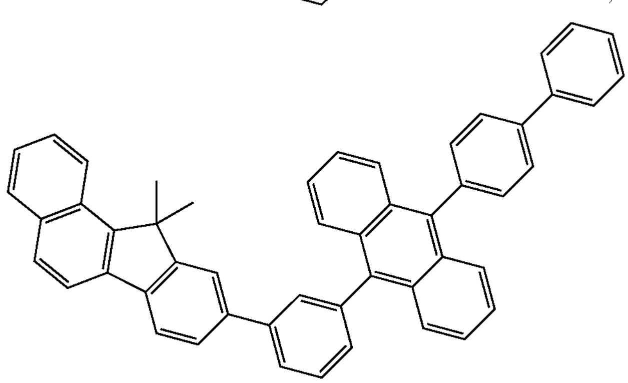
, -continued
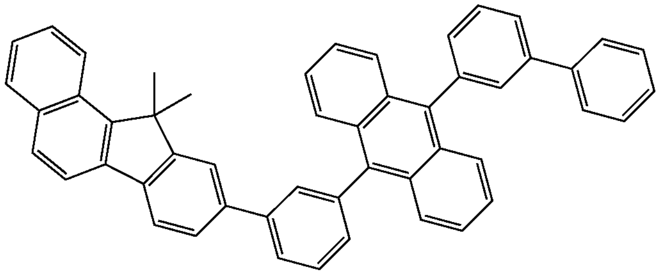
,
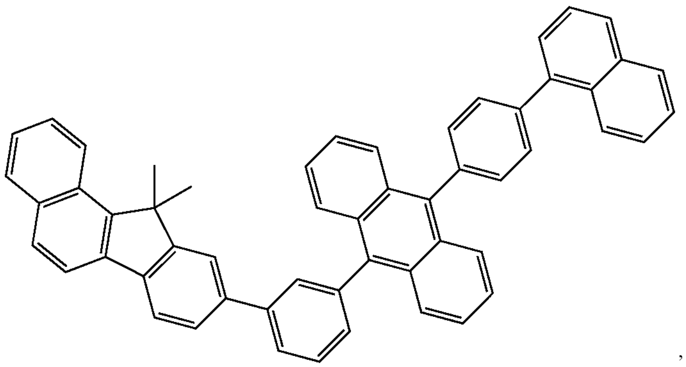
,
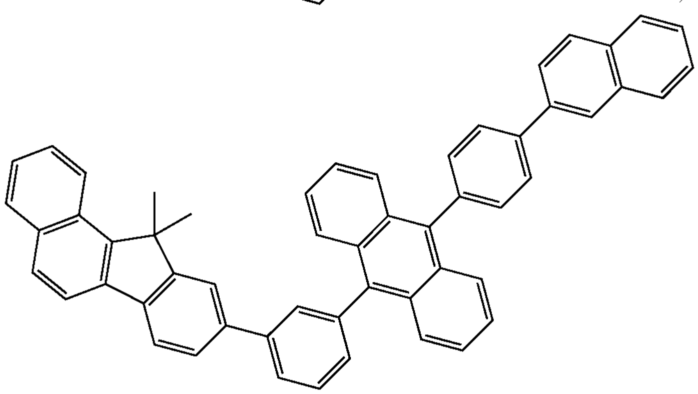
,
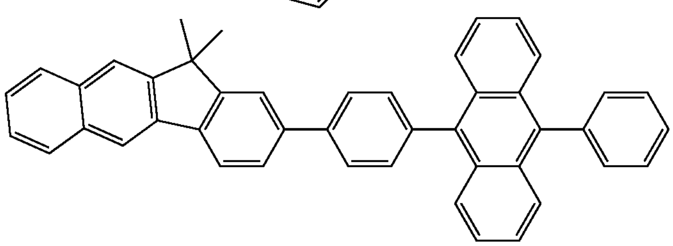
,
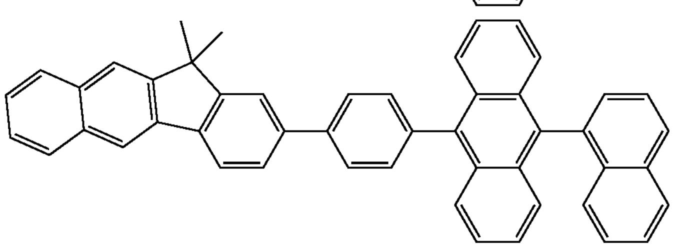
,
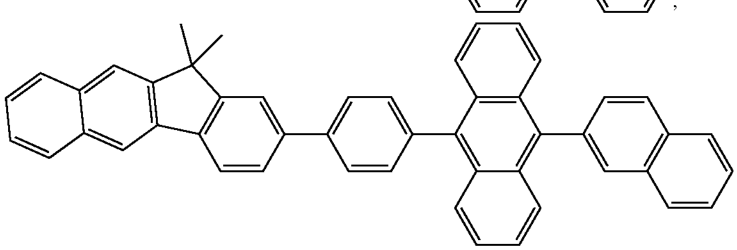
, -continued
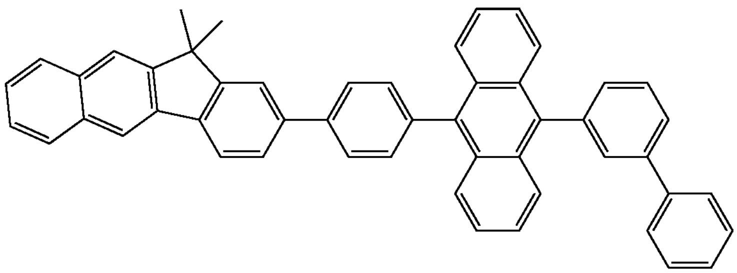
,
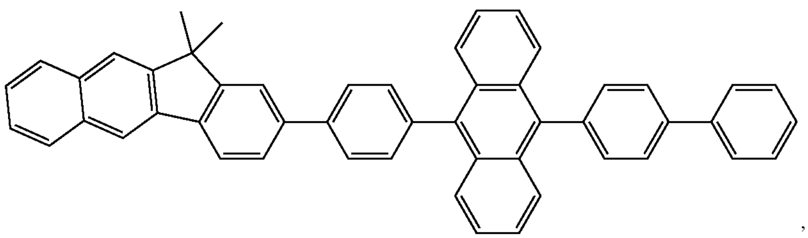
,
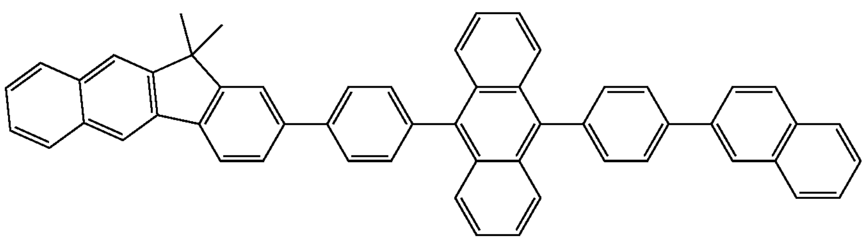
,
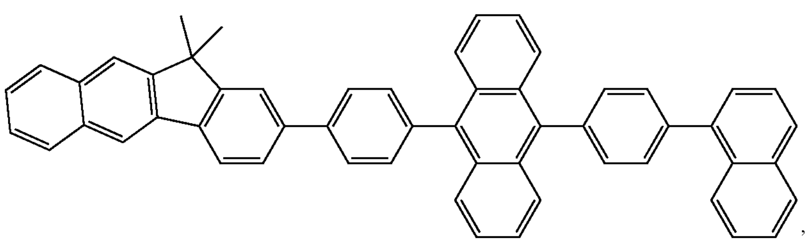
,
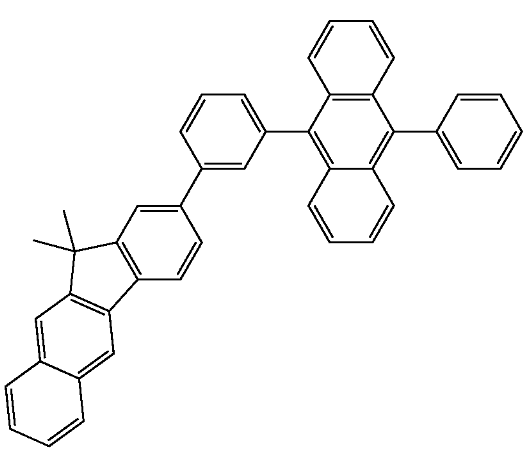
,
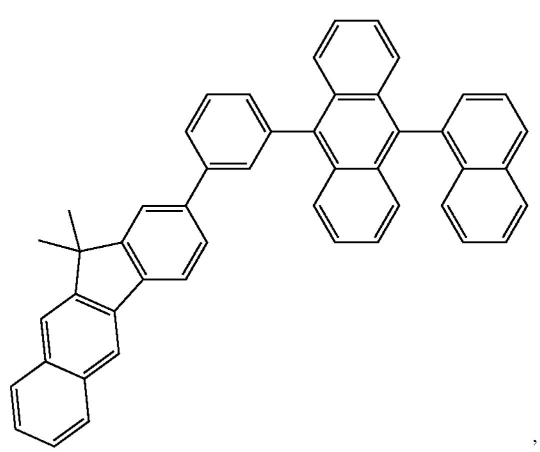
, -continued
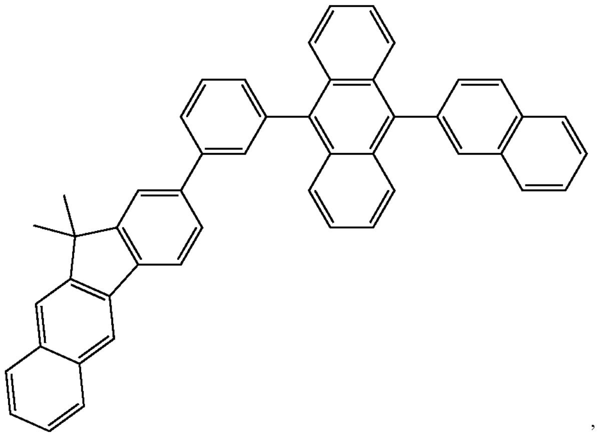
,
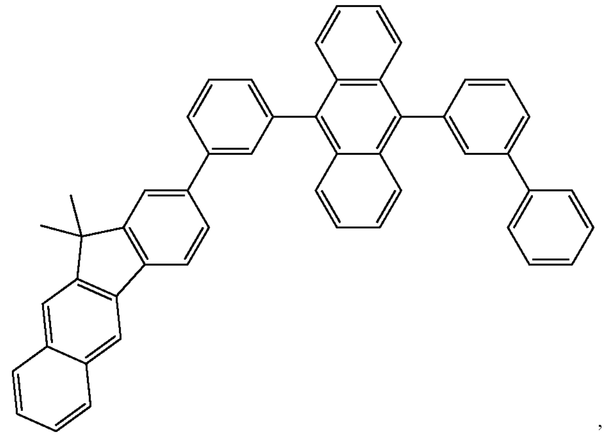
,
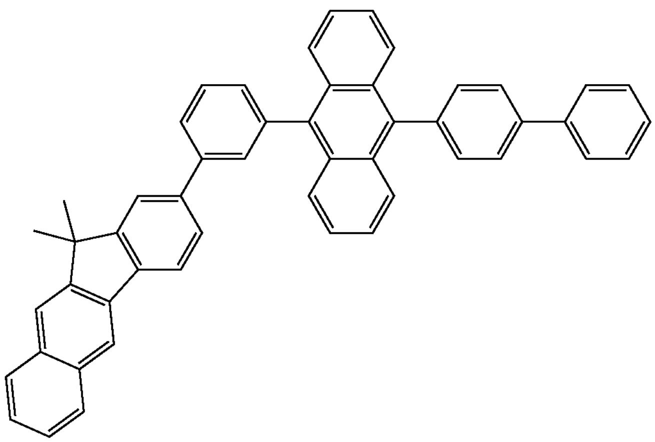
,
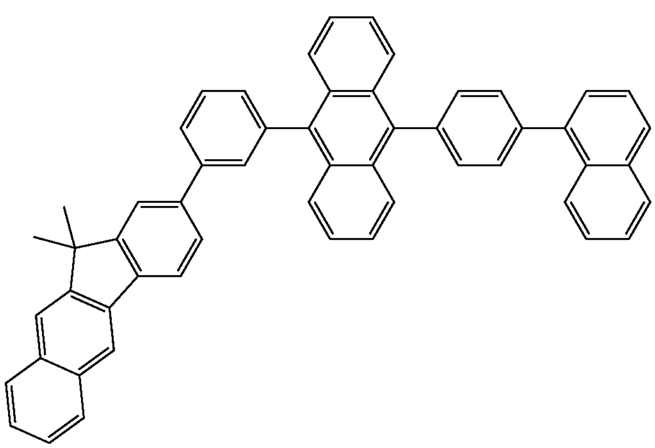
, -continued
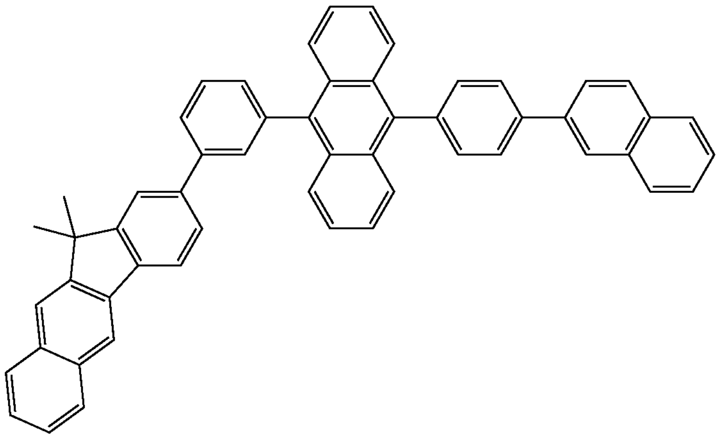
,
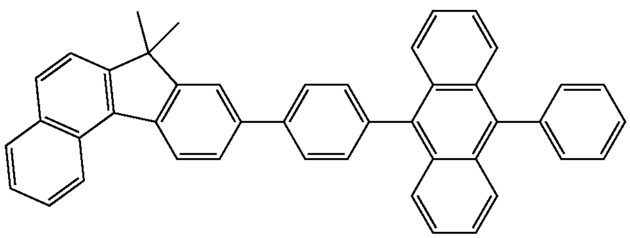
,
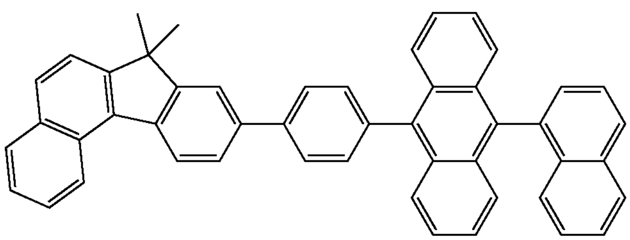
,
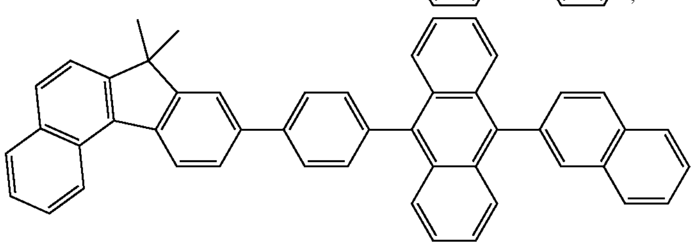
,
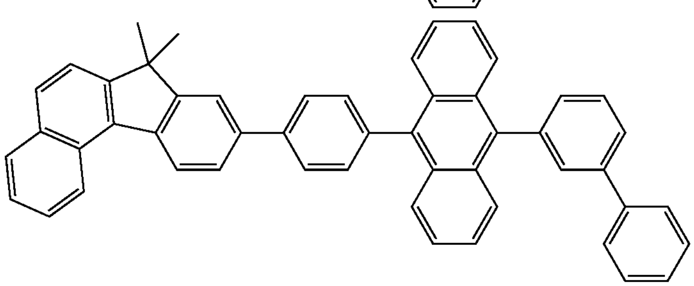
,
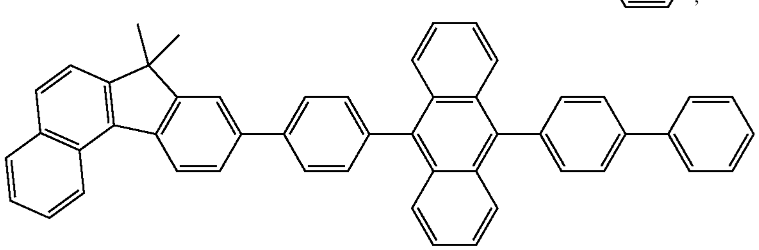
, -continued
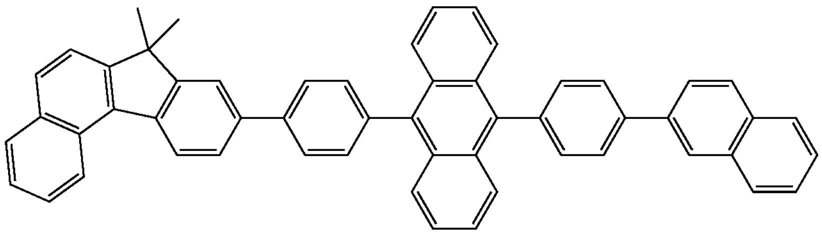
,
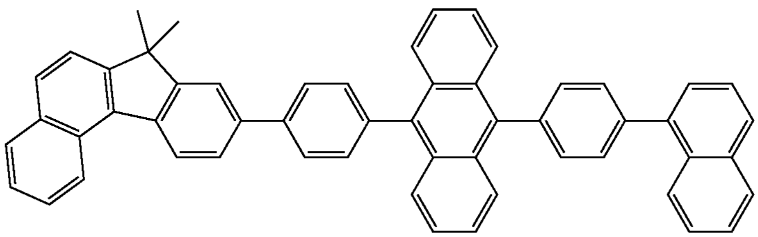
,
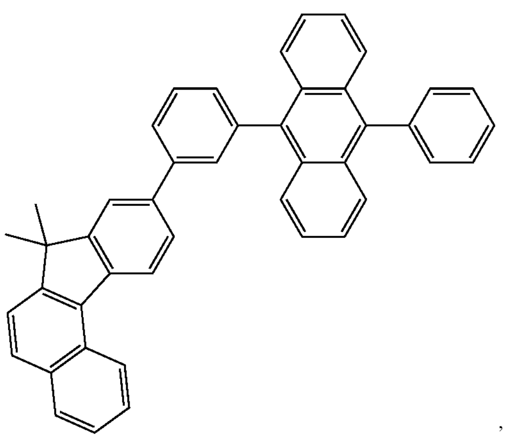
,
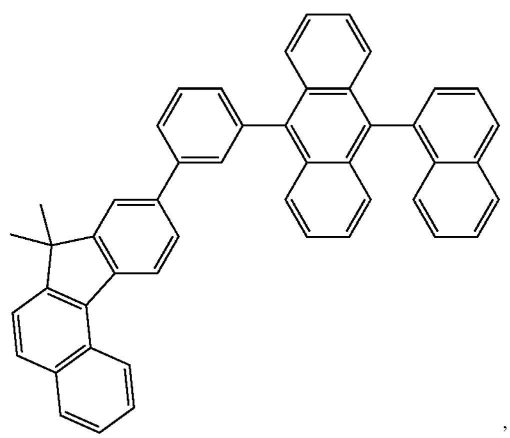
,
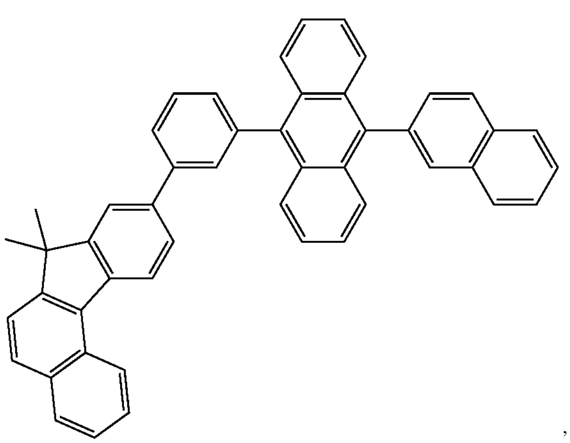
,
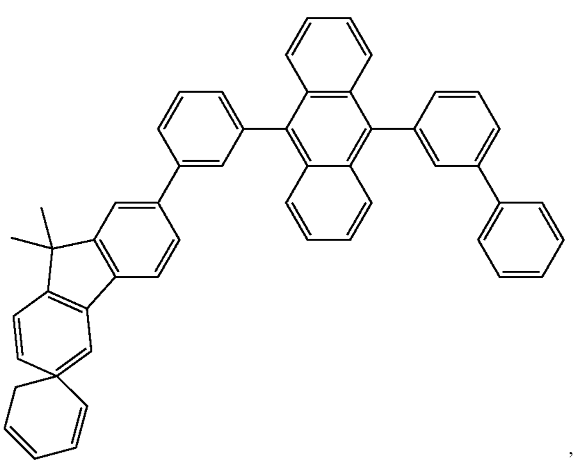
, -continued
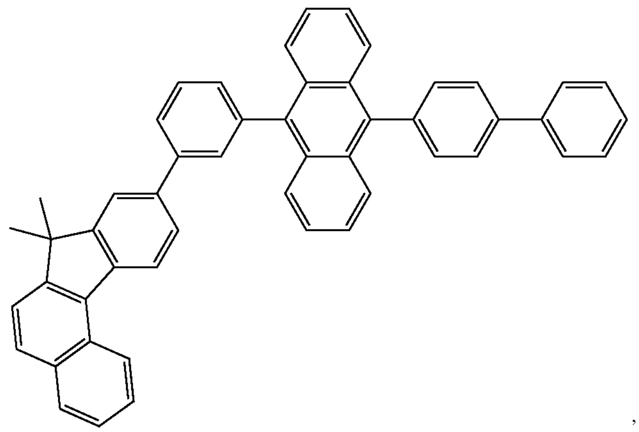
,
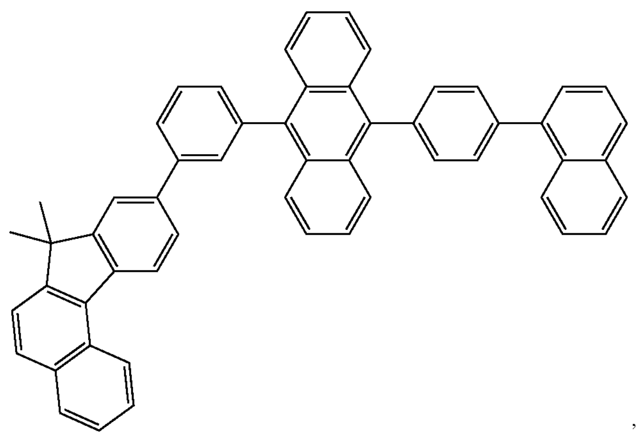
,
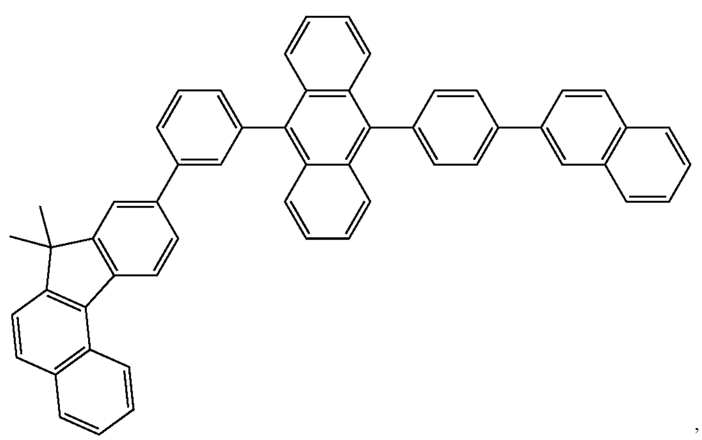
,
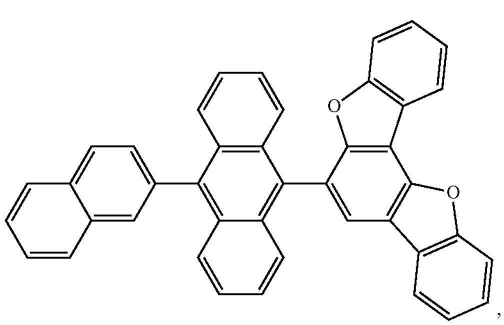
,
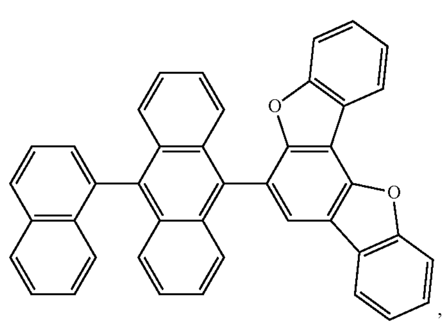
, -continued
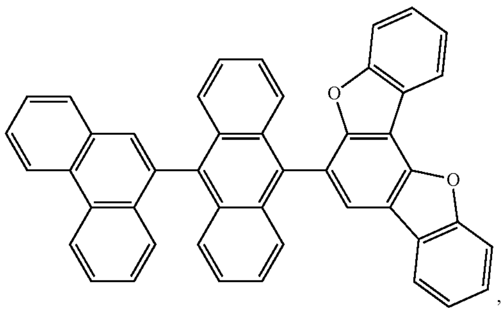
,
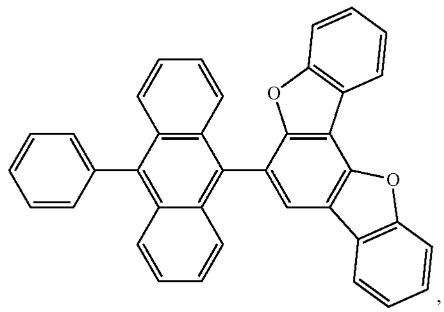
,
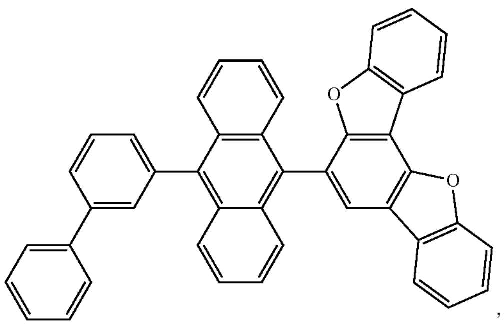
,
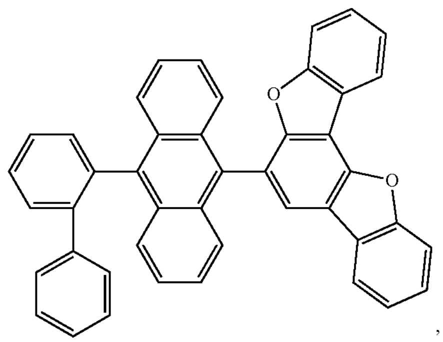
,
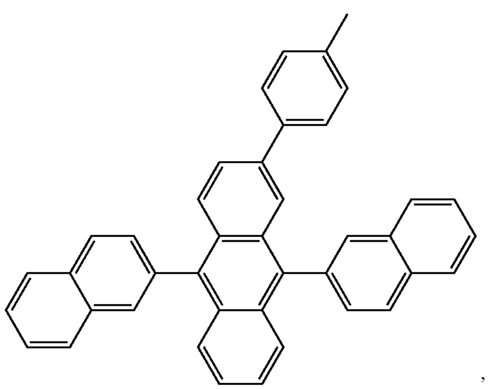
,
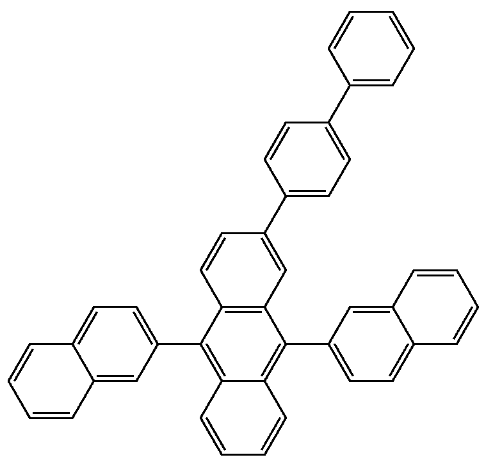
,
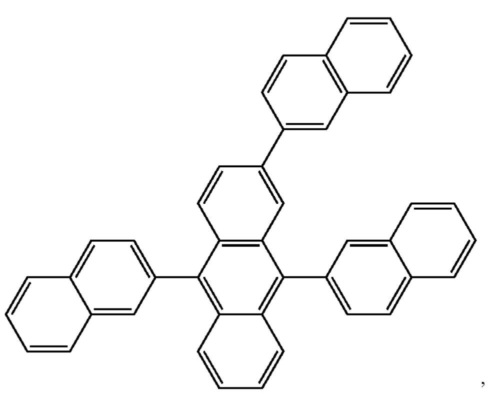
,
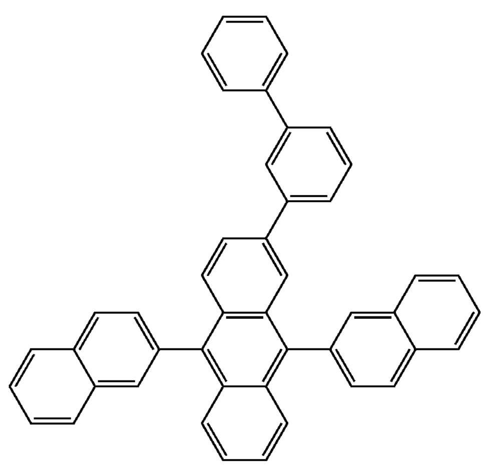
, -continued
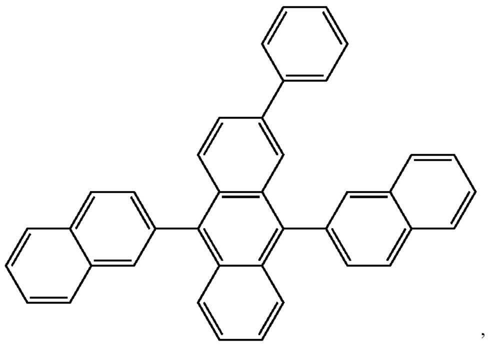
,
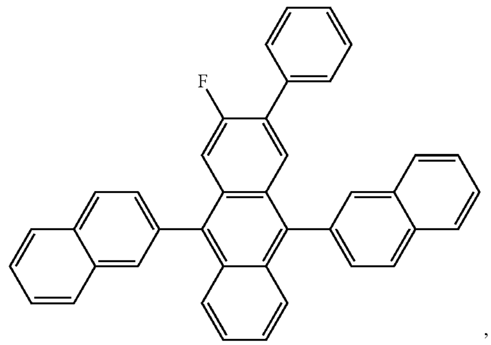
,
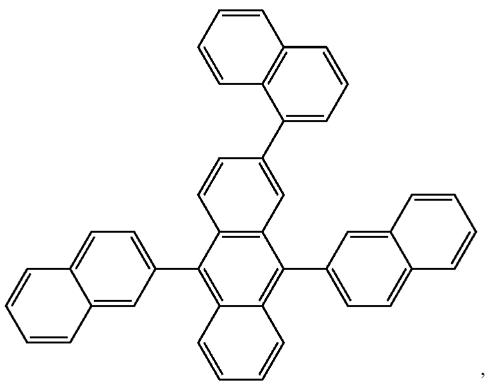
,
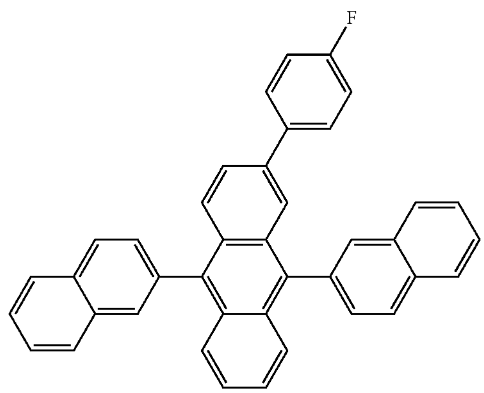
,
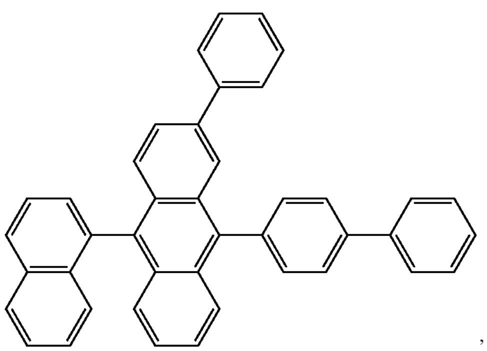
,
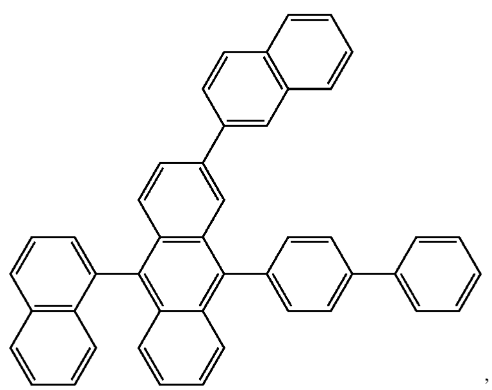
,
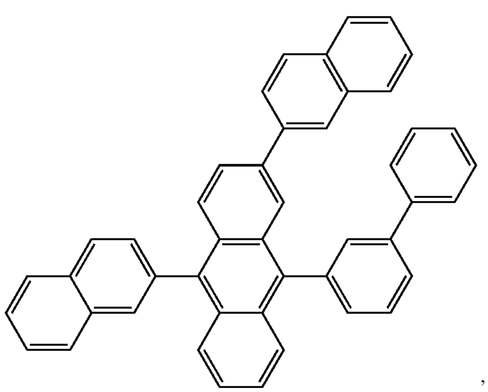
,
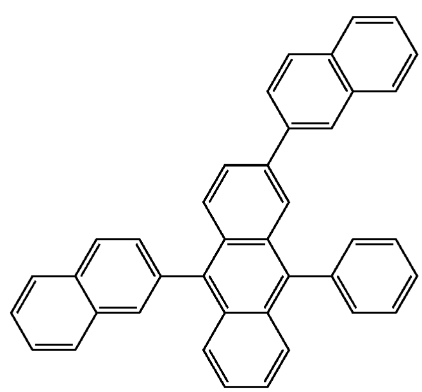
, -continued
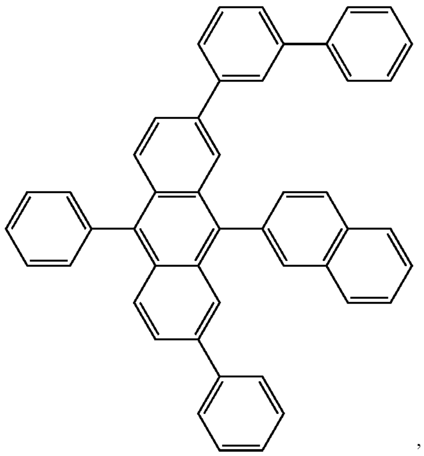
,
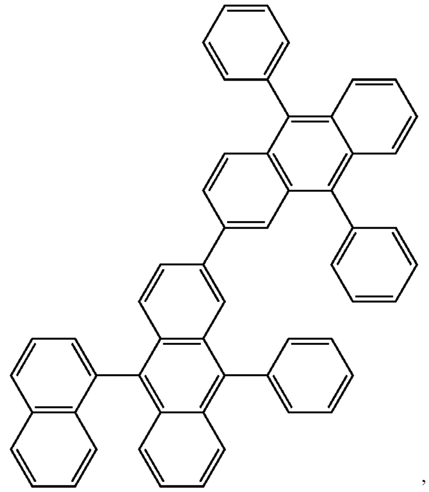
,
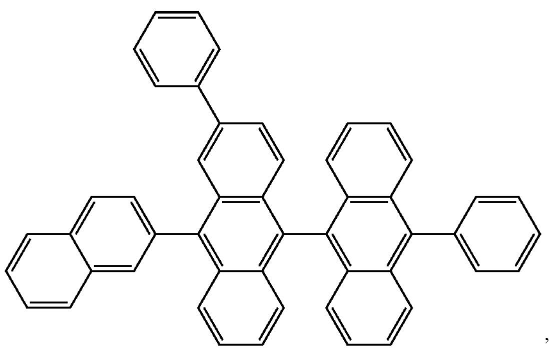
,
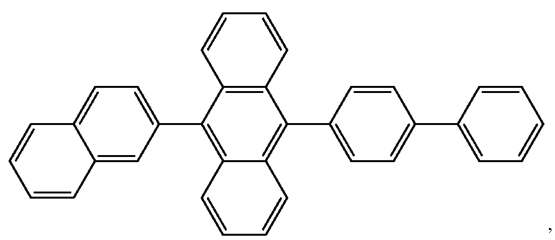
,
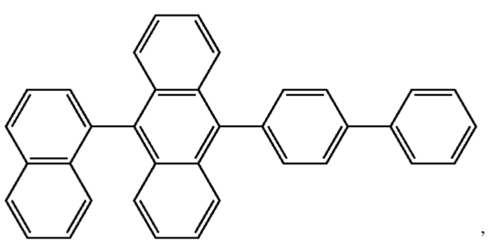
,
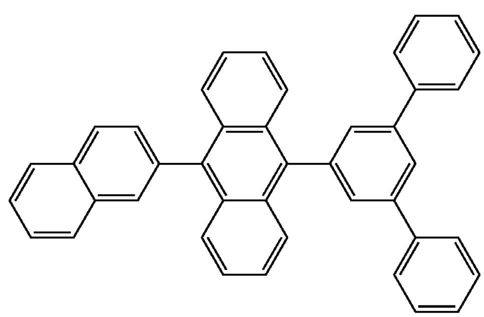
,
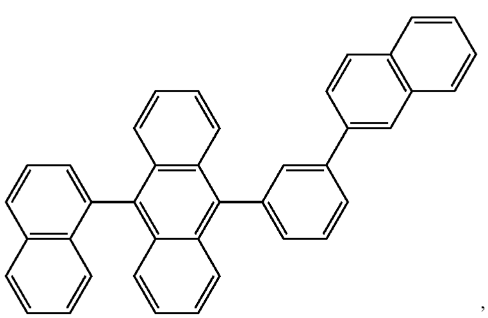
,
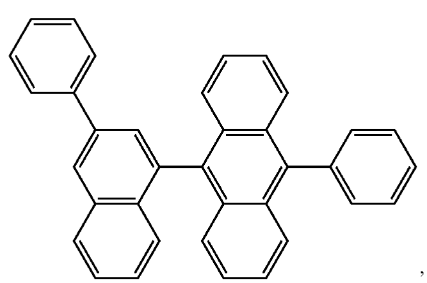
, -continued

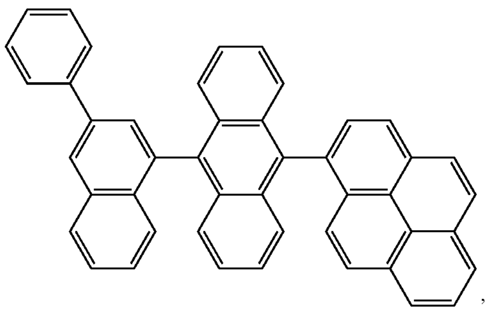

,

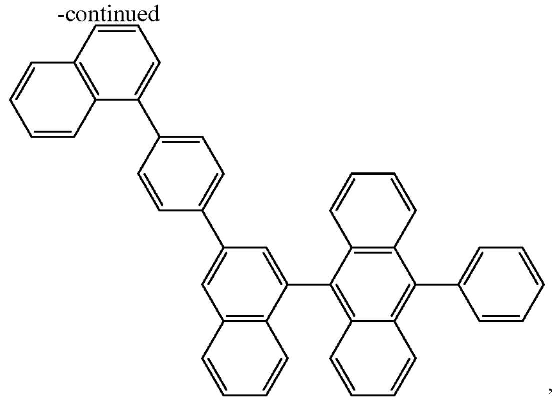

, and

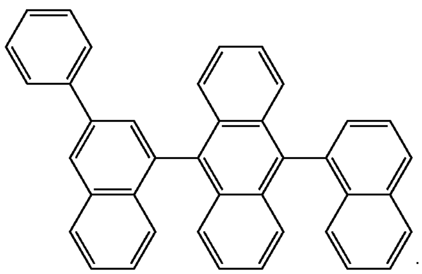 [SMILES: c1ccc(-c2cc(-c3c4ccccc4c(-c4cccc5ccccc45)c4ccccc34)c3ccccc3c2)cc1]

.

In another aspect, the present invention includes an emitter. As used herein, the term "emitter" refers to a compound that can emit light in the visible region. Any compound that emits light in the visible region is contemplated by the present invention. In one embodiment, the emitter comprises a group selected from the group consisting of: fluoranthene, pyrene, triarylamine, and combinations thereof In one embodiment, the emitter is selected from the group consisting of:

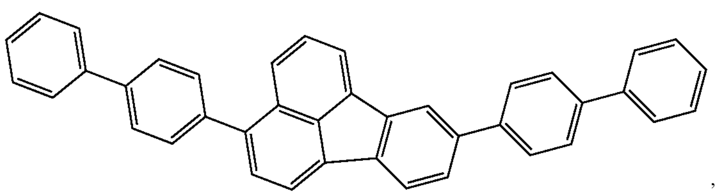

,

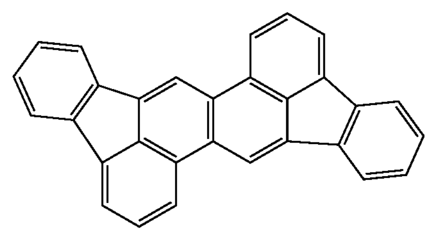

,

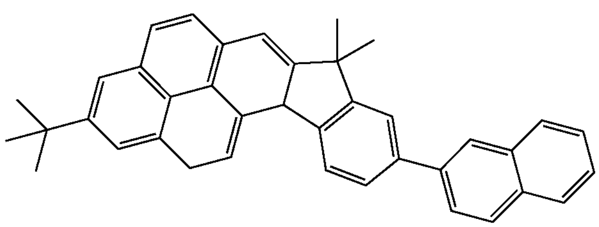

,

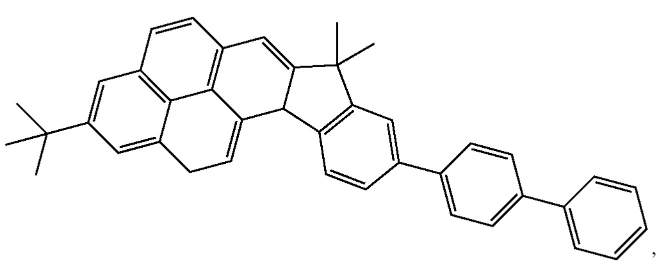

,

-continued
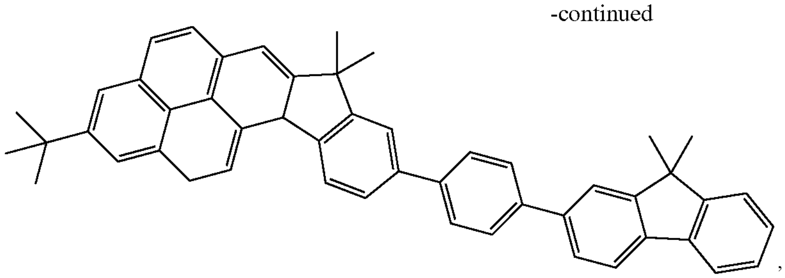
,
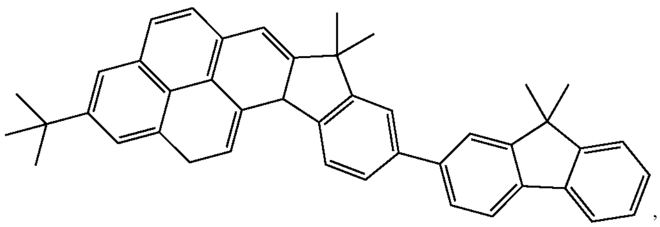
,
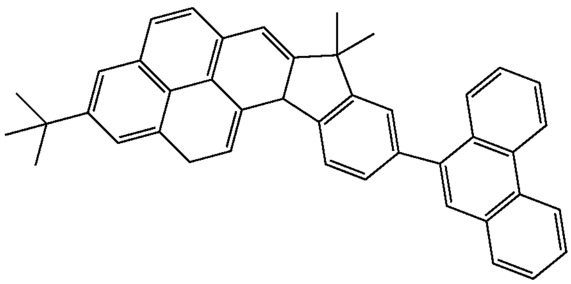
,
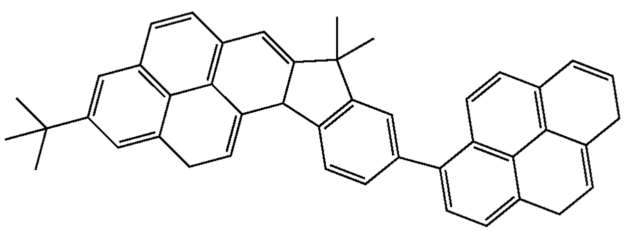
,
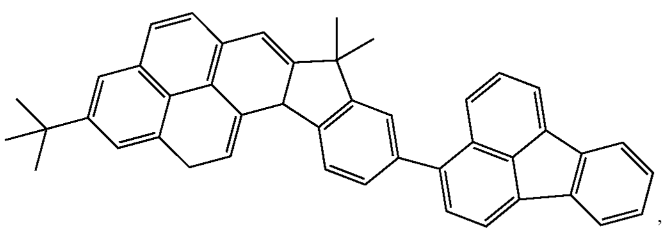
,
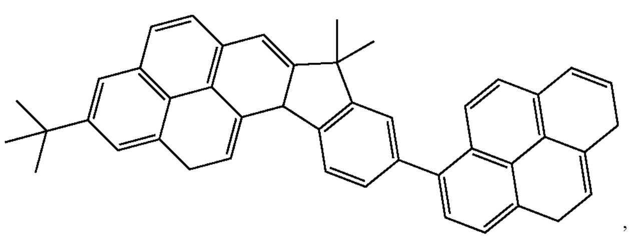
,
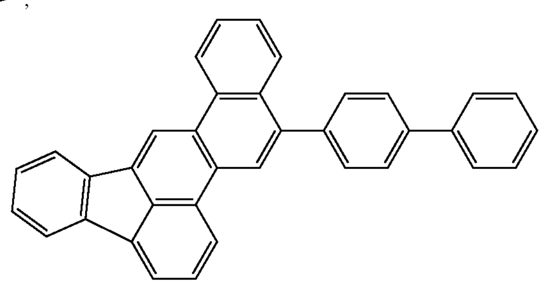
, -continued
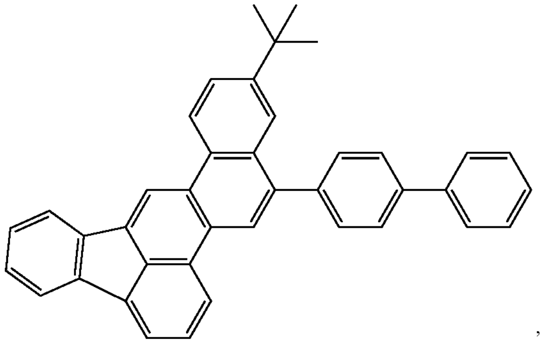
,
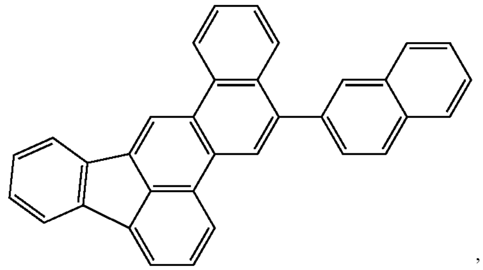
,
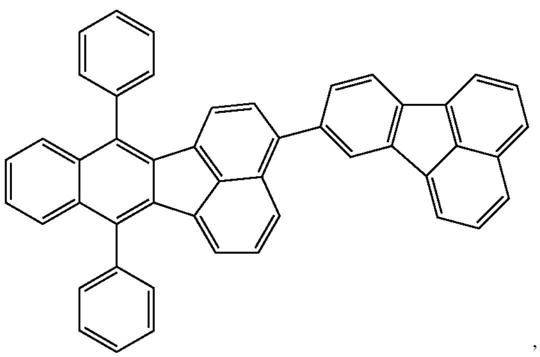
,
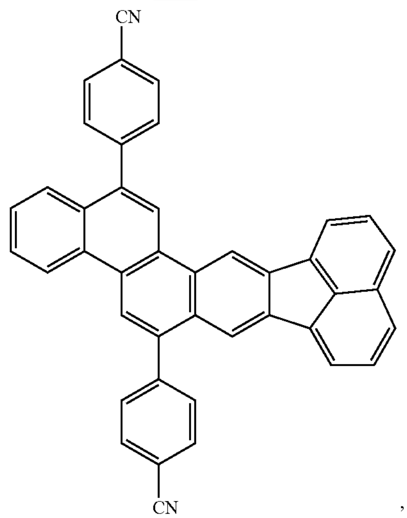
,
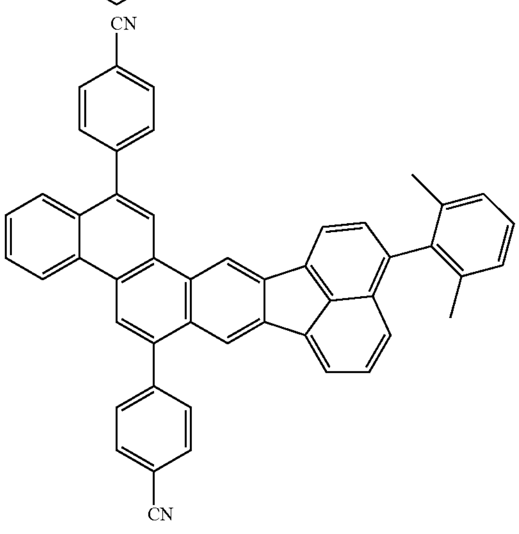
,
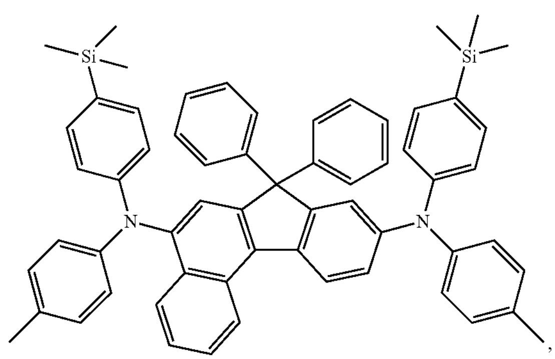
,
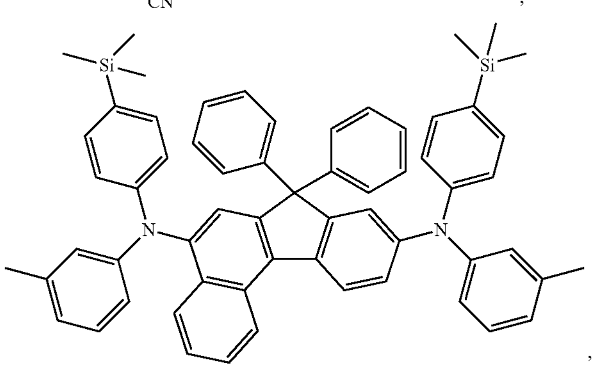
, -continued
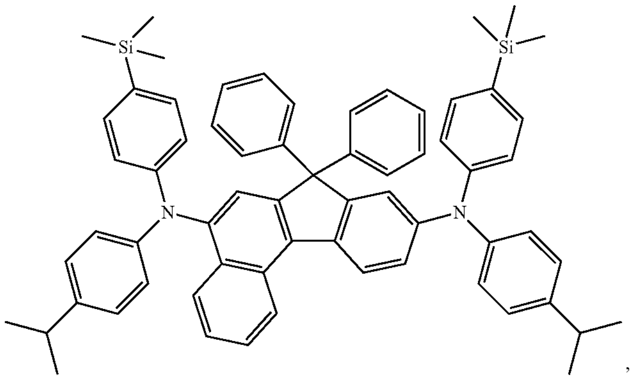
,
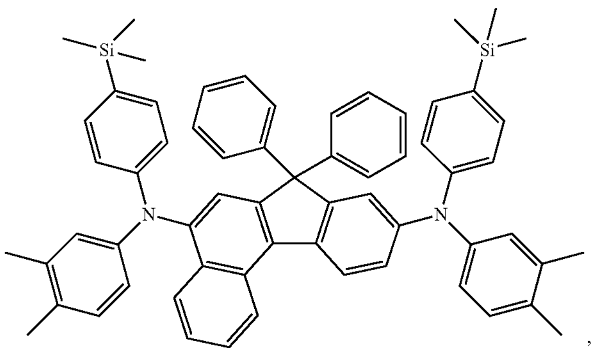
,
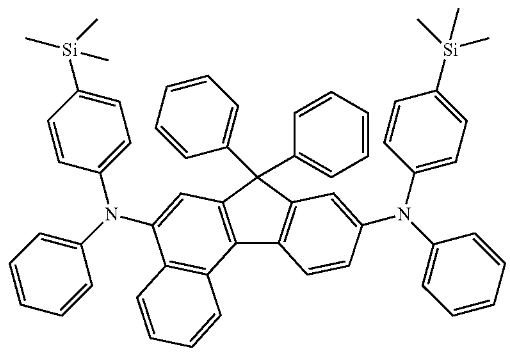
,
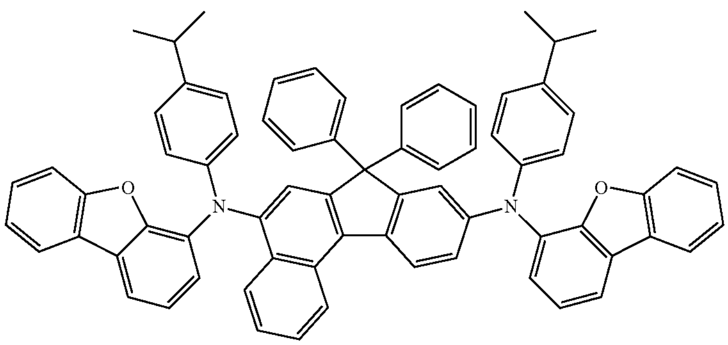
,
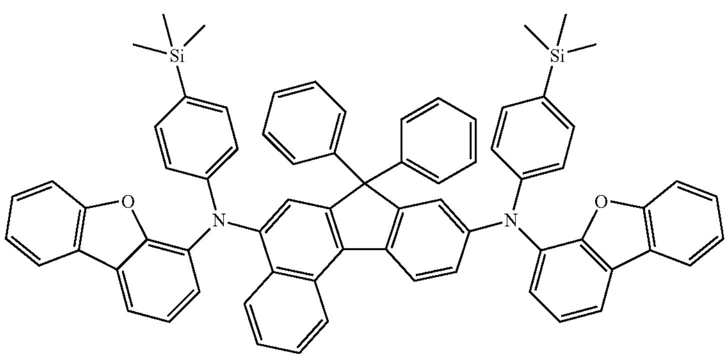
,
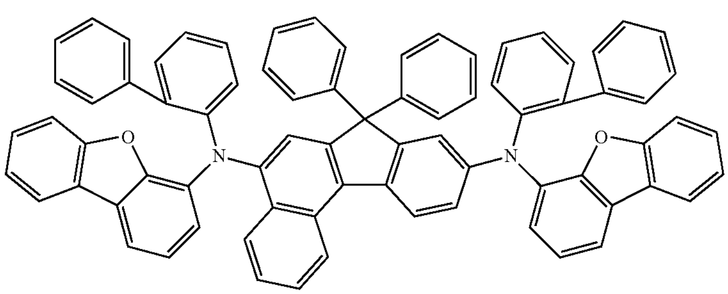
, -continued
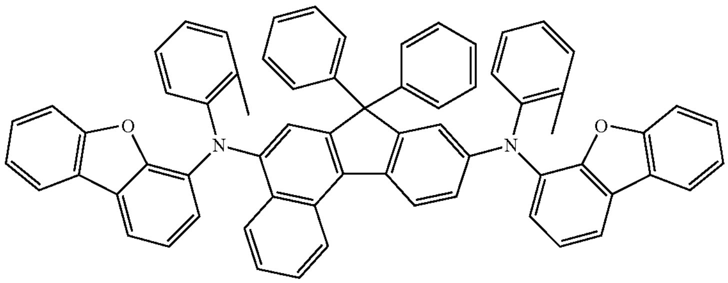
,
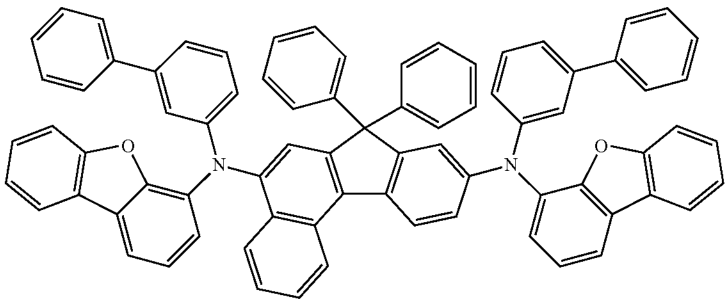
,
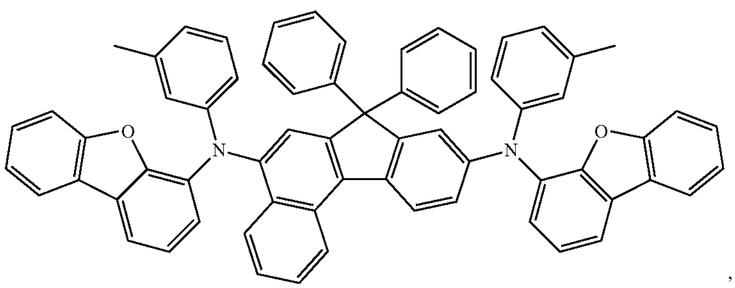
,
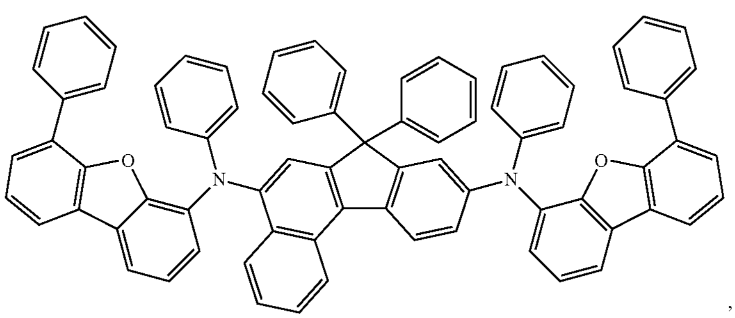
,
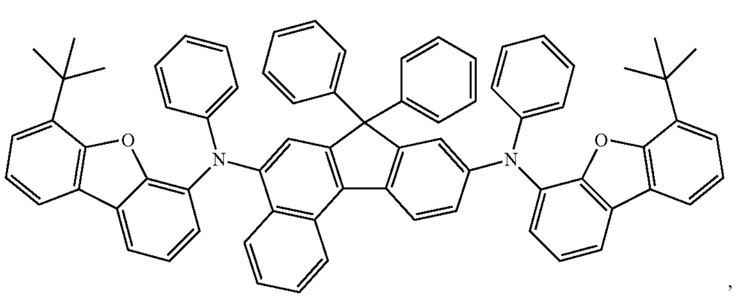
, -continued
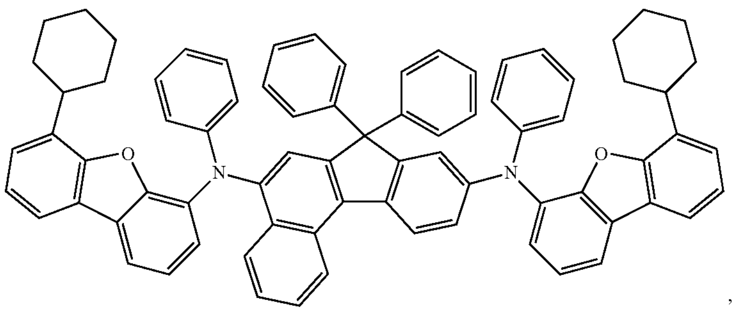
,
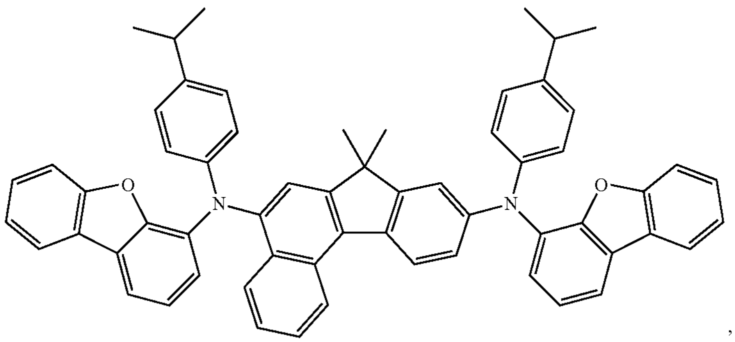
,
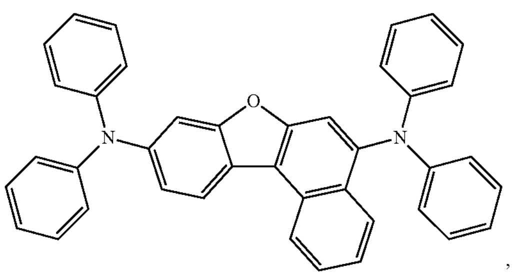
, 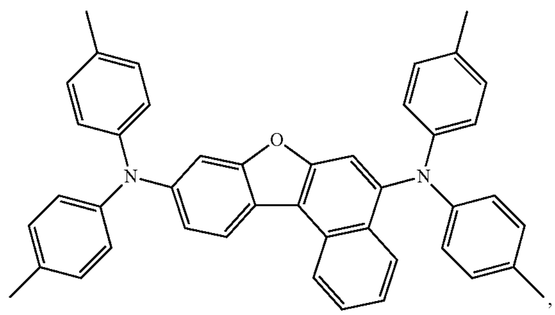
,
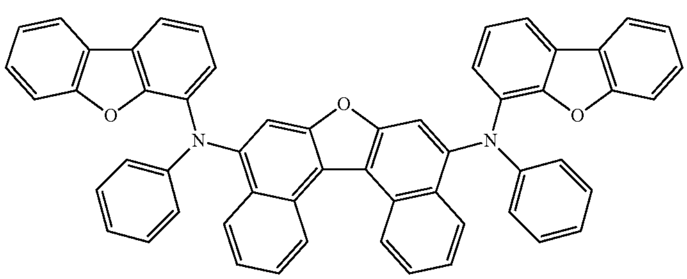
,
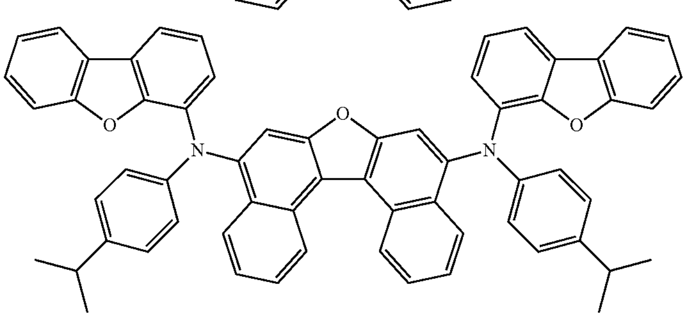
, -continued
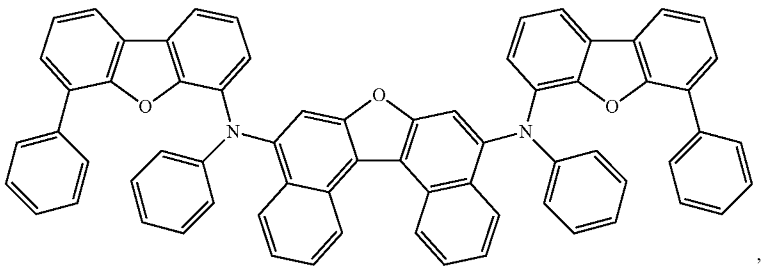
,
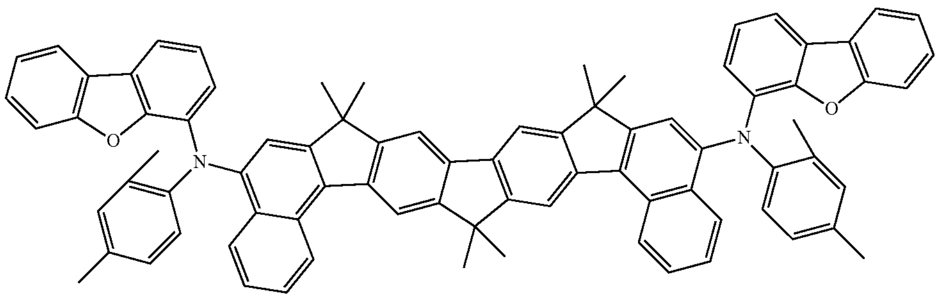
,
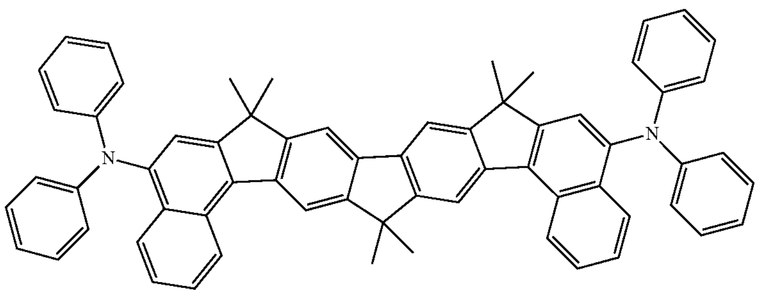
,
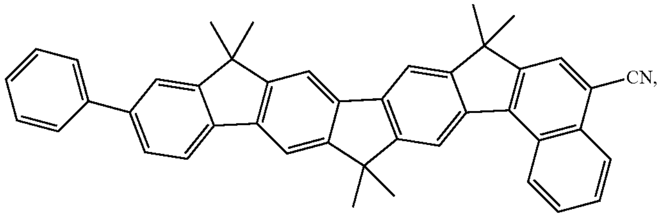
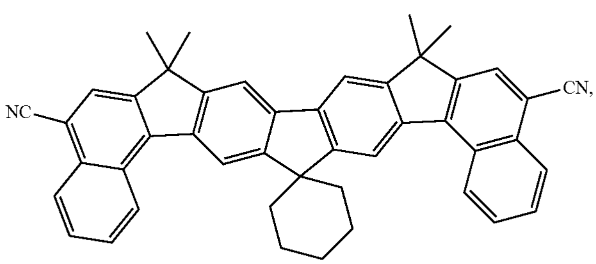
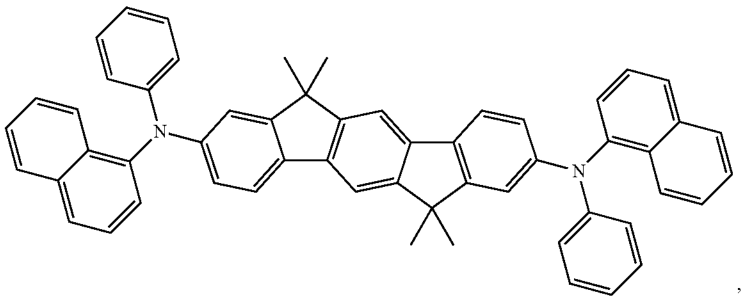
, -continued
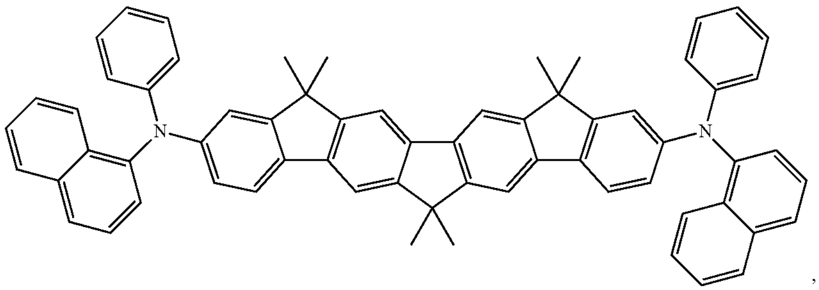
,
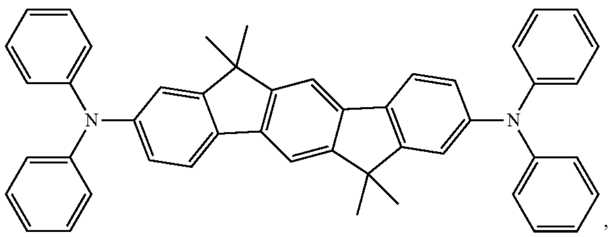
,
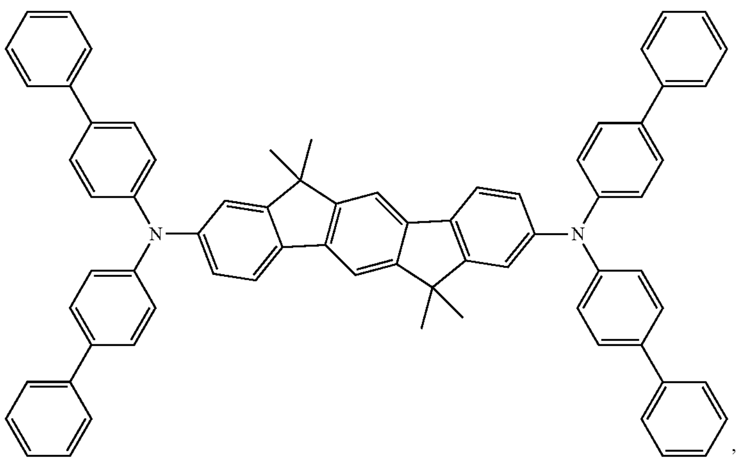
,
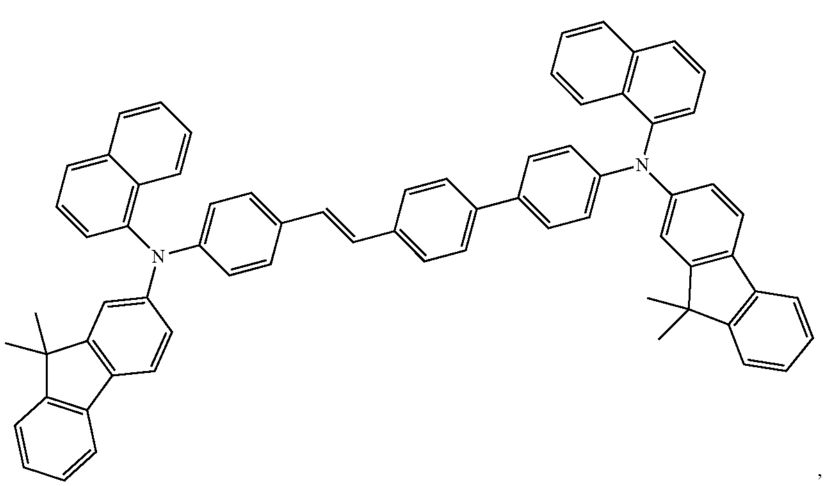
, -continued
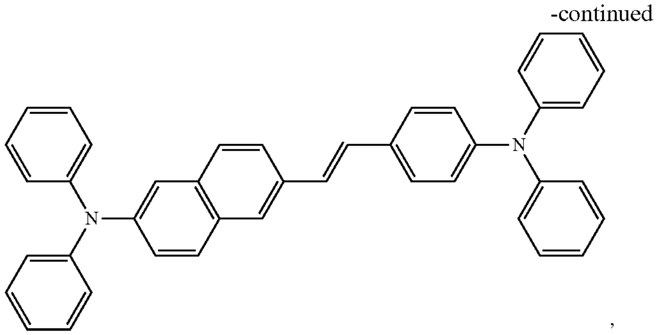
,
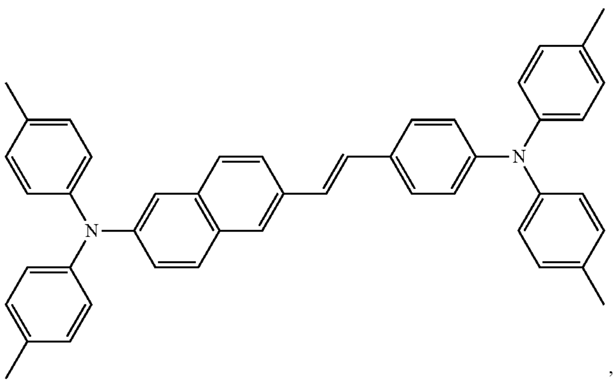
,
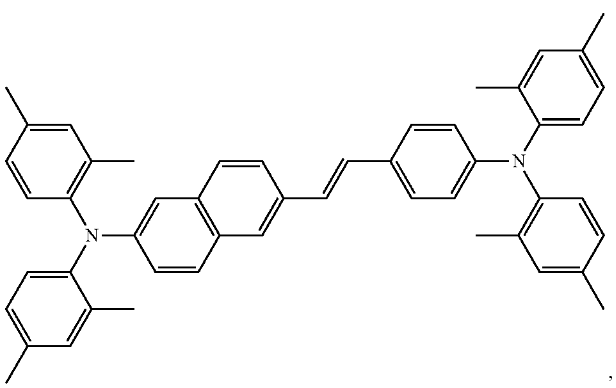
,
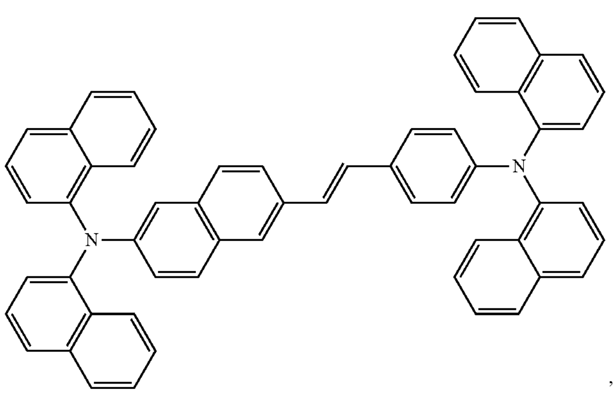
, -continued
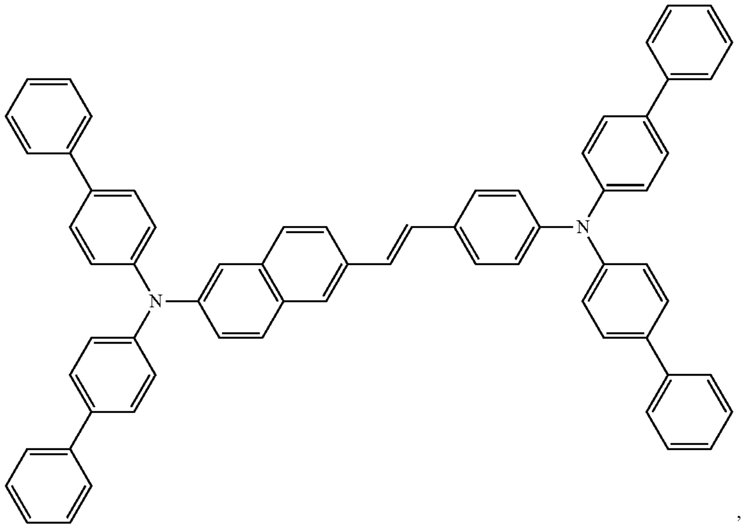
,
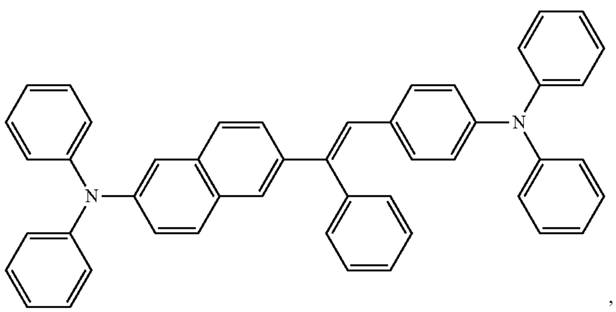
,
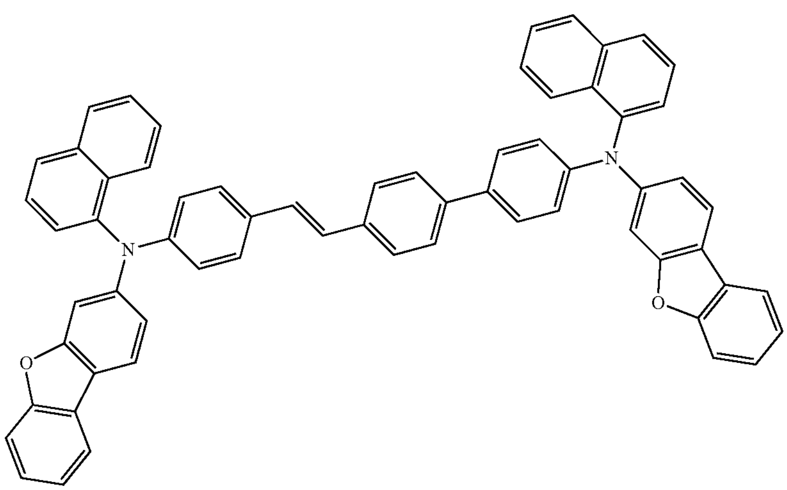
, -continued
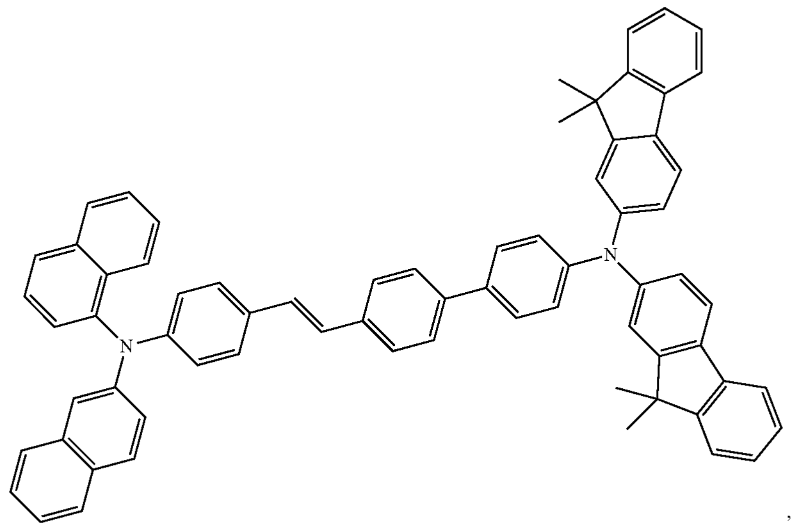
,
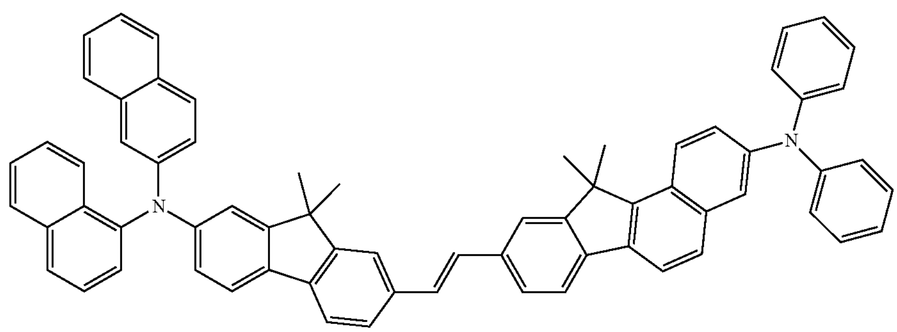
,
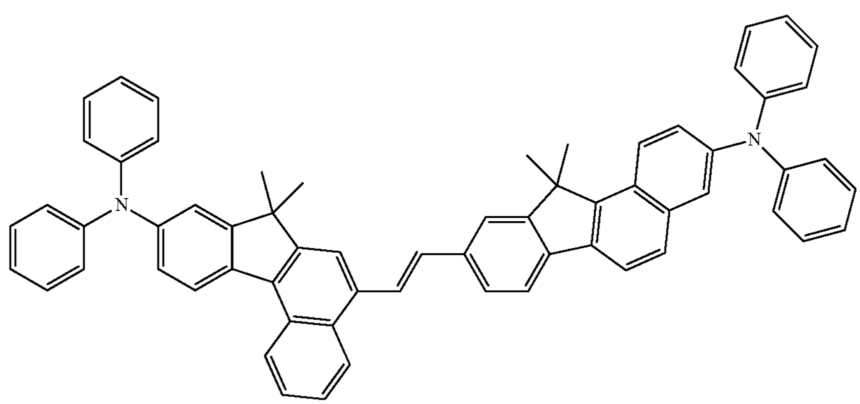
,
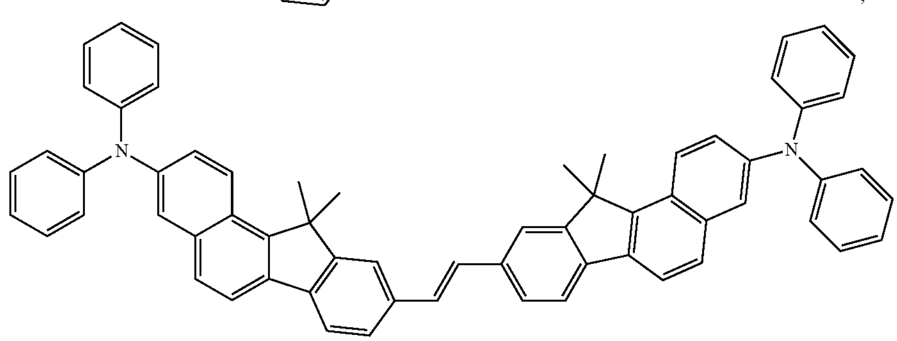
, -continued
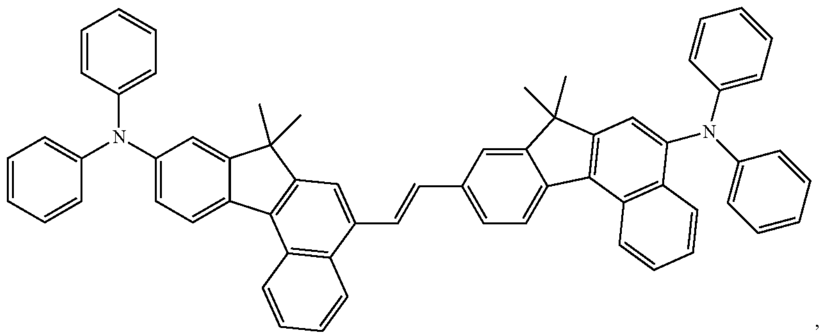
,
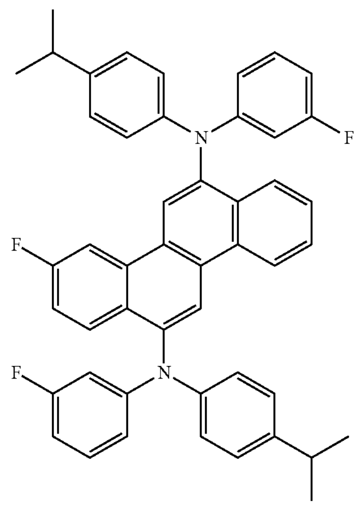
,
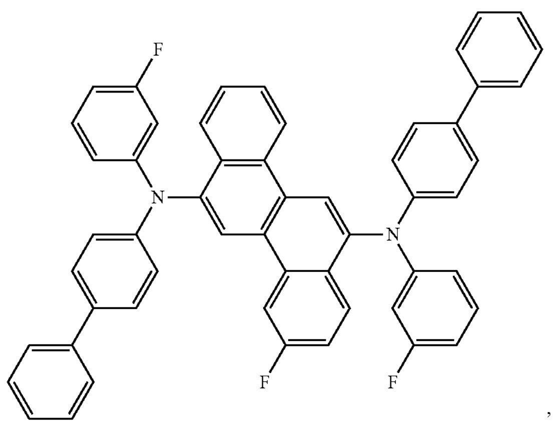
,
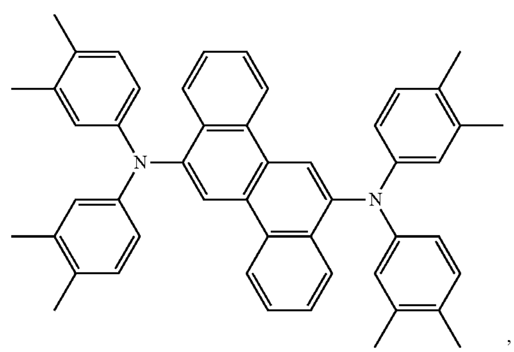
,
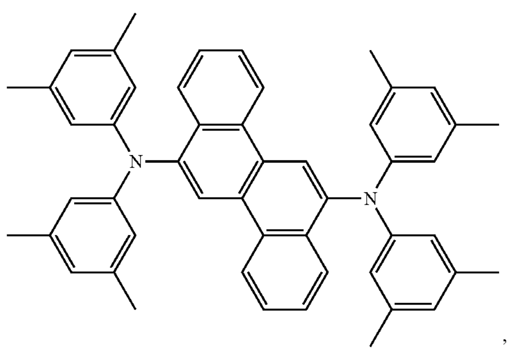
,
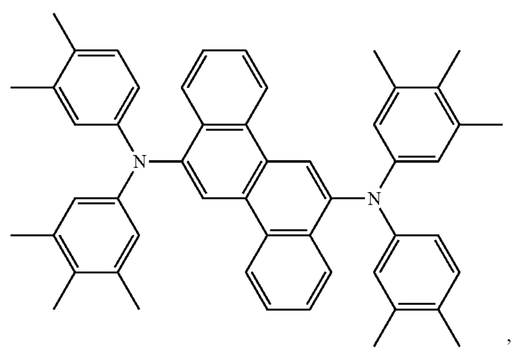
,
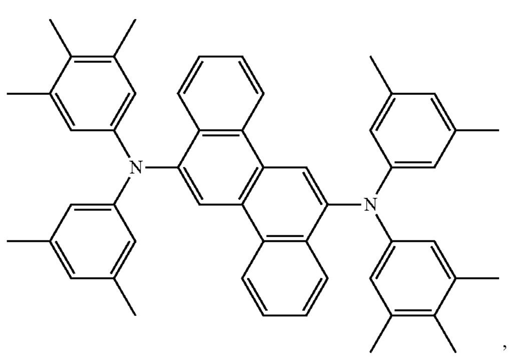
,
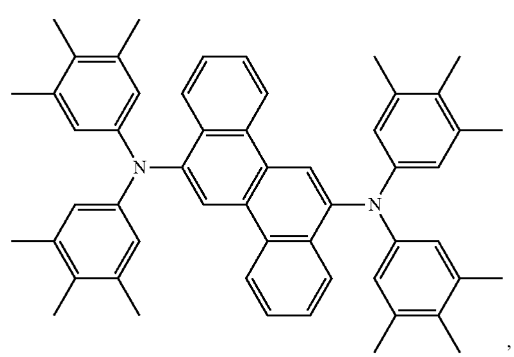
, -continued
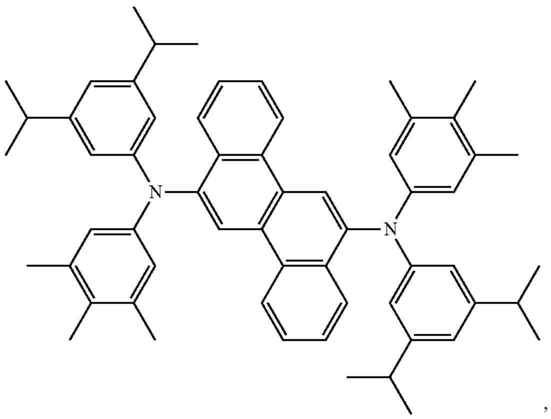
,
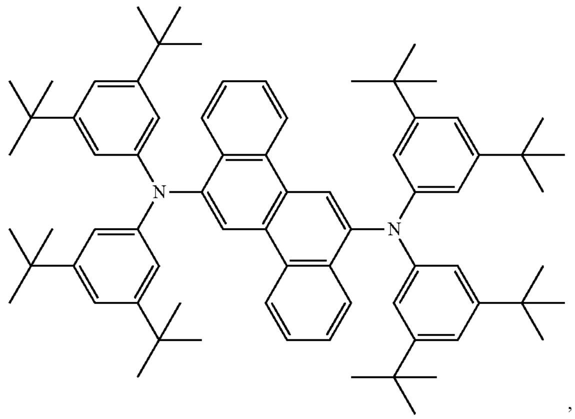
,
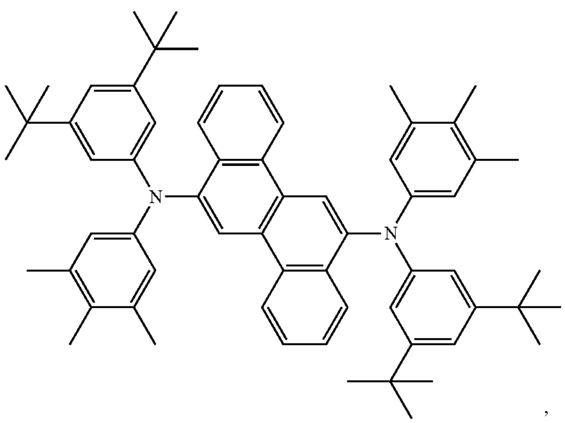
,
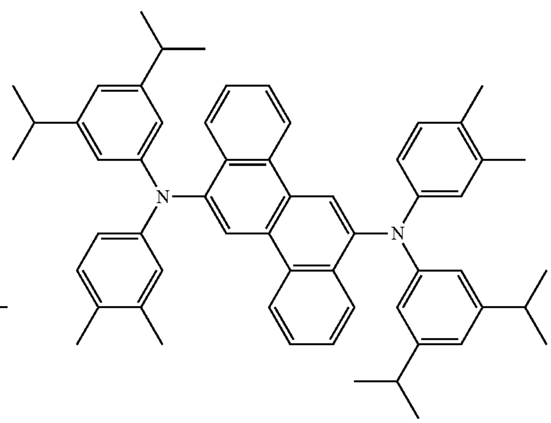
,
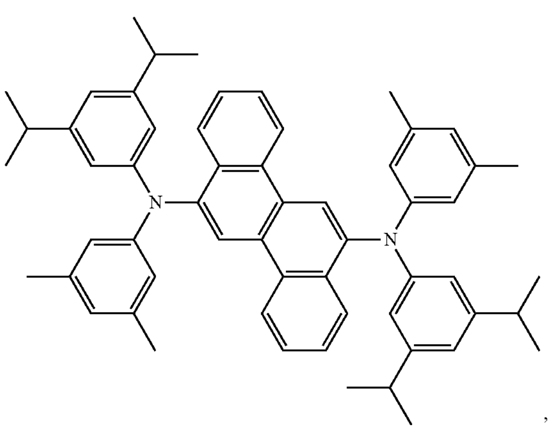
,
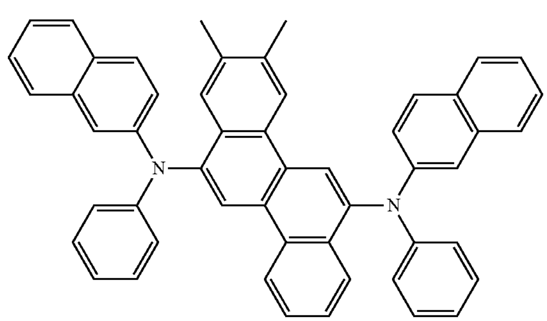
, -continued
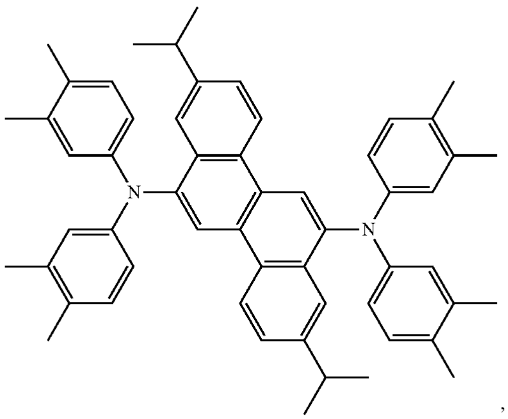
,
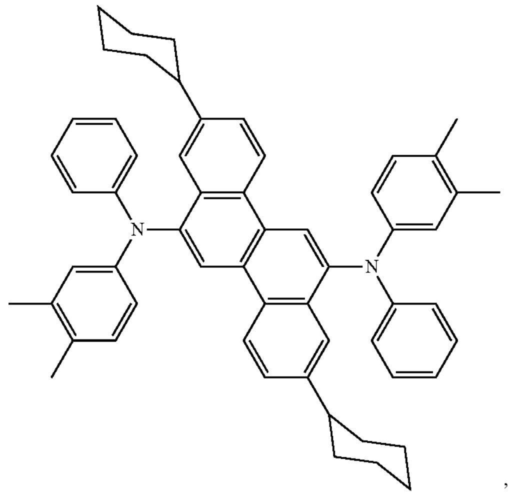
,
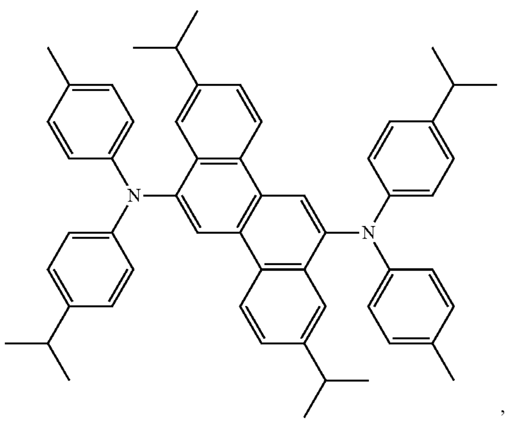
,
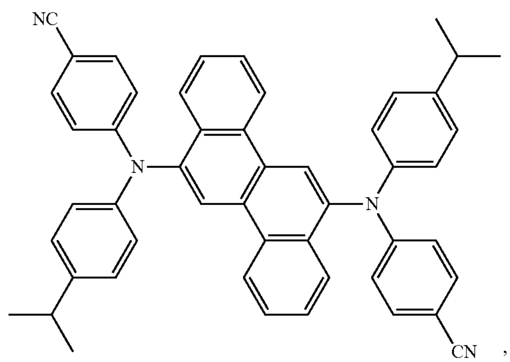
,
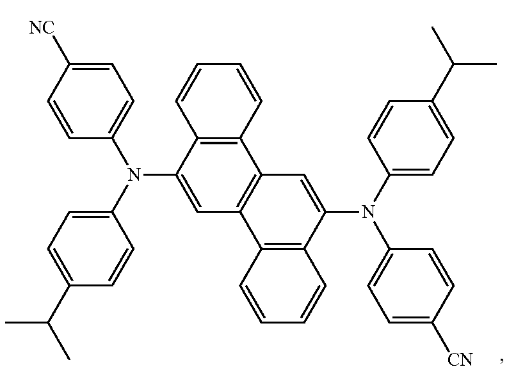
,
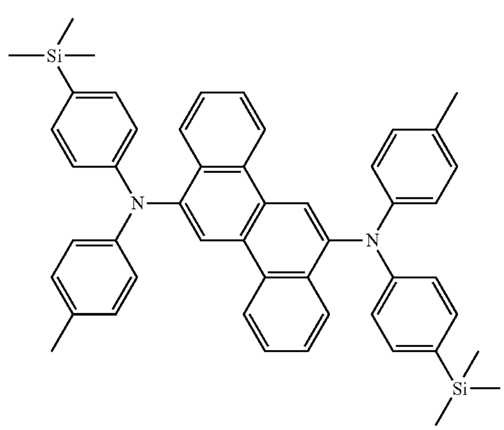
, -continued
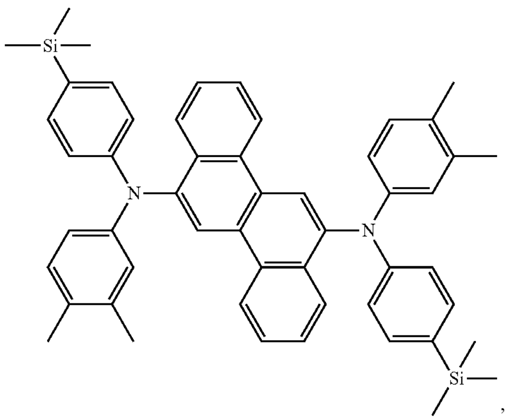
,
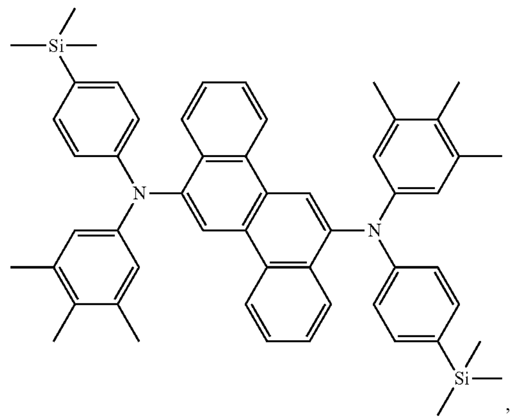
,
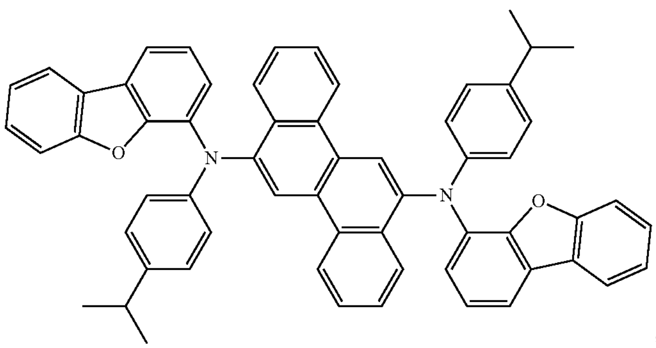
,
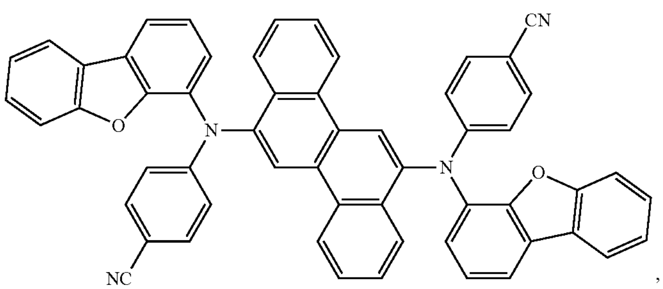
,
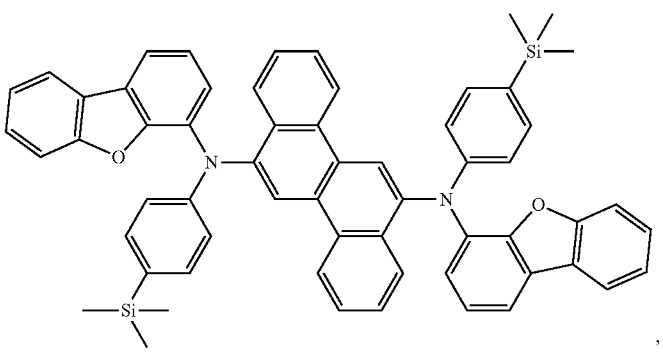
,
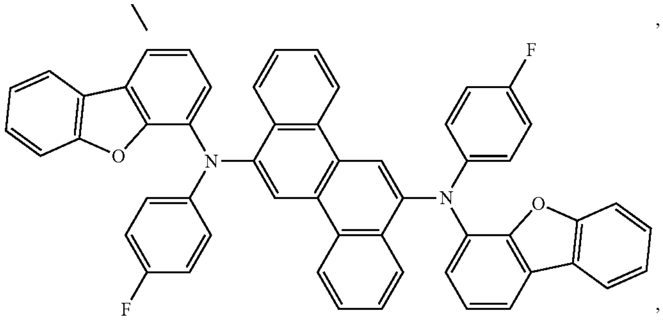
, -continued
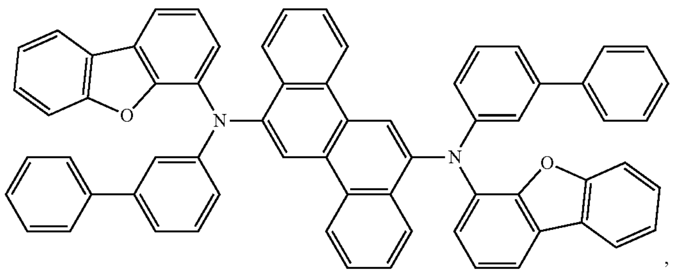
,
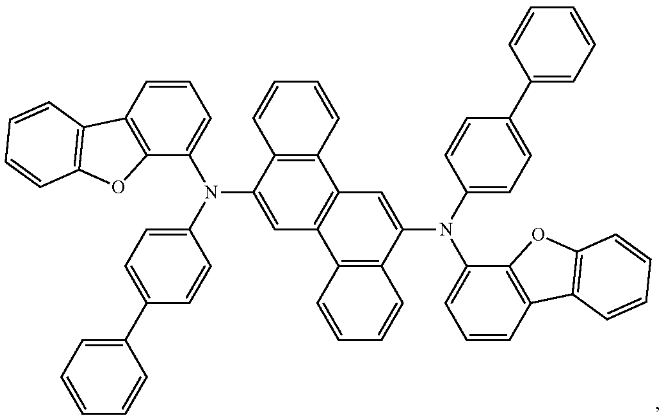
,
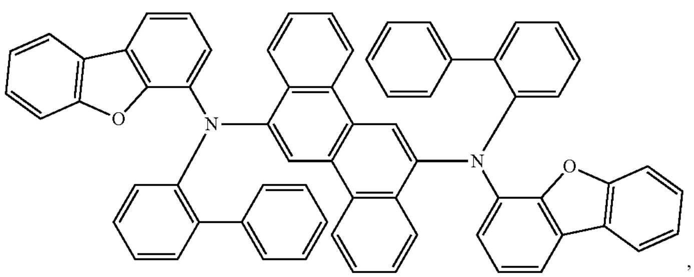
,
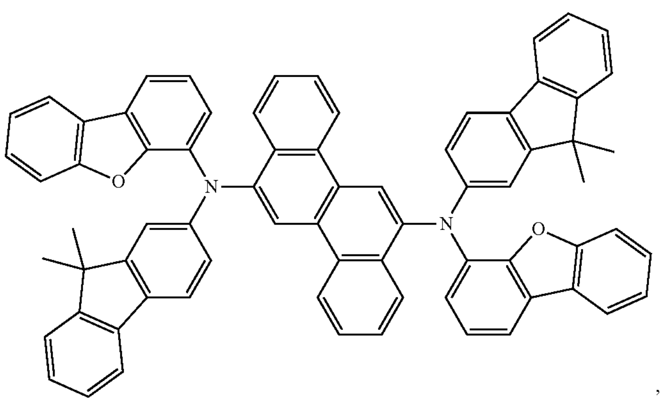
,
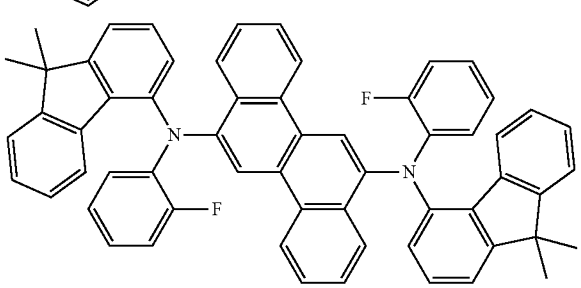
, -continued
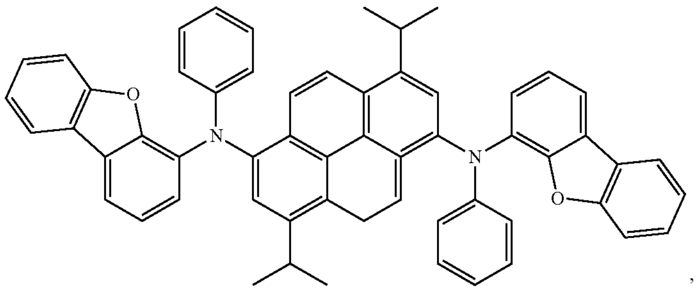
,
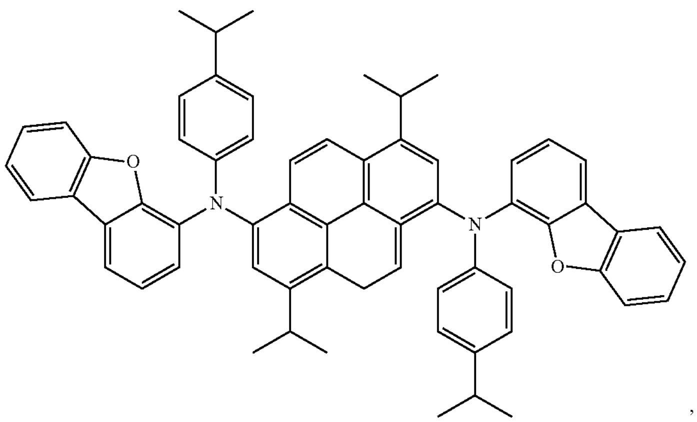
,
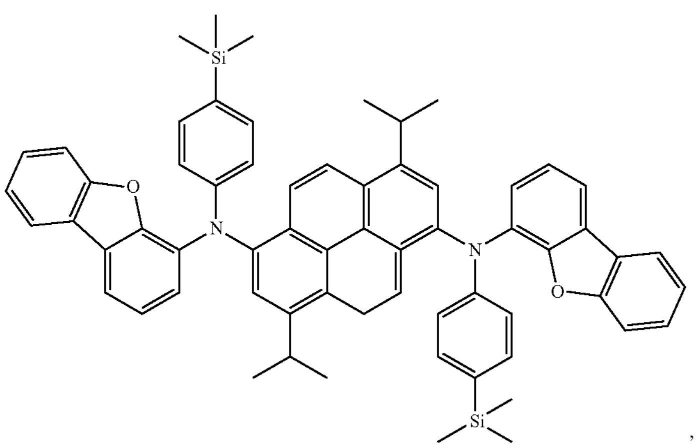
,
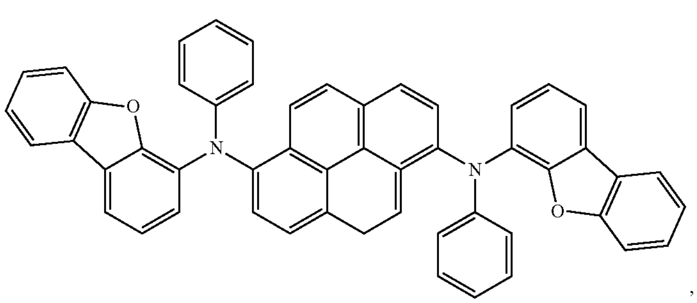
, -continued
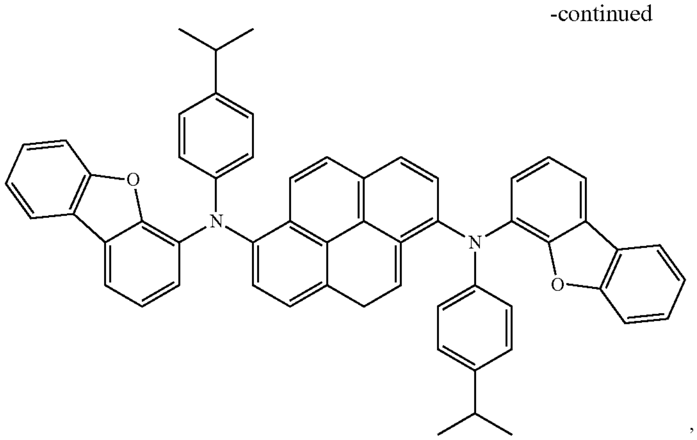
,
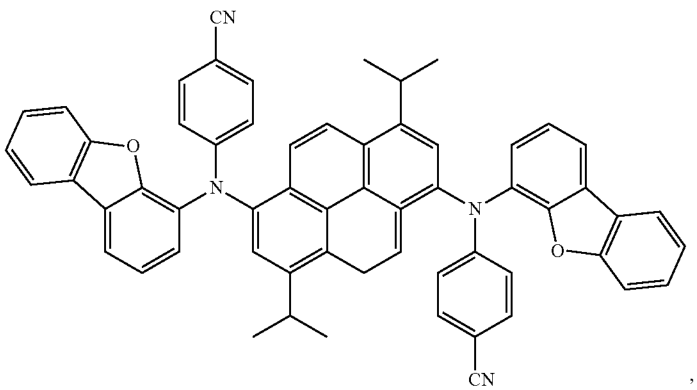
,
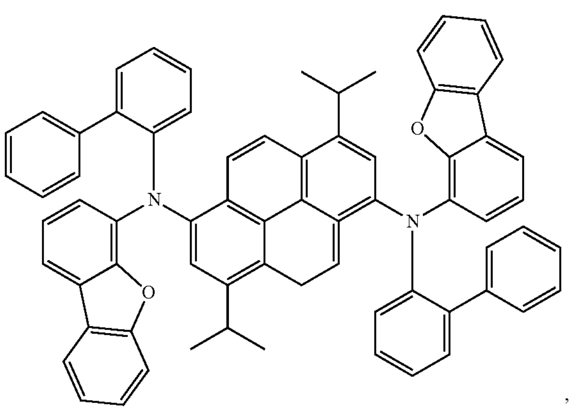
,
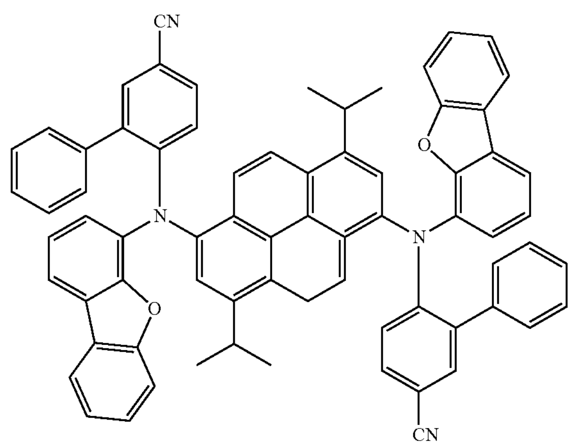
,
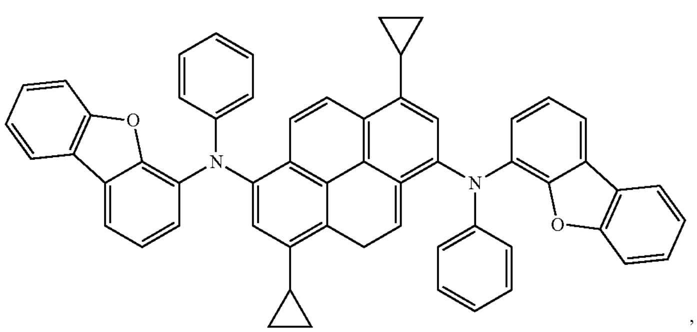
, -continued
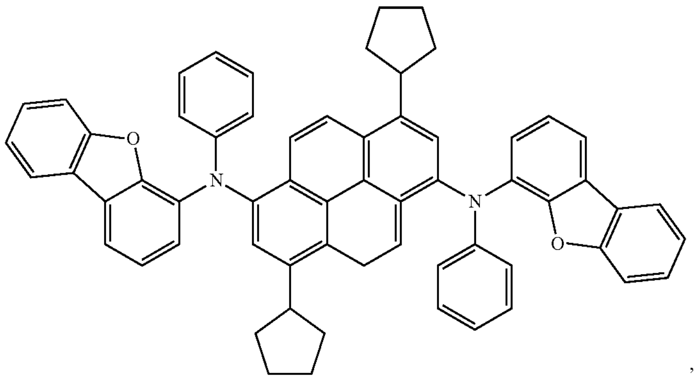
,
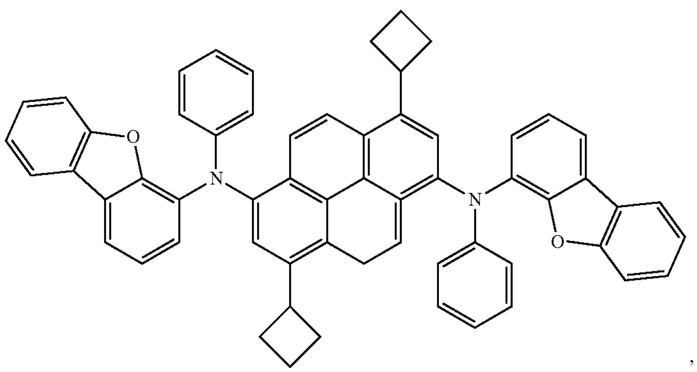
,
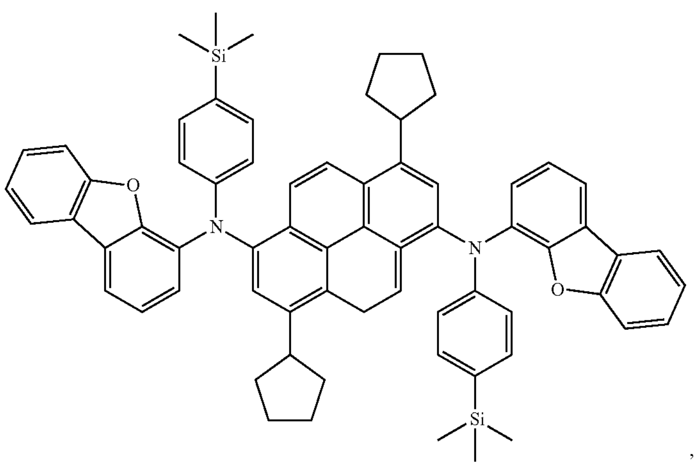
,
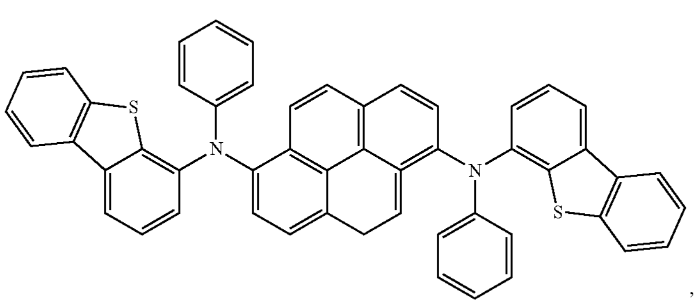
, -continued
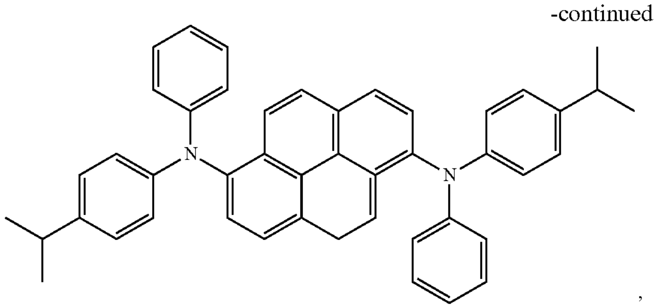
,
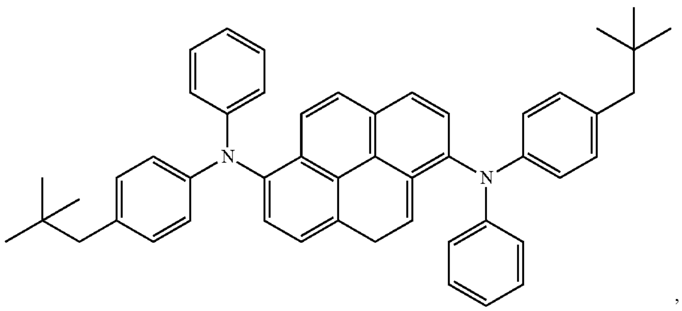
,
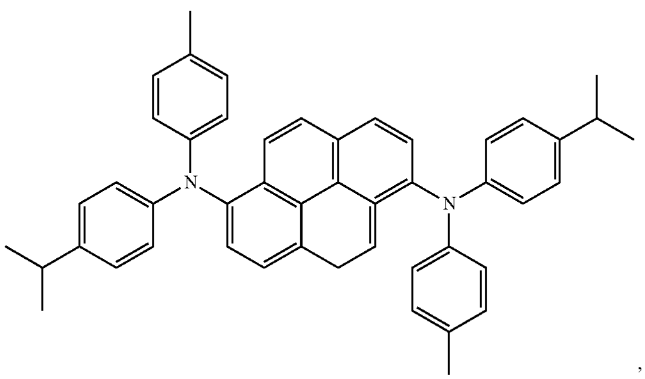
,
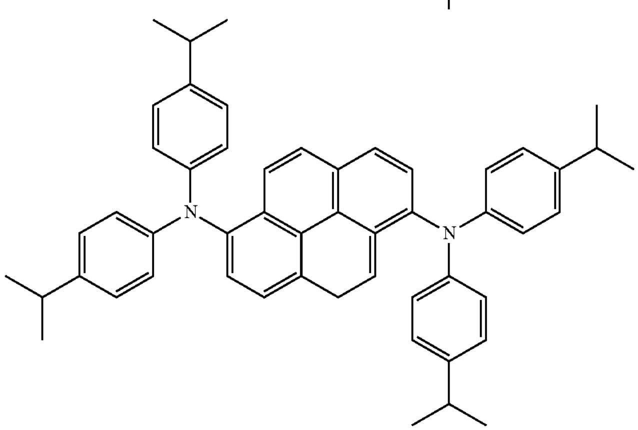
,
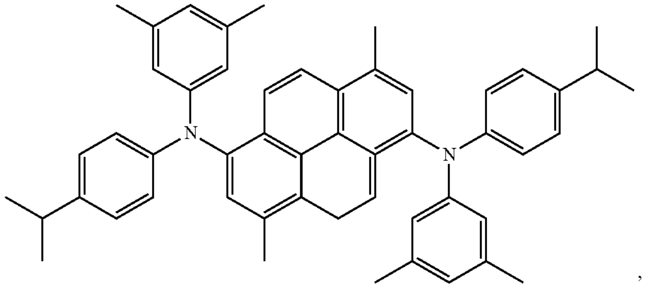
, -continued
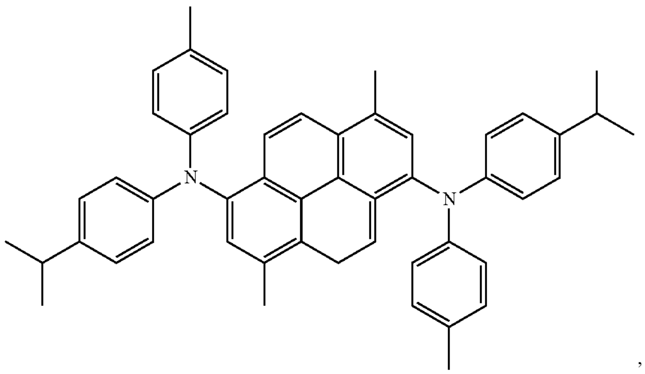
,
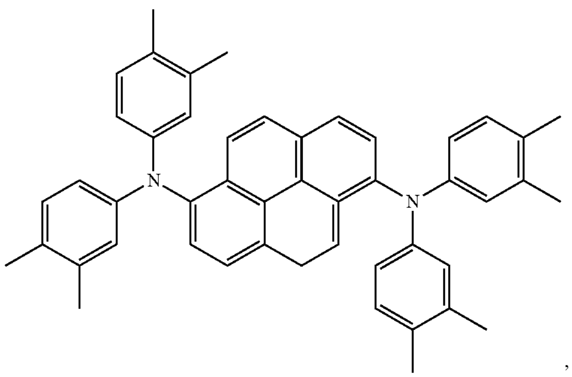
,
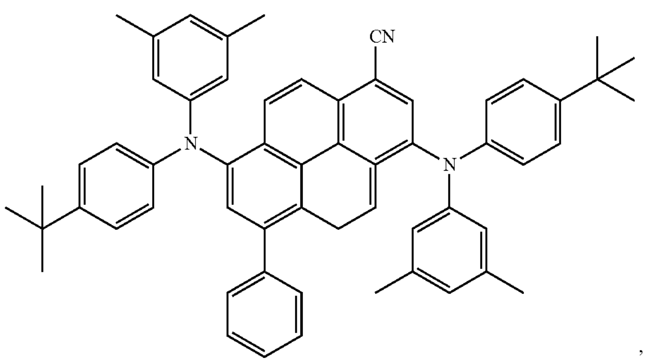
,
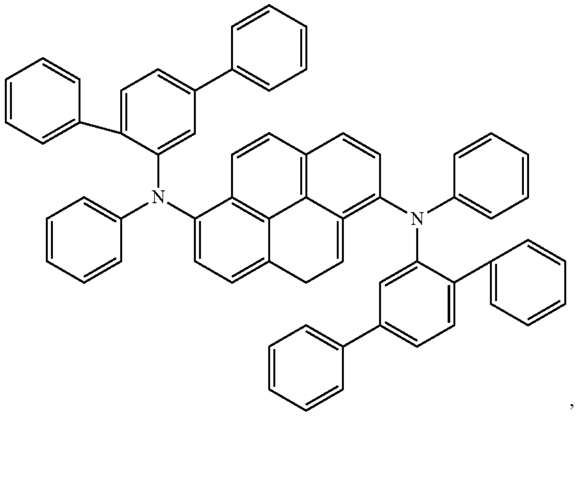
,
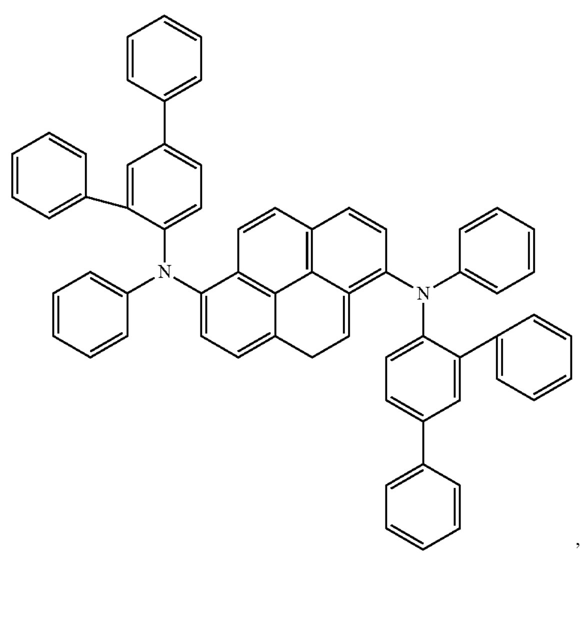
, -continued
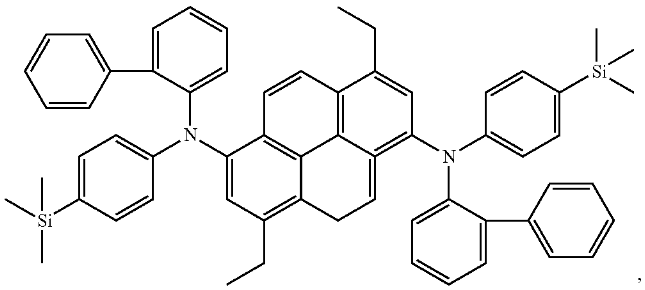
,
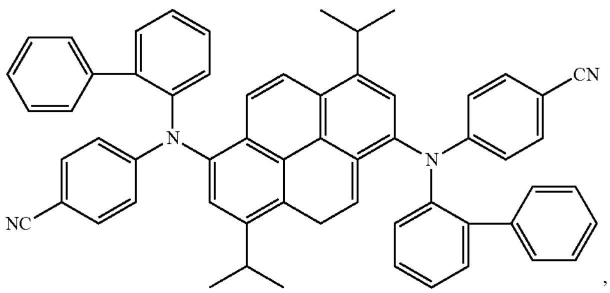
,
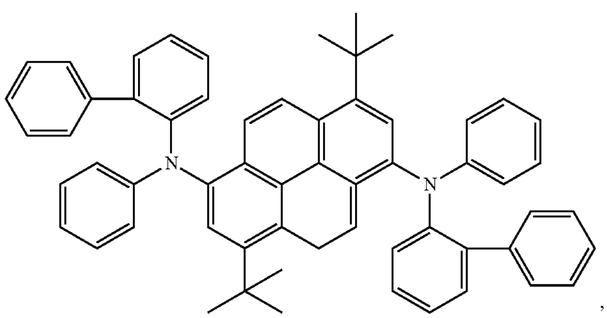
,
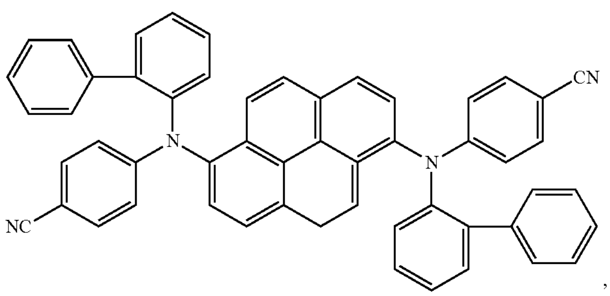
,
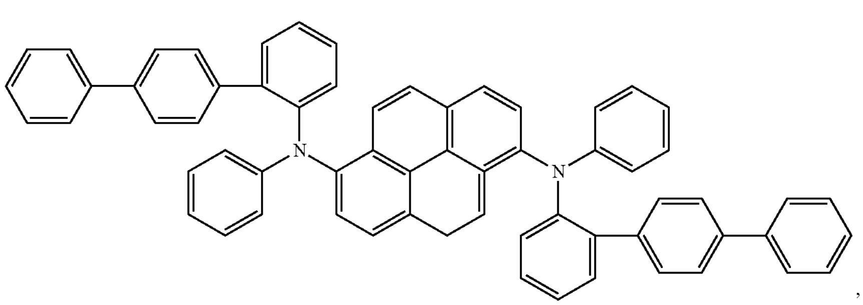
, -continued
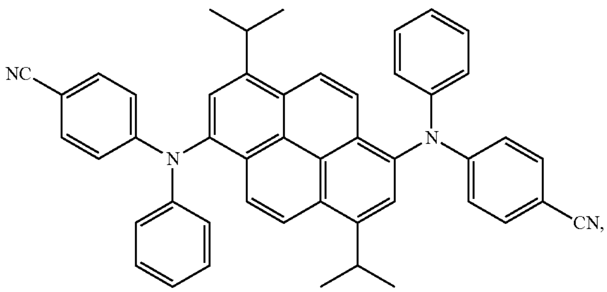
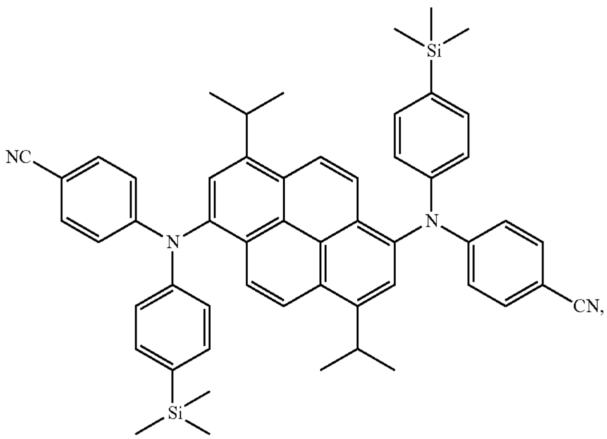
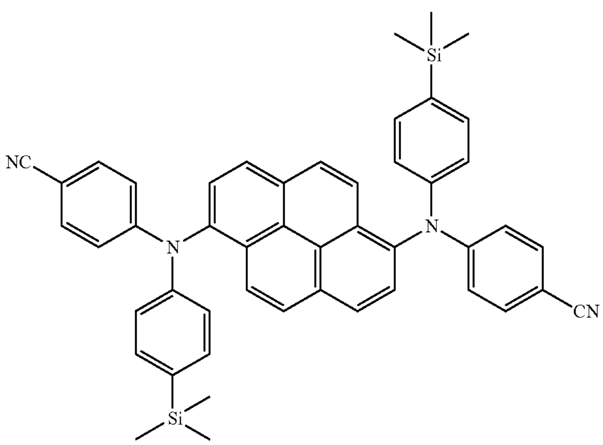
,
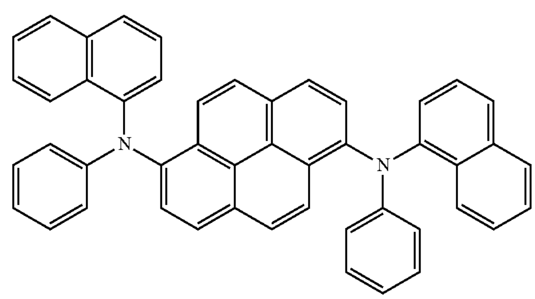
,
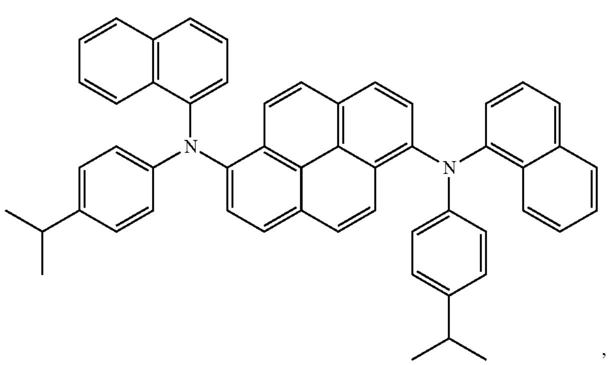
,
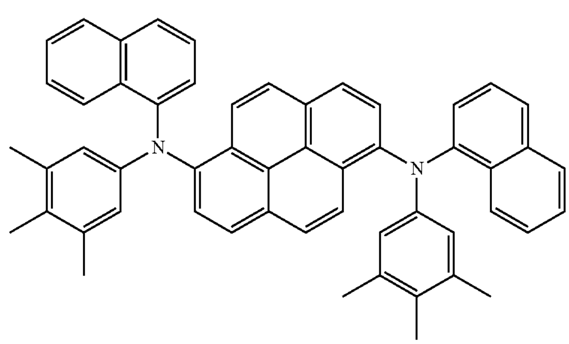
, -continued
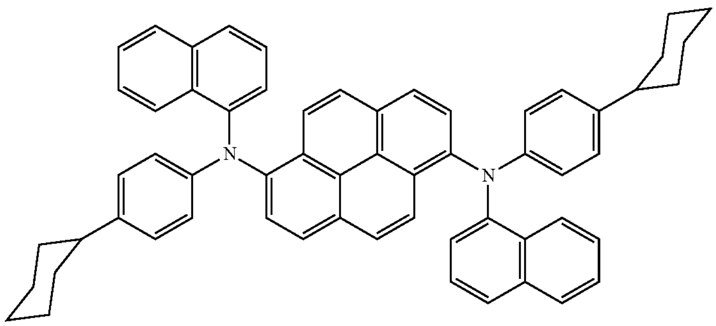
,
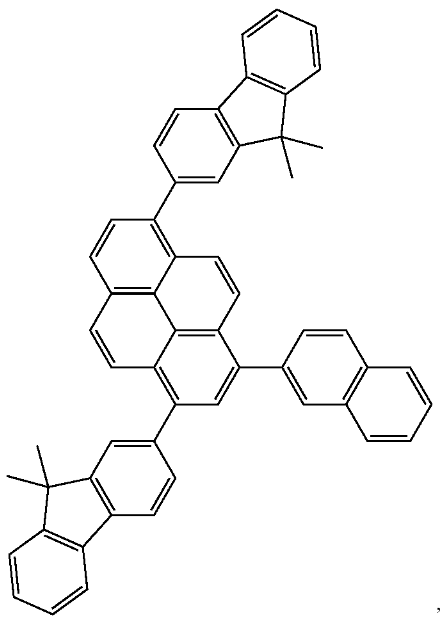
,
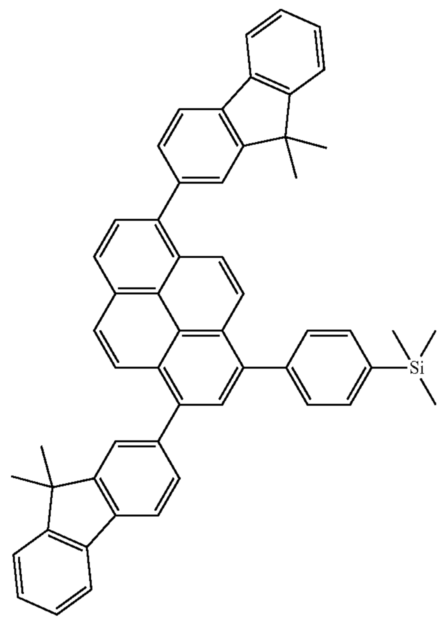
,
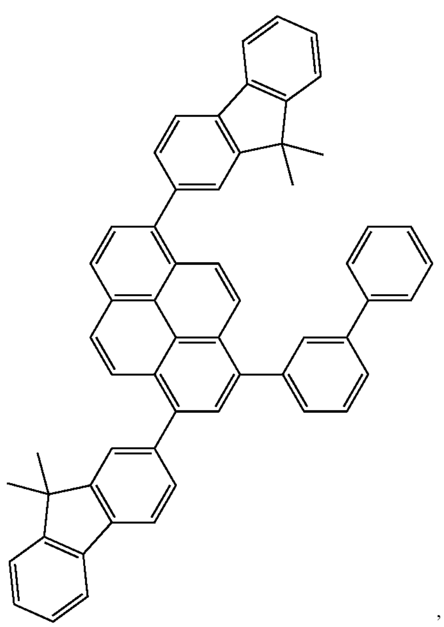
,
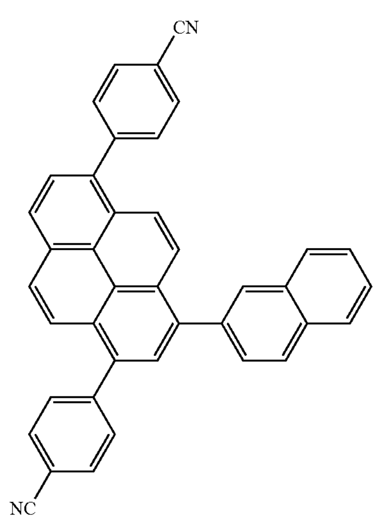
, -continued
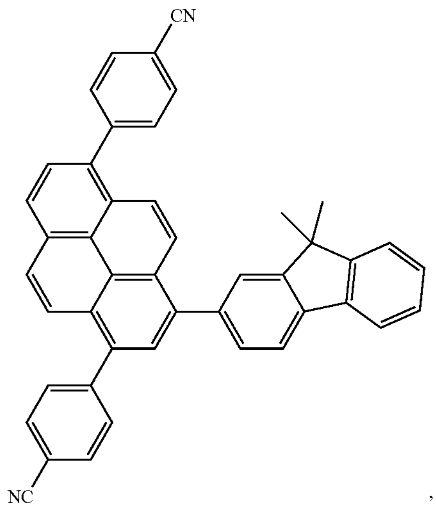
,
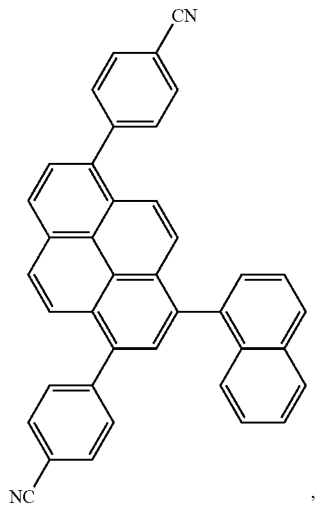
,
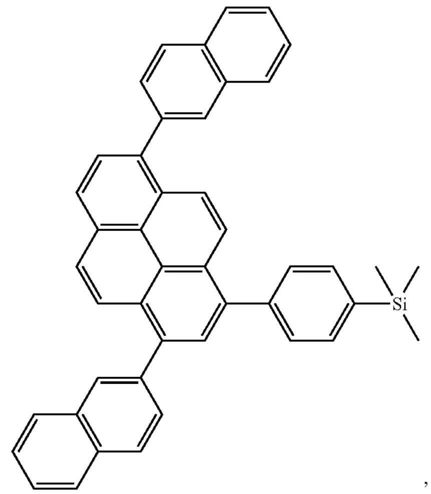
,
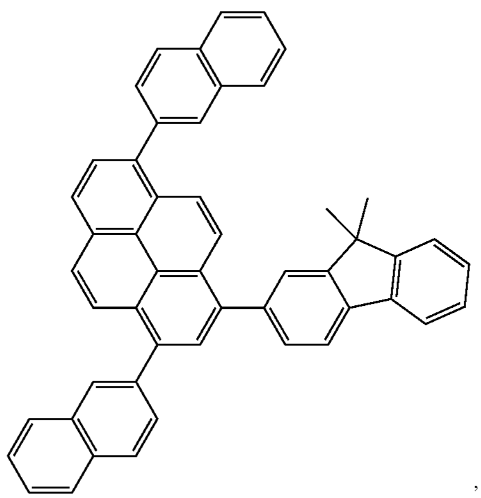
,
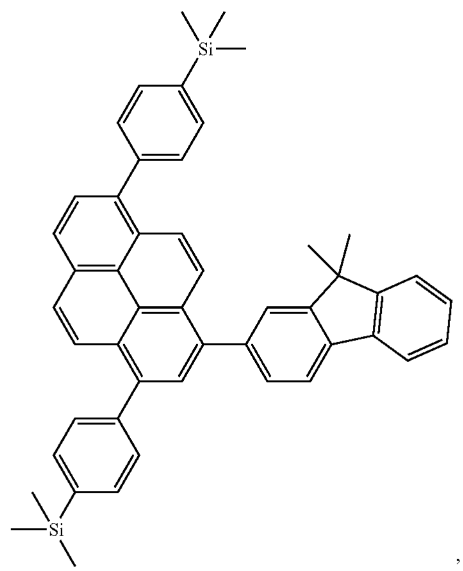
,
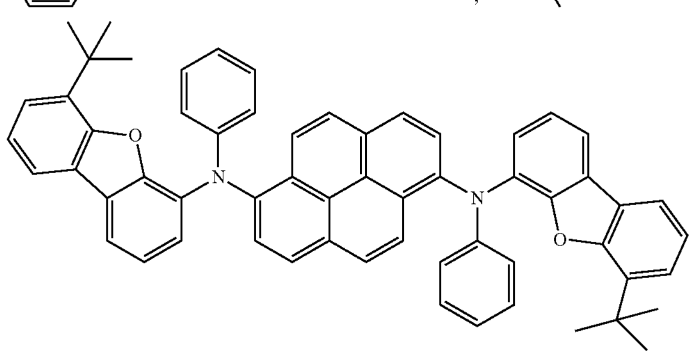
,
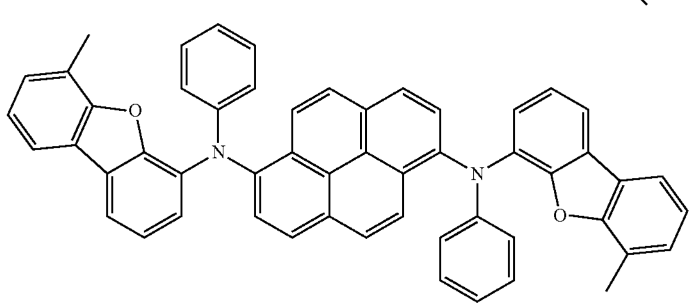
, -continued
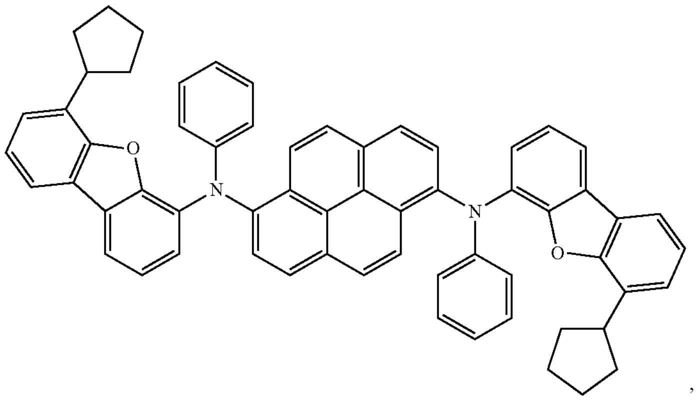
,
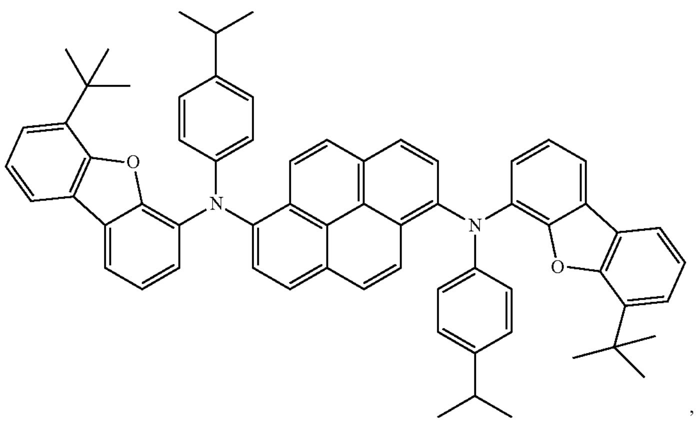
,
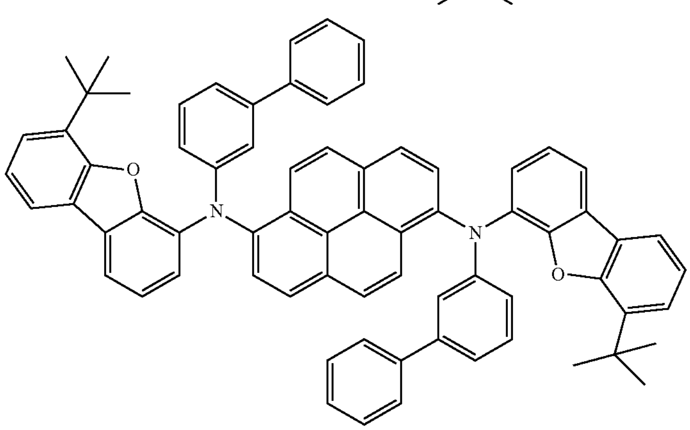
,
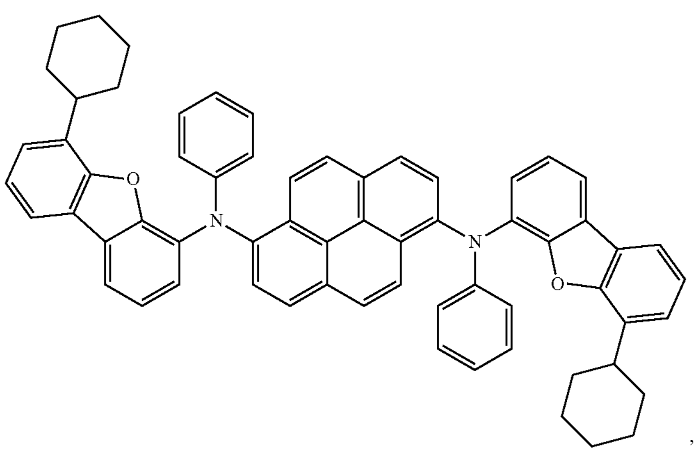
, -continued
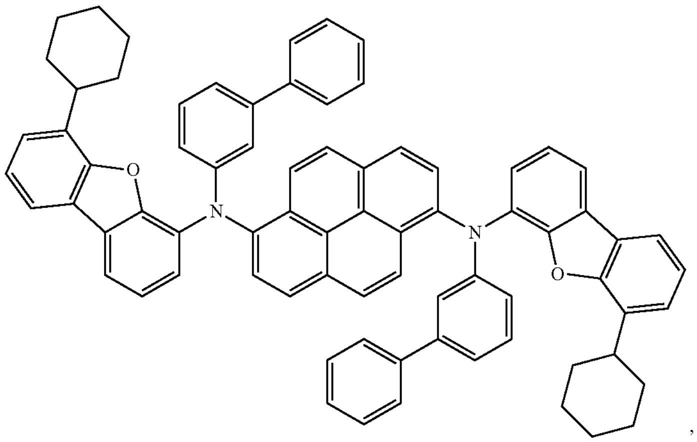
,
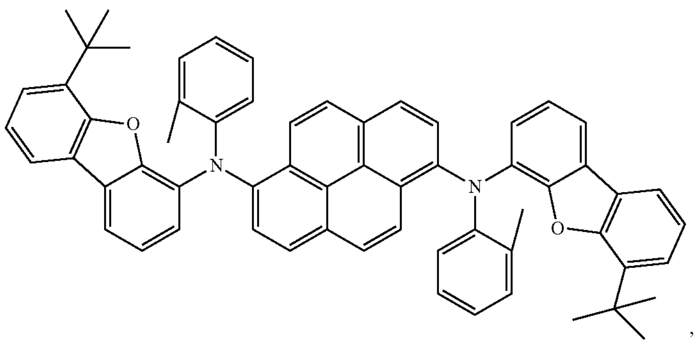
,
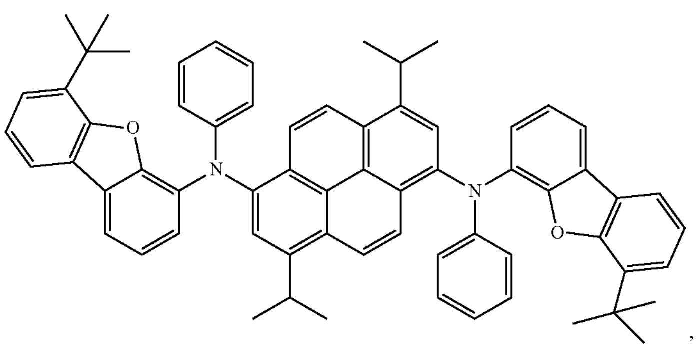
,
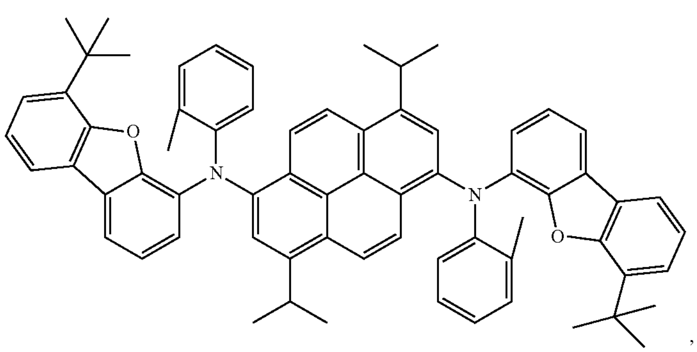
, -continued
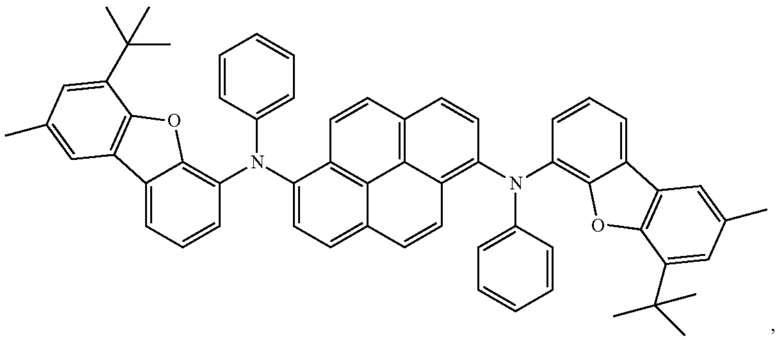
,
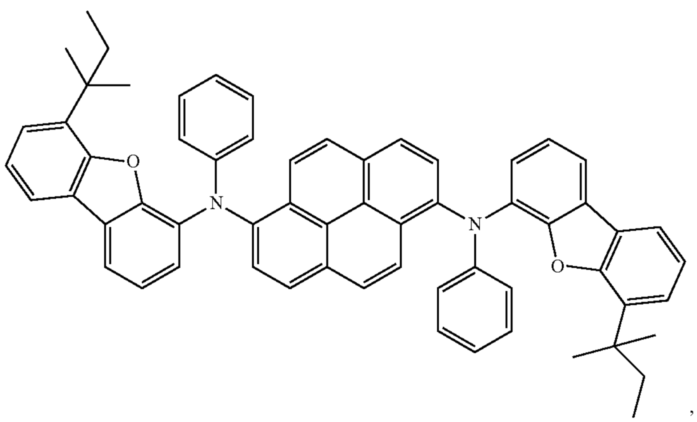
,
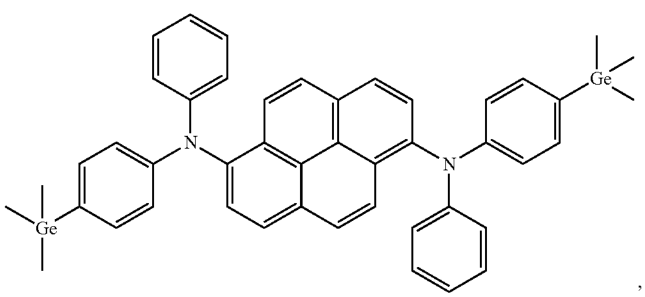
,
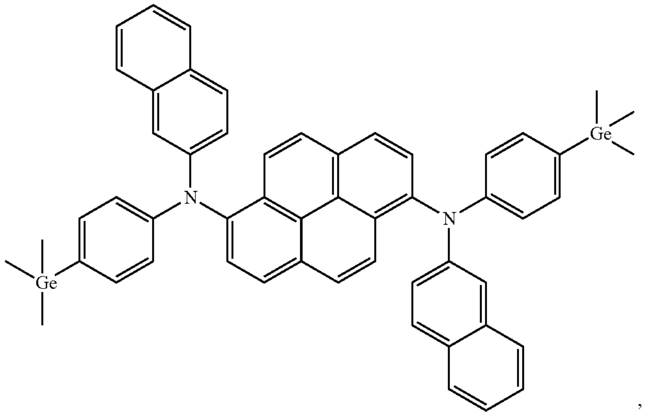
, -continued
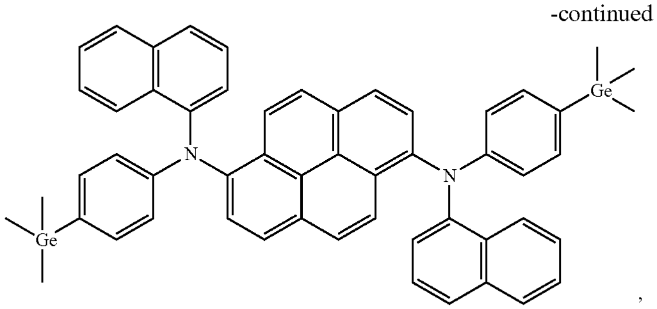
,
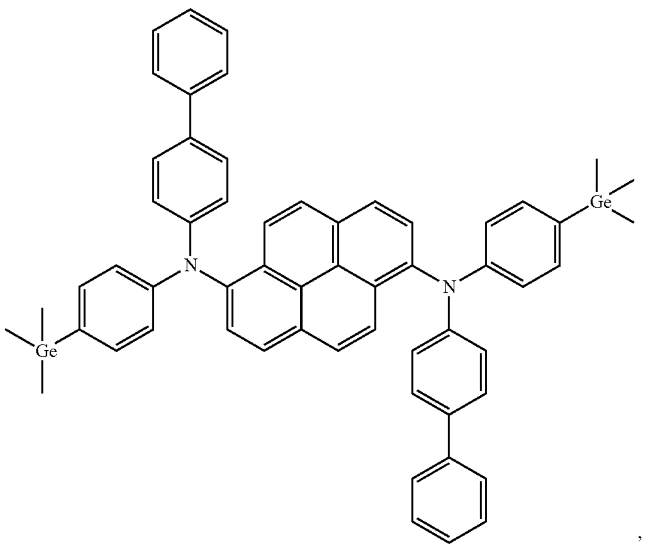
,
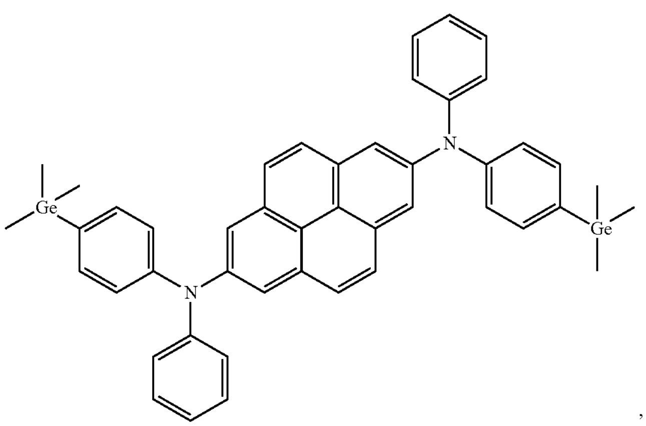
,
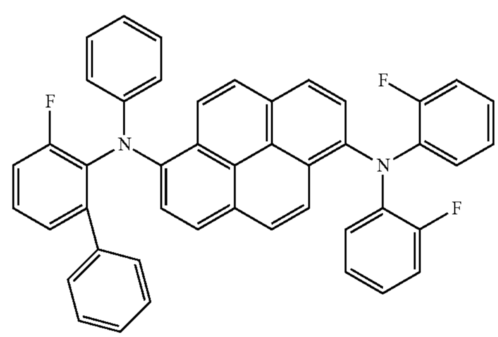
,
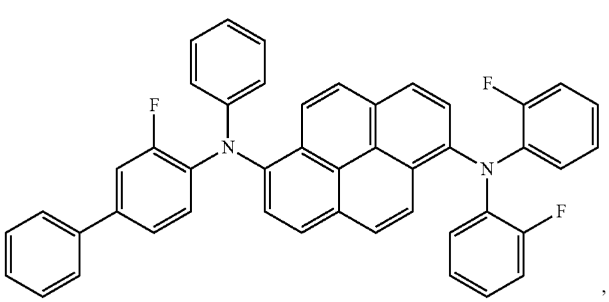
, -continued
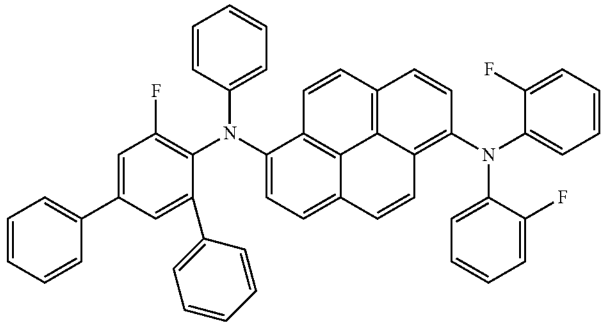
,
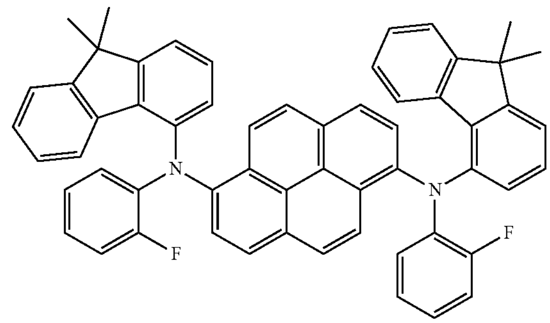
,
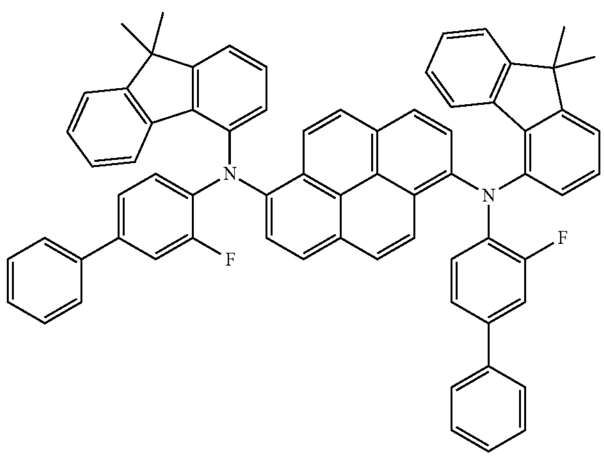
,
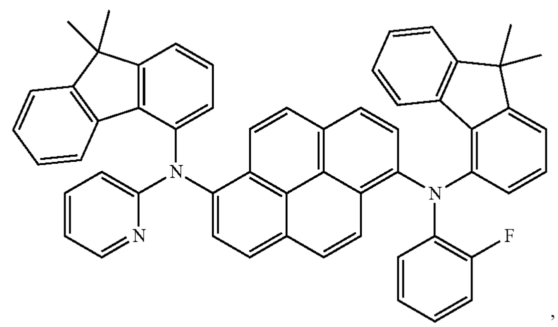
,
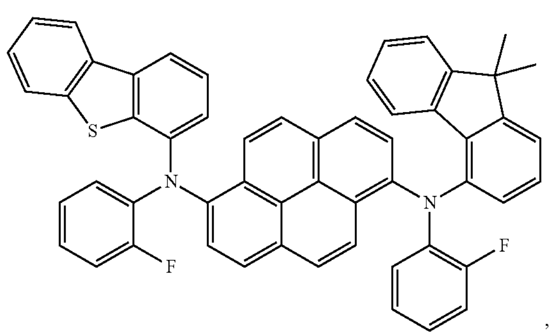
,
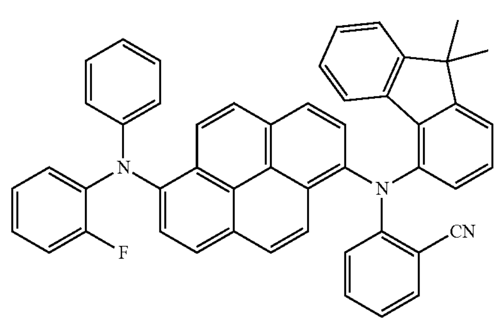
,
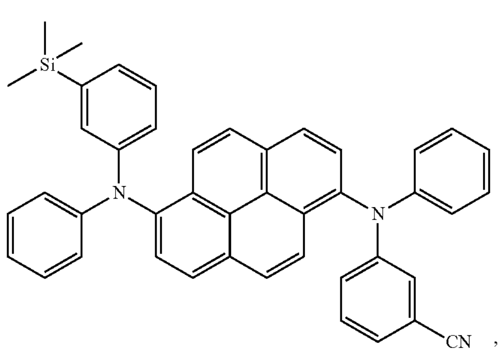
,
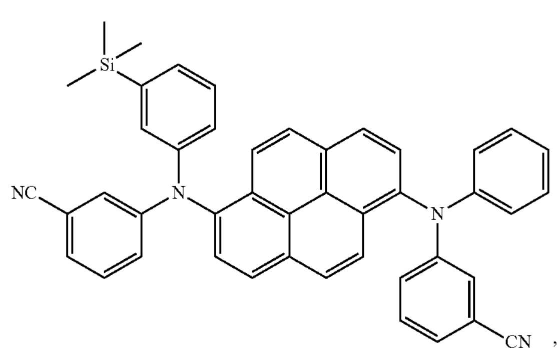
, -continued
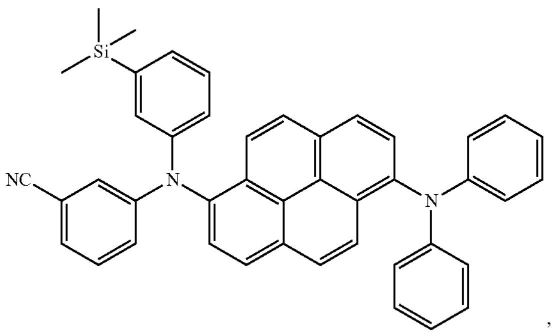
,
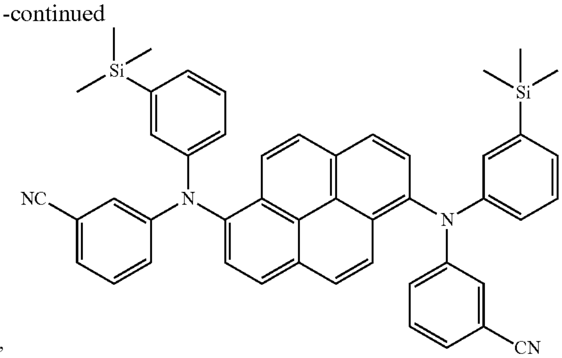
,
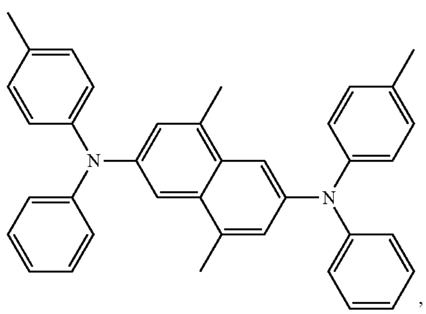
,
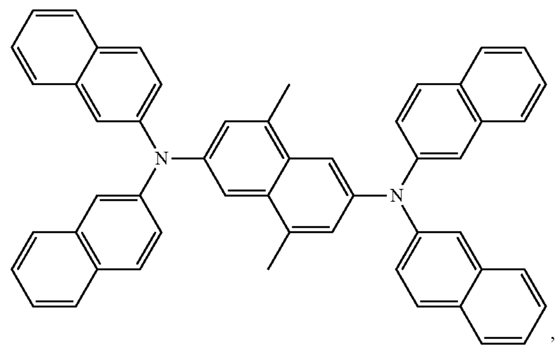
,
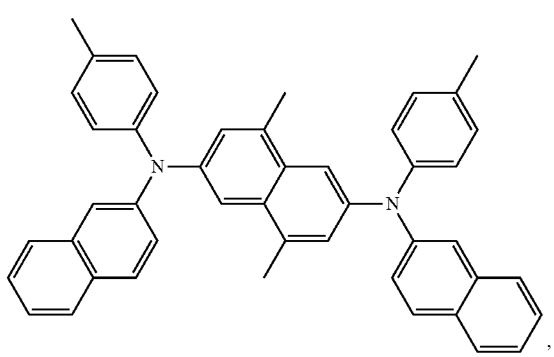
,
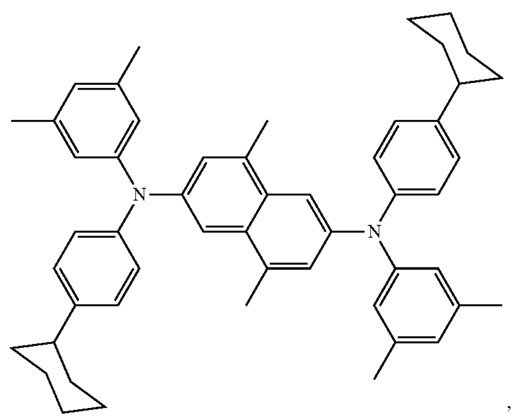
,
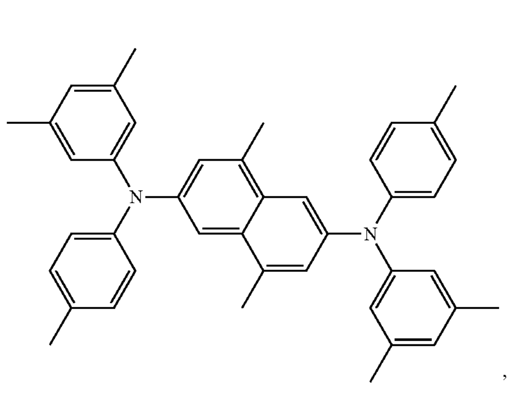
,
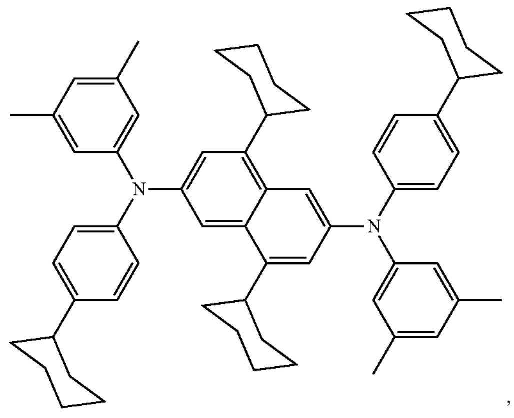
, -continued
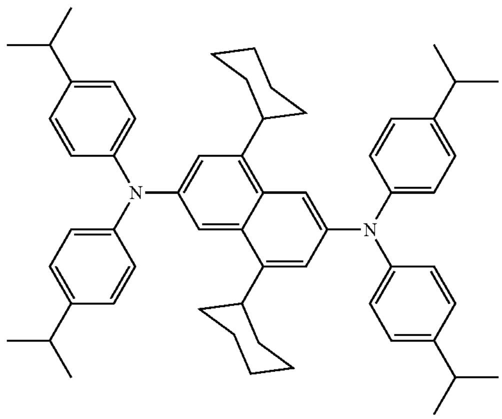
,
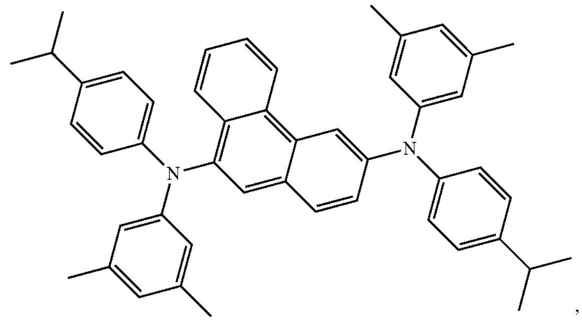
,
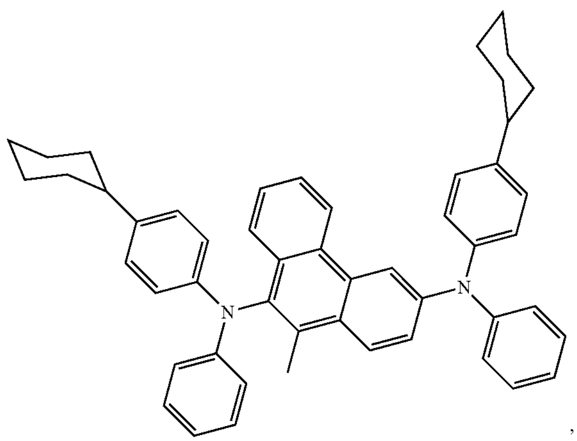
,
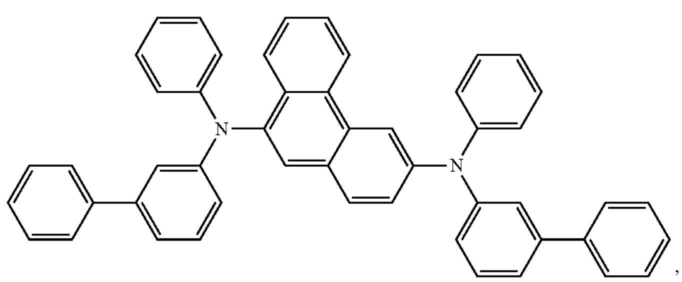
,
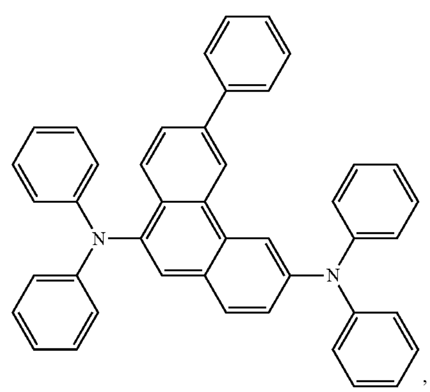
,
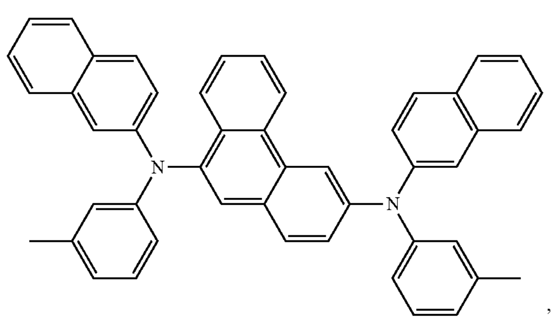
,
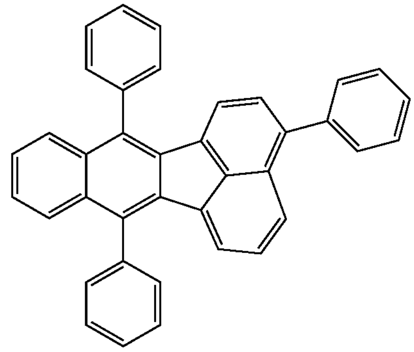
, -continued
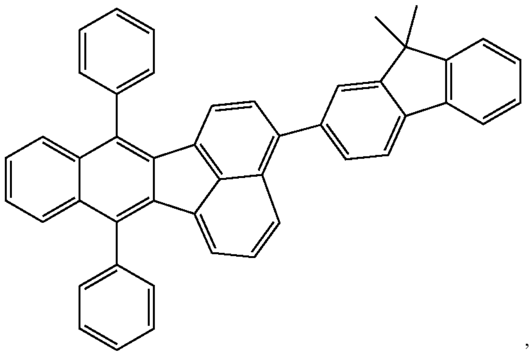
,
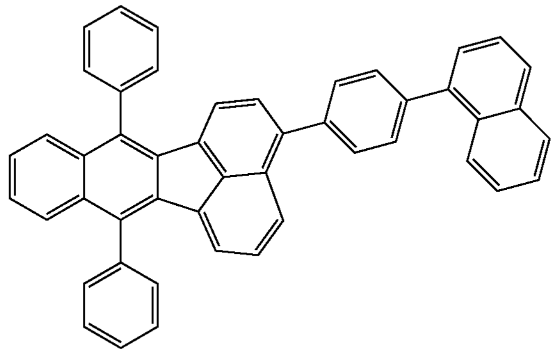
,
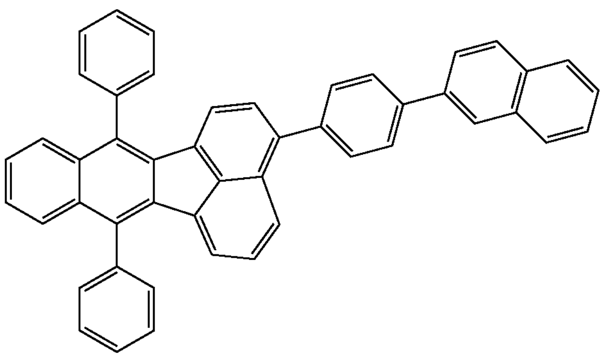
,
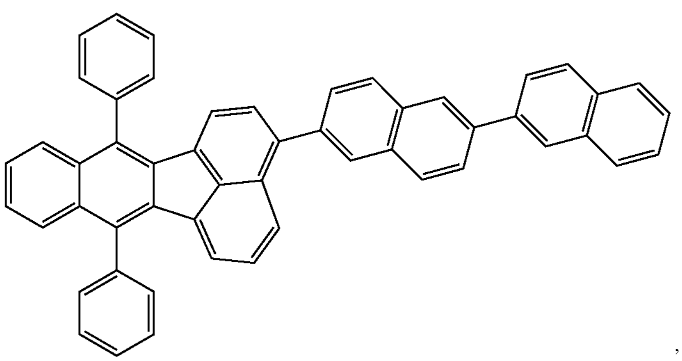
,
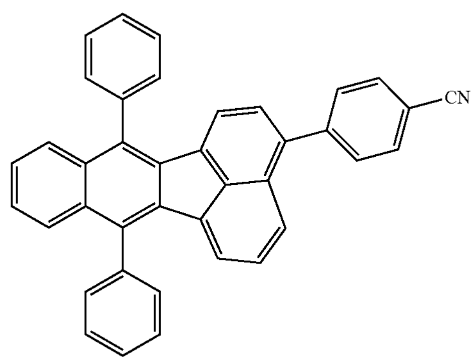
,
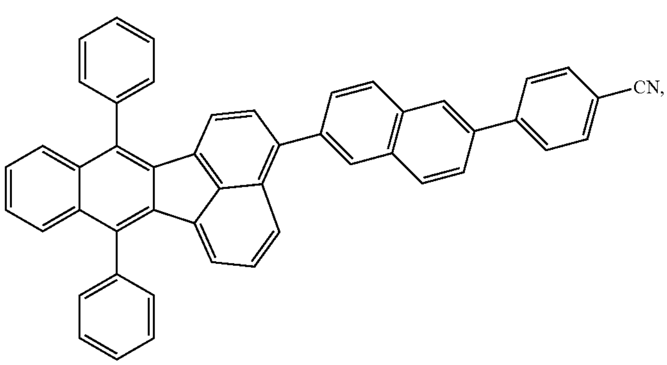

-continued
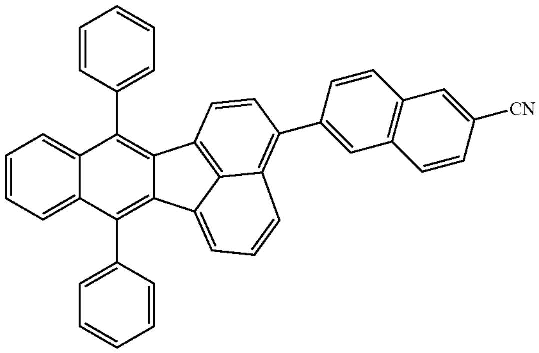
,
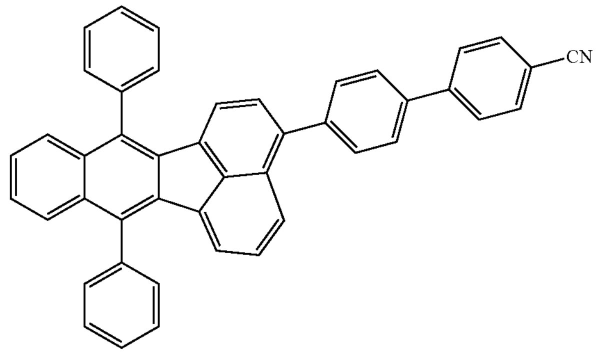
,
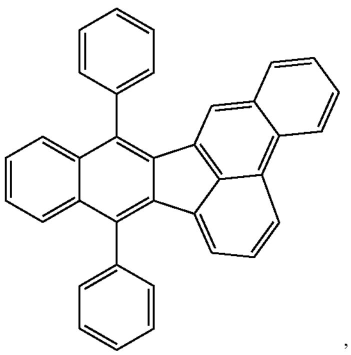
,
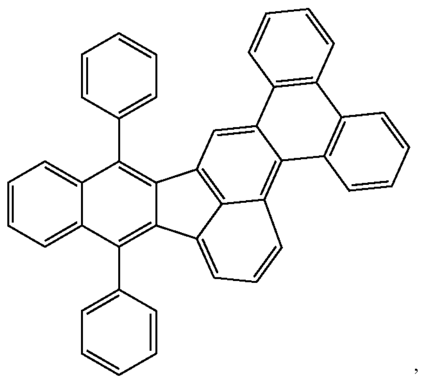
,
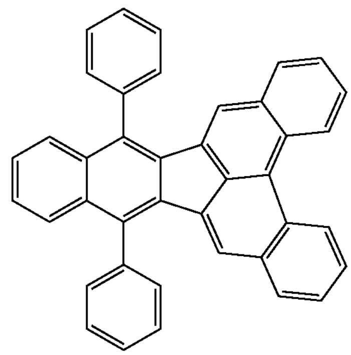
,
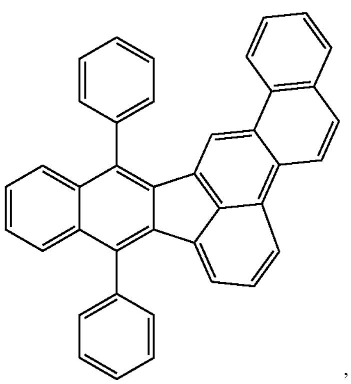
,
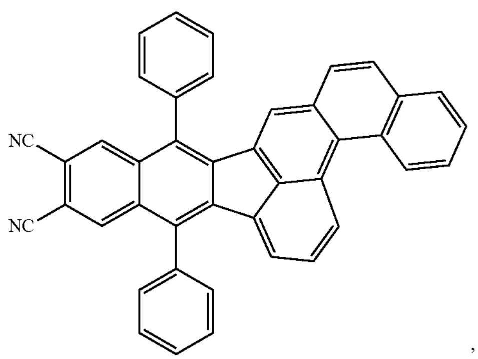
, and
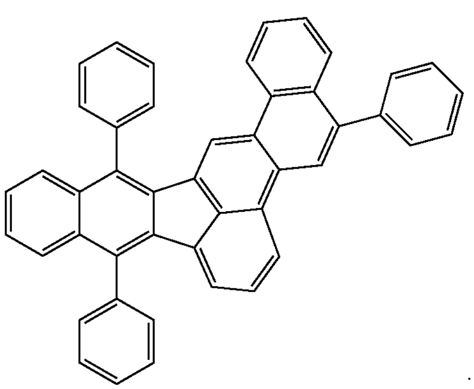
.

In another aspect, the present invention includes a compound for triplet-triplet annihilation upconversion comprising:

a sensitizer group;

an acceptor group; and an emitter group;

wherein the sensitizer group, the acceptor group, and the emitter group are connected together through covalent bonds by a plurality of spacer groups;

wherein the acceptor group has a first triplet energy lower than a first triplet energy of the sensitizer group;

wherein the emitter group has a first singlet energy lower than a first singlet energy of the acceptor group; and wherein the compound is capable of performing triplet-triplet annihilation upconversion of light incident on the compound to emit a luminescent radiation comprising a radiation component from the first singlet energy of the emitter group.

In one embodiment, the emitter group has a first triplet energy higher than the first triplet energy of the acceptor group. The triplet energies or singlet energies of the sensitizer group, emitter group, and acceptor group may be measured using any method known in the art.

Any group that is capable of absorbing photon energy and undergoing efficient intersystem crossing to generate triplet states is contemplated as a sensitizer group by the present invention. In one embodiment, the sensitizer group is selected from the group consisting of: an iridium complex, an osmium complex, a platinum complex, a palladium complex, a rhenium complex, a ruthenium complex, and a gold complex. Any compound of the present invention that is contemplated as a sensitizer is also contemplated as a sensitizer group of the present invention.

Any group that is capable of that accepting the triplet energy from the sensitizer and undergoing TTA is contemplated as an acceptor group by the present invention. In one embodiment, the acceptor group comprises a fused aromatic group. In one embodiment, wherein the acceptor group comprises a group selected from the group consisting of: naphthalene, anthracene, tetracene, pyrene, chrysene, perylene, and combination thereof. Any compound of the present invention that is contemplated as an acceptor is also contemplated as an acceptor group of the present invention.

Any group that emits light in the visible region is contemplated as an emitter group by the present invention. In one embodiment, the emitter group comprises a group selected from the group consisting of: fluoranthene, pyrene, triarylamine, and combinations thereof. Any compound of the present invention that is contemplated as an emitter is also contemplated as an emitter group of the present invention.

The spacer group is not particularly limited. In some embodiment, the compound comprises a plurality of spacer groups. In one embodiment, the plurality of spacer groups includes spacer groups that are all the same. In one embodiment, the spacer group is any organic group. In another embodiment, the spacer groups are non-conjugated organic groups. In one embodiment, the spacer groups are selected from the group consisting of: alkyl, cycloalkyl, heteroalkyl, arylalkyl, alkoxy, aryloxys, amino, silyl, alkenyl, cycloalkenyl, heteroalkenyl, alkynyl, aryl, heteroaryl, acyl, carbonyl, ester, and combinations thereof.

In one embodiment, the total molecular weight of the compound is comprised of the molecular weights of each of the sensitizer group, acceptor group, and emitter group in addition to the weight of any spacer groups. The weight percent (wt %) of the total molecular weight of the compound of each group may be independently modified as necessary, as would be understood by one of ordinary skill in the art. In one embodiment, the acceptor group in the compound comprises at least 50 wt % of the total molecular weight of the compound. In another embodiment, the acceptor group in the compound comprises at least 60 wt % of the total molecular weight of the compound. In another embodiment, the acceptor group in the compound comprises at least 70 wt % of the total molecular weight of the compound.

In one aspect, a compound of the invention may have one or more of each of a sensitizer group, an acceptor group, or an emitter group. In one embodiment, the compound has a plurality of acceptor groups. In another embodiment, the compound has a plurality of emitter groups. In another aspect, the sensitizer group, acceptor group, or emitter group may also be substantially surrounded by the plurality of spacer groups. As used herein, one group may be said to "substantially surround" another when it is isolated by the other group. For example, the sensitizer group and/or the acceptor group may be isolated by the spacer group, such that the spacer group prevents the sensitizer group and/or the acceptor group from contacting adjacent molecules. In one embodiment, the plurality of spacer groups substantially surrounds the sensitizer group. In another embodiment, the plurality of spacer groups substantially surrounds the acceptor group. In another embodiment, the plurality of spacer groups substantially surrounds the emitter group.

In one embodiment, the compound is selected from the group consisting of:

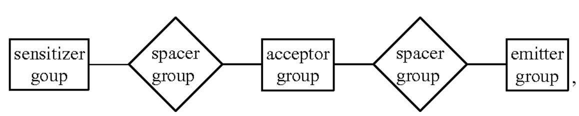

,

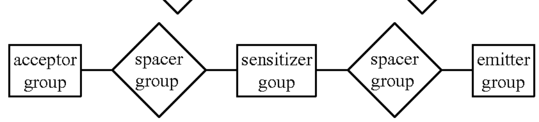

, and

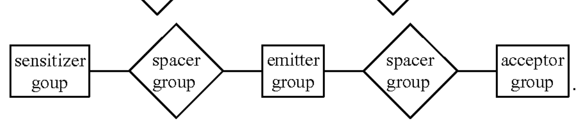

.

In one embodiment, the compound is selected from the group consisting of:

Compound 1
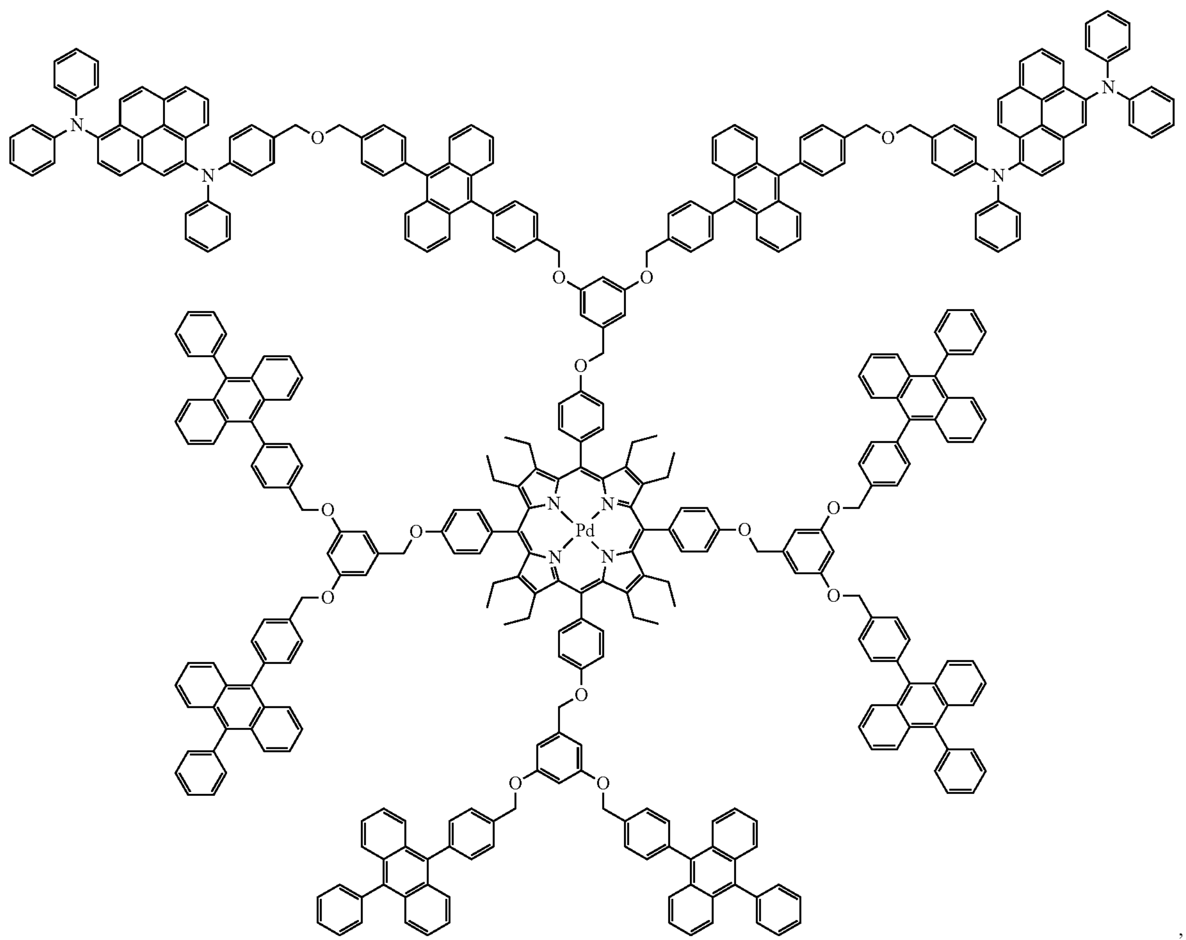
,
Compound 2
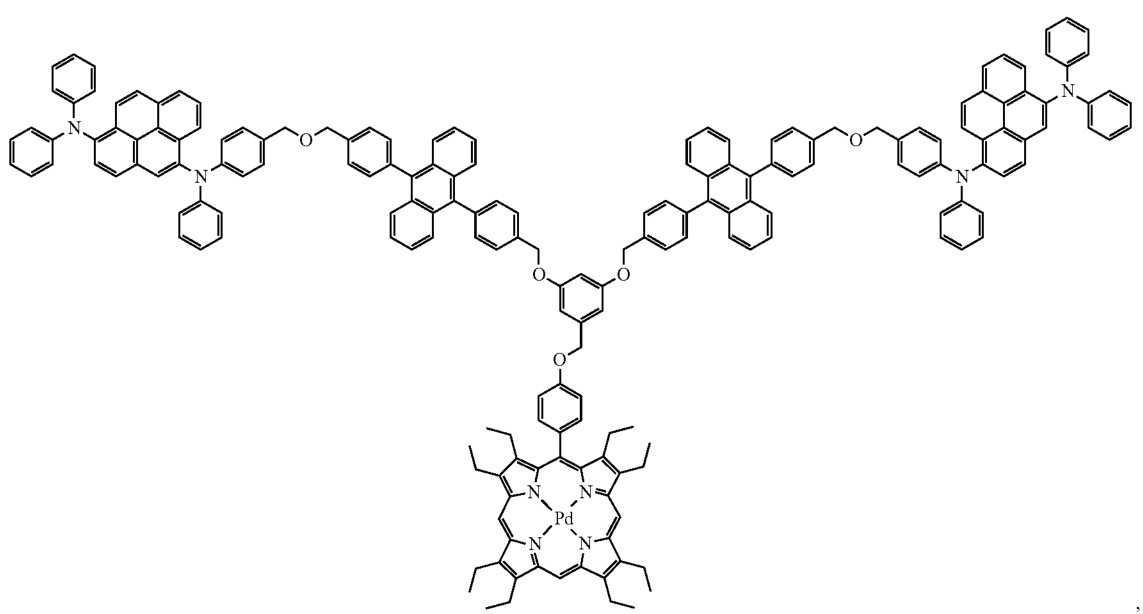
,

-continued
Compound 3
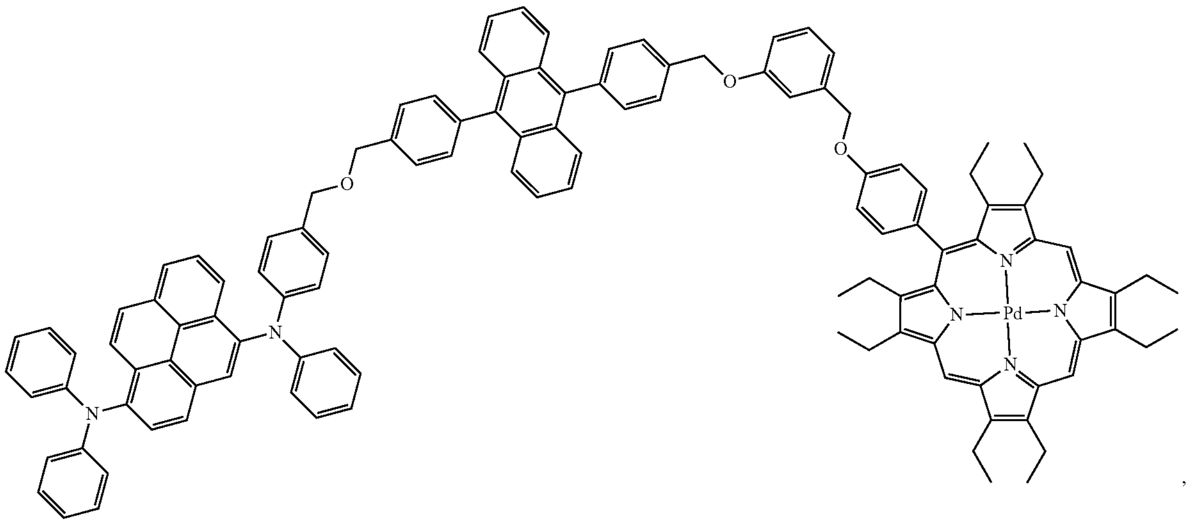
,
Compound 4
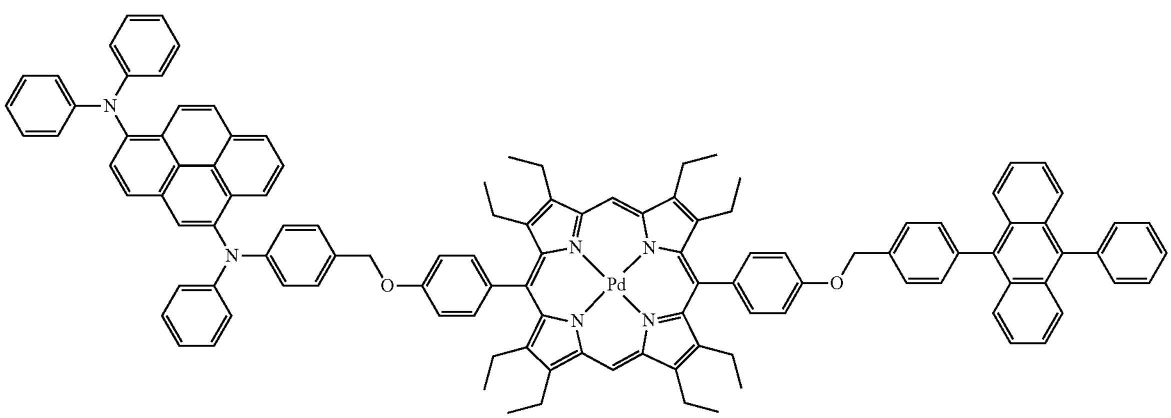
,
Compound 5
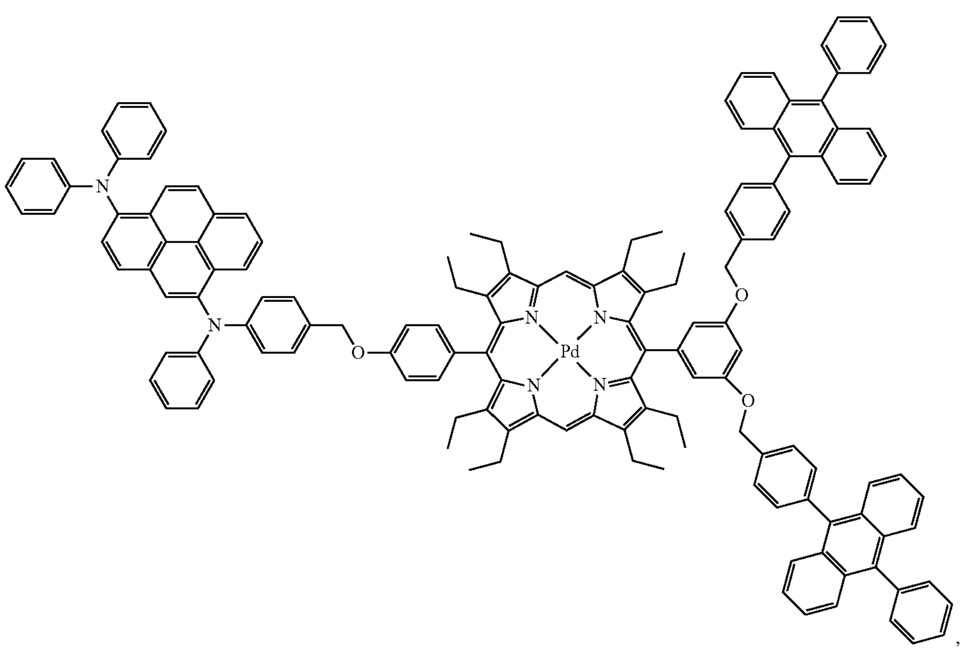
, -continued Compound 6

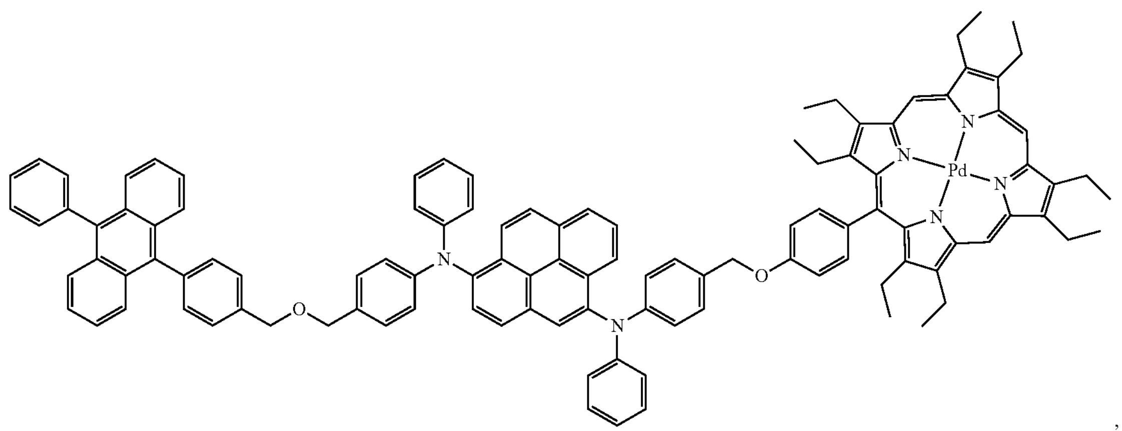

, and

Compound 7

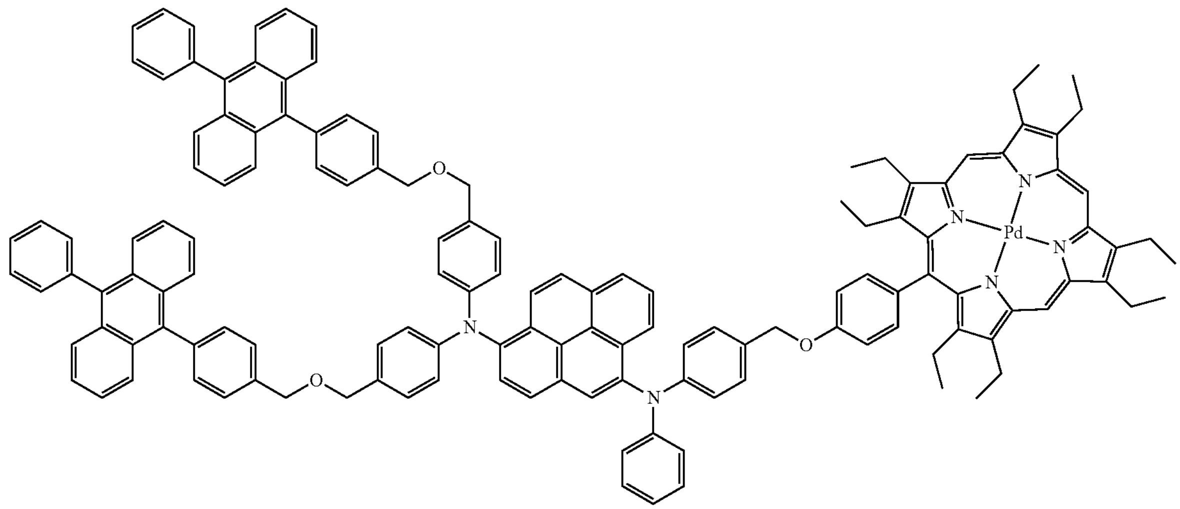

.

Devices:

According to another aspect of the present disclosure, a first device is also provided. In one embodiment, the first device comprises a first organic layer, the first organic layer comprising the formulation of the mixture of compounds or the single compound of the present invention. In one embodiment, the first organic layer only contains the formulation of the sensitizer, the acceptor, and the emitter. In one embodiment, the organic layer is a solution or a solid film.

An organic light emitting device is also provided. The device may include an anode, a cathode, and an organic emissive layer disposed between the anode and the cathode. The organic emissive layer may include a host and a phosphorescent dopant.

Further, an organic light emitting device is provided, wherein the device includes an emissive material having an emissive spectrum. An up-conversion layer may be disposed adjacent to the organic light emitting device such that light emitted by the organic light emitting device is incident on the up-conversion layer. A compound or a formulation, as described herein, may be included in the up-conversion layer.

In one embodiment, the light emitted by the organic light emitting device is selected from the group consisting of red, green, and yellow; and the first device emits white light. In another embodiment, light emitted by the organic light emitting device has a peak wavelength of 500 nm to 700 nm, and the first device emits light having CIE coordinates of within a seven step McAdam ellipse centered on the black body curve with a correlated color temperature (CCT) in the range of 2500-7000K. The peak wavelength may be measured using any method known in the art. Determination of CIE coordinates may be carried out using any method known in the art, as long as the coordinates are within a seven step McAdam ellipse centered on the black body curve with a correlated color temperature (CCT) in the range of 2500-7000K, as would be understood by one of ordinary skill in the art.

Furthermore, a device including light-emitting diodes (LEDs) is provided, wherein the device includes the compounds or the formulations described herein. The light source may be an inorganic LED. In an embodiment, the light source may be sun light.

In an embodiment, a photovoltaic device is provided. An upconversion layer may be disposed in the optical path of the incident light on the photovoltaic device. The upconversion layer may include the compounds or the formulations described herein. In an aspect, a lighting panel comprising the compounds or the formulations described herein is provided.

As would be understood by one of ordinary skill in the art, the devices of the present invention exhibit an upconversion efficiency. In one embodiment, the first device has an upconversion efficiency of at least 10%. In another embodiment, the first device has an upconversion efficiency of at least 15%. In another embodiment, the first device has an upconversion efficiency of at least 20%.

A consumer product including a compound or a formulation as described herein is also provided.

In addition to the devices described above, the device may further include a touch sensitive surface. For example, the device may include a device type selected from the group consisting of: a full-color display, a flexible display in a consumer device, a mobile phone, a pad computer, a smartphone, a portable computer, a monitor, a television, and a consumer device including a flexible display.

The first device can be one or more of a consumer product, an organic light-emitting device, an electronic component module, an organic light-emitting device, a light emitting diode, and a photovoltaic device and a lighting panel. The organic layer can be an emissive layer and the compound can be an emissive dopant in some embodiments, while the compound can be a non-emissive dopant in other embodiments. In one embodiment, the first device is selected from the group consisting of a consumer product, an electronic component module, an organic light-emitting device, a lighting panel, a light emitting diode, and a photovoltaic device.

EXPERIMENTAL

Preparation of Solutions

Two solutions in toluene were prepared for the TTA-UC experiments. Solution 1 contains $4\times10^{-5}$ M of DPA and $1\times10^{-5}$ M of PdOEP. Solution 2 contains $4\times10^{-4}$ M of DPA, $1\times10^{-5}$ M of PdOEP, and $1\times10^{-5}$ M of Compound E. Both solutions were degassed with nitrogen for 20 min and sealed for measurements. Both solutions were excited at 544 nm with the same power intensity. The excitation wavelength is chosen for the absorption maximum for PdOEP and not exciting the DPA and Compound E molecules directly. The emission spectra were recorded under the same experimental condition. The structures of DPA, PdOEP, and Compound E are shown below.

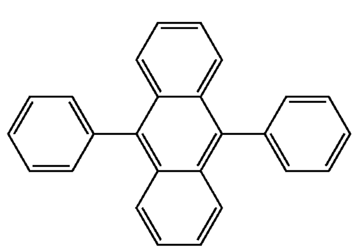

DPA

-continued

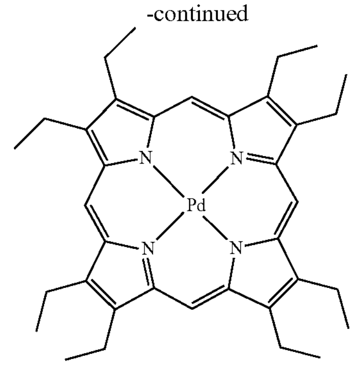

PdOEP

Compound E

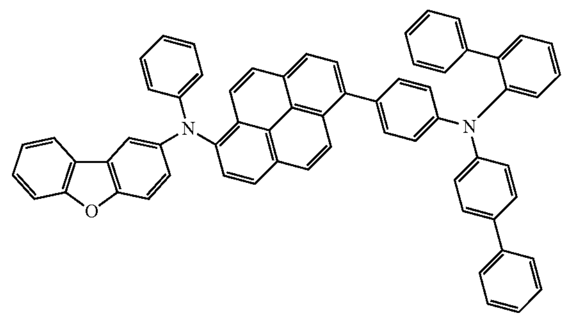

Figure 5:
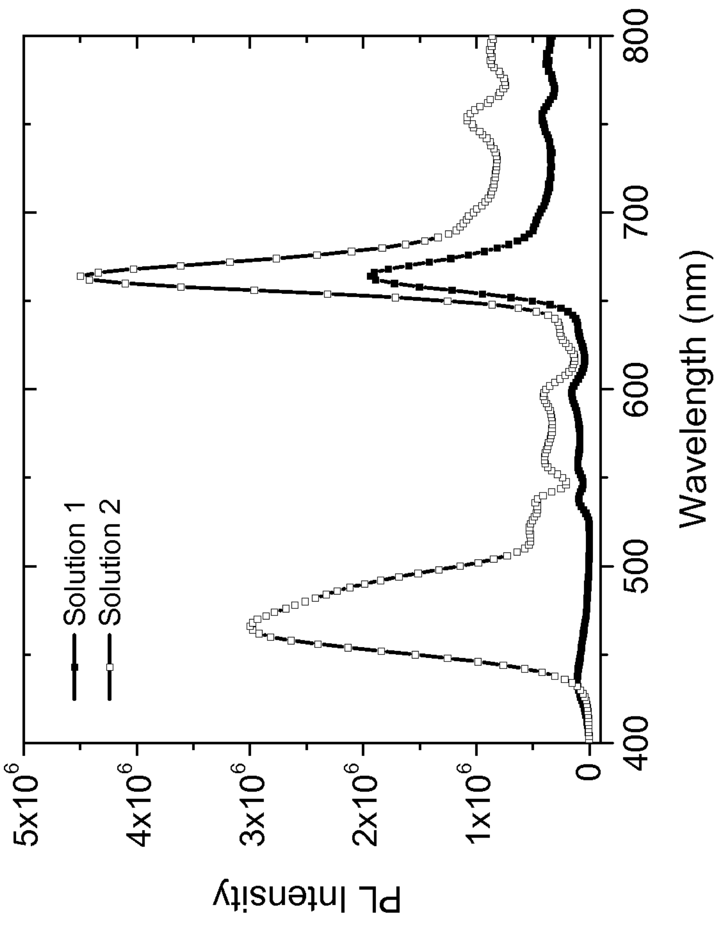
FIG. 5. shows the emission spectra of two TTA-UC solutions. Both solutions were excited at 544 nm.
Figure 6:
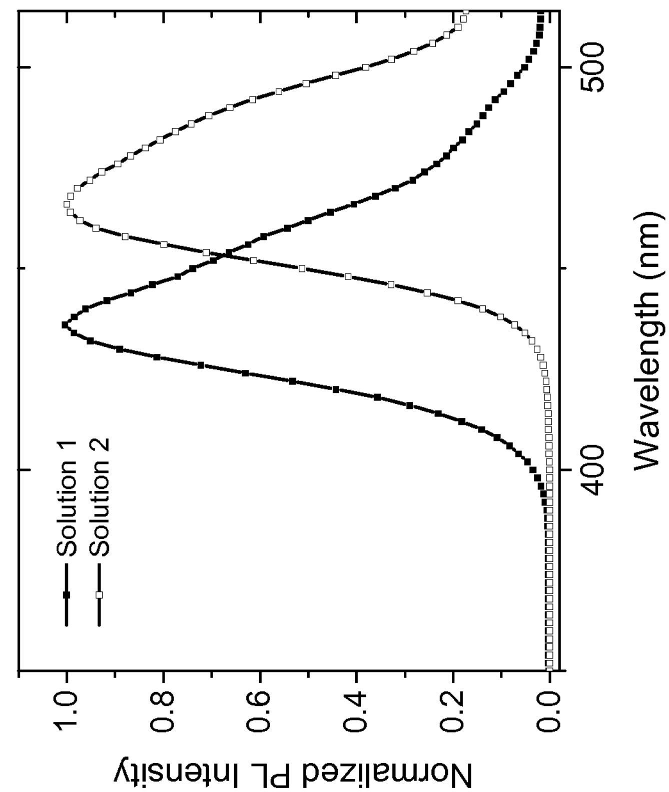
FIG. 6 shows the normalized up converted emission spectra of Solution 1 and Solution 2.
Figure 7:
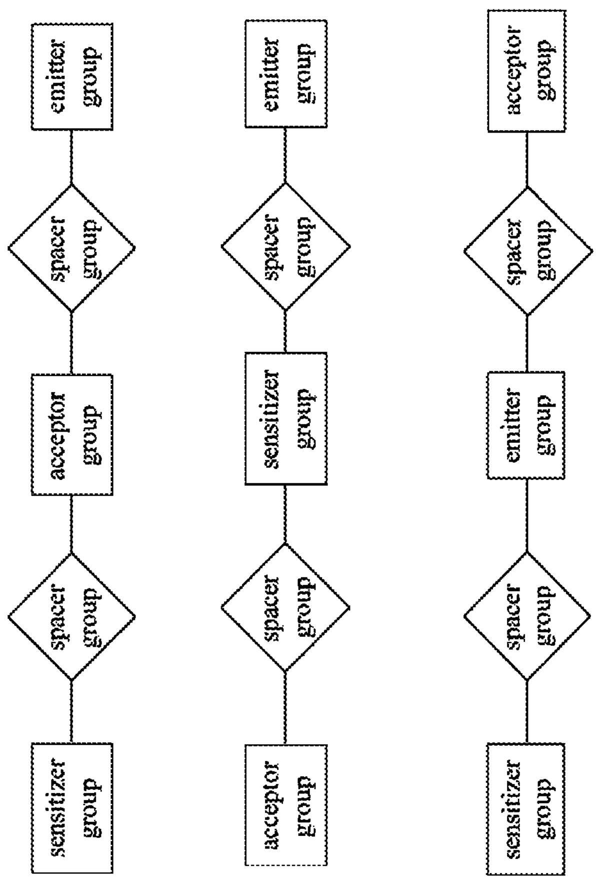
FIG. 7 shows a schematic drawing of TTA-UC compounds.

FIG. 5 shows the emission spectra of solution 1 and solution 2 with absolute intensities. Up conversion is clearly seen from both solutions. Solution 1 shows the up converted emission of DPA at 435 nm and residual emission from PdOEP at 663 nm. Solution 2 shows the emission from Compound E at 466 nm and residual emission from PdOEP at 663 nm. FIG. 6 shows the normalized up conversion spectra of both solutions. The emission from DPA in solution 2 is absent due the efficient energy transfer from DPA to Compound E. From FIG. 7, it can be seen that the up conversion emission intensity of solution 2 is much higher than that of solution 1, which may be due to the higher PLQY of the emitter than the acceptor. Therefore, it is advantageous to have an additional emitter in the TTA-UC system to achieve higher efficiency. The acceptor concentration can be further increased to obtain more efficient TTA. The energy can quickly transfer to the emitter to maintain high PLQY. Therefore, higher total up conversion efficiency can be realized through the formulation of the present invention.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

We claim:

1. A compound comprising:

a sensitizer group;

an acceptor group; and an emitter group;

wherein the sensitizer group, the acceptor group, and the emitter group are connected together through covalent bonds by a plurality of spacer groups;

wherein the acceptor group has a first triplet energy lower than a first triplet energy of the sensitizer group;

wherein the emitter group has a first singlet energy lower than a first singlet energy of the acceptor group; and wherein the compound is capable of performing triplet-triplet annihilation upconversion of light incident on the compound resulting in an emission of luminescent radiation that includes a radiation component from the first singlet energy of the emitter.

2. A device comprising an organic layer that includes the compound of claim 1, wherein the device is selected from the group consisting of a consumer product, an electronic component module, an organic light-emitting device, a lighting panel, a light emitting diode, and a photovoltaic device.

3. The compound of claim 1, wherein the emitter group has a first triplet energy higher than the first triplet energy of the acceptor group.

4. The compound of claim 1, wherein the emitter group has a first triplet energy higher than the first triplet energy of the sensitizer group; and the first singlet energy of the emitter group is higher than a first singlet energy of the sensitizer group.

5. The compound of claim 1, wherein the sensitizer group is selected from the group consisting of: an iridium complex, an osmium complex, a platinum complex, a palladium complex, a rhenium complex, a ruthenium complex, and a gold complex.

6. The compound of claim 1, wherein the sensitizer group is selected from the group consisting of:

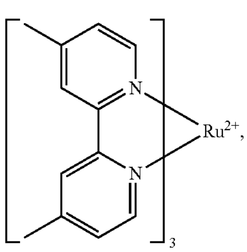

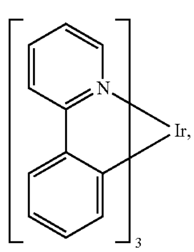

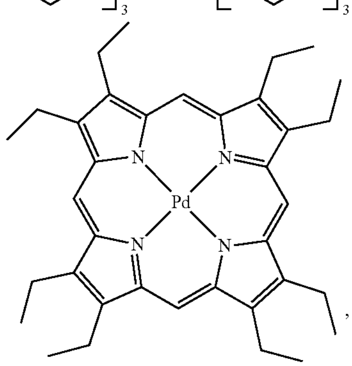

-continued

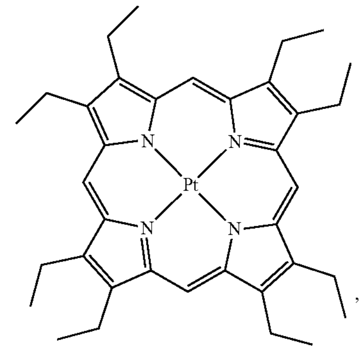

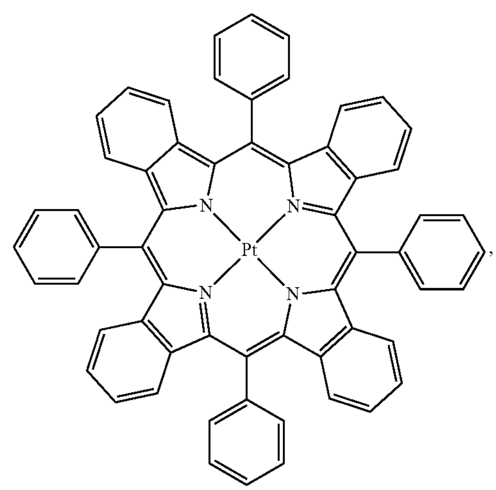

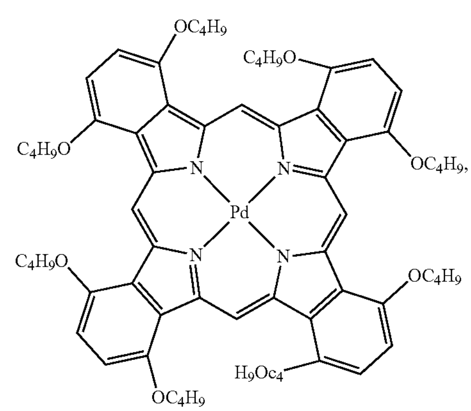

-continued

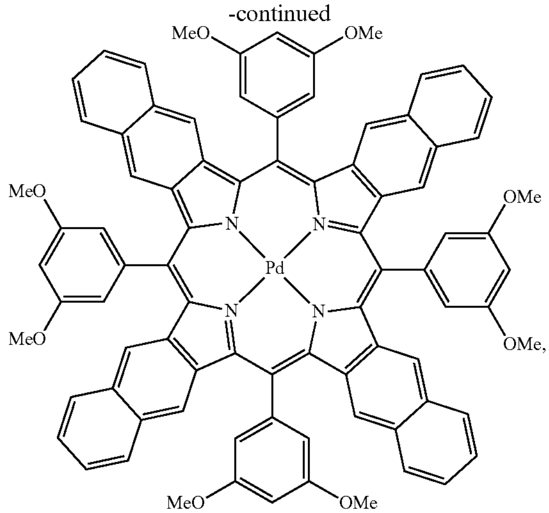

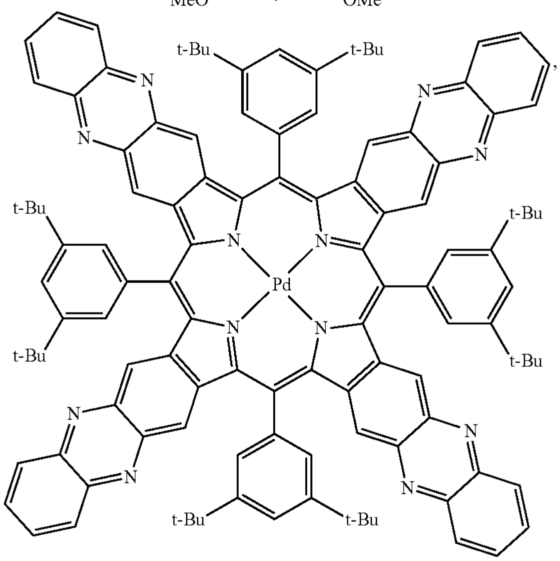

-continued

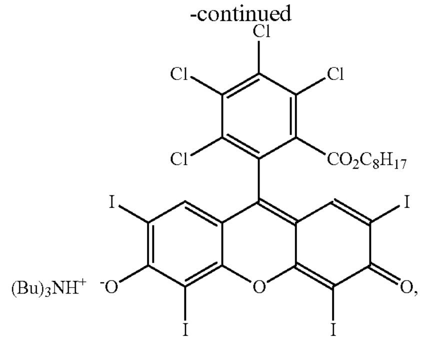
and

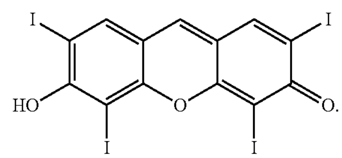

7. The compound of claim 1, wherein the acceptor group comprises a fused aromatic group.

8. The compound of claim 1, wherein the acceptor group comprises a group selected from the group consisting of: naphthalene, anthracene, tetracene, pyrene, chrysene, perylene, and combinations thereof.

9. The compound of claim 1, wherein the acceptor group is selected from the group consisting of:

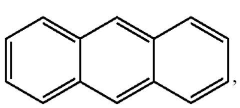,
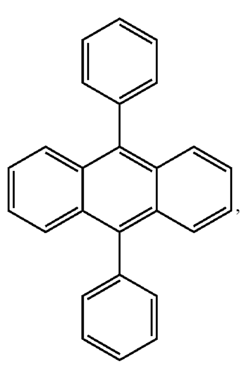,
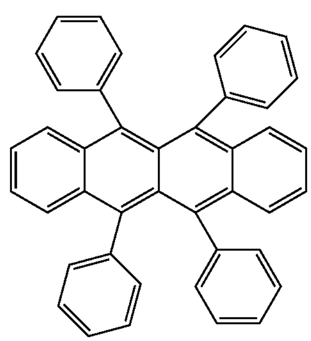,
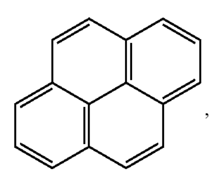,
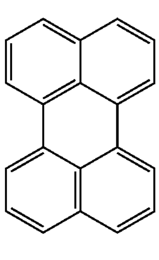,
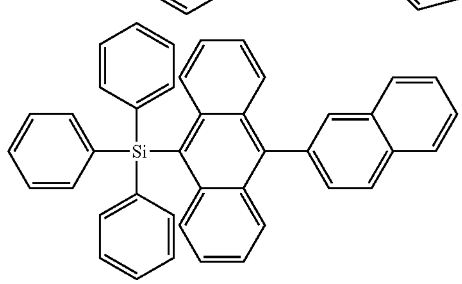,
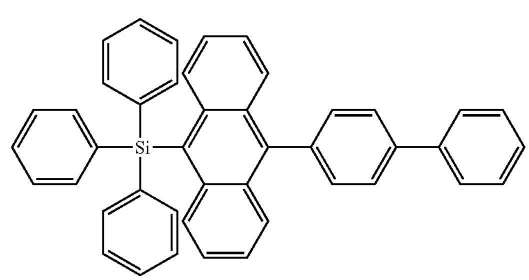, -continued
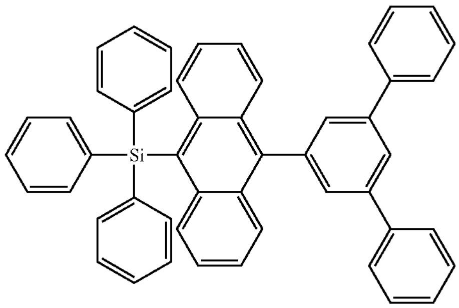
,
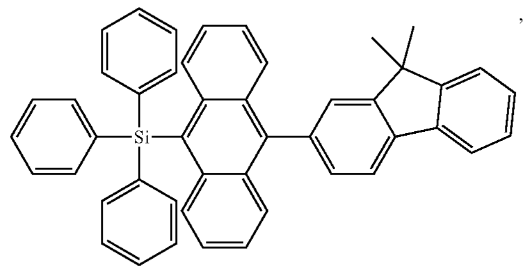
,
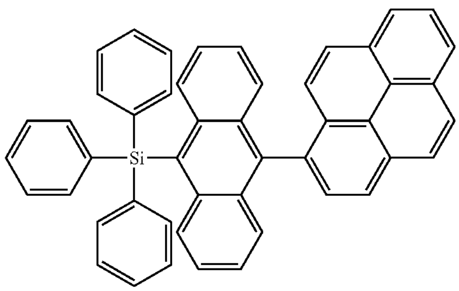
,
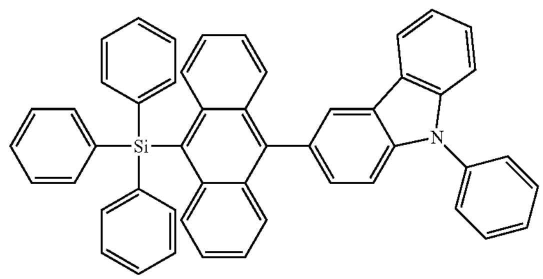
,
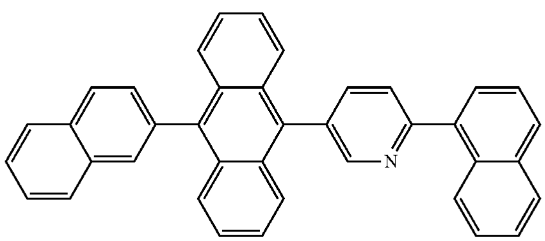
,
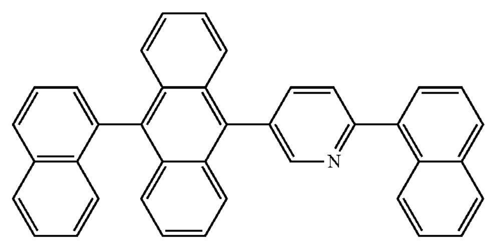
,
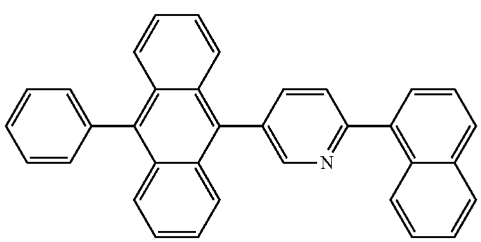
,
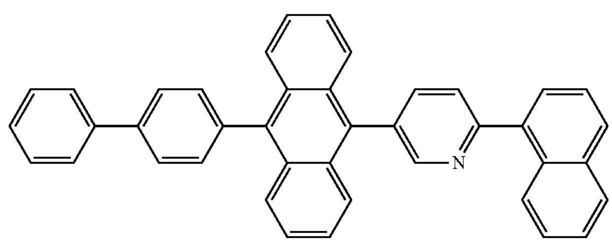
,
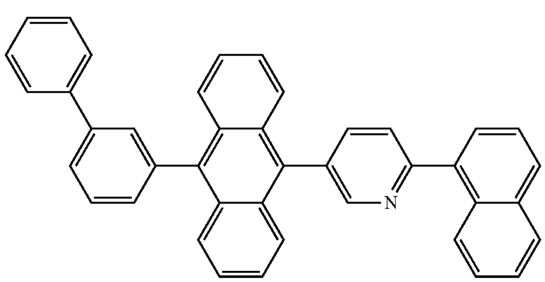
,
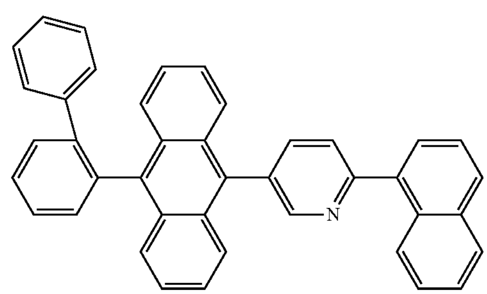
,
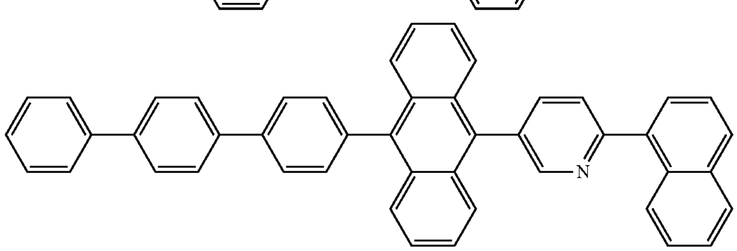
, -continued
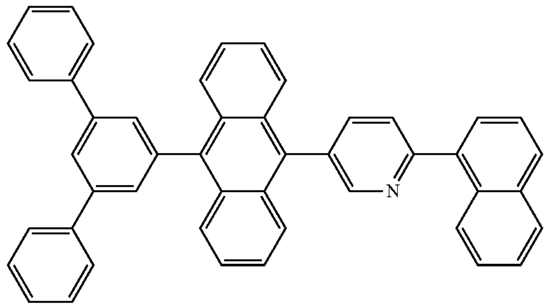
,
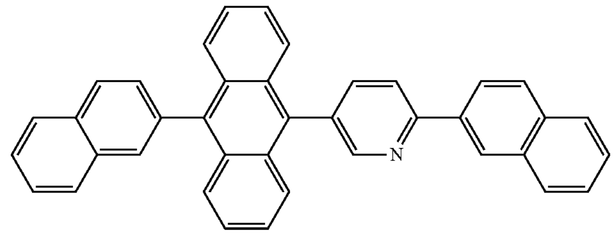
,
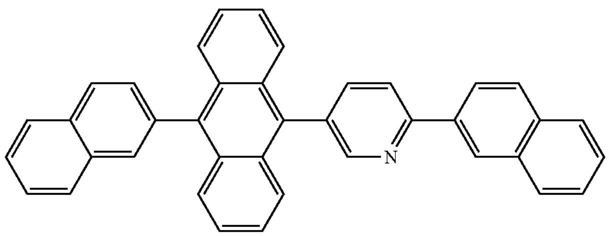
,
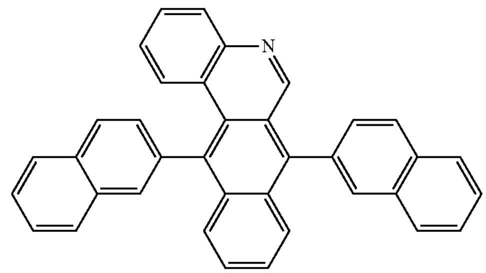
,
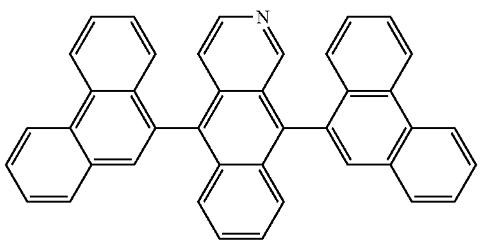
,
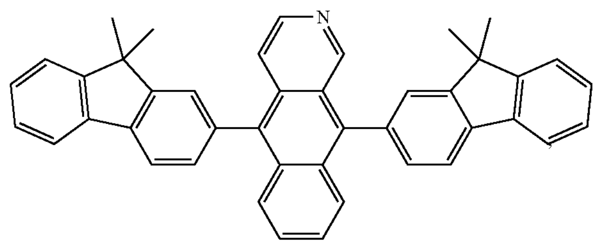
,
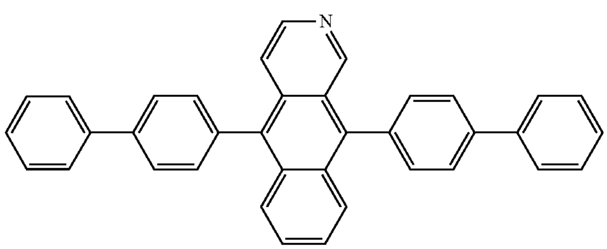
,
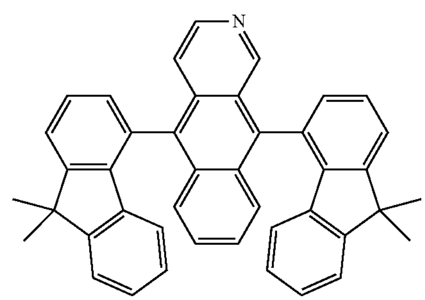
,
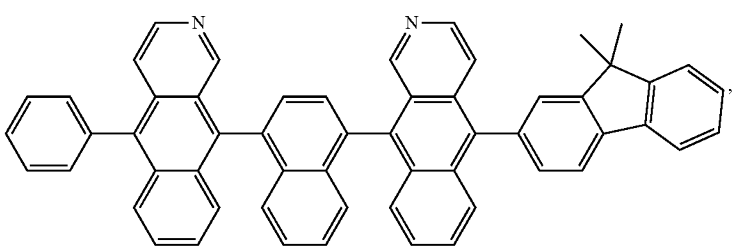
,
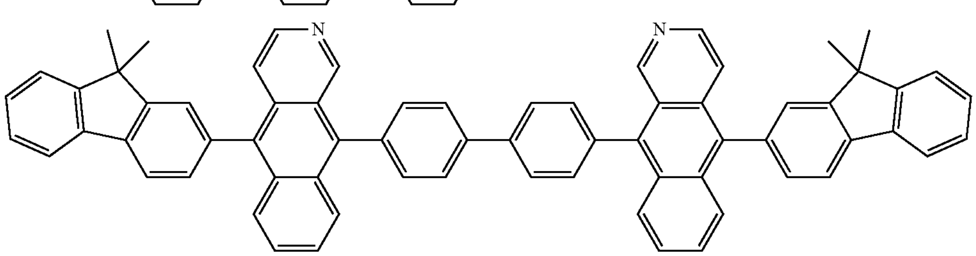
, -continued
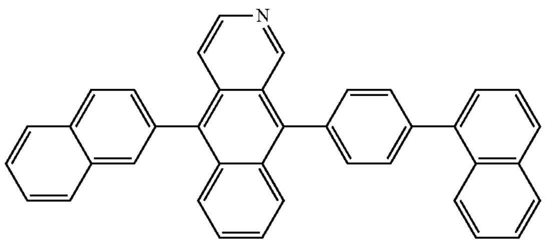,
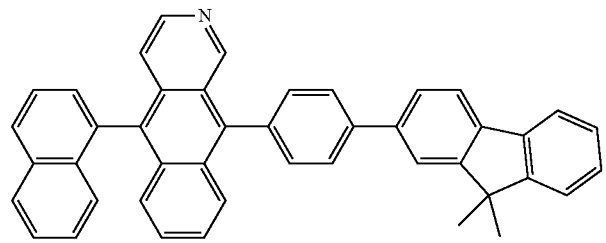,
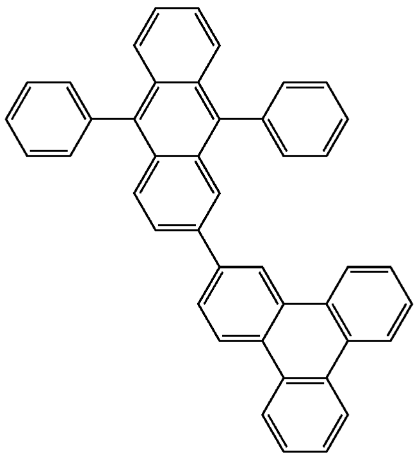,
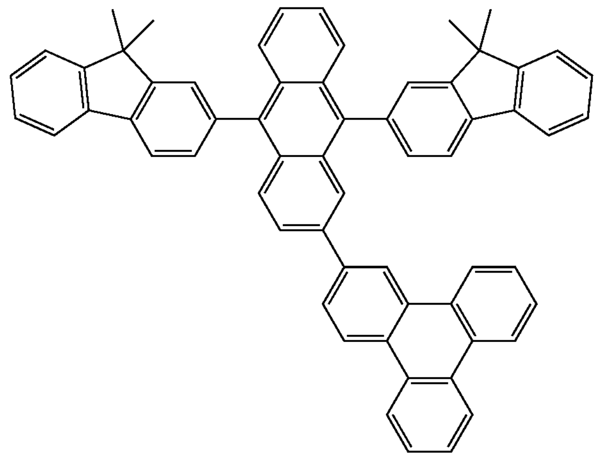,
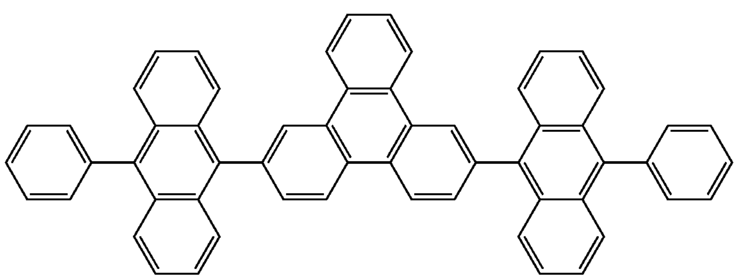,
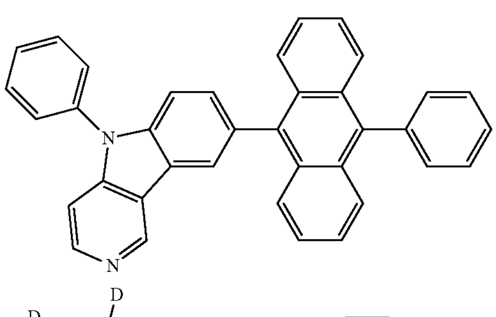,
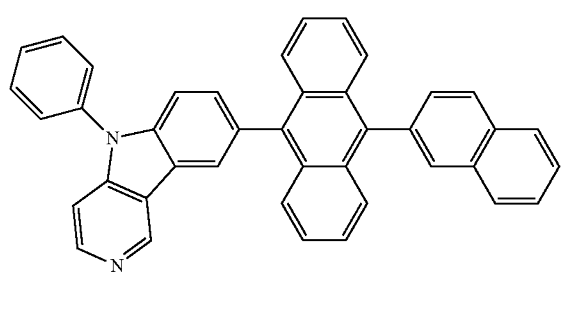,
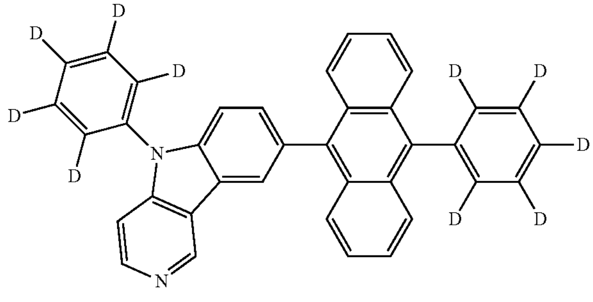, -continued
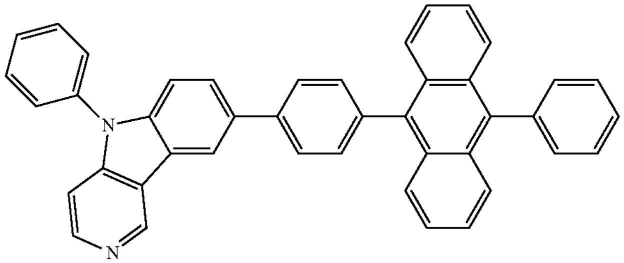
,
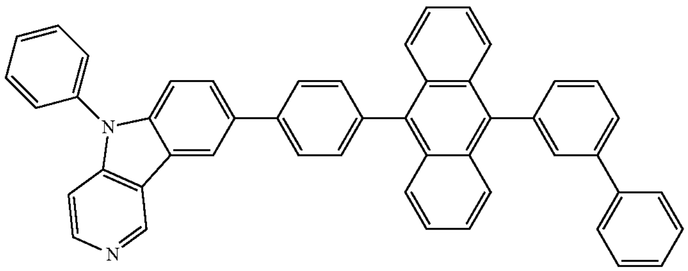
,
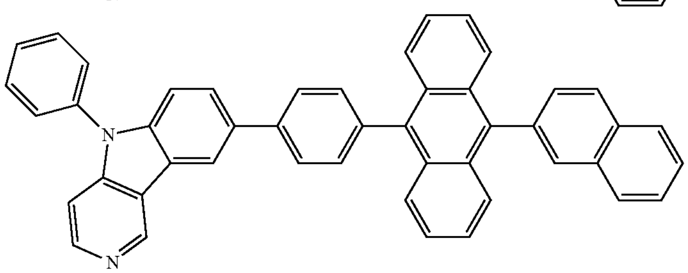
,
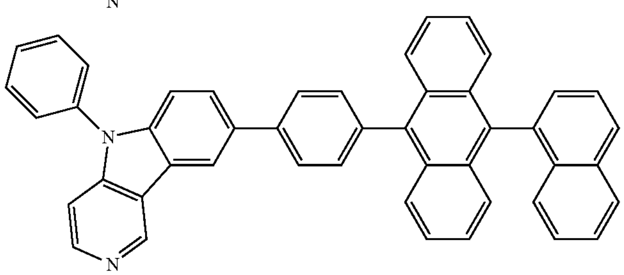
,
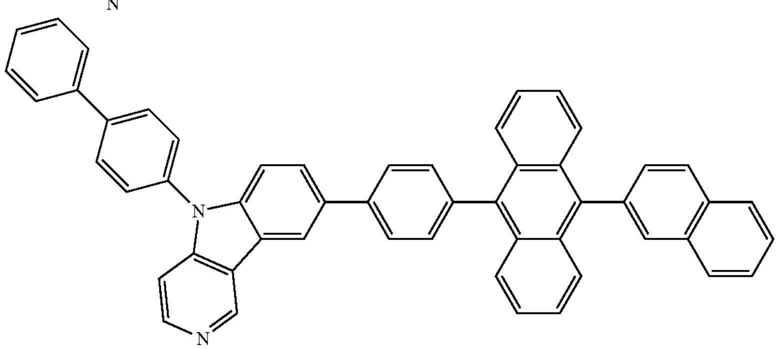
,
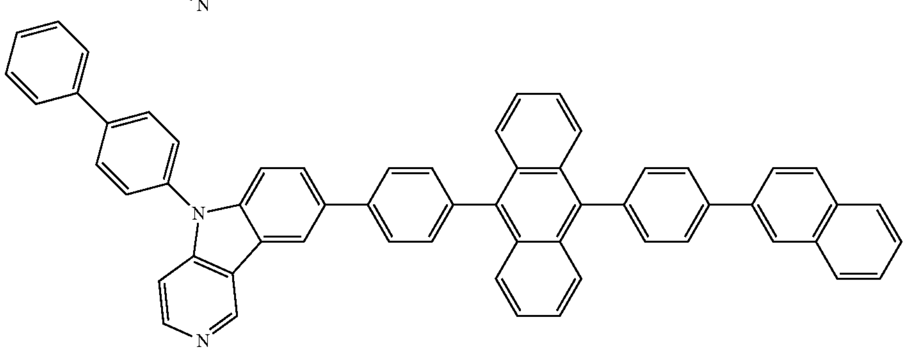
, -continued
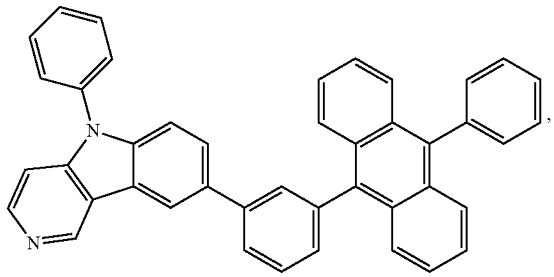
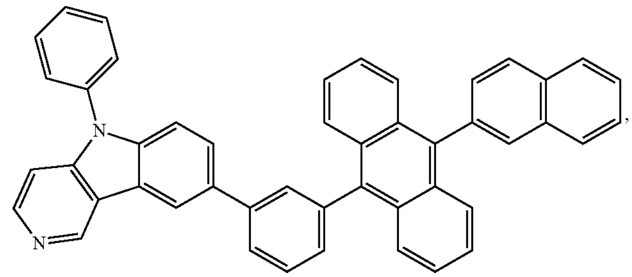
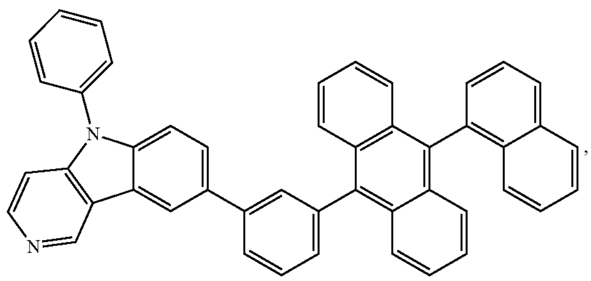
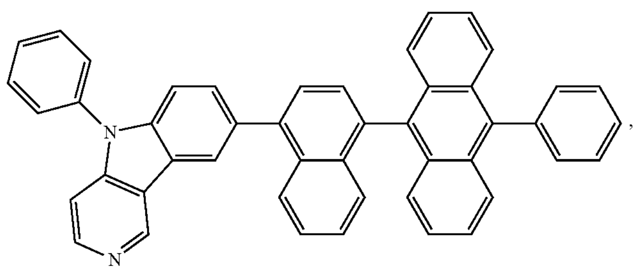
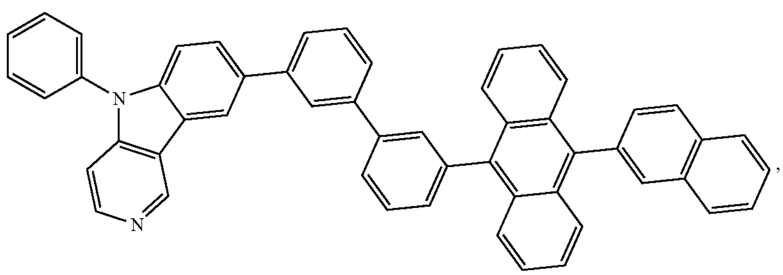
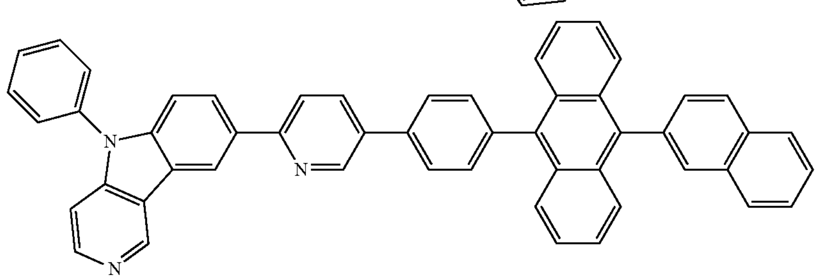
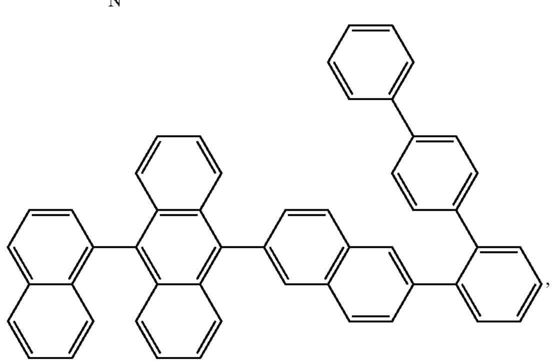
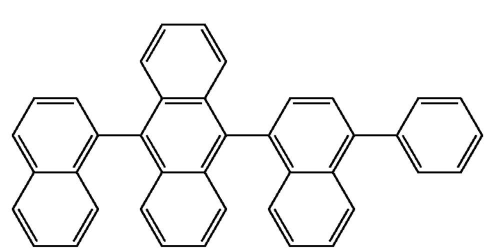

-continued
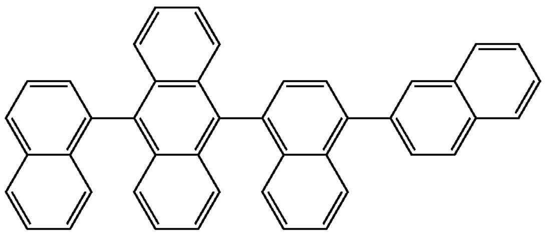,
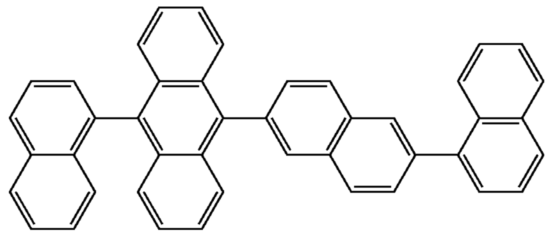,
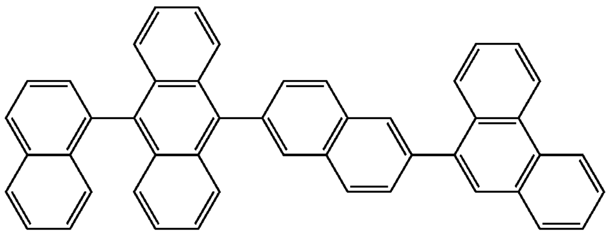,
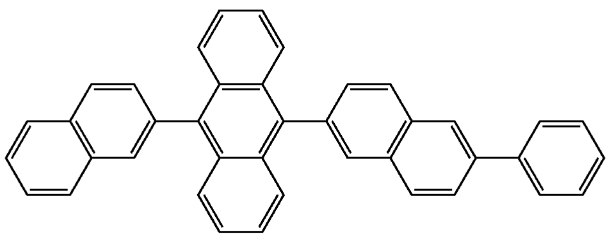,
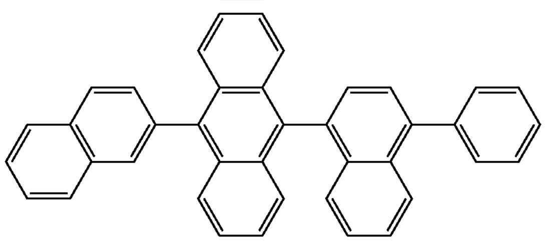,
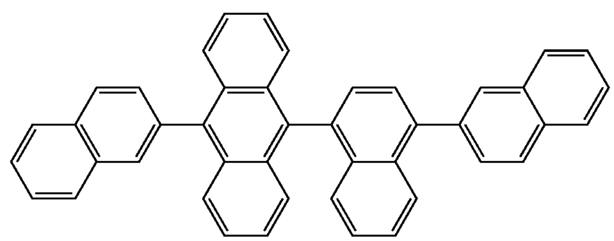,
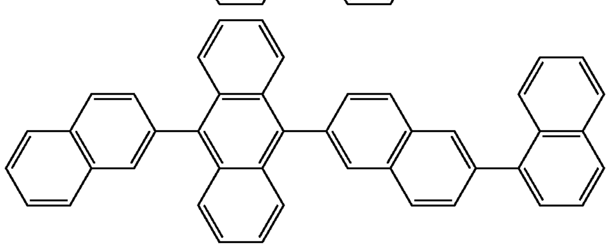,
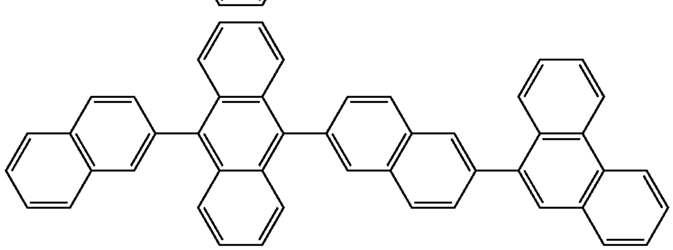,
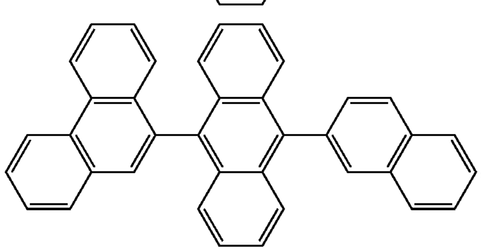,
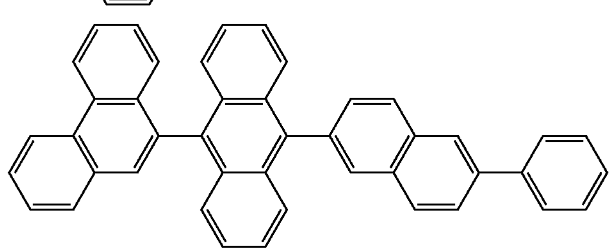, -continued
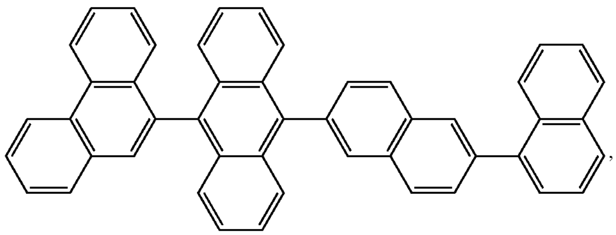
,
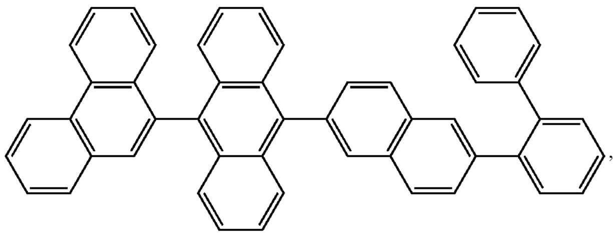
,
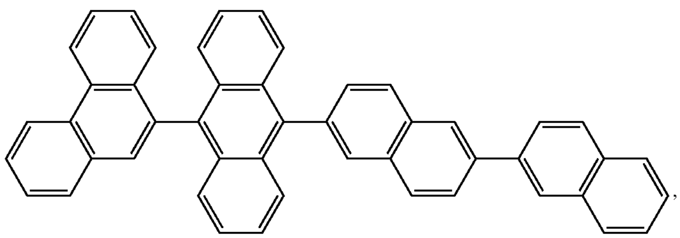
,
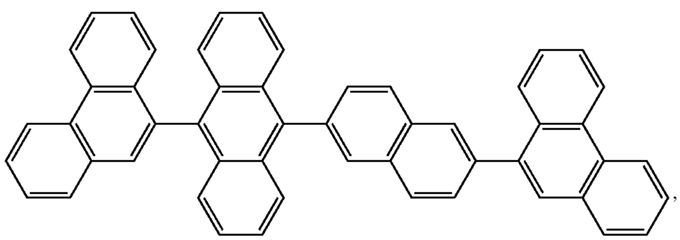
,
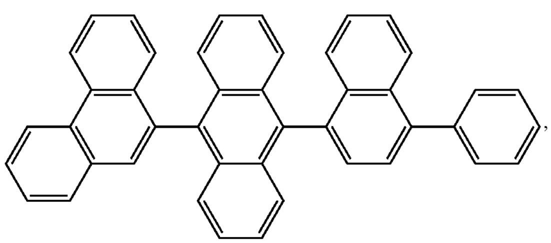
,
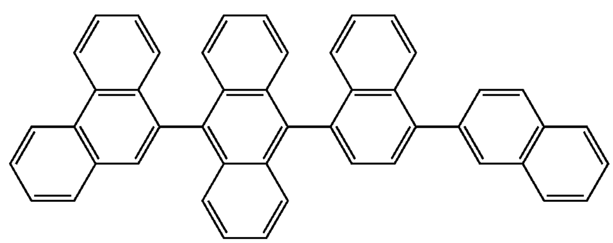
,
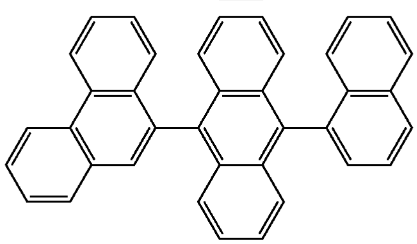
,
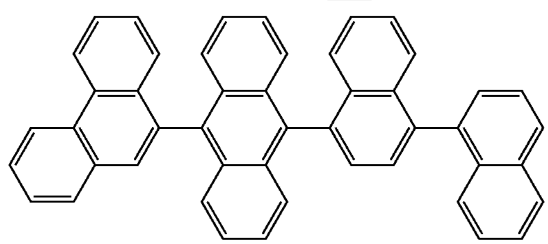
,
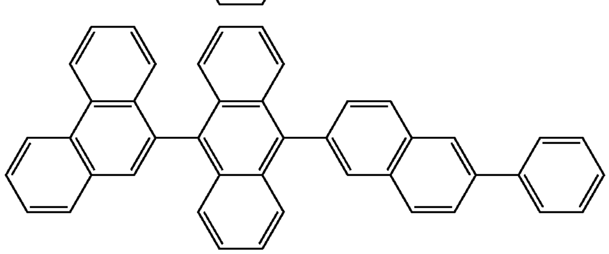
,
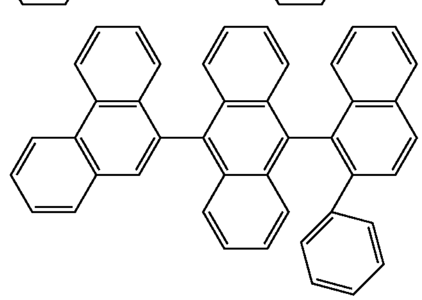
, -continued
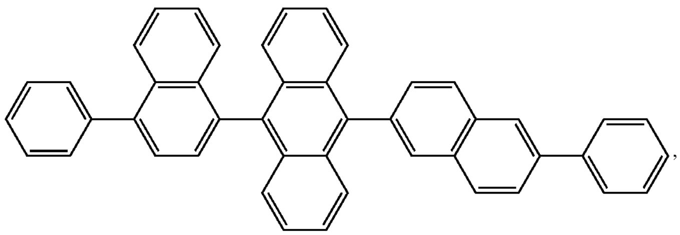
,
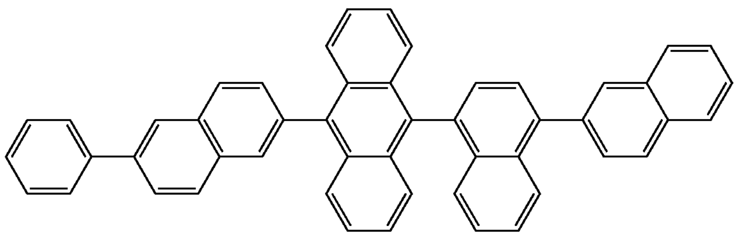
,
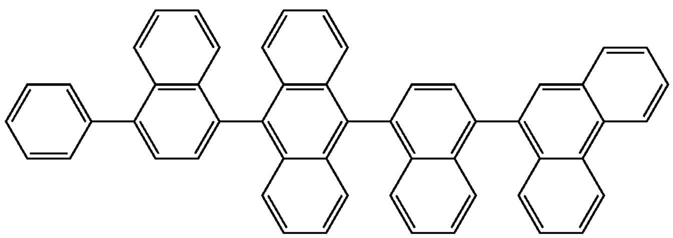
,
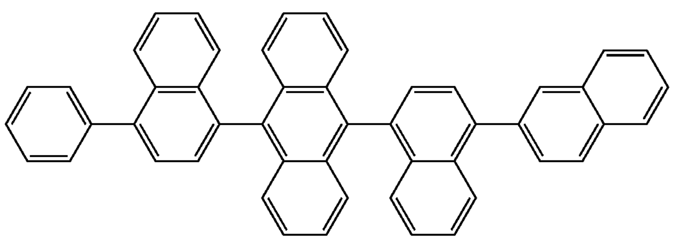
,
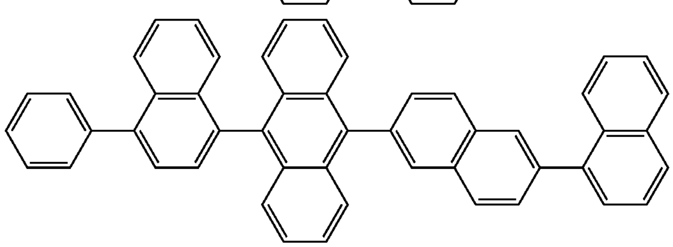
,
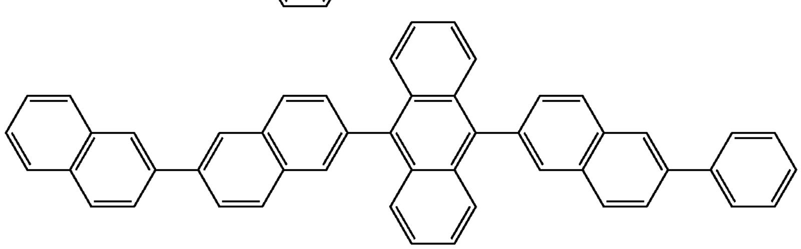
,
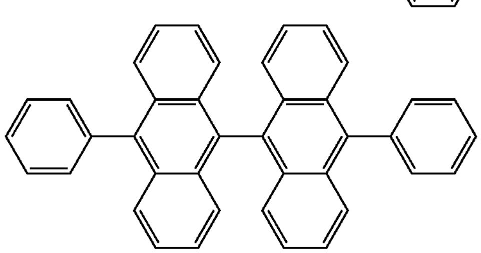
, -continued
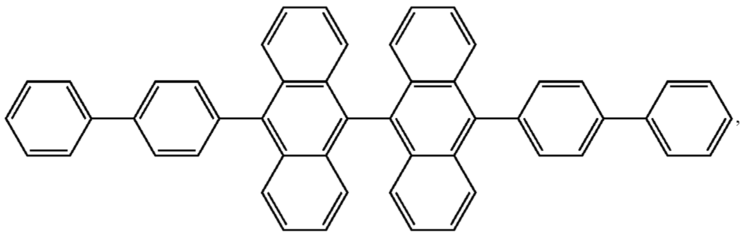
,
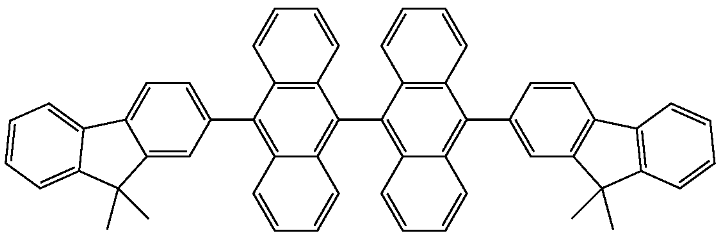
,
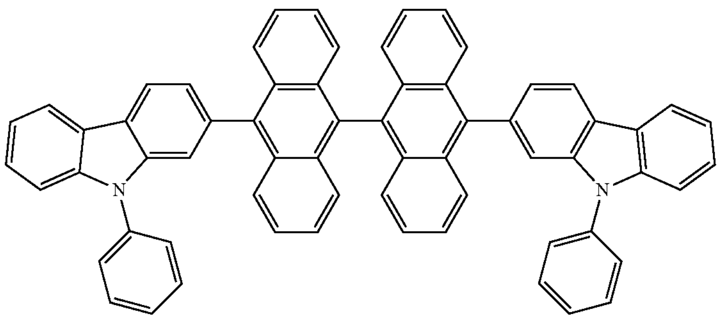
,
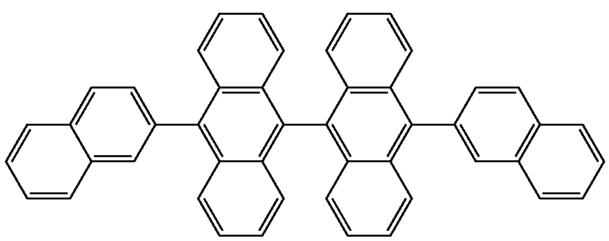
,
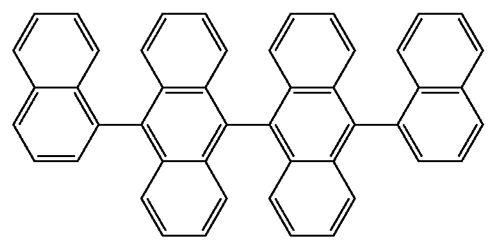
,
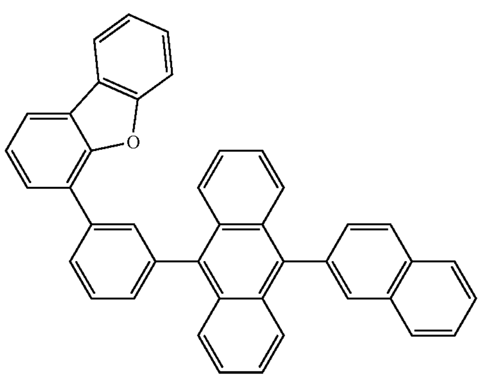
,
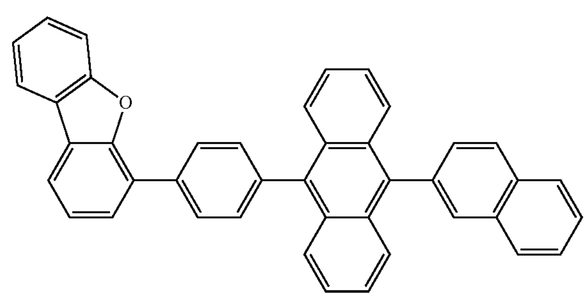
,
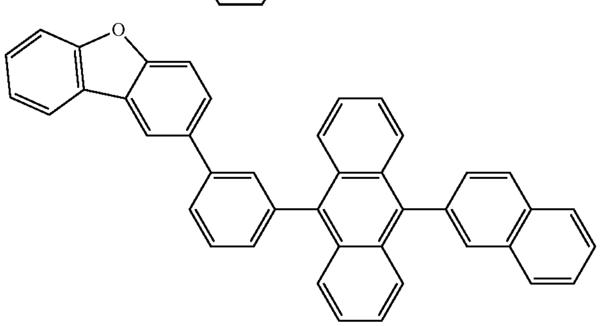
, -continued
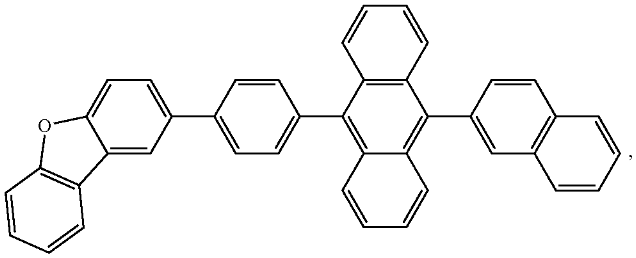
,
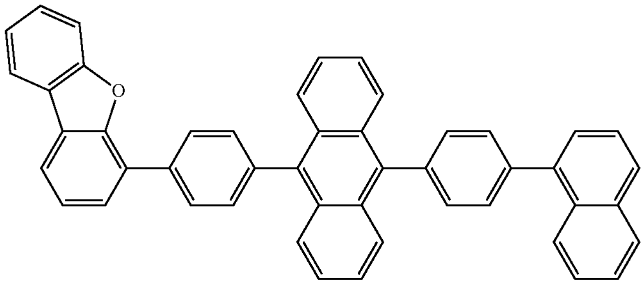
,
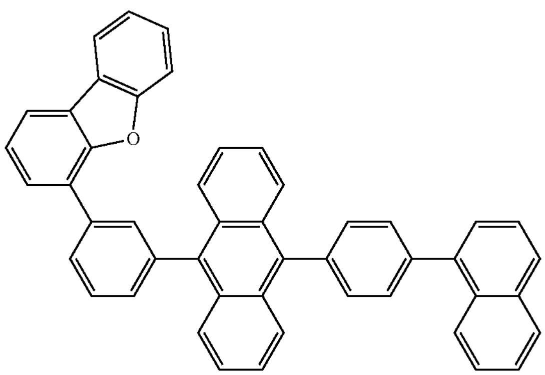
,
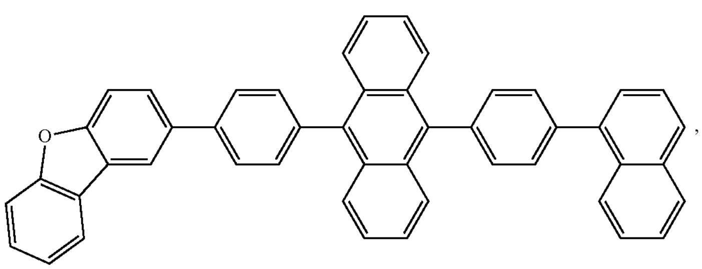
,
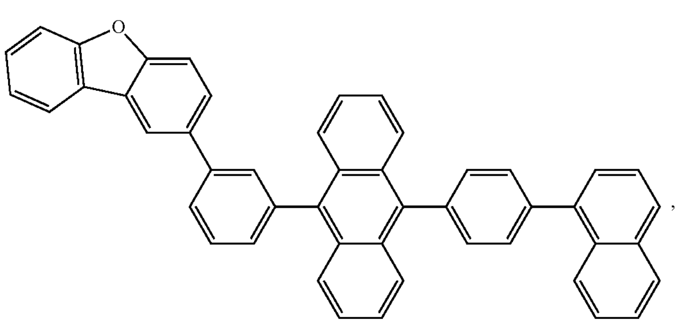
, -continued
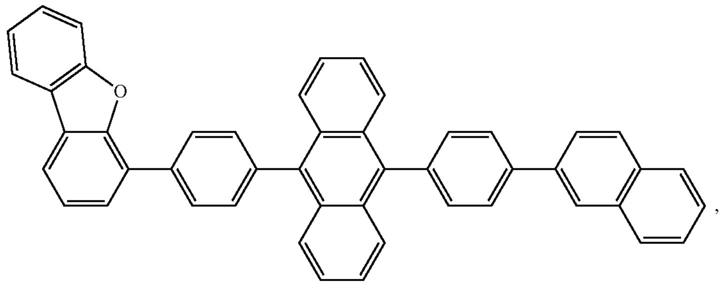
,
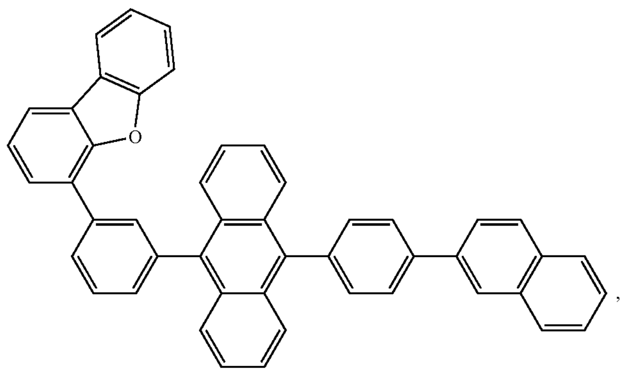
,
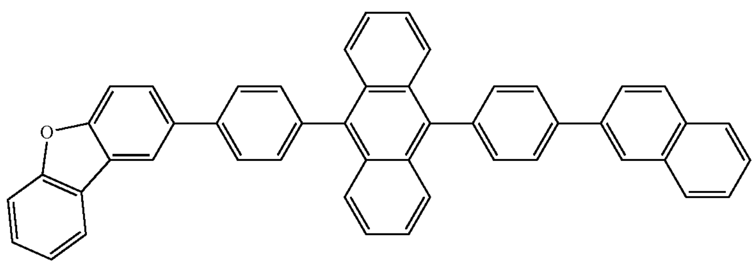
,
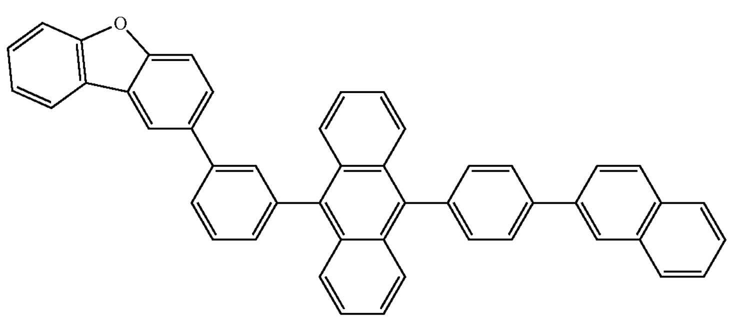
,
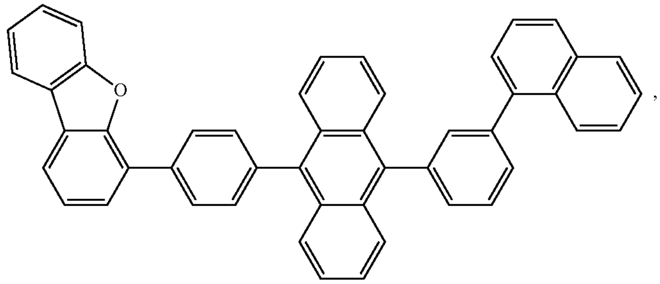
, -continued
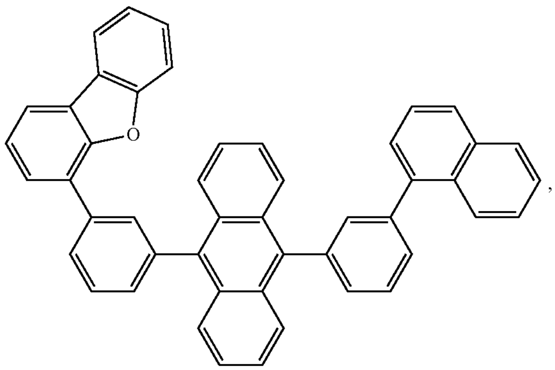
,
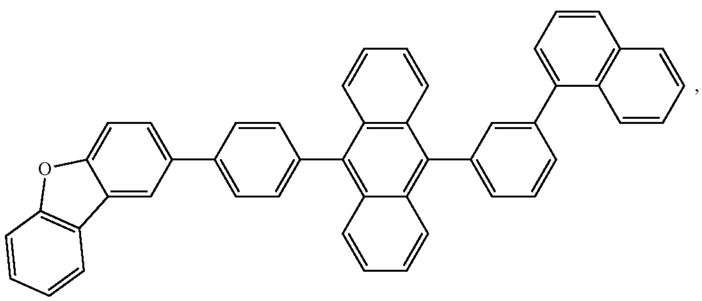
,
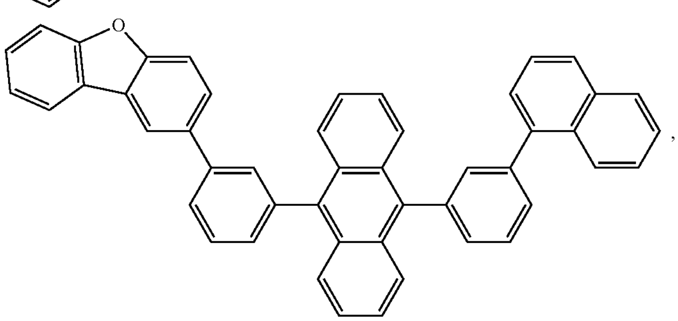
,
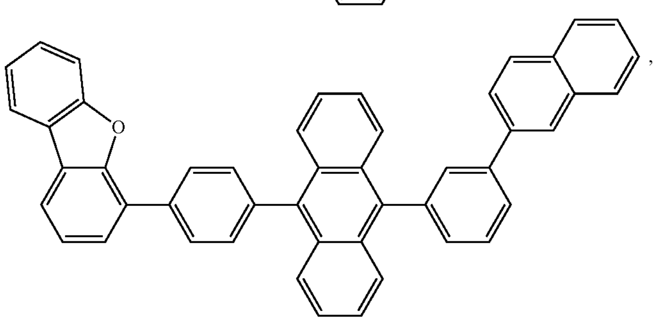
,
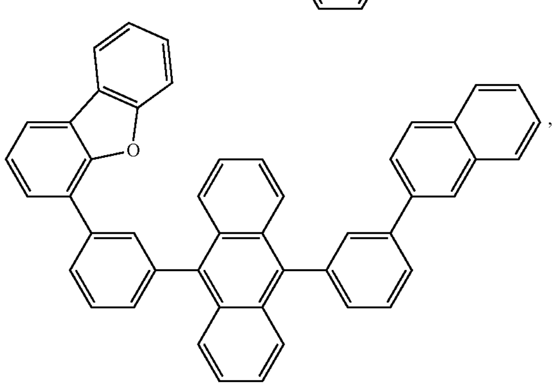
, -continued
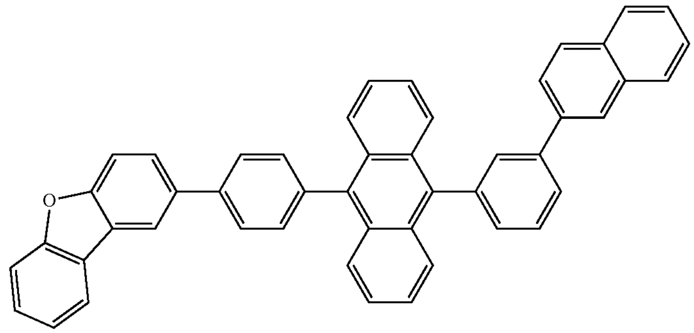
,
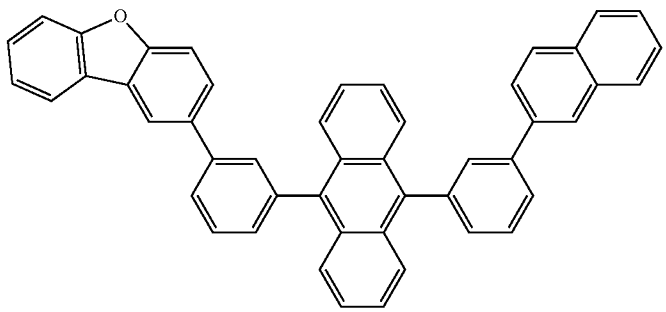
,
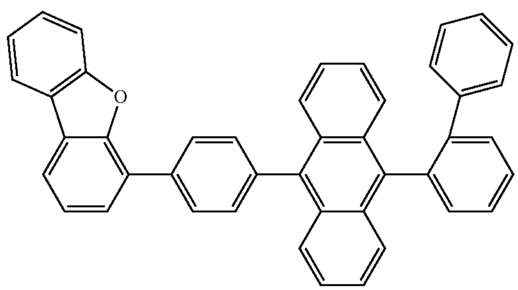
,
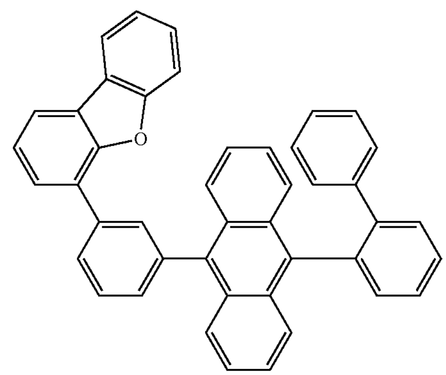
,
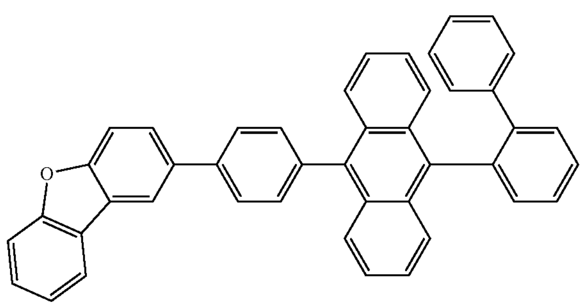
,
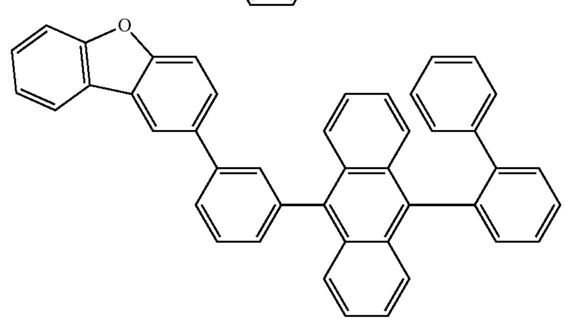
,
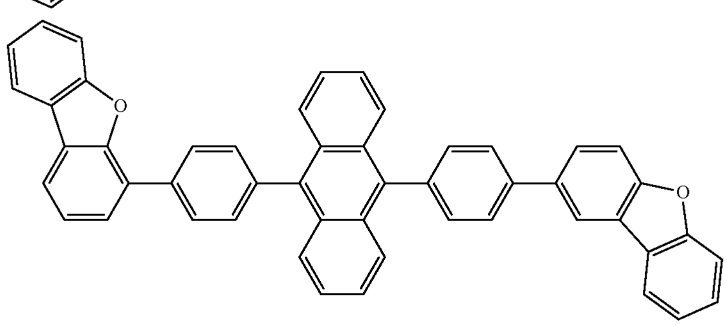
, -continued
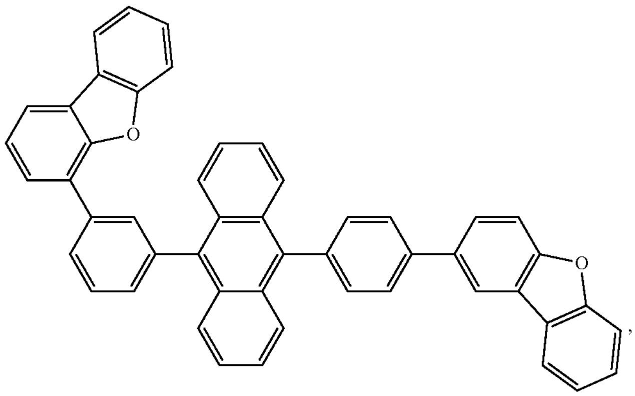
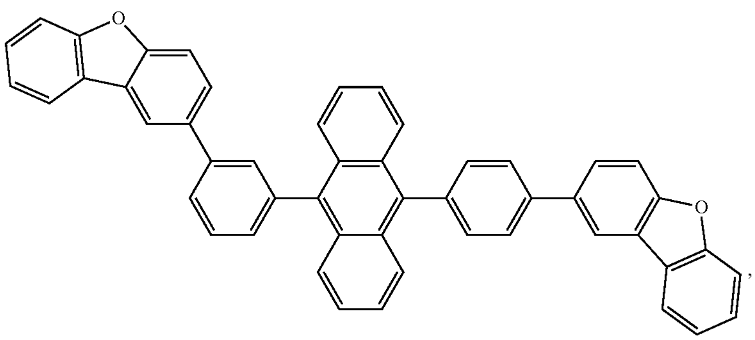
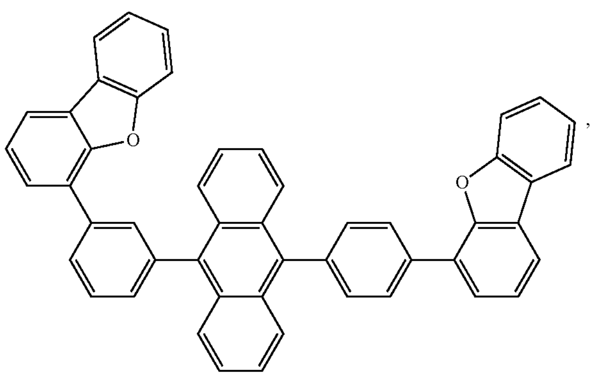
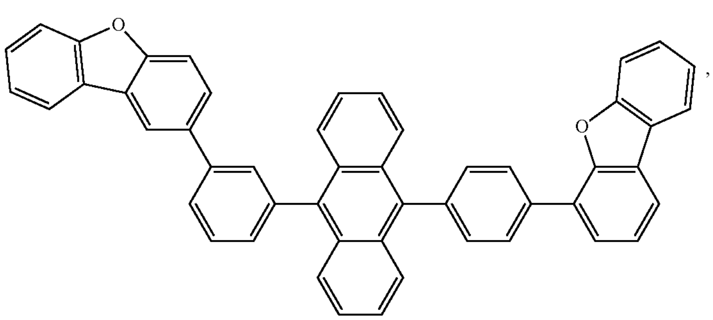

-continued
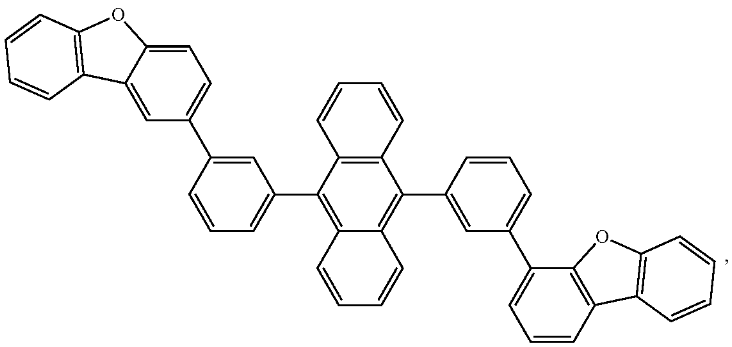
,
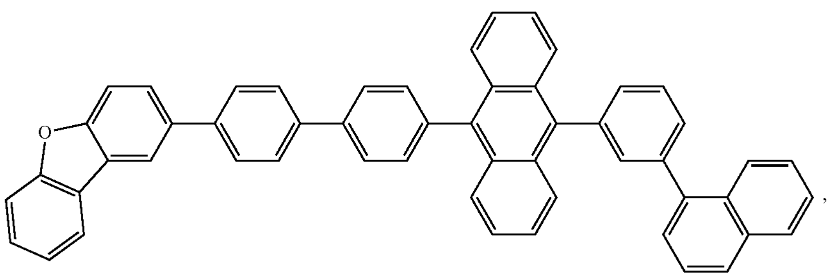
,
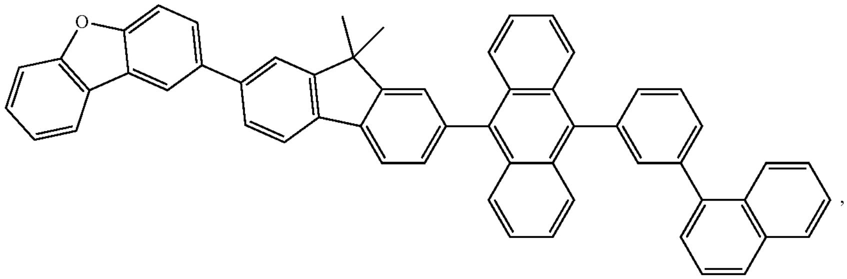
,
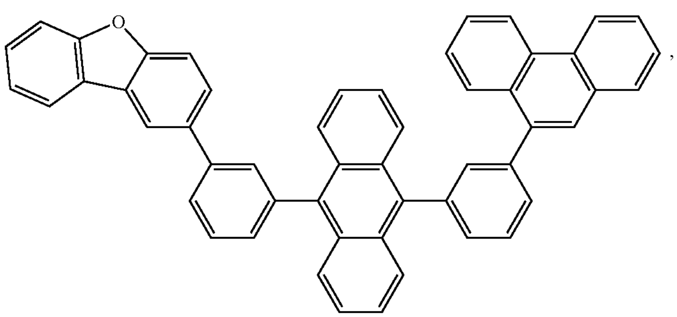
,
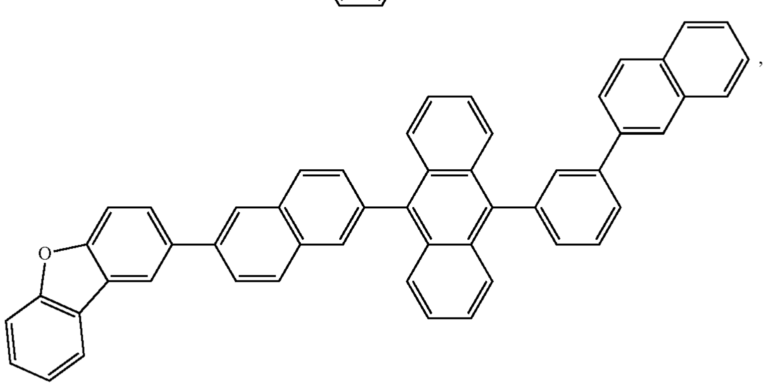
, -continued
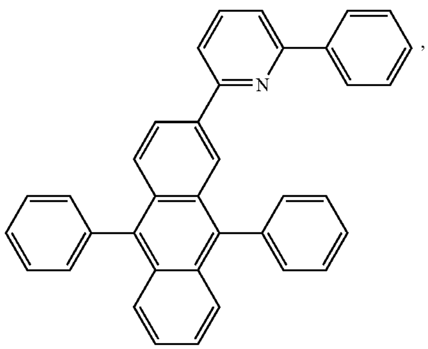
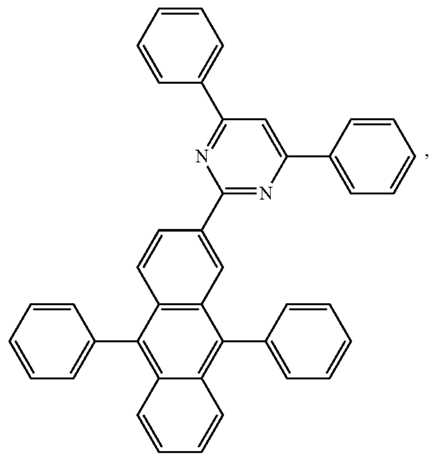
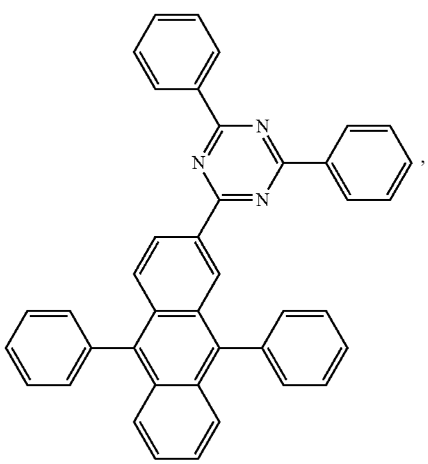
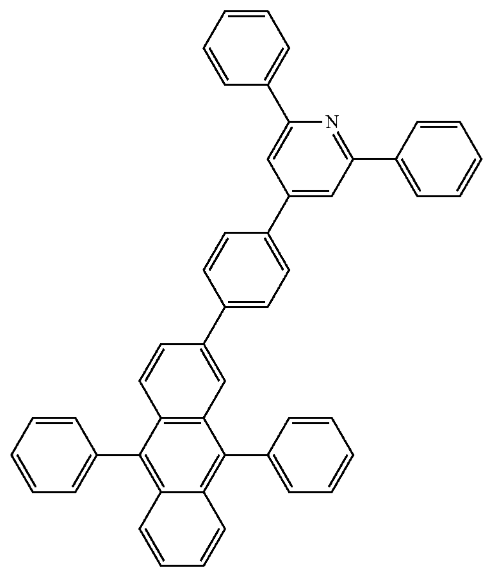
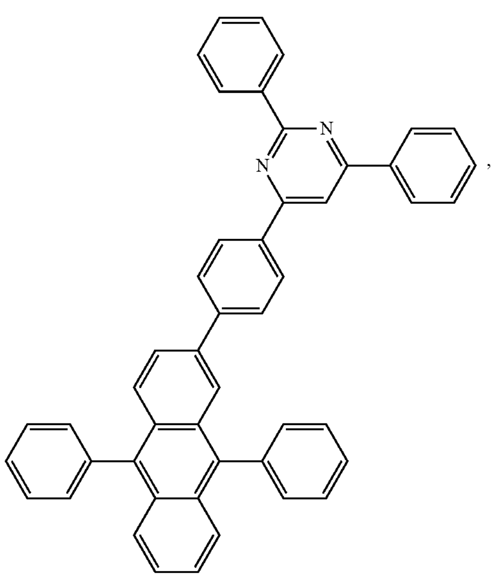
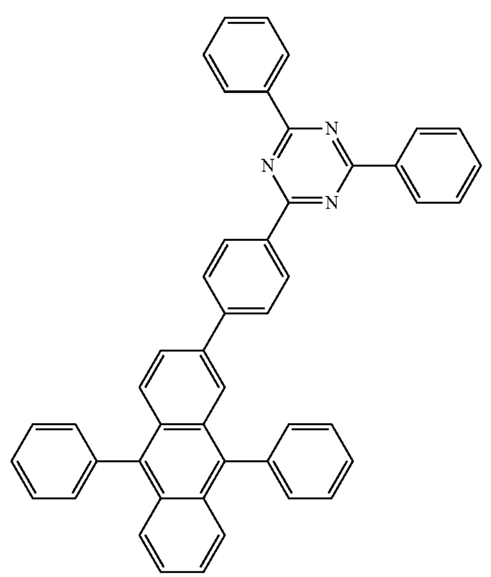

-continued
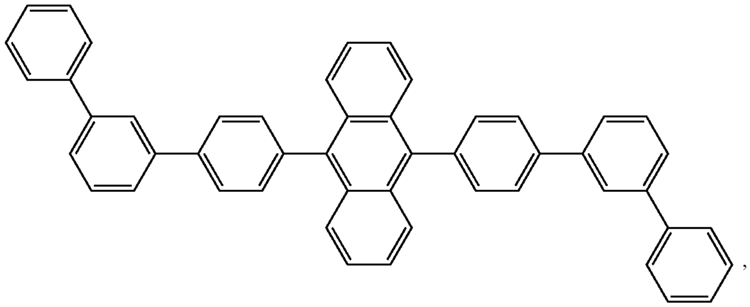
,
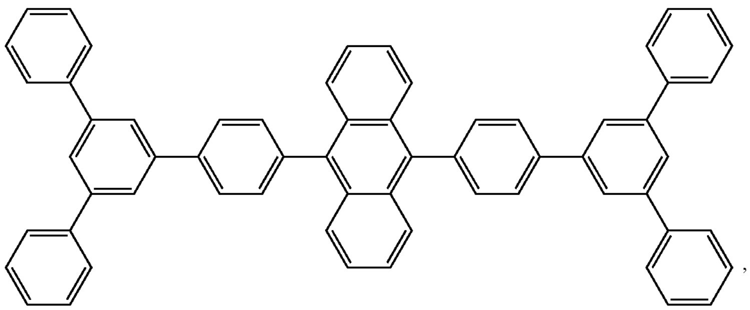
,
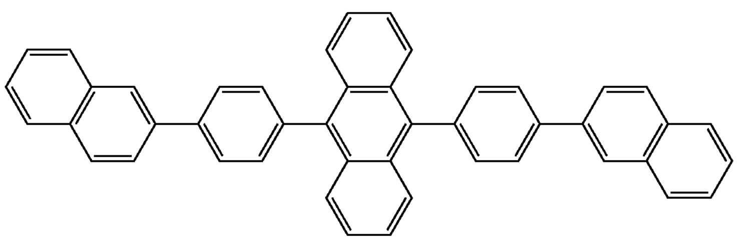
,
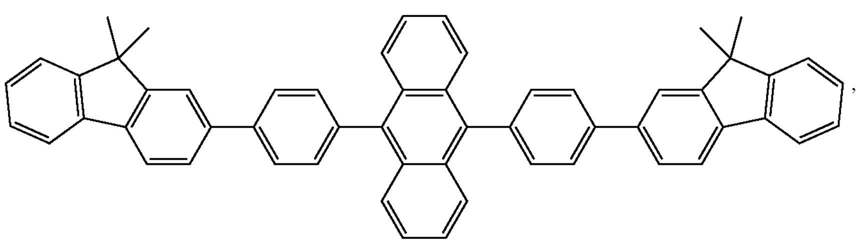
,
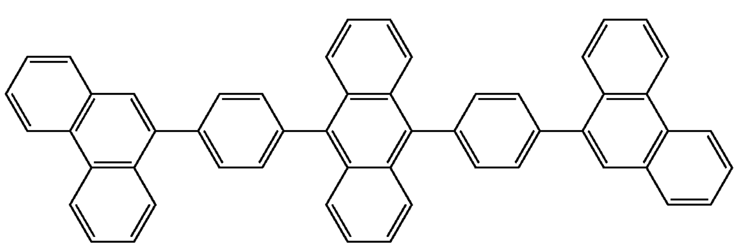
, -continued
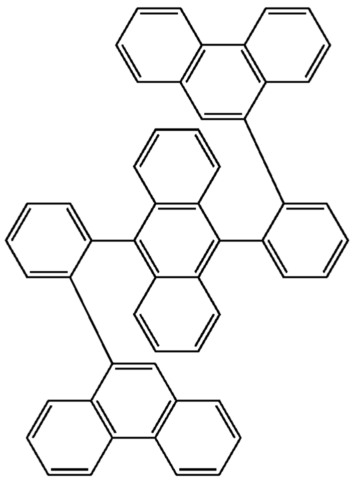
,
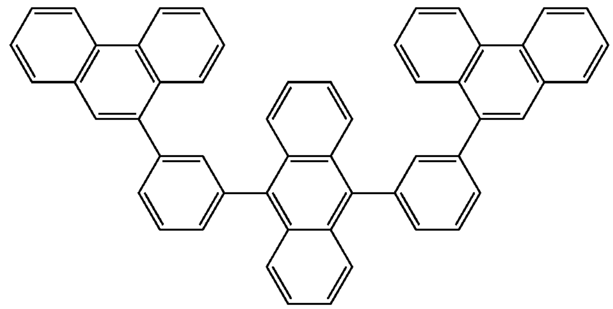
,
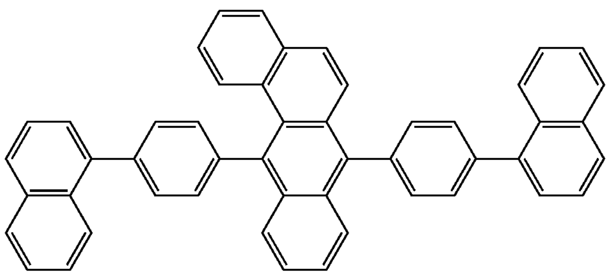
,
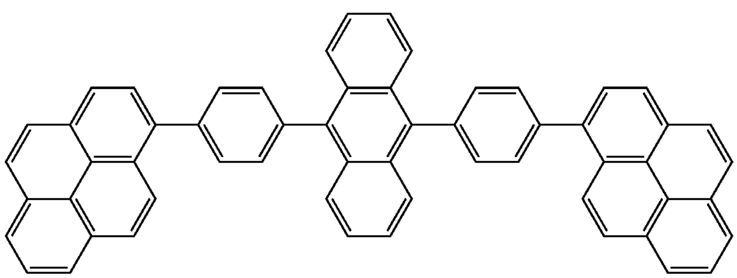
,
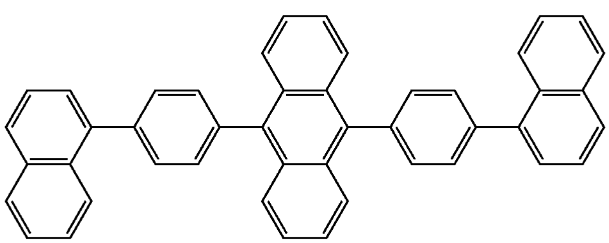
,
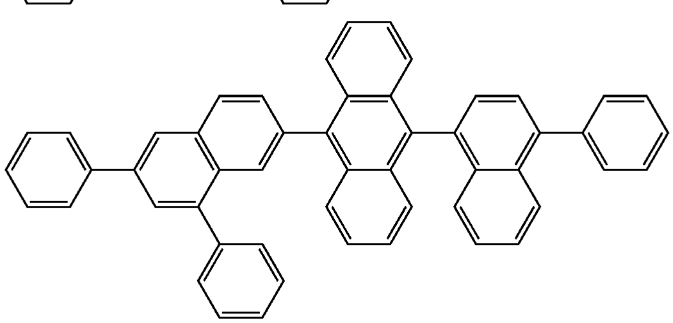
, -continued
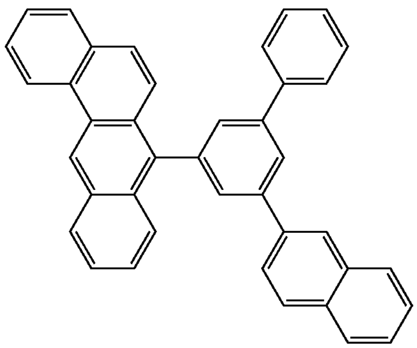
,
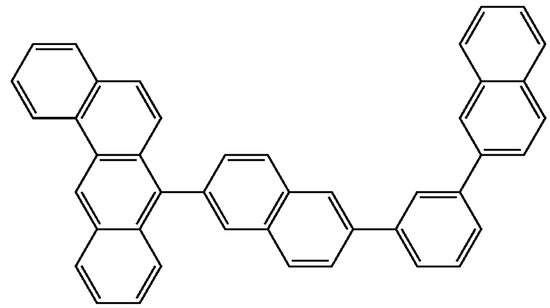
,
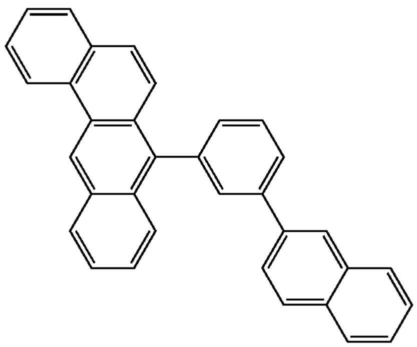
,
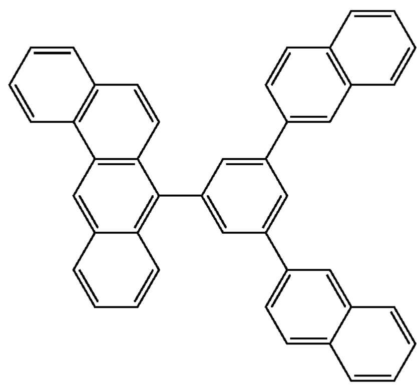
,
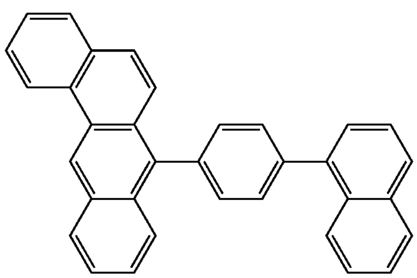
,
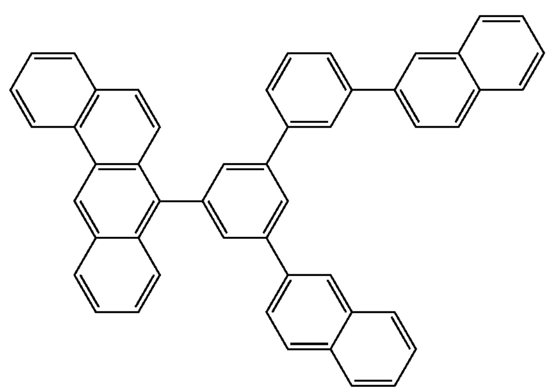
,
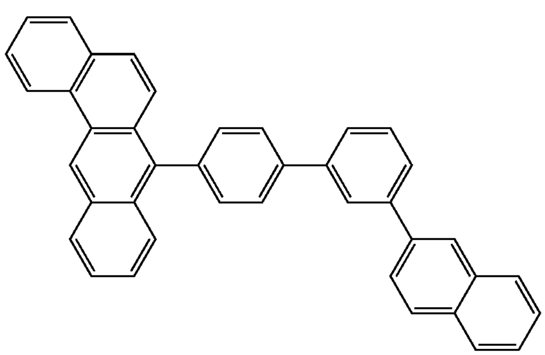
,
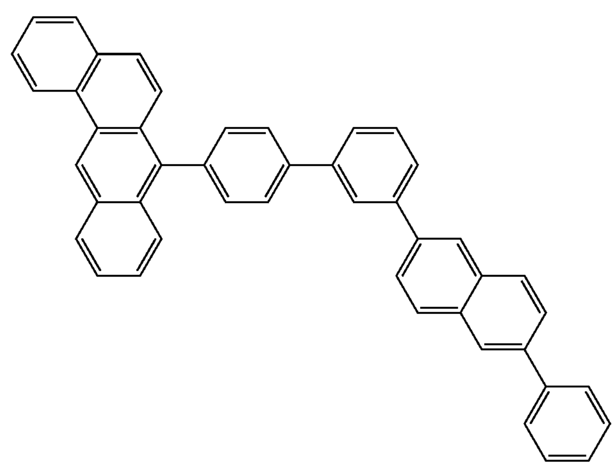
, -continued
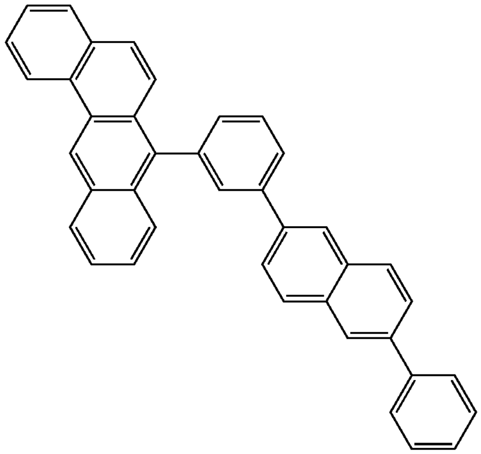,
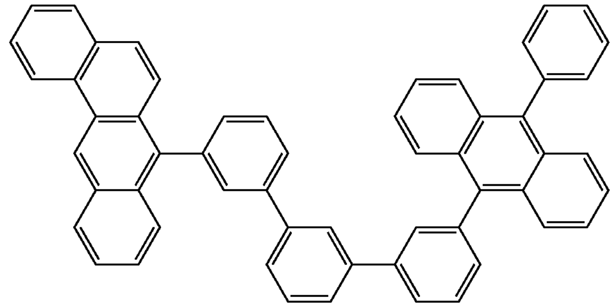,
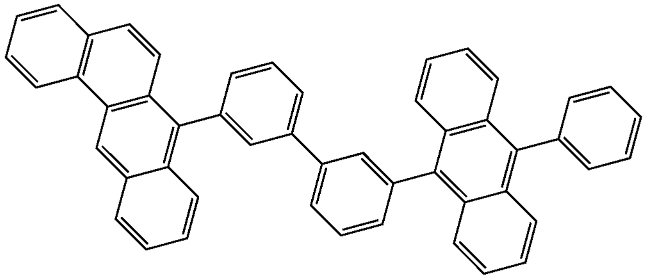,
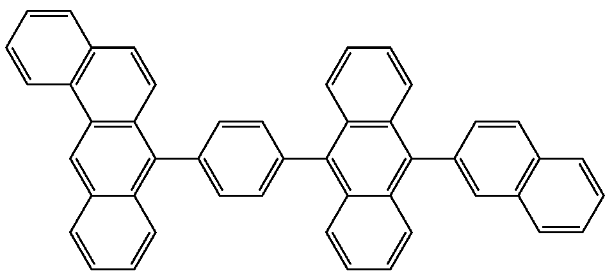,
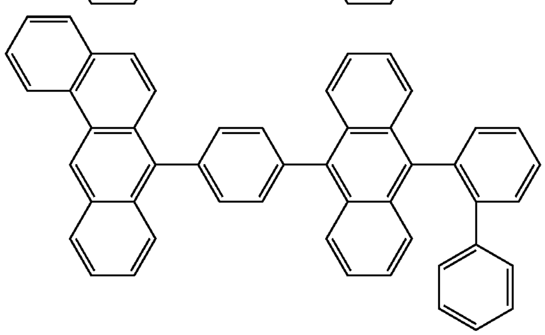,
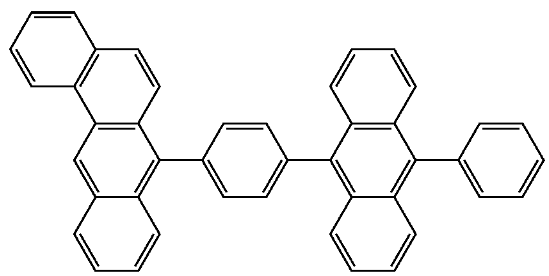,
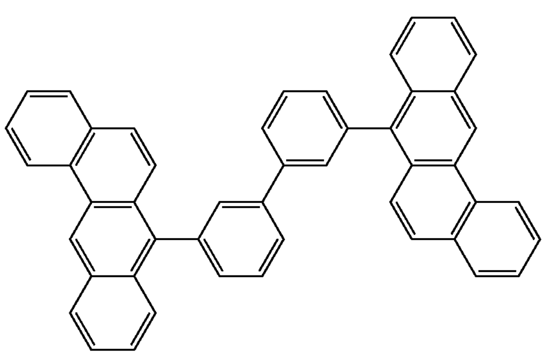, -continued
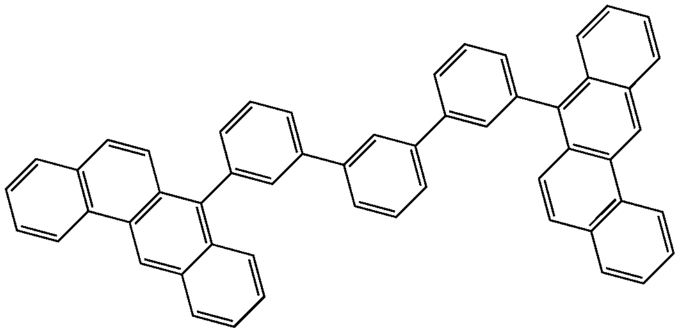
,
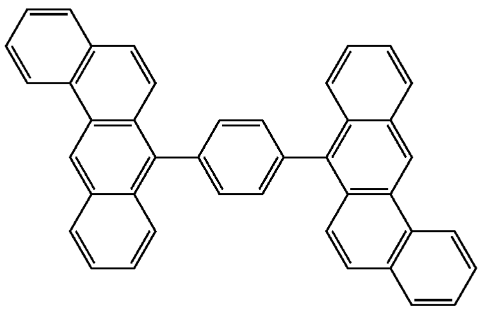
,
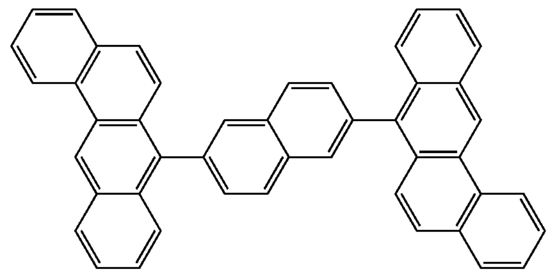
,
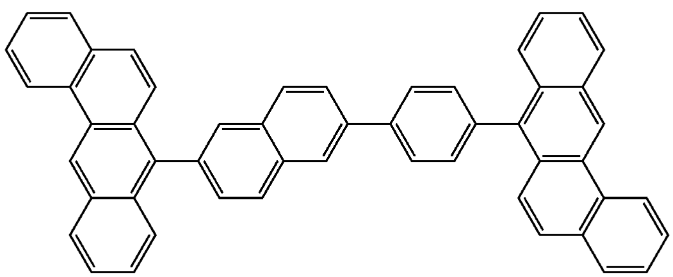
,
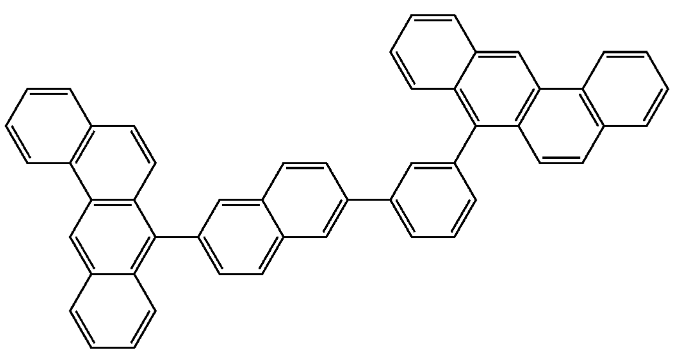
,
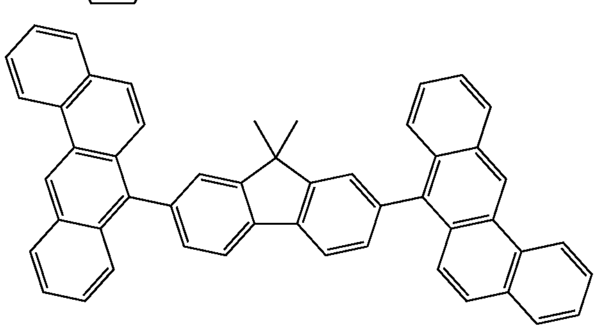
, -continued
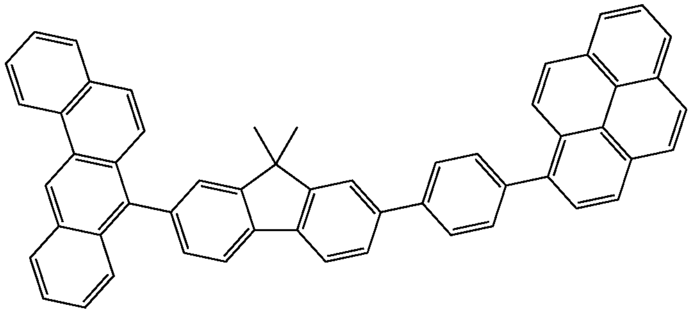
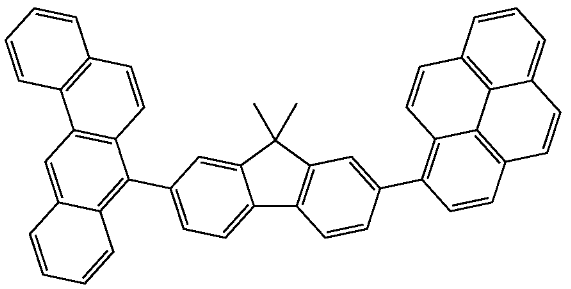
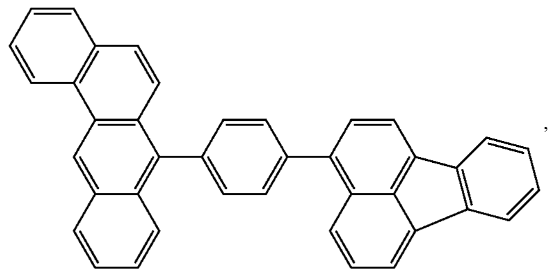
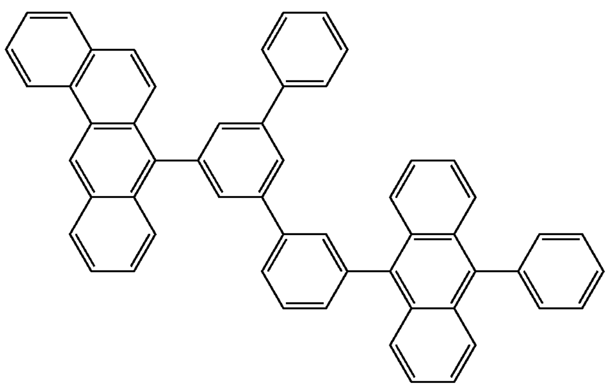
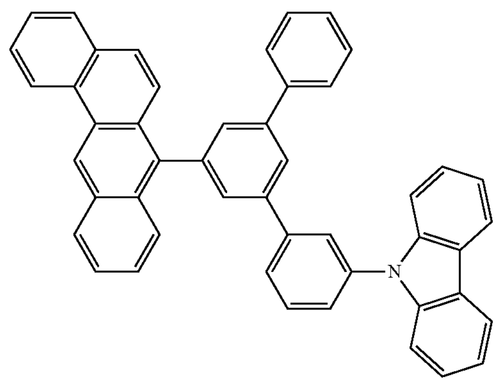
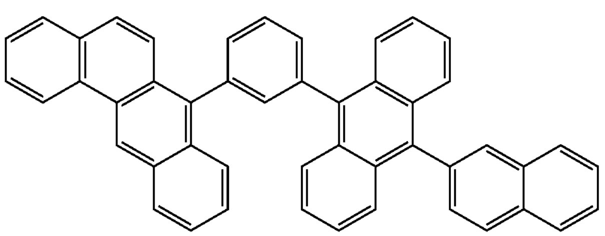
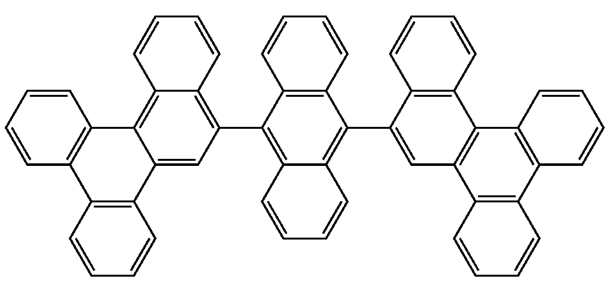
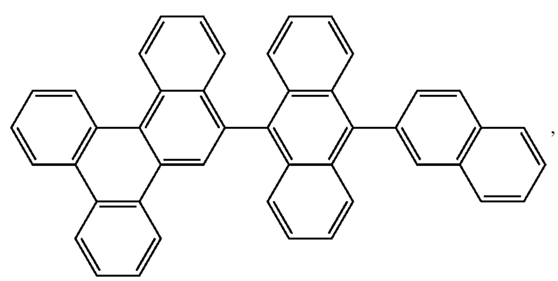

-continued
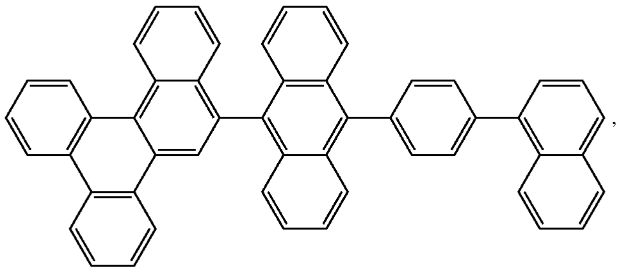
,
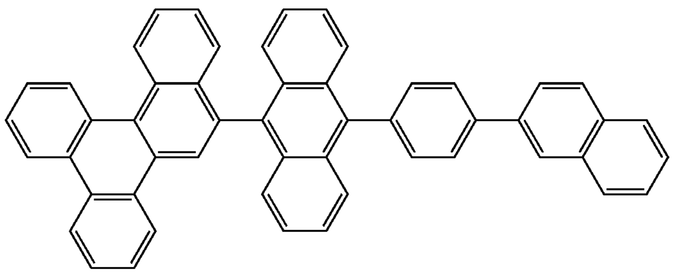
,
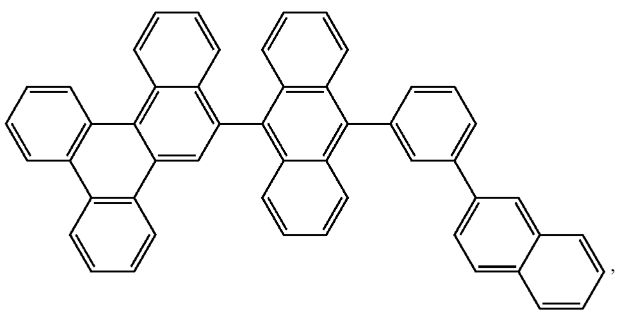
,
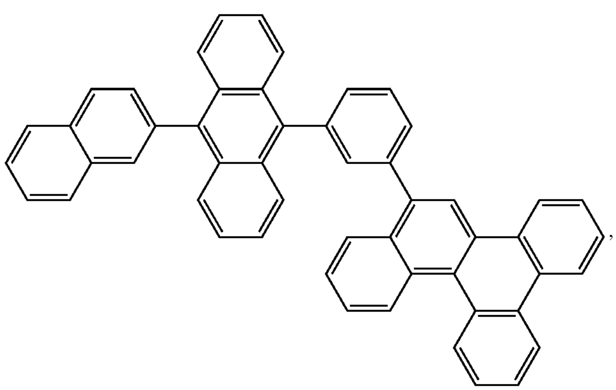
,
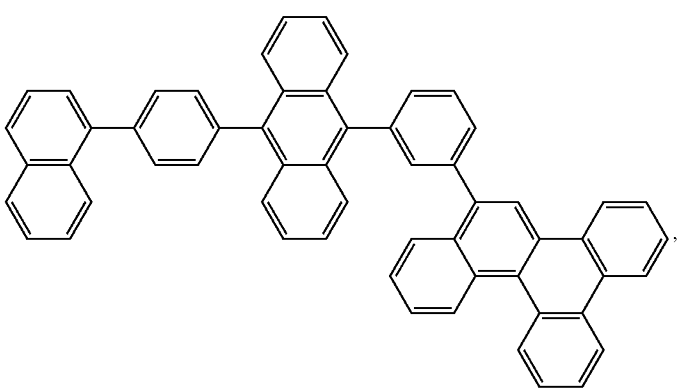
, -continued
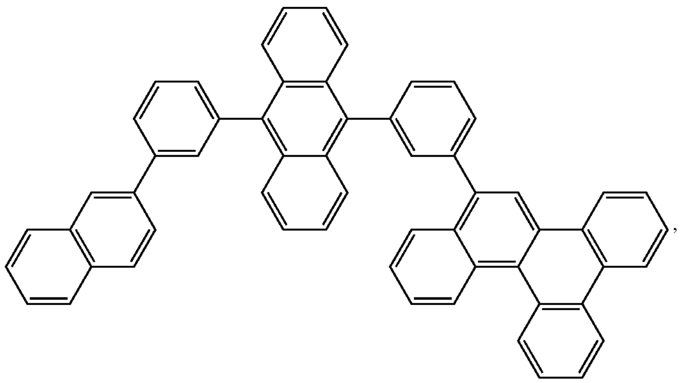
,
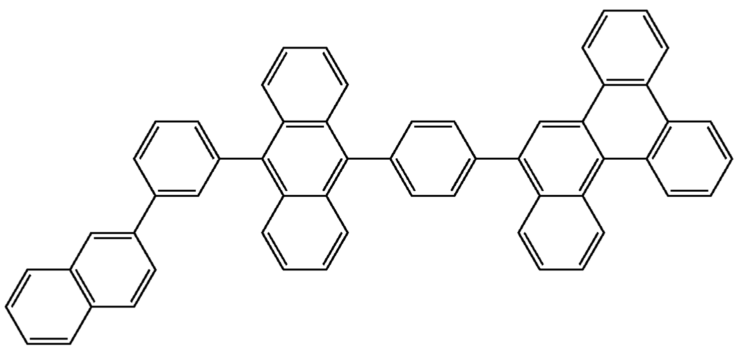
,
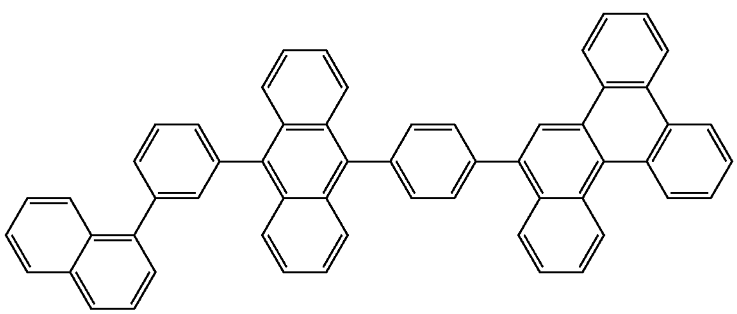
,
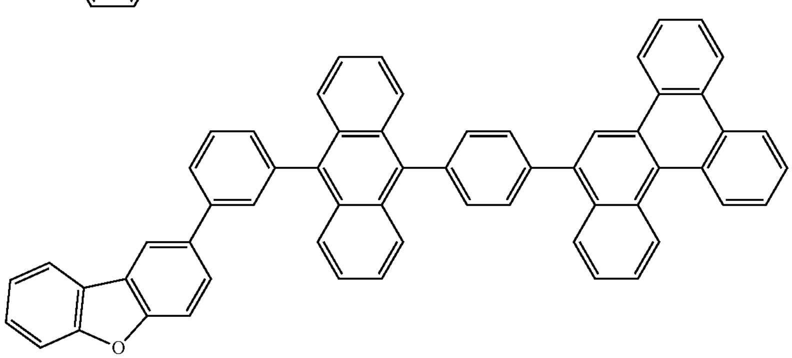
,
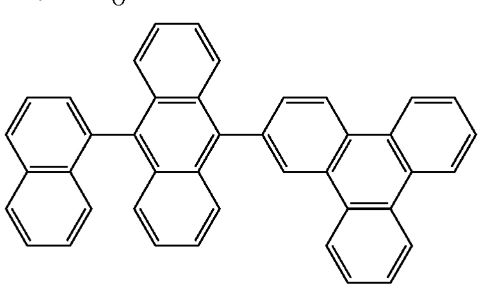
,
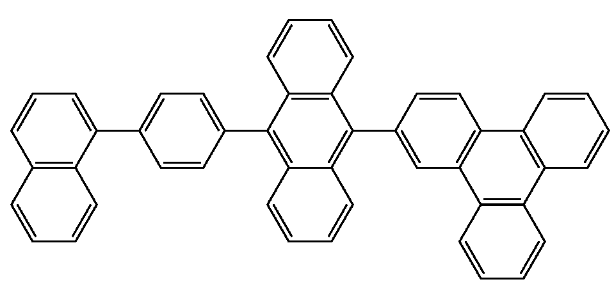
, -continued
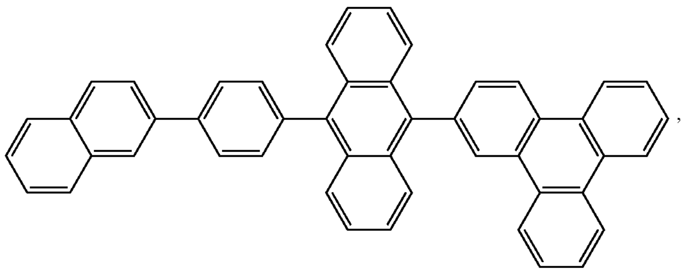
,
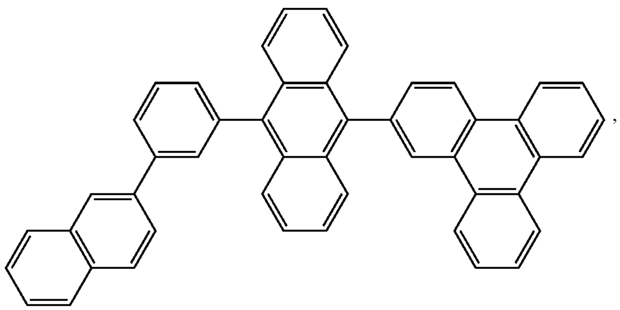
,
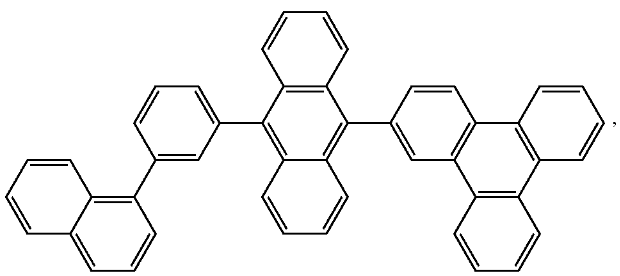
,
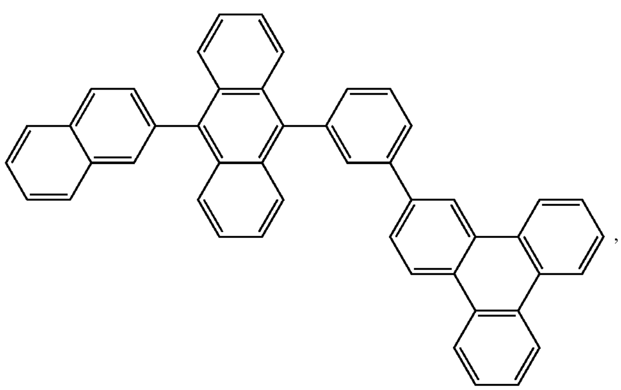
,
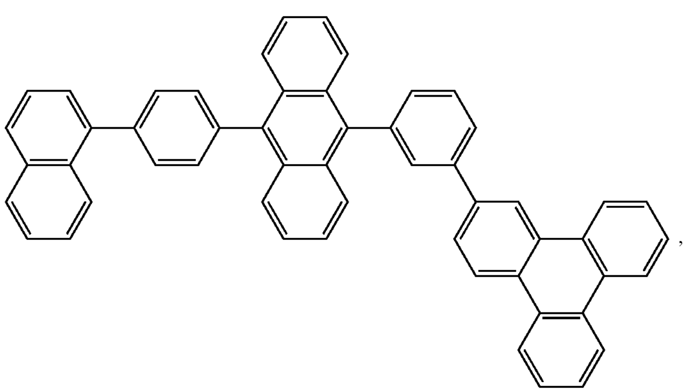
, -continued
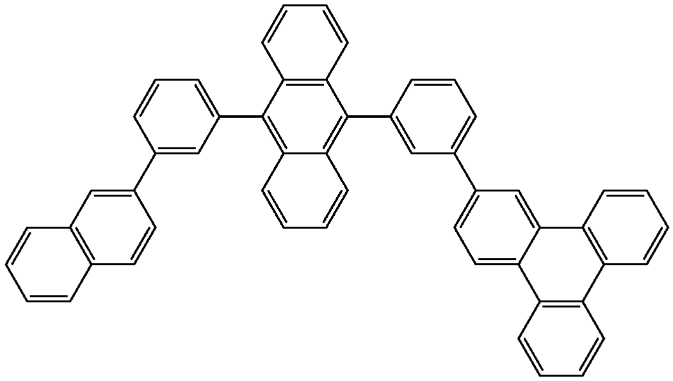
,
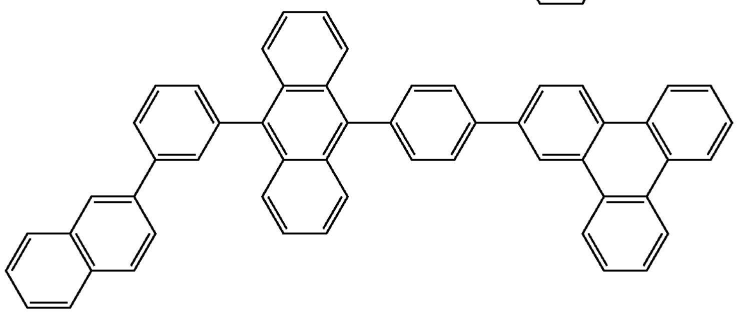
,
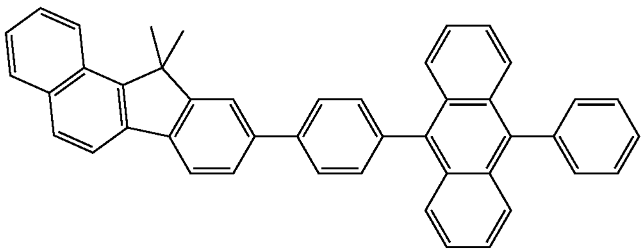
,
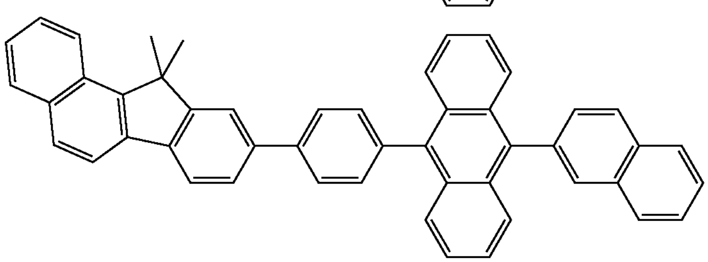
,
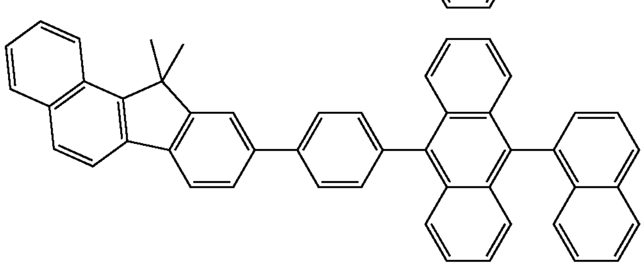
,
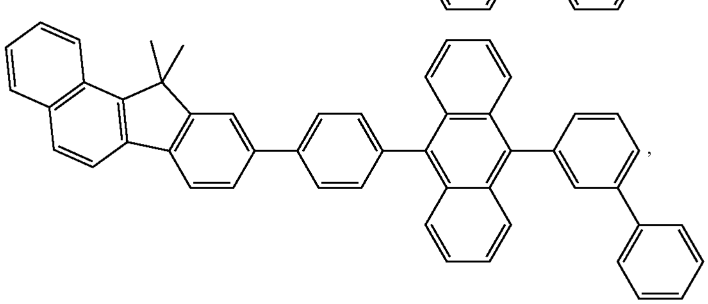
, -continued
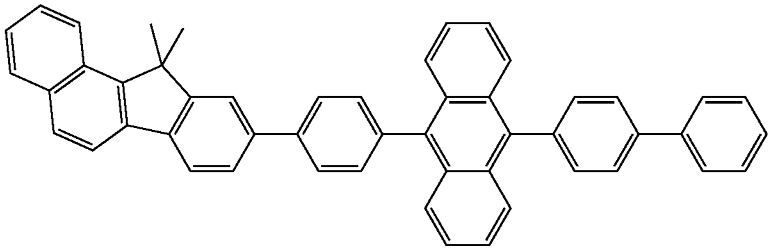
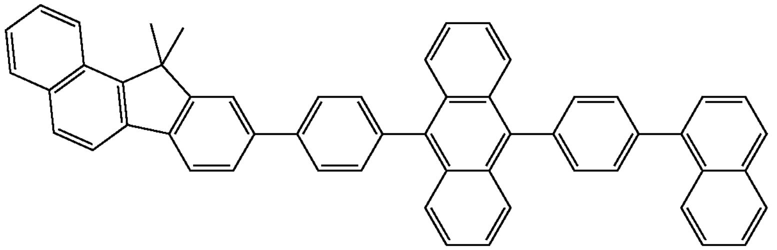
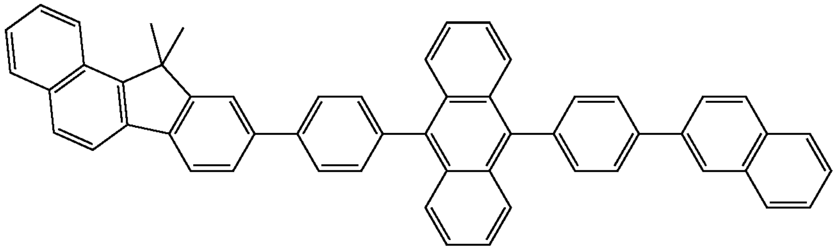
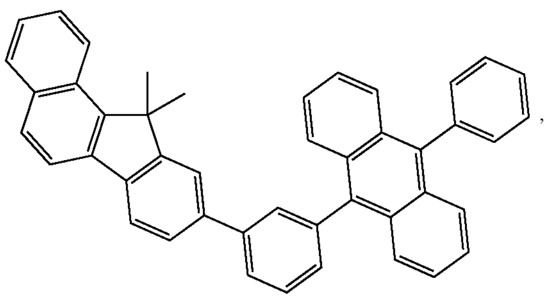
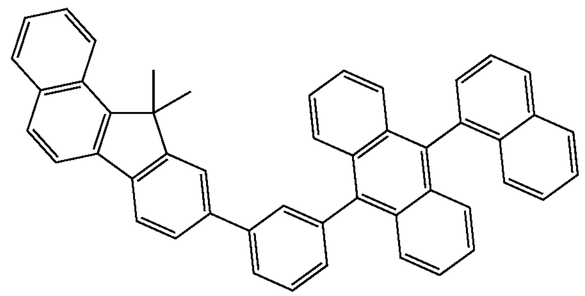
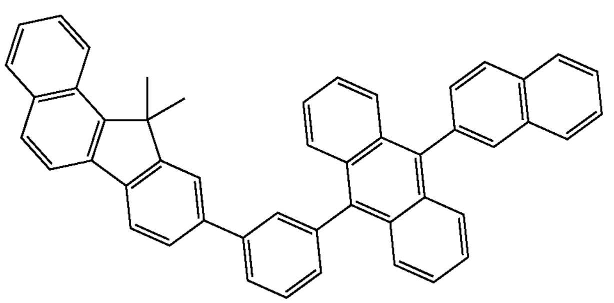
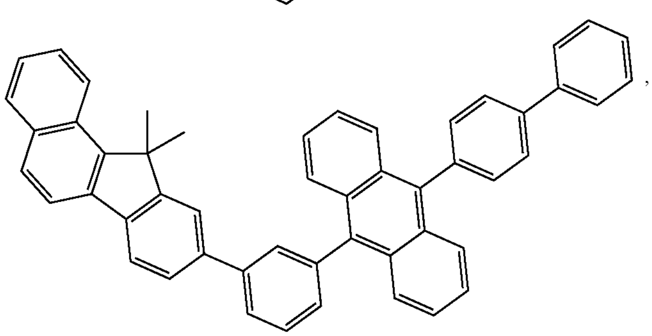

-continued
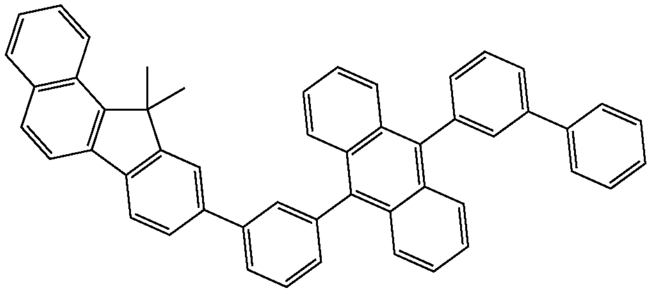
,
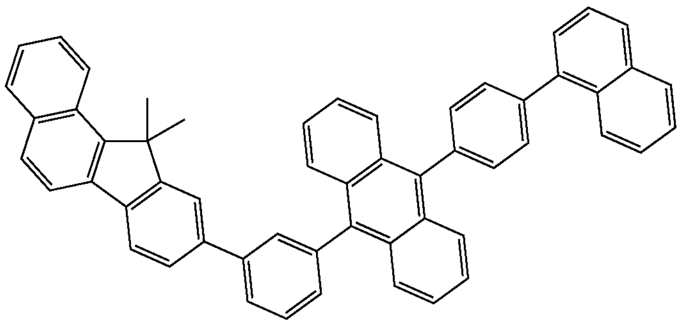
,
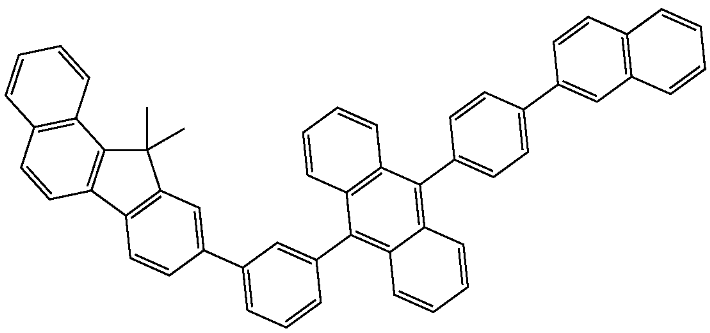
,
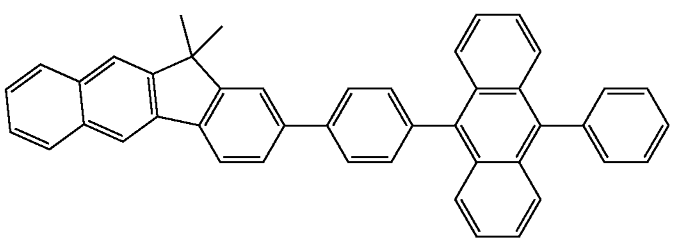
,
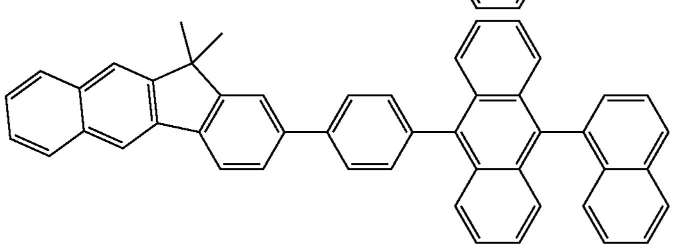
,
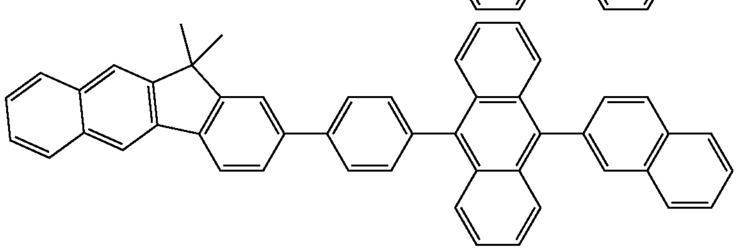
, -continued
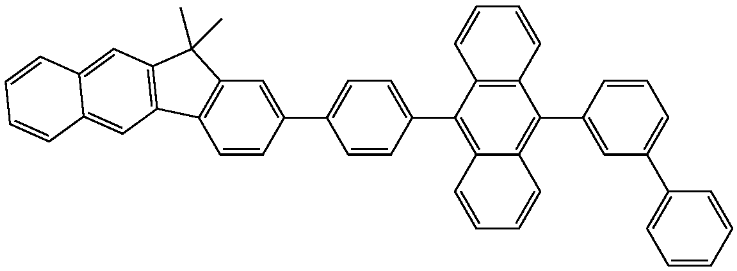
,
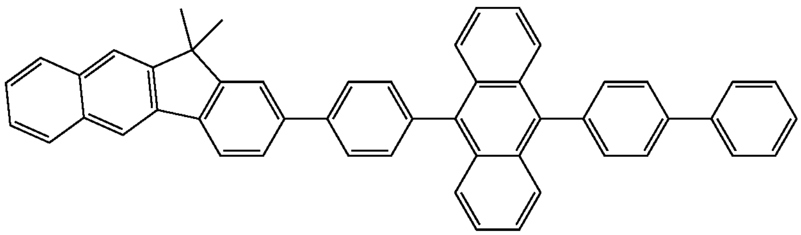
,
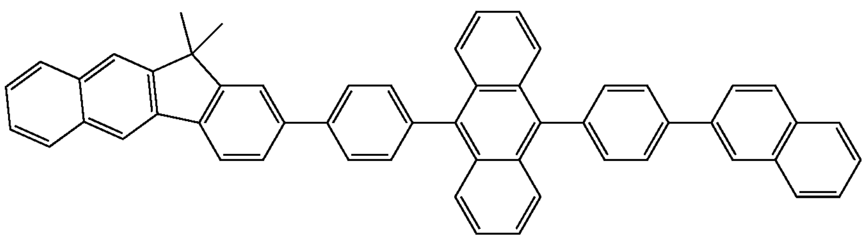
,
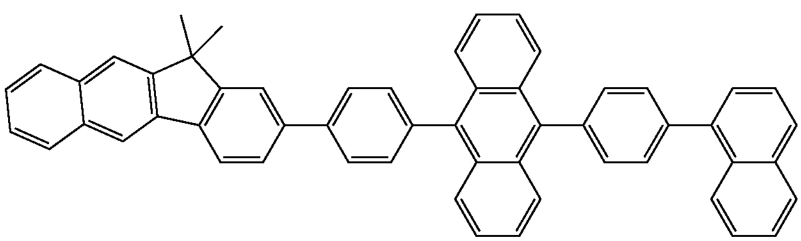
,
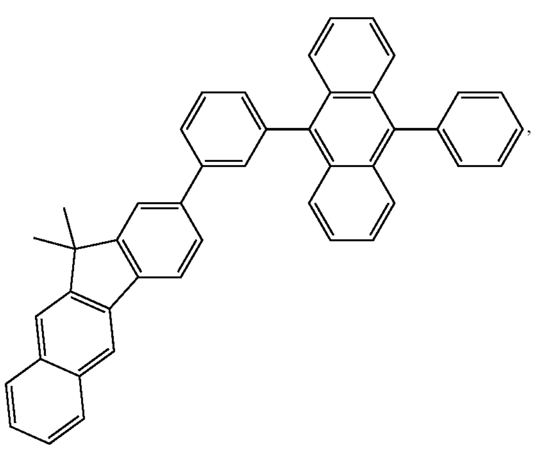
,
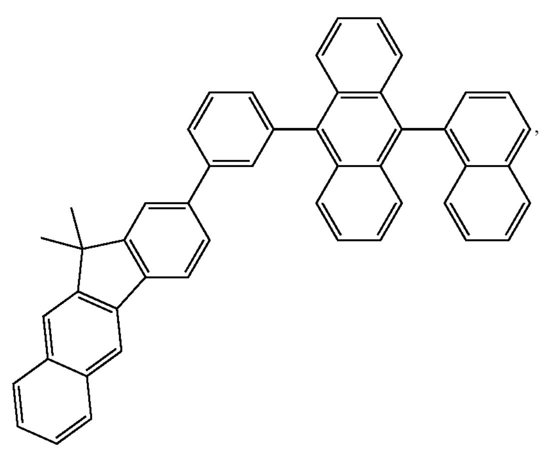
, -continued
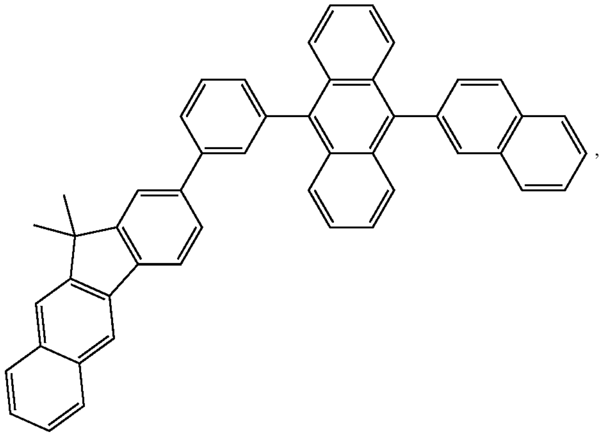
,
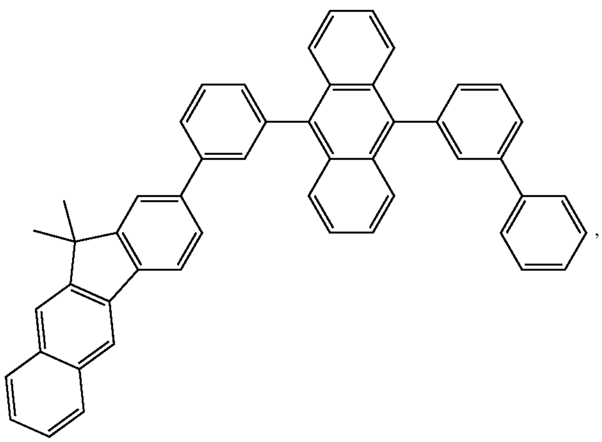
,
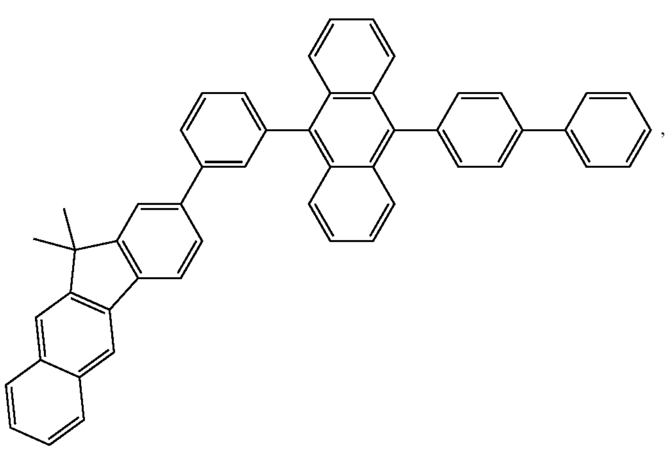
, -continued
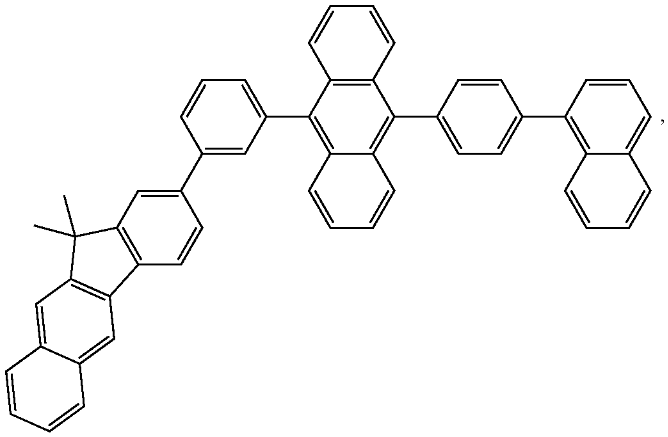
,
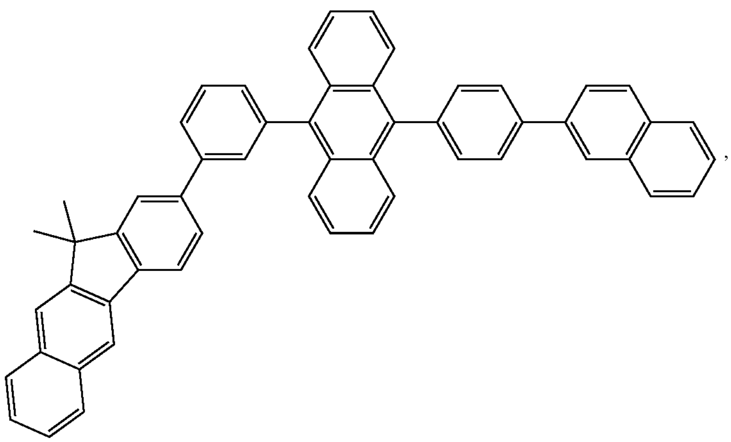
,
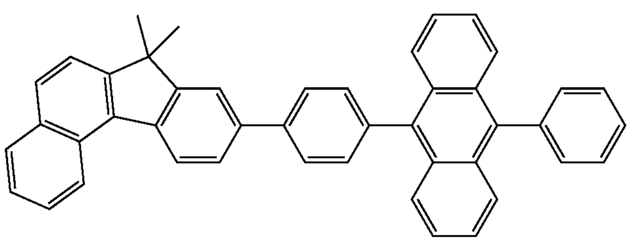
,
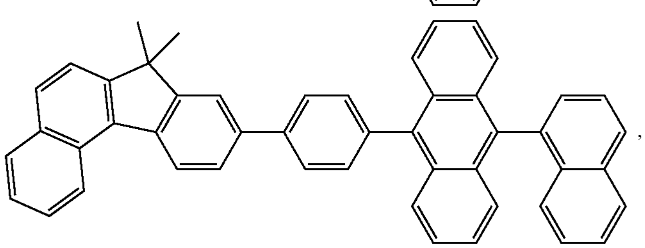
,
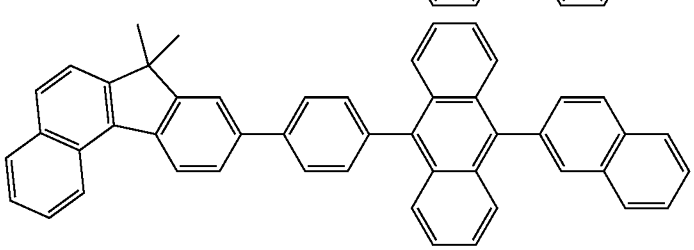
, -continued
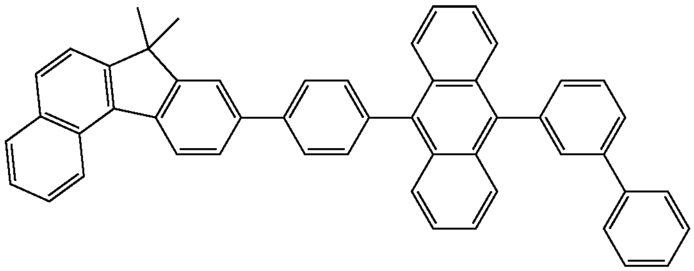,
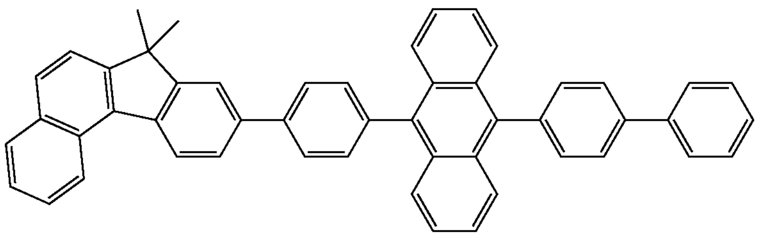,
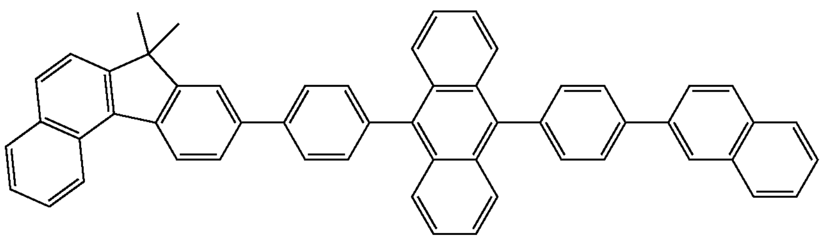,
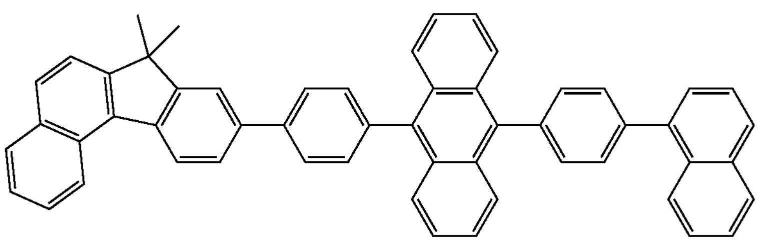,
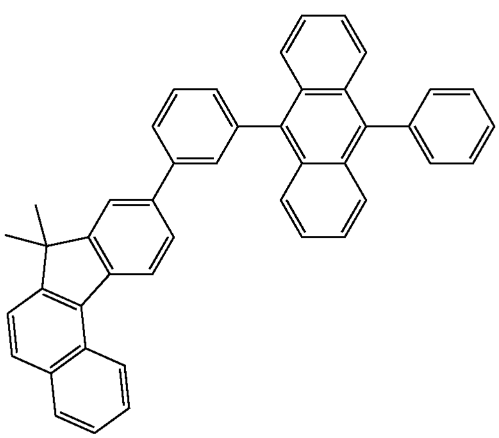,
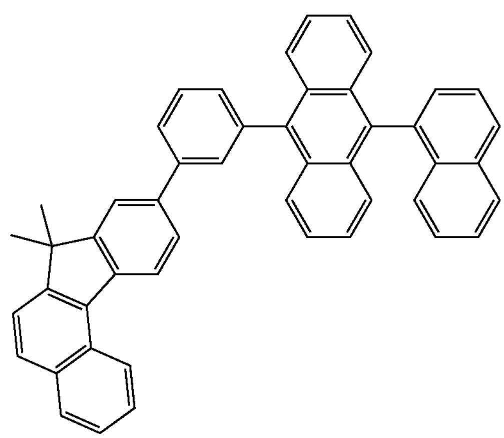, -continued
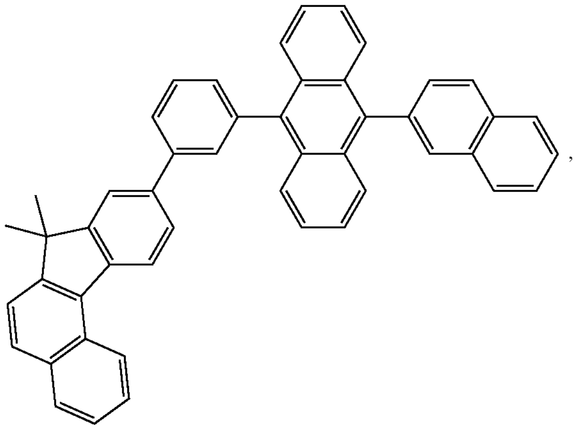
,
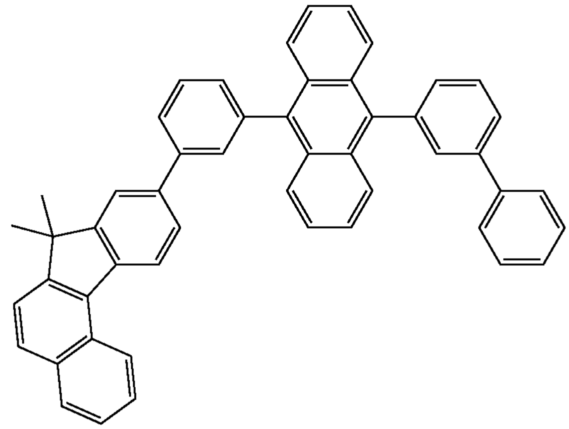
,
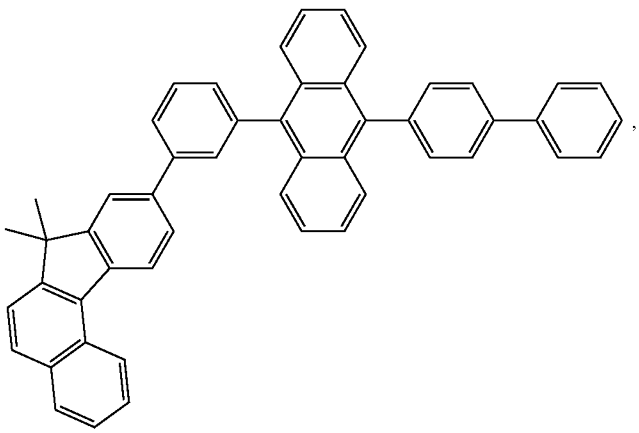
,
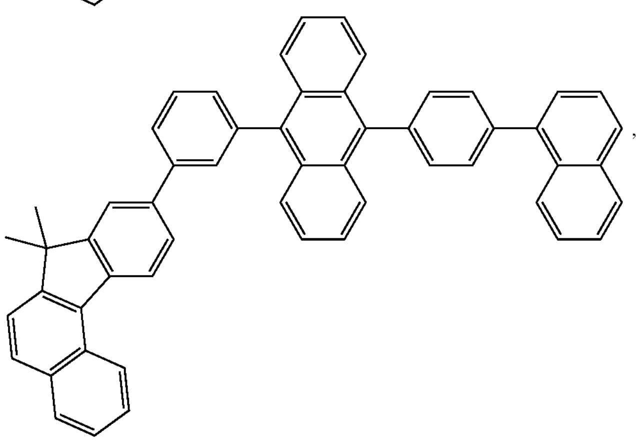
,
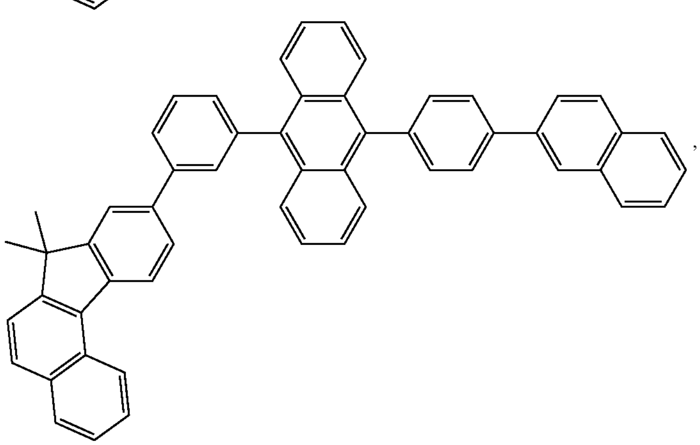
, -continued
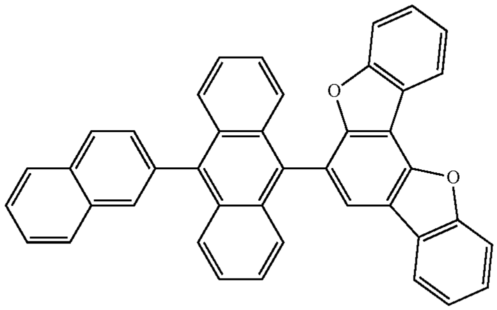
,
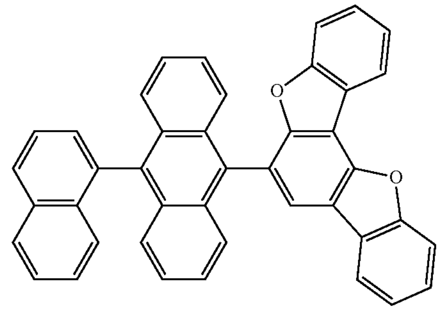
,
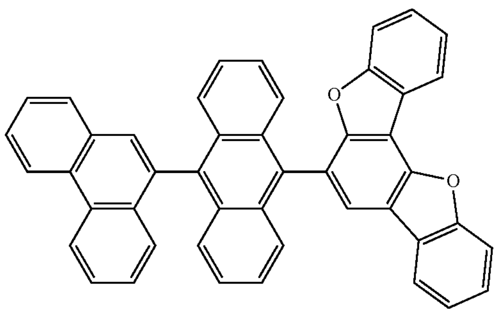
,
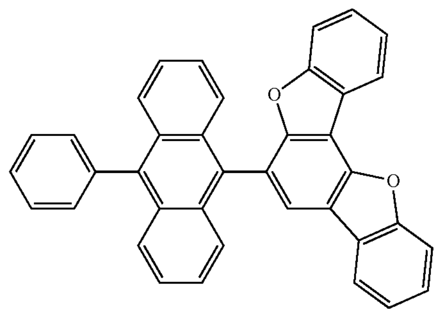
,
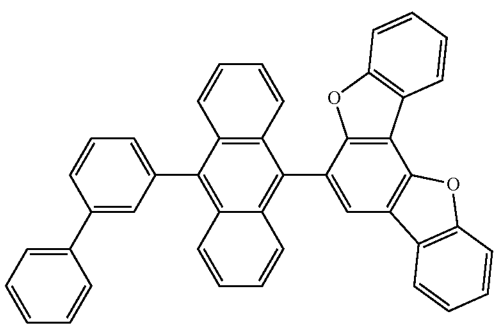
,
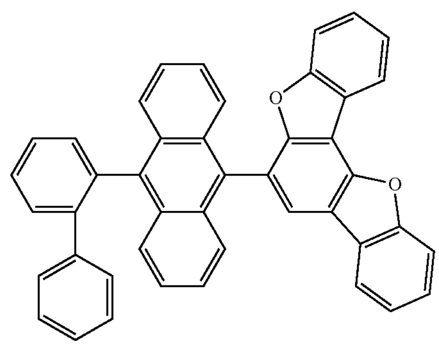
,
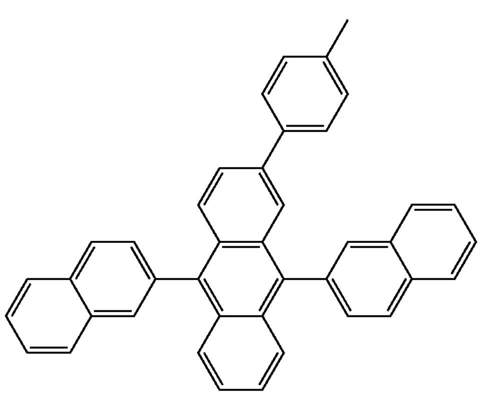
,
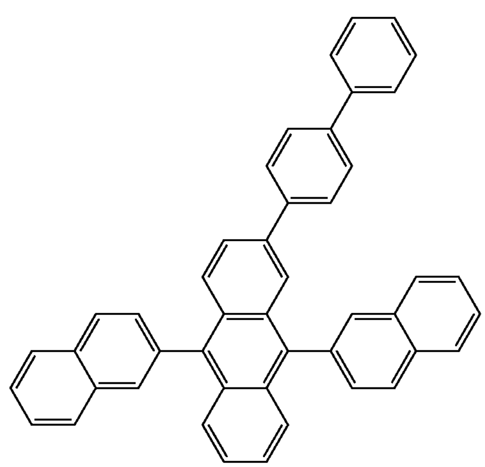
, -continued
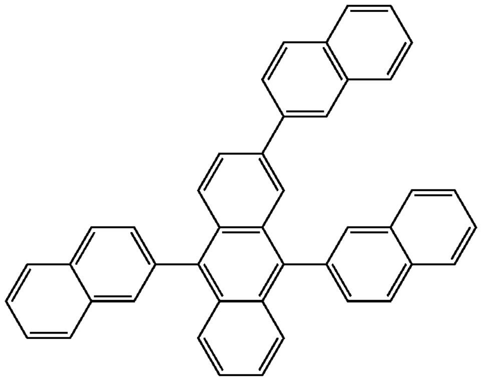,
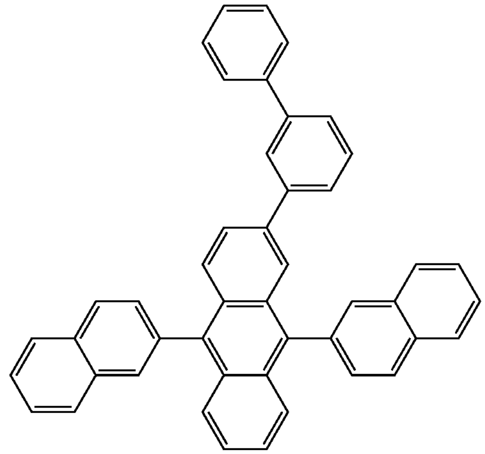,
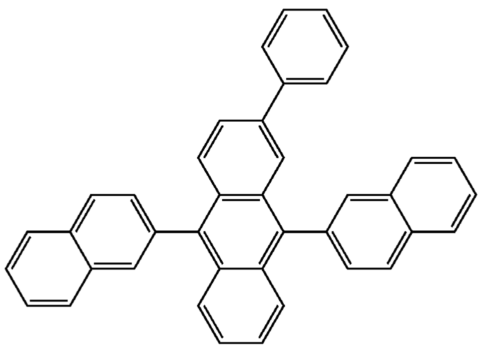,
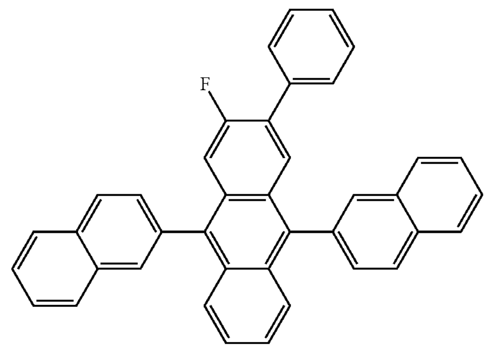,
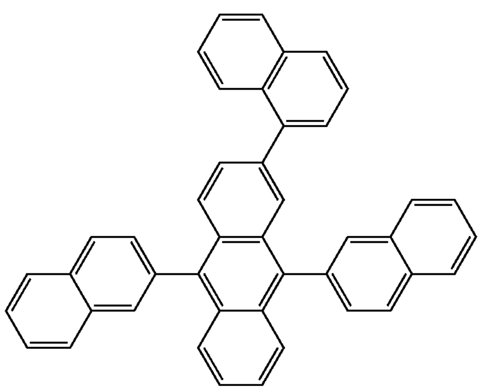,
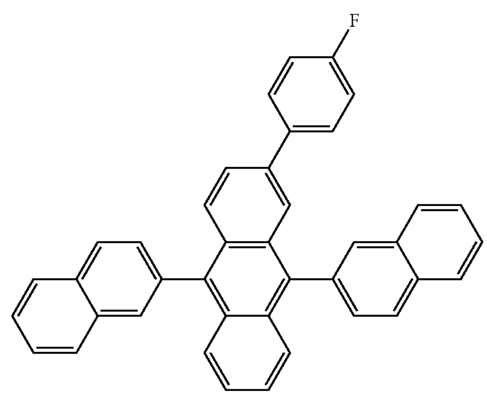,
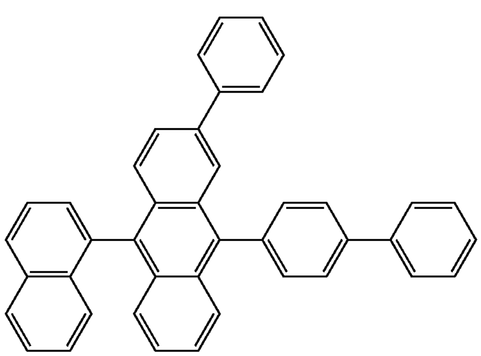,
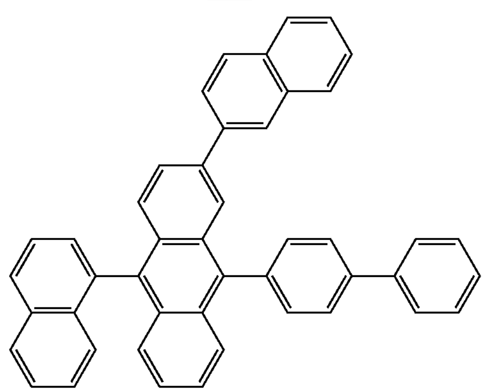, -continued
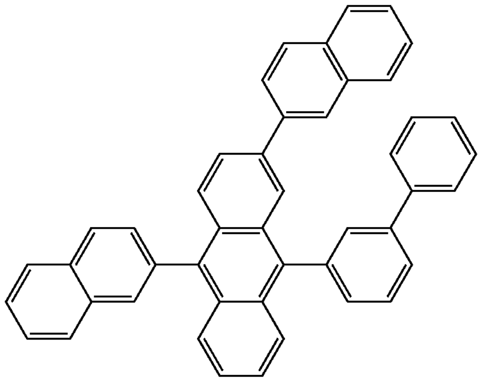,
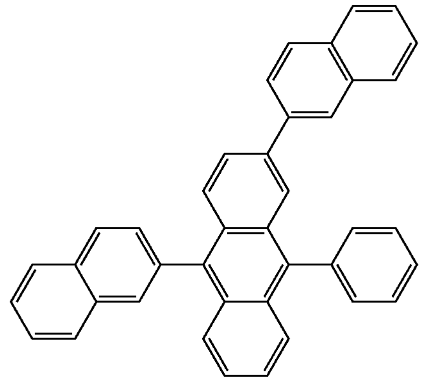,
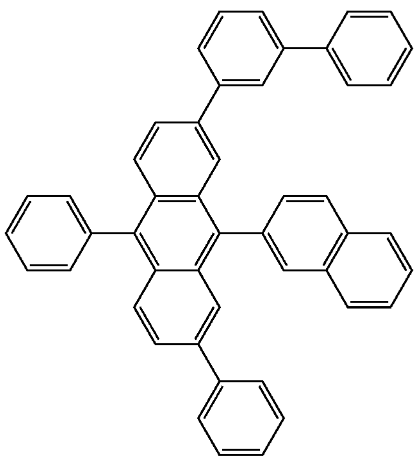,
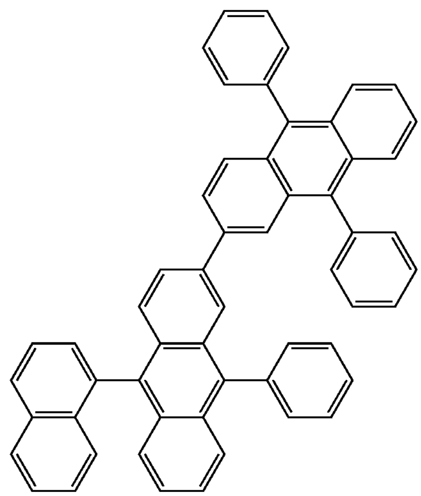,
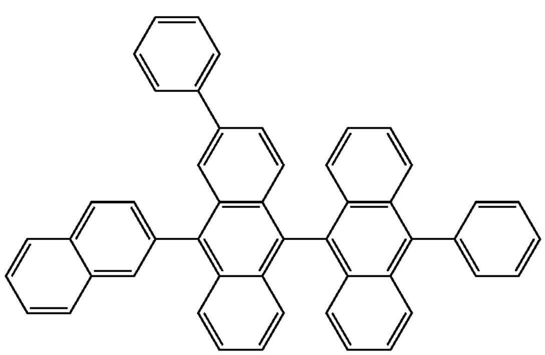,
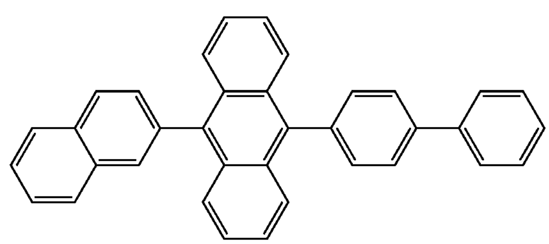,
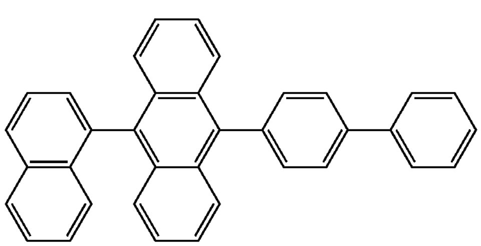,
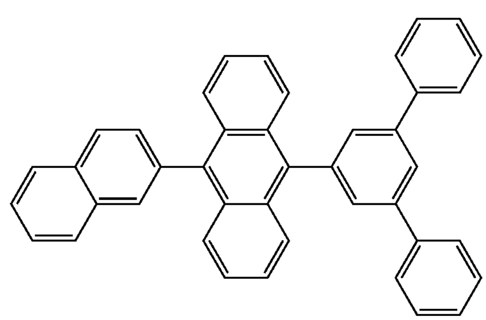, -continued
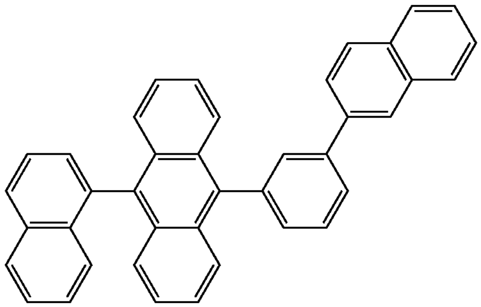
,
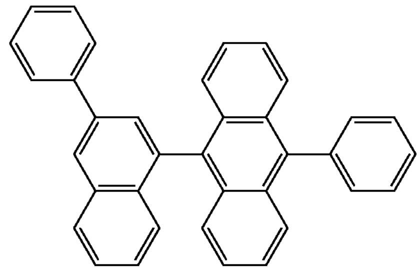
,
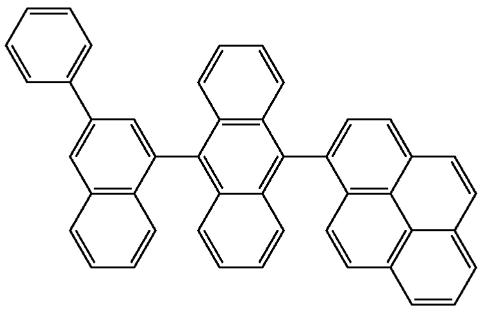
,
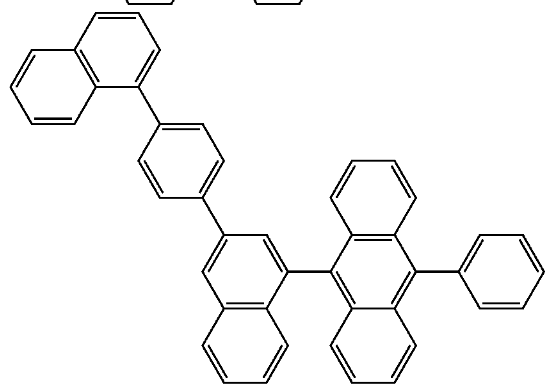
, and
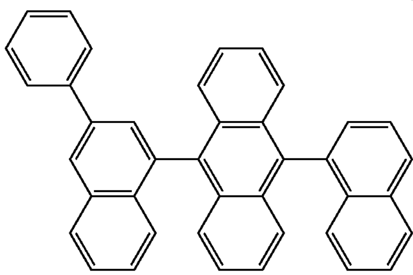
.
10. The compound of claim 1, wherein the emitter group comprises a group selected from the group consisting of: fluoranthene, pyrene, triarylamine, and combinations thereof.
11. The compound of claim 1, wherein the emitter group is selected from the group consisting of:
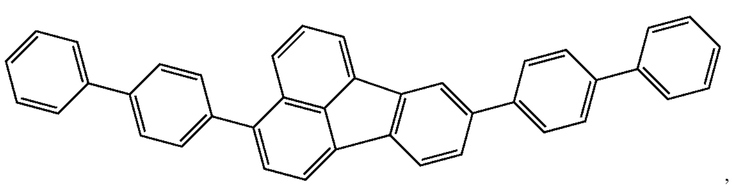
,
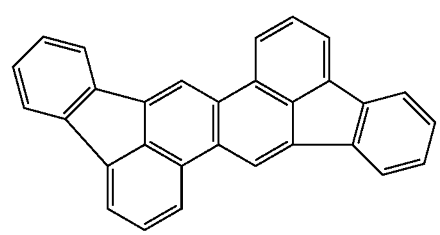
,
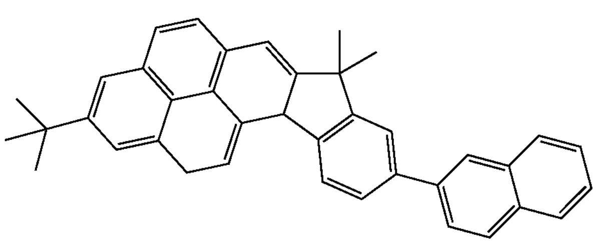
, -continued
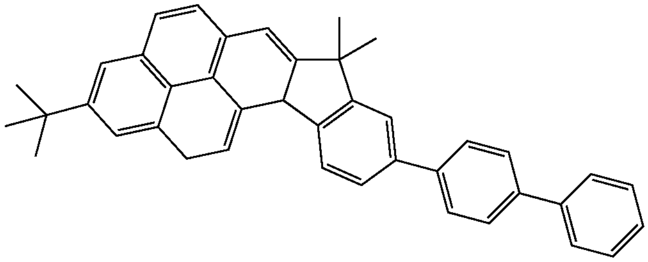
,
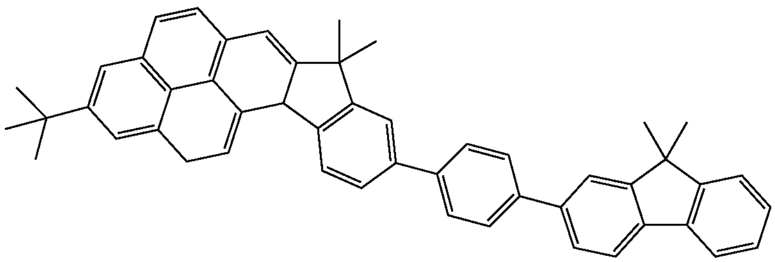
,
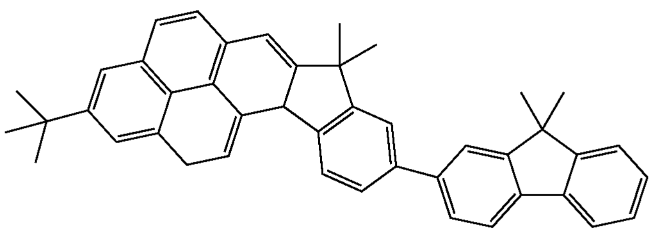
,
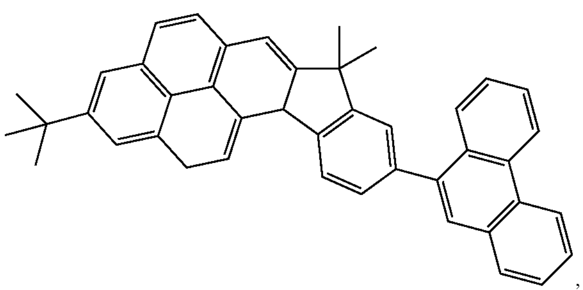
,
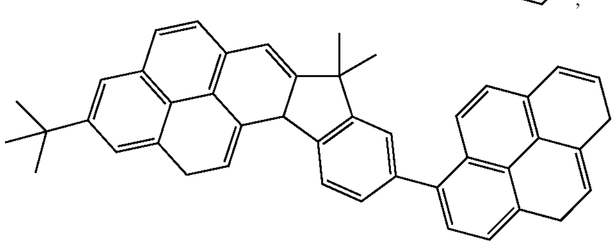
,
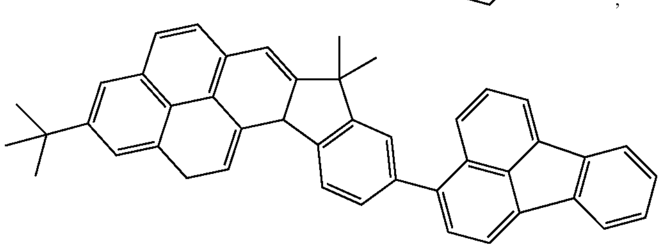
, -continued
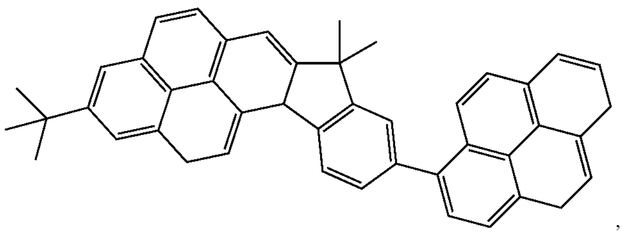
,
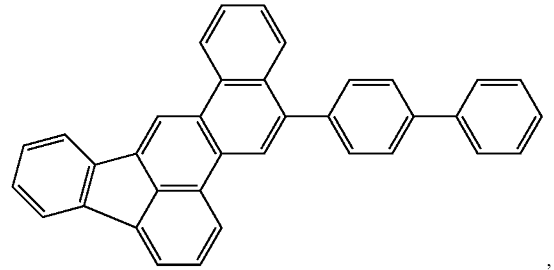
,
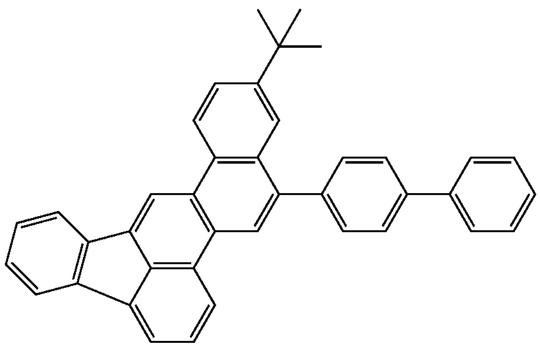
,
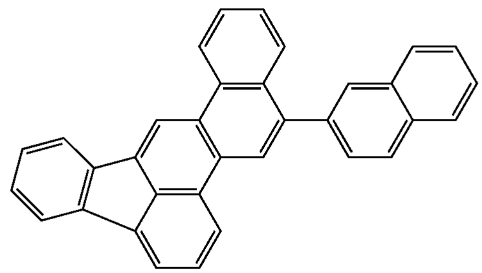
,
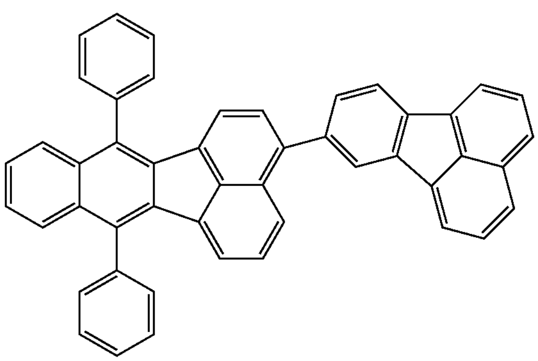
,
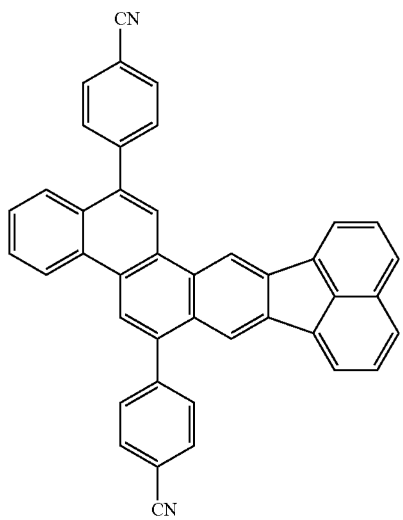
,
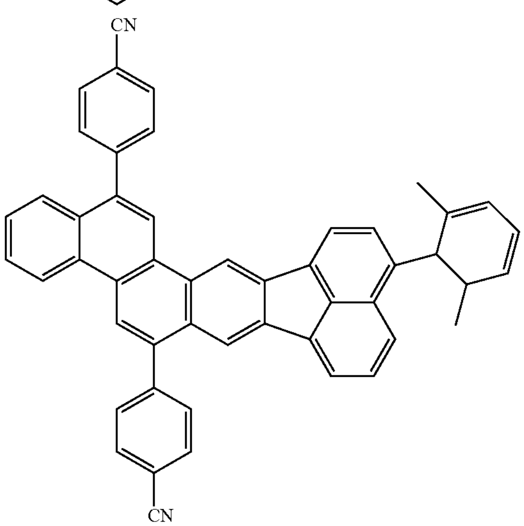
,
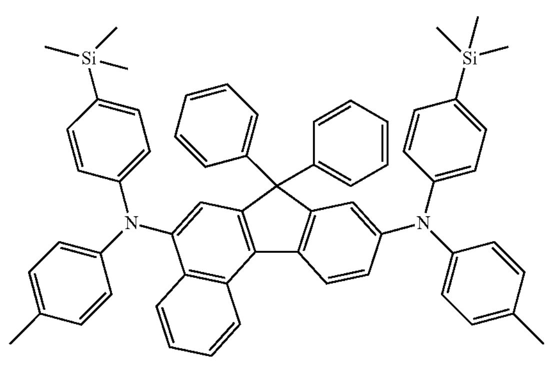
, -continued
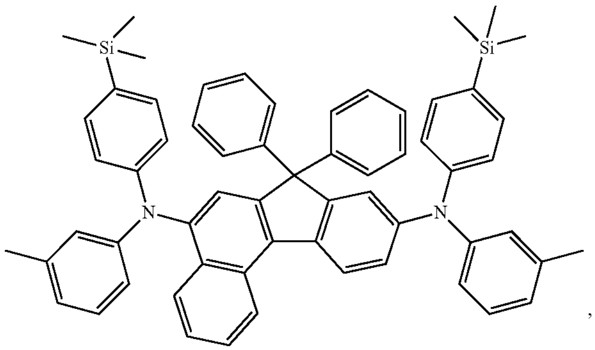
,
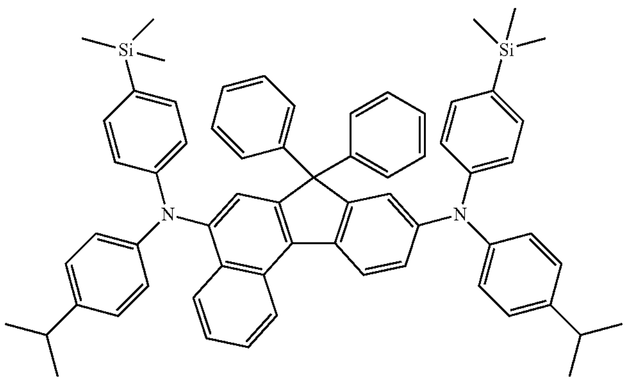
,
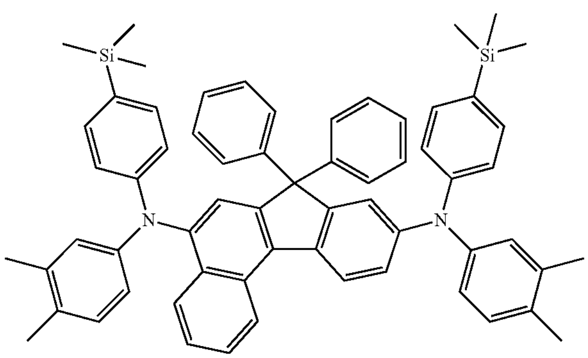
,
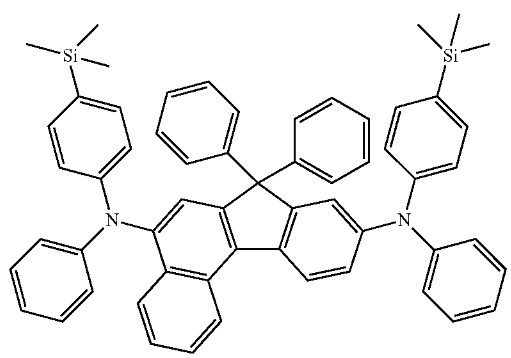
,
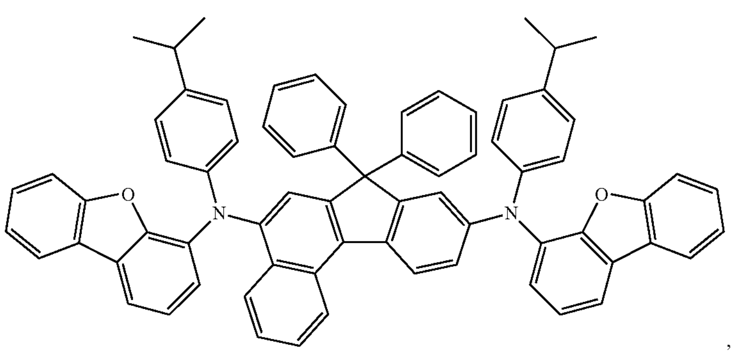
, -continued
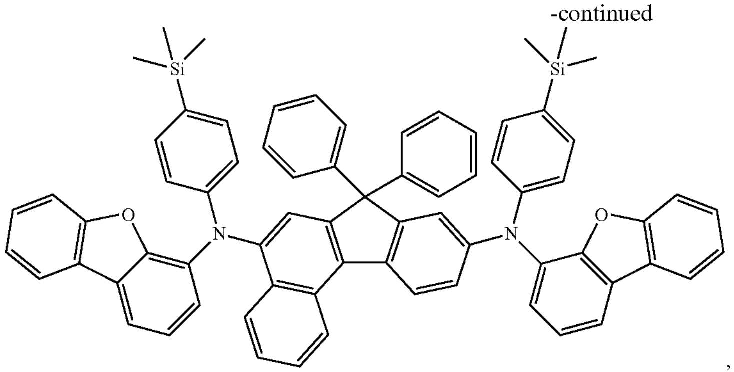
,
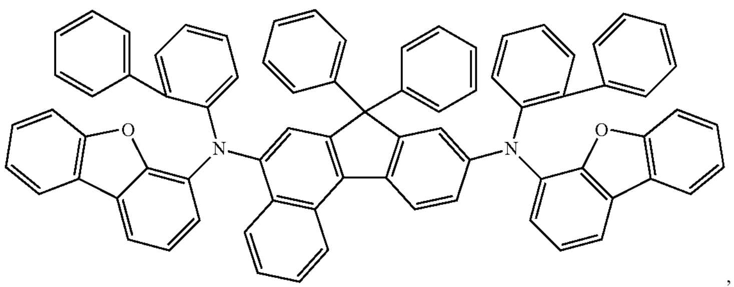
,
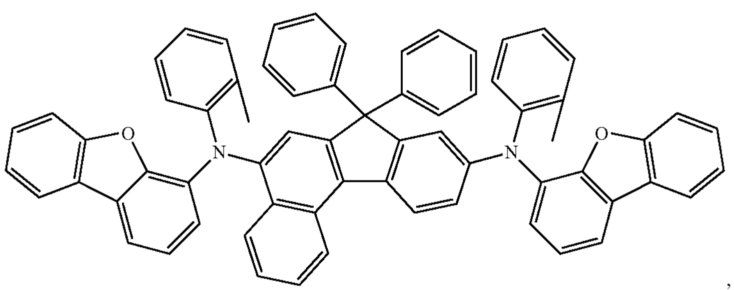
,
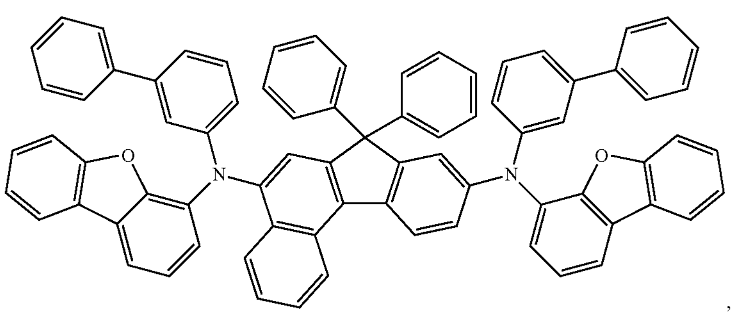
,
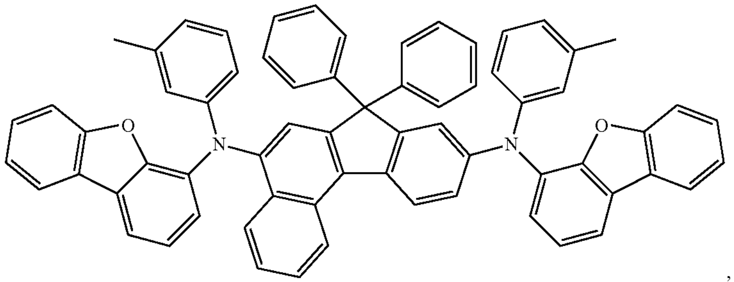
, -continued
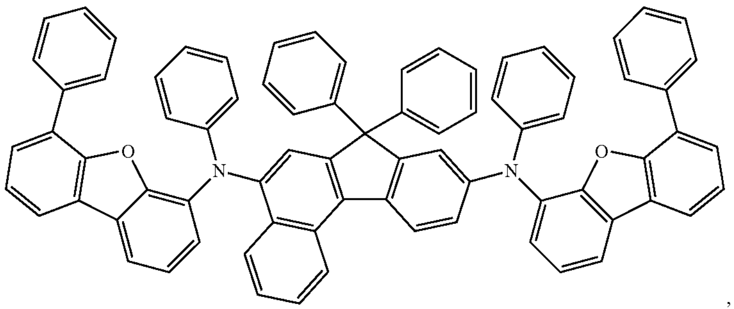
,
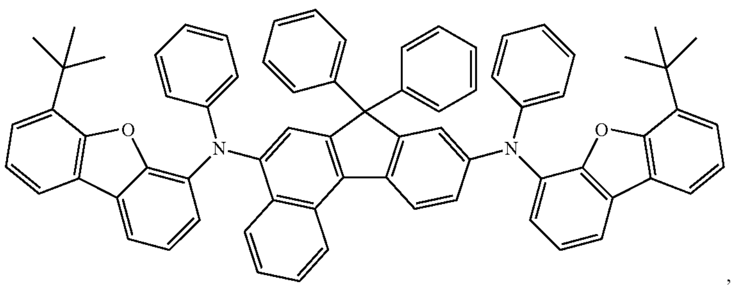
,
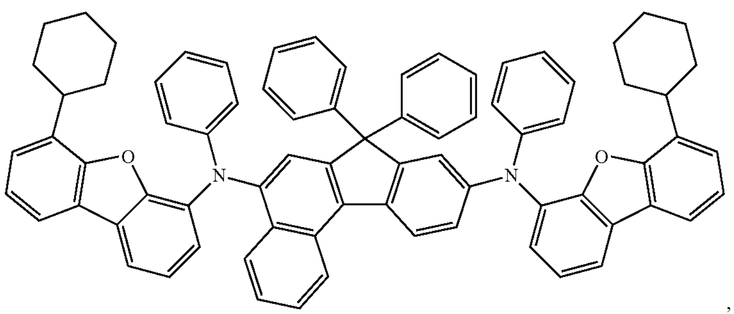
,
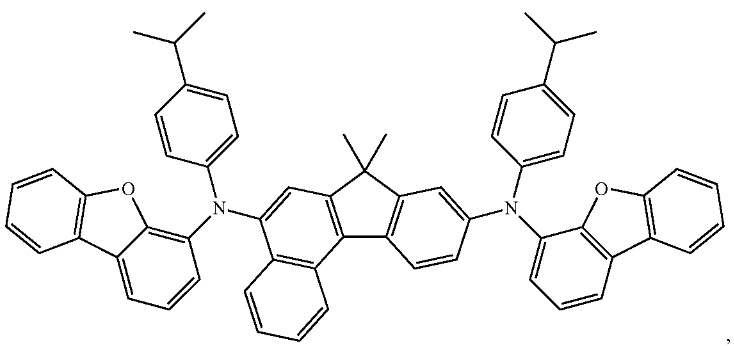
,
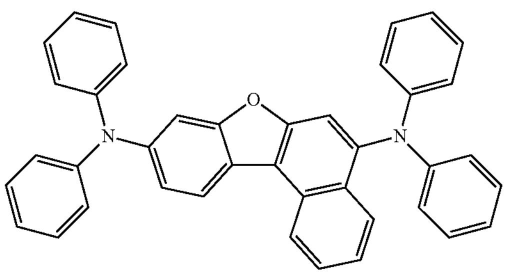
,
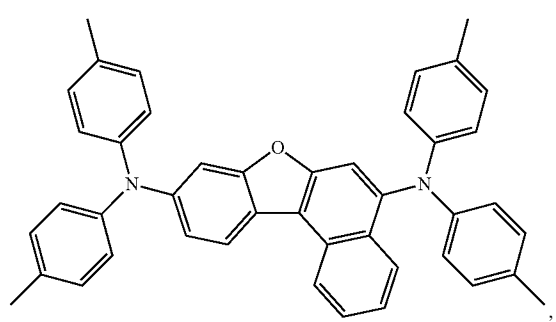
, -continued
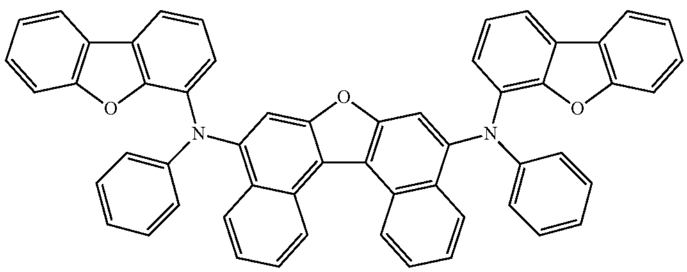
,
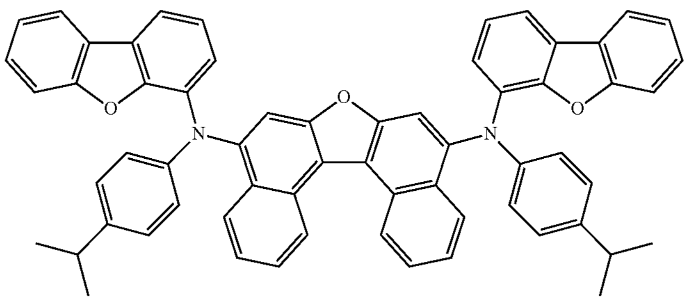
,
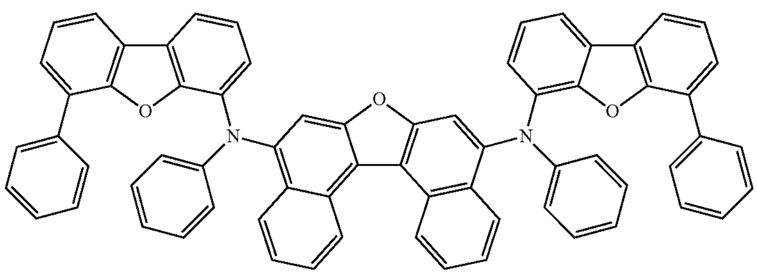
,
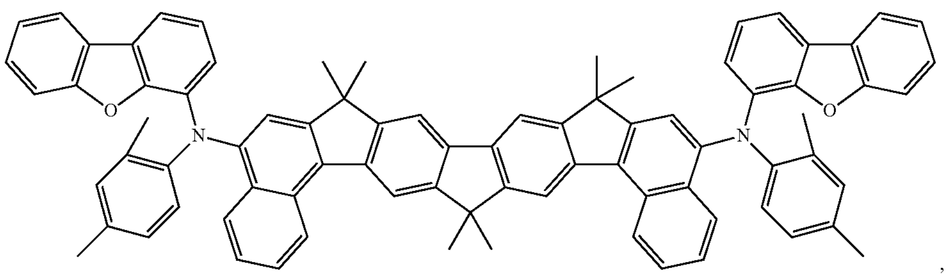
,
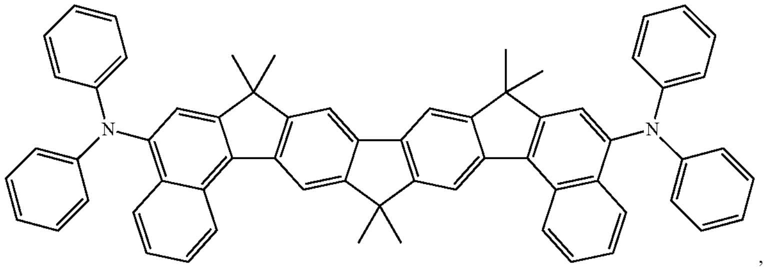
,
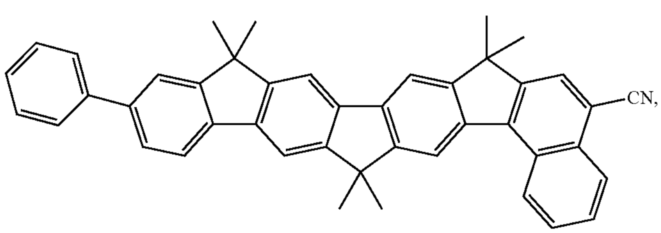
, -continued
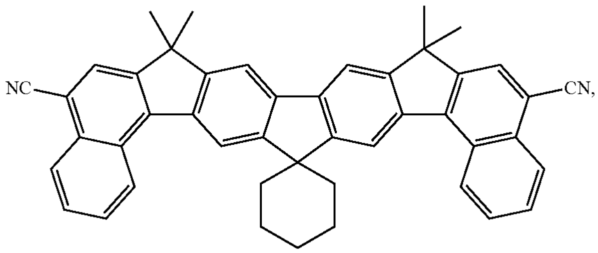
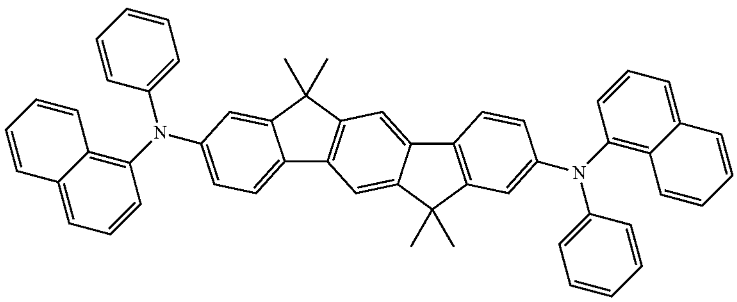
,
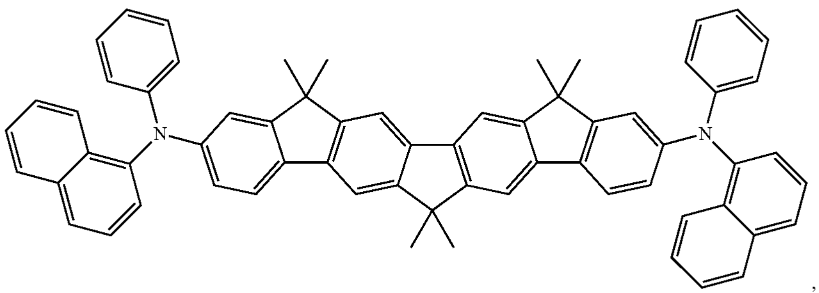
,
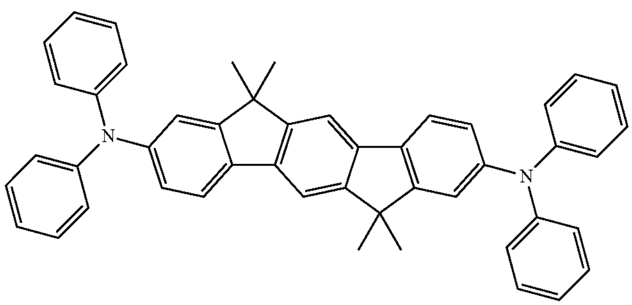
,
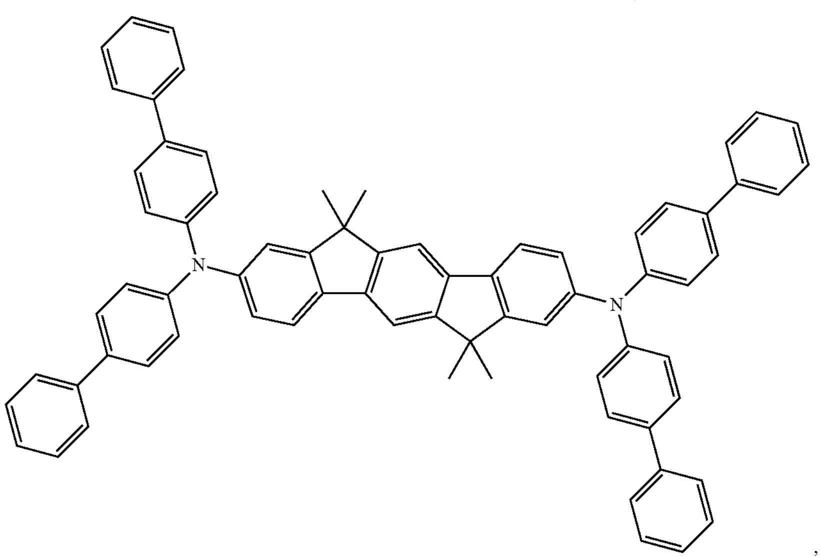
, -continued
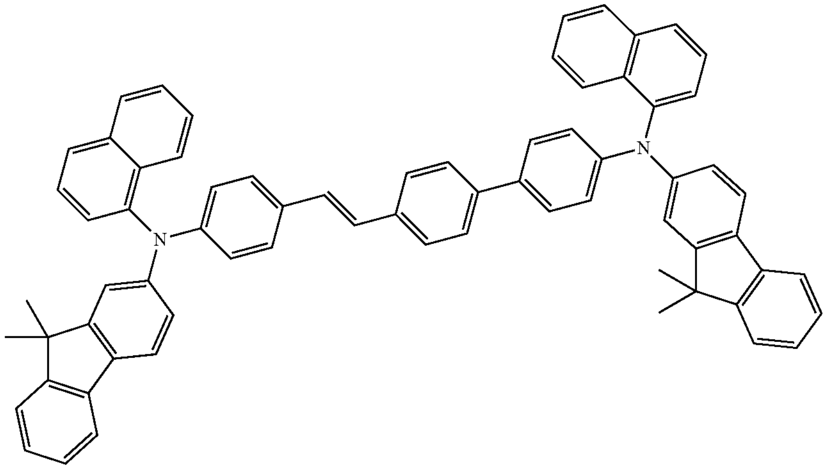
,
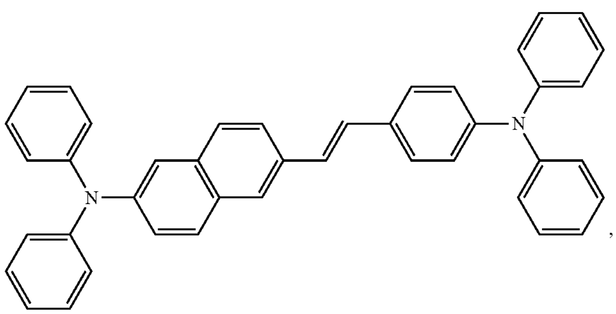
,
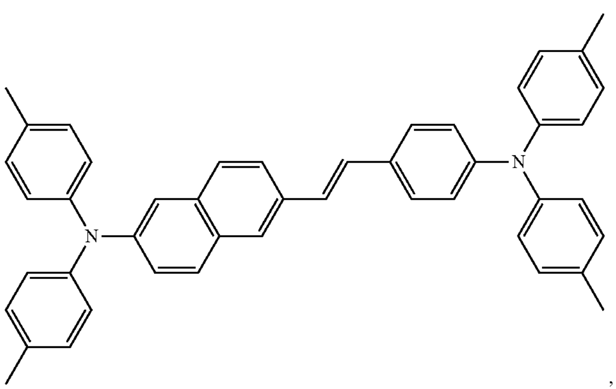
,
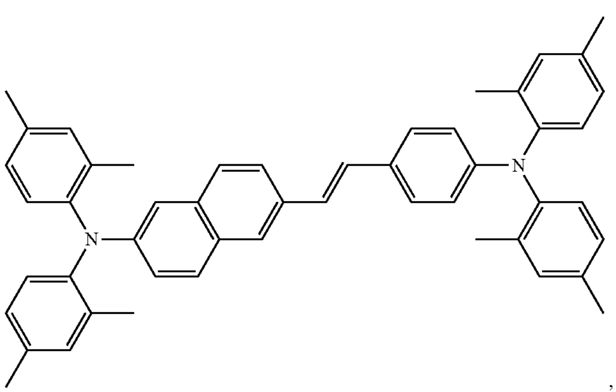
, -continued
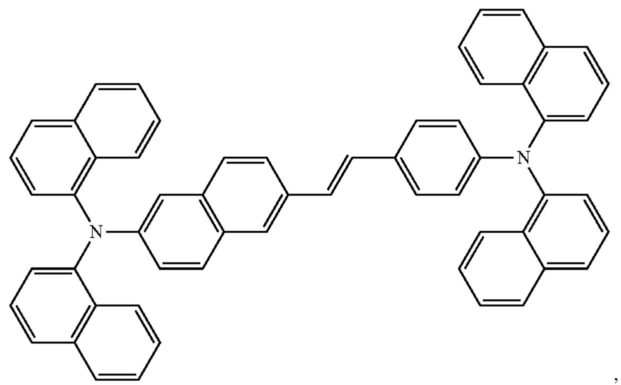
,
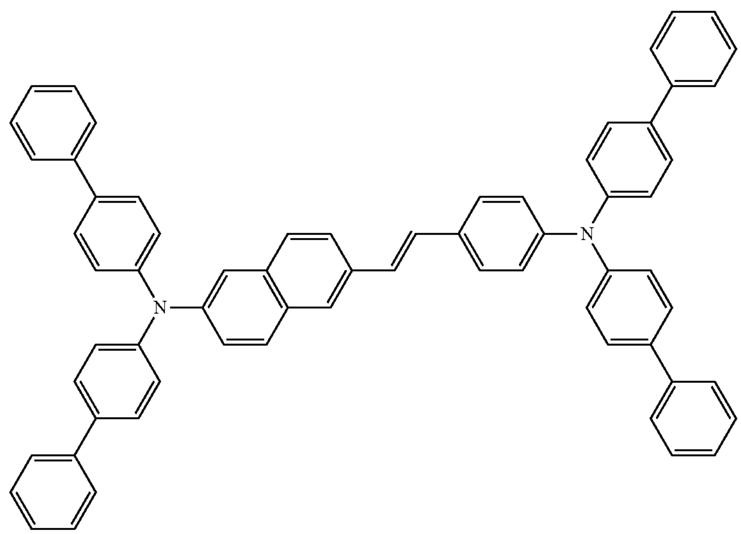
,
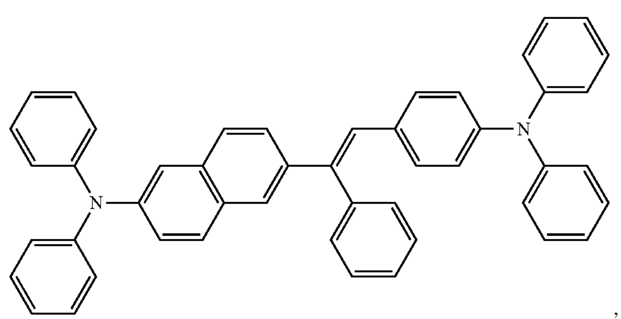
,
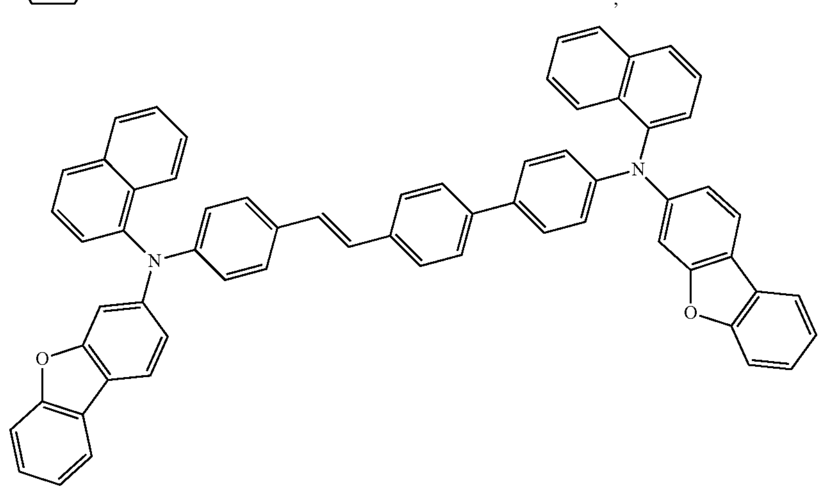
, -continued
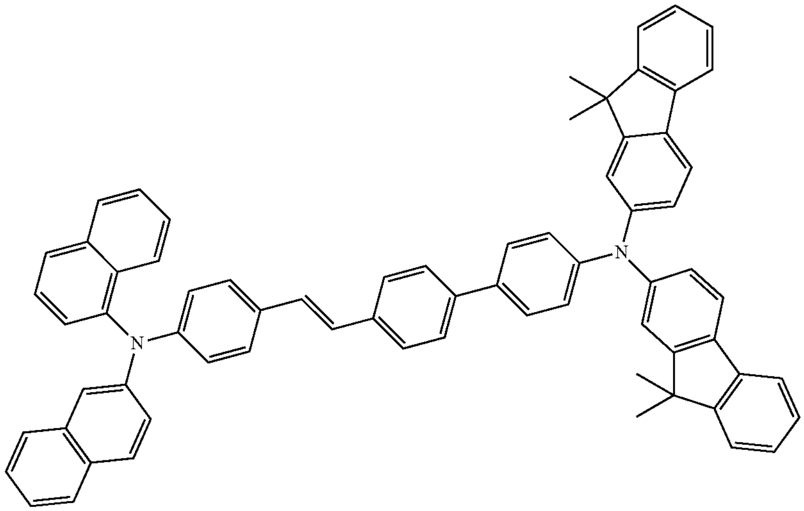
,
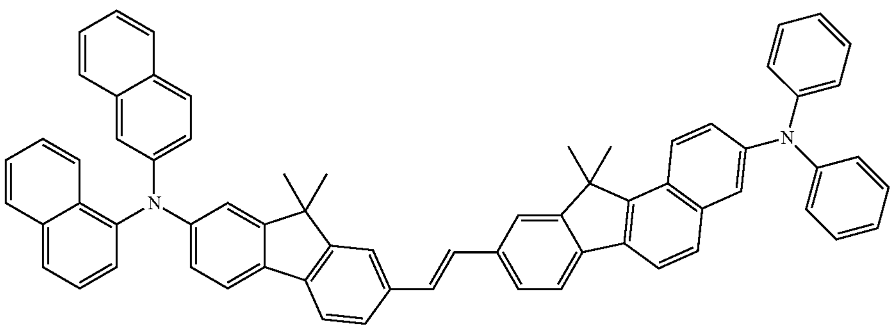
,
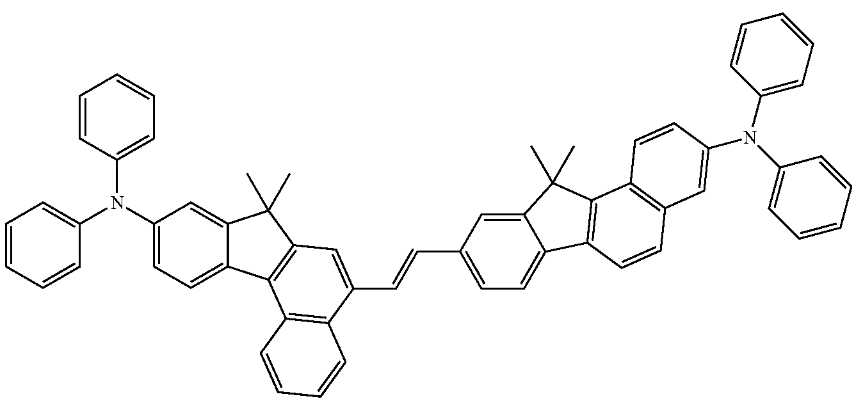
,
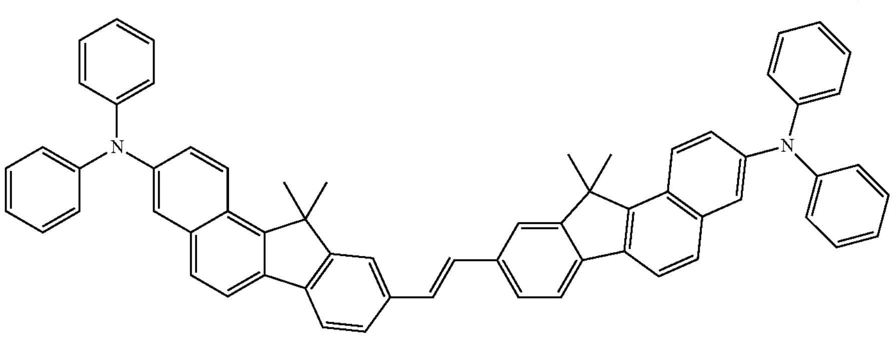
, -continued
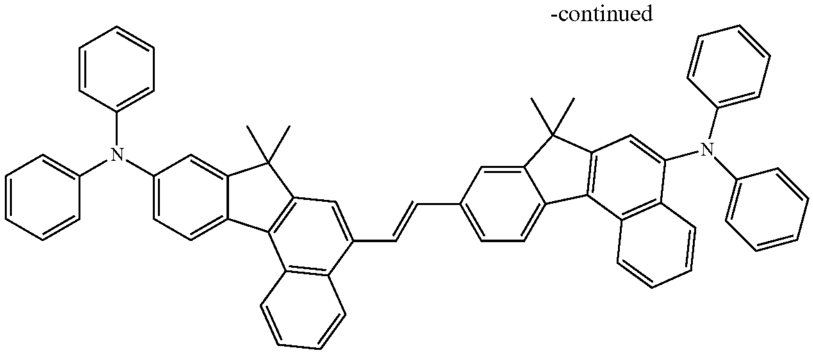
,
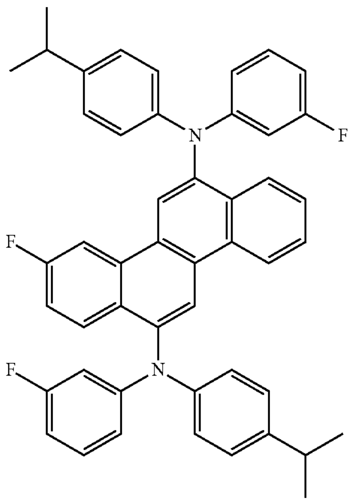
,
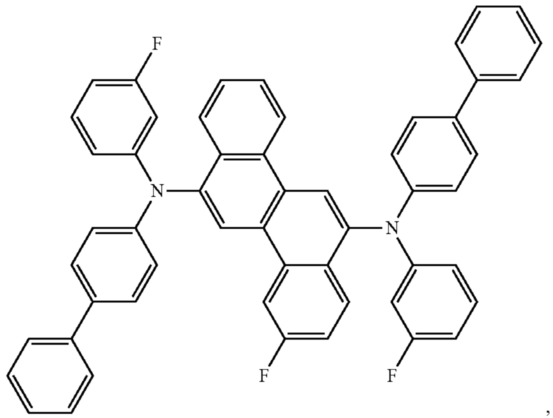
,
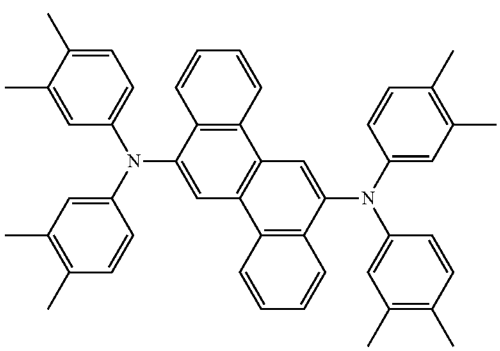
,
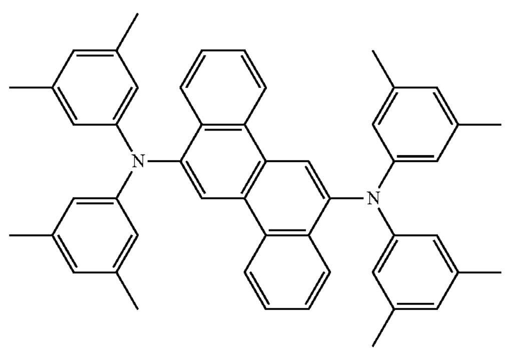
,
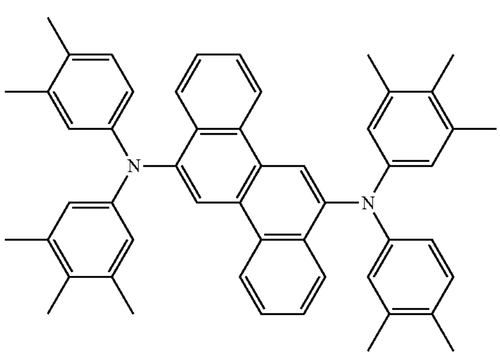
,
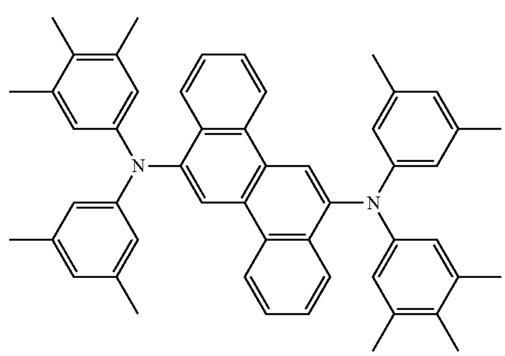
, -continued
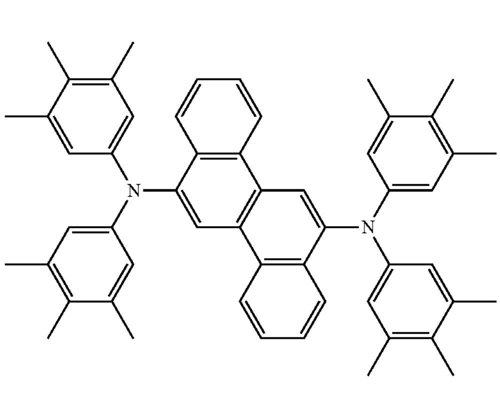
,
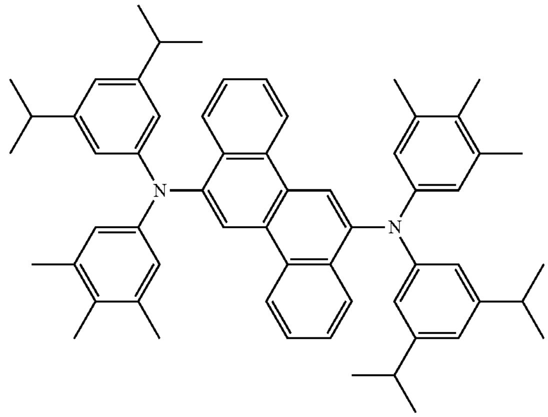
,
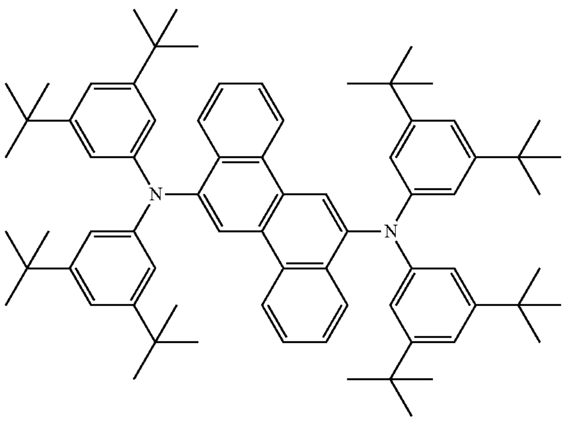
,
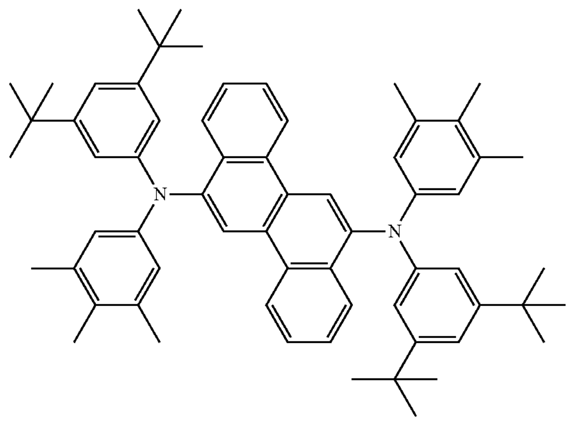
,
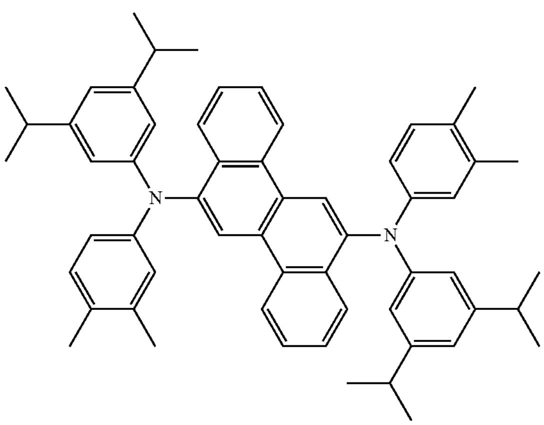
,
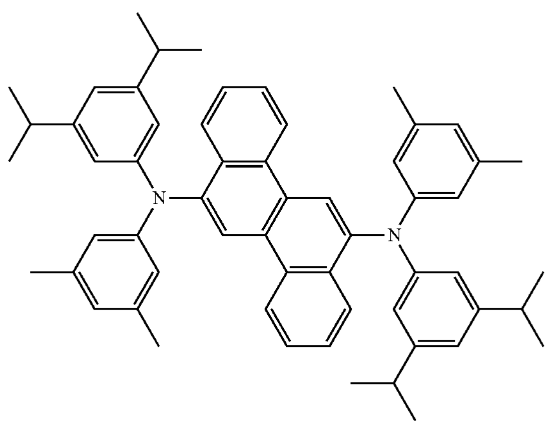
,
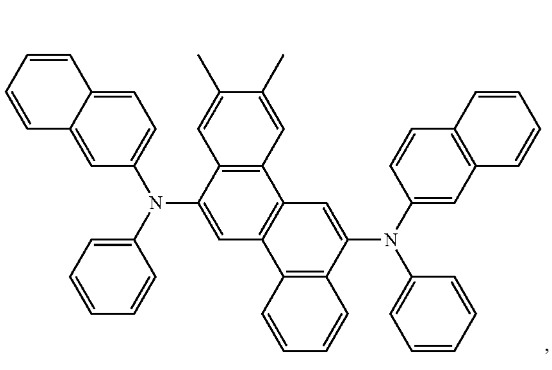
,
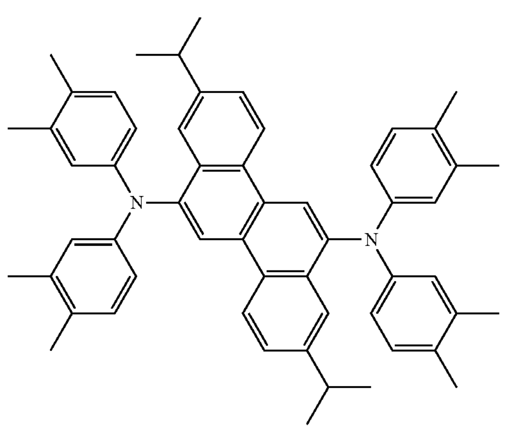
, -continued
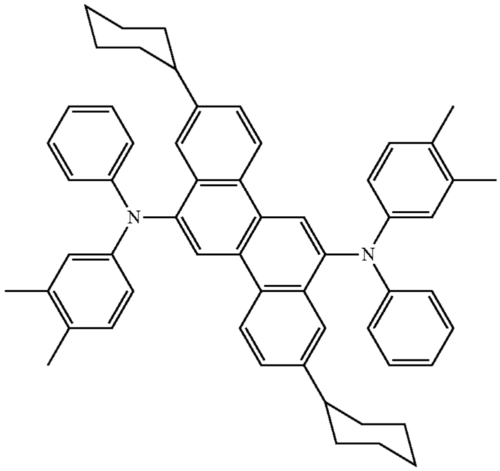
,
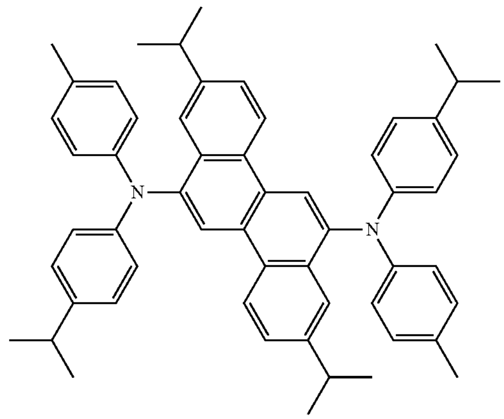
,
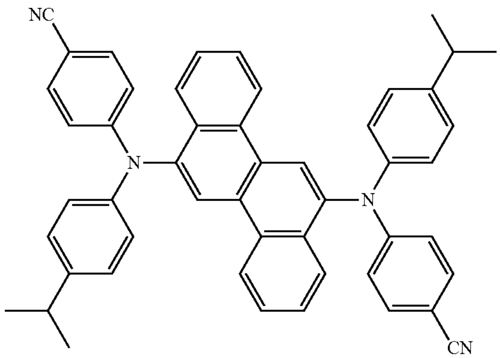
,
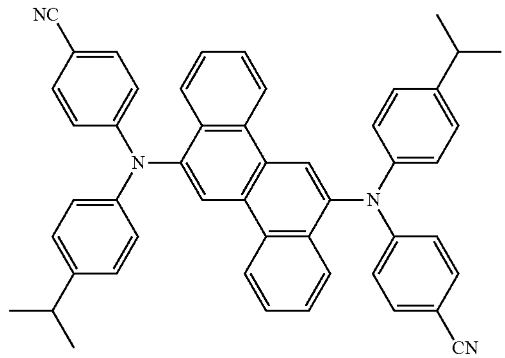
,
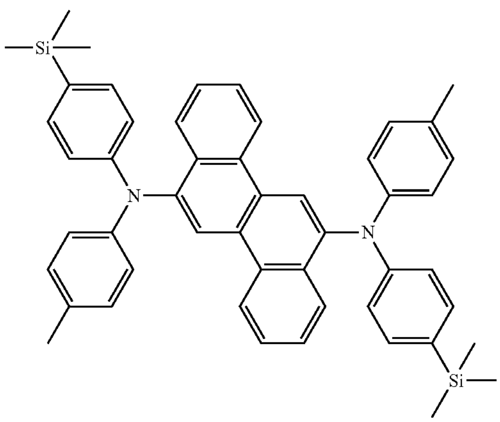
,
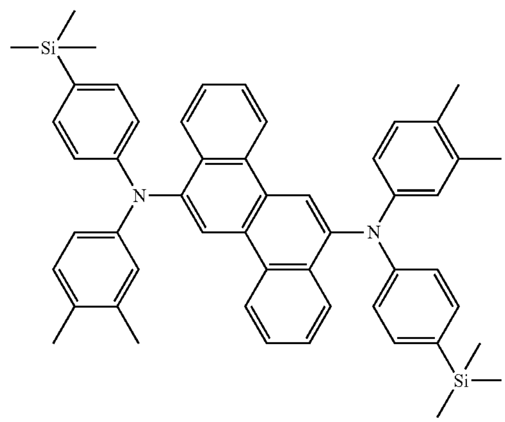
,
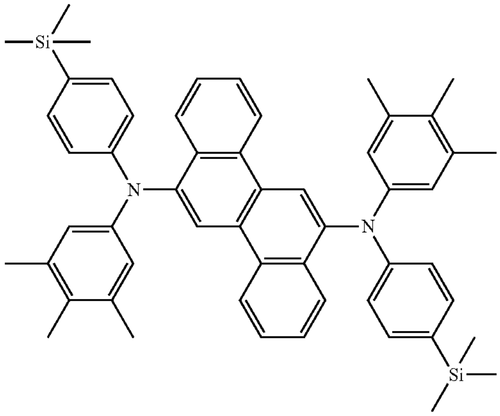
,
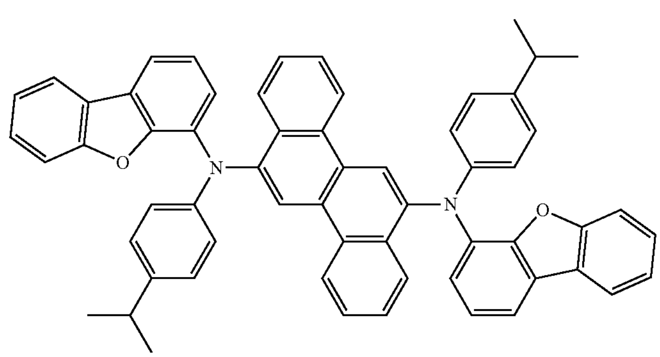
, -continued
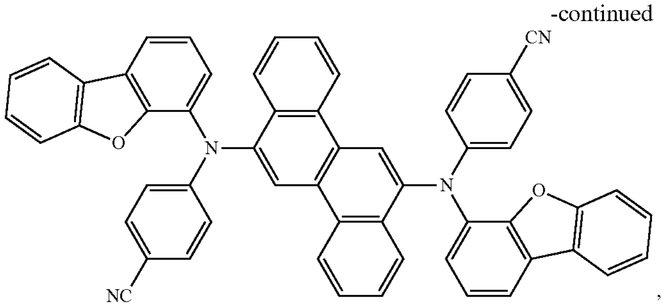
,
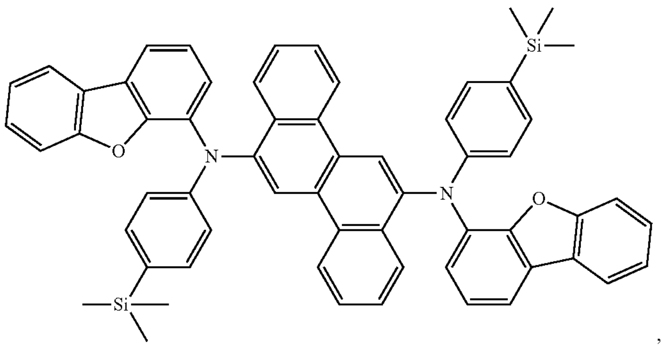
,
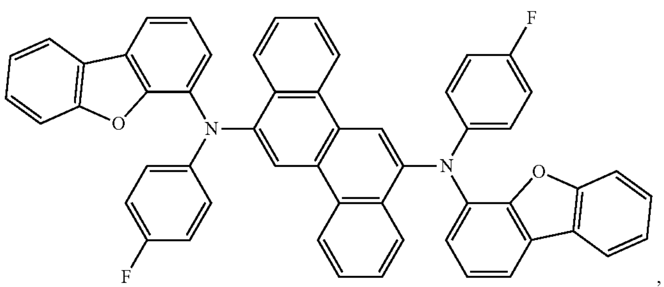
,
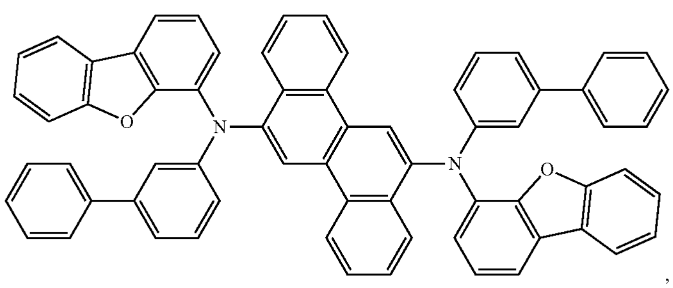
,
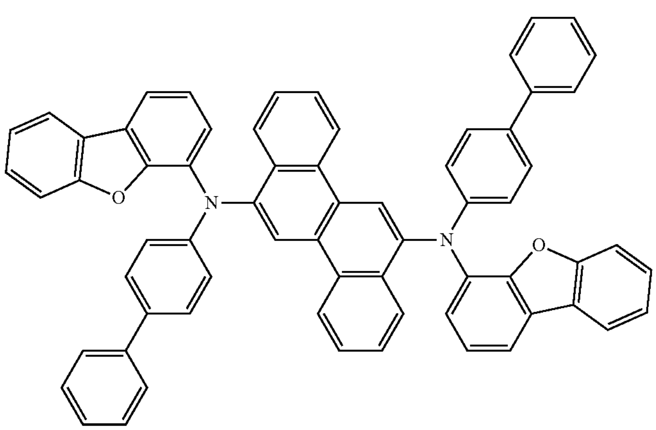
, -continued
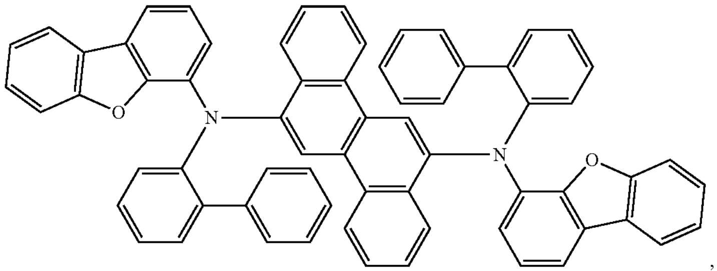
,
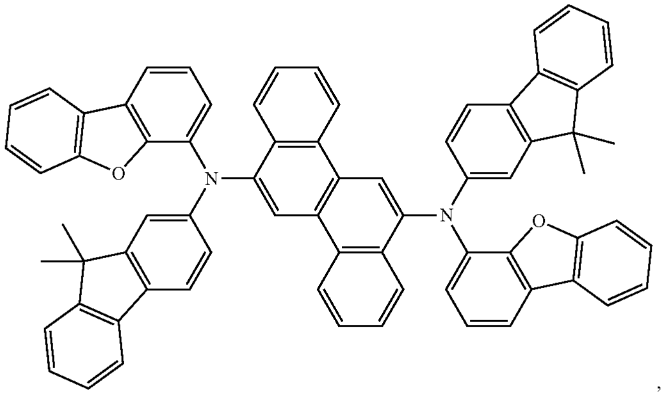
,
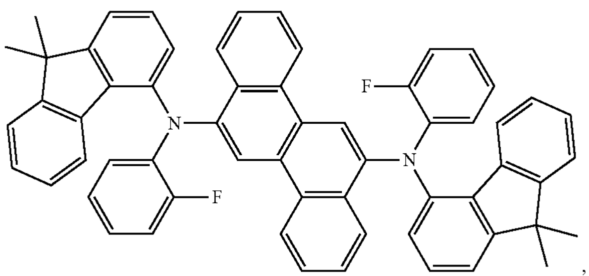
,
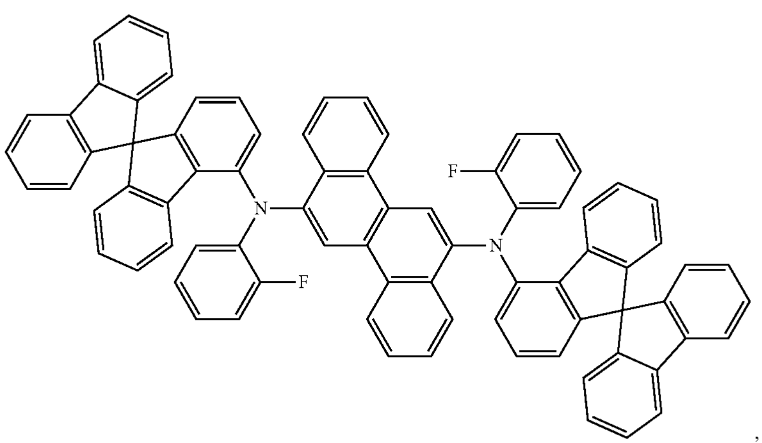
,
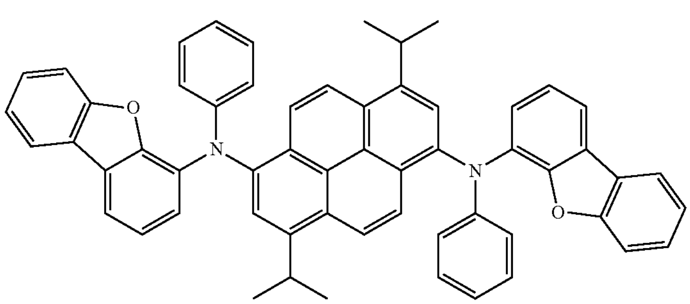
, -continued
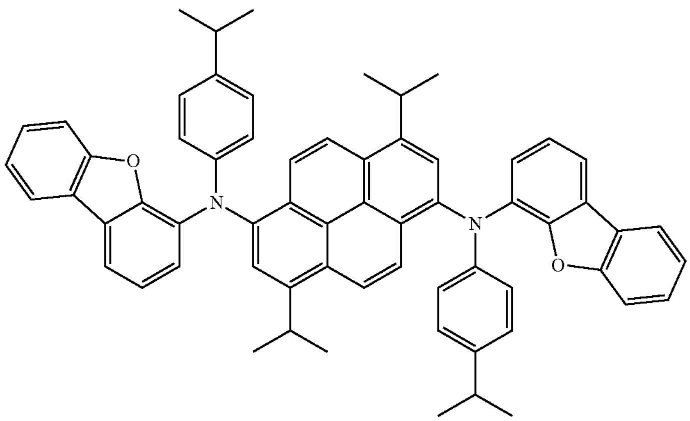
,
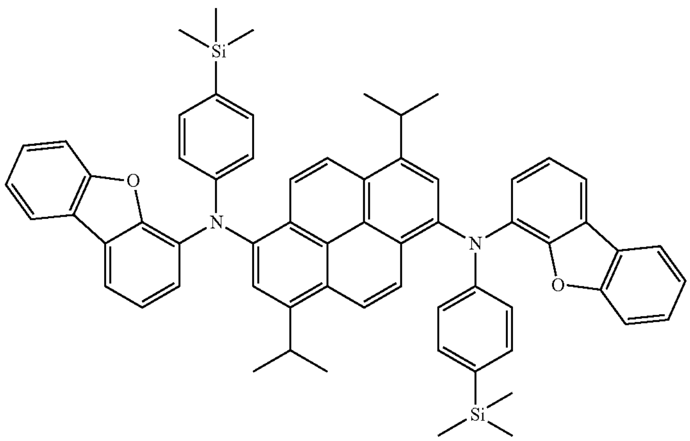
,
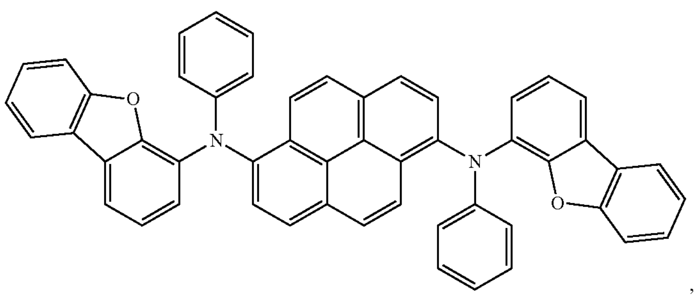
,
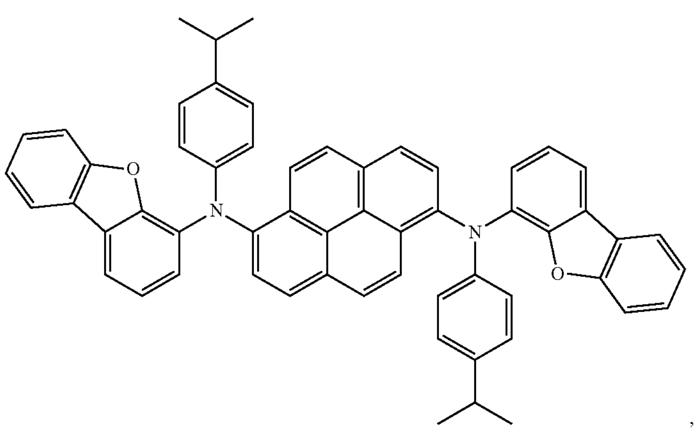
, -continued
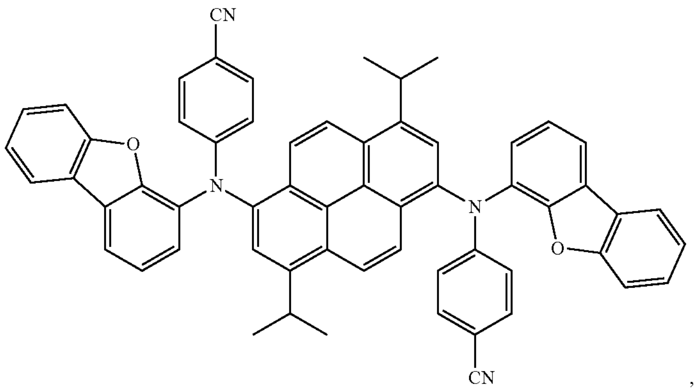 [SMILES: CC(C)c1cc(N(c2ccc(C#N)cc2)c2cccc3c2oc2ccccc23)c2ccc3c(C(C)C)cc(N(c4ccc(C#N)cc4)c4cccc5c4oc4ccccc45)c4ccc1c2c34]
,
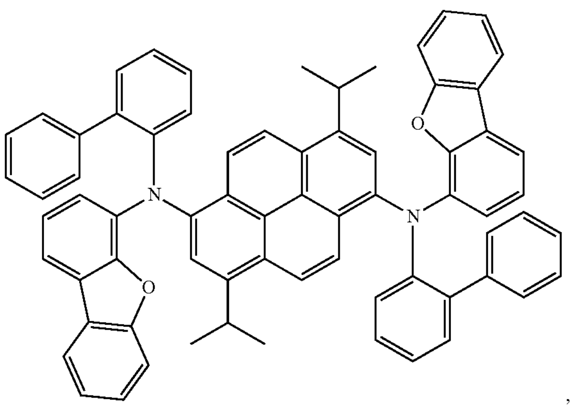
,
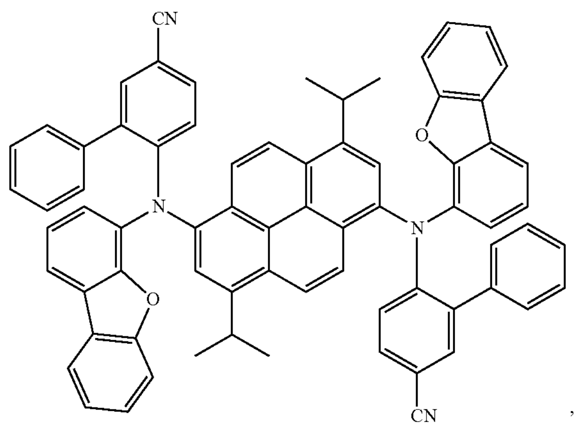
,
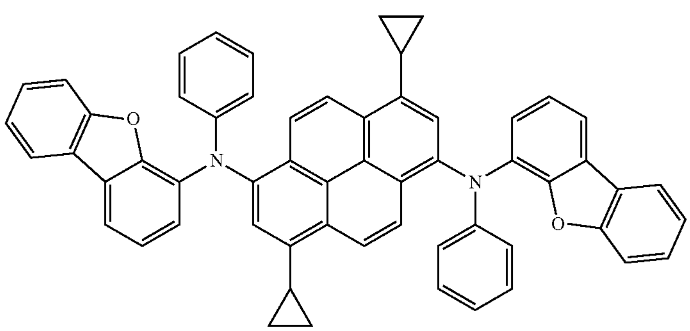
,
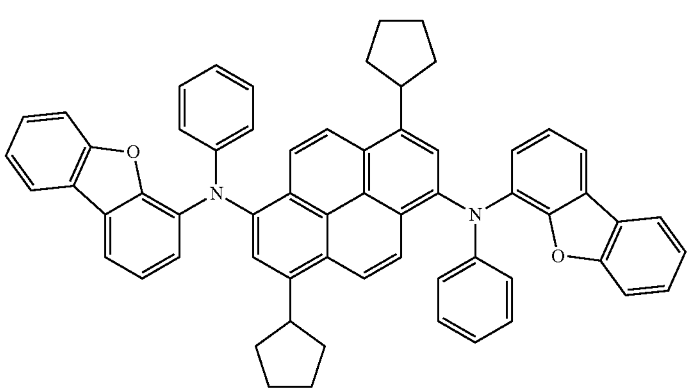
, -continued
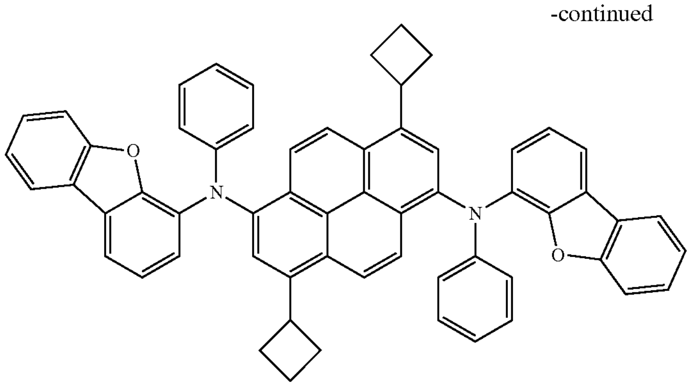
,
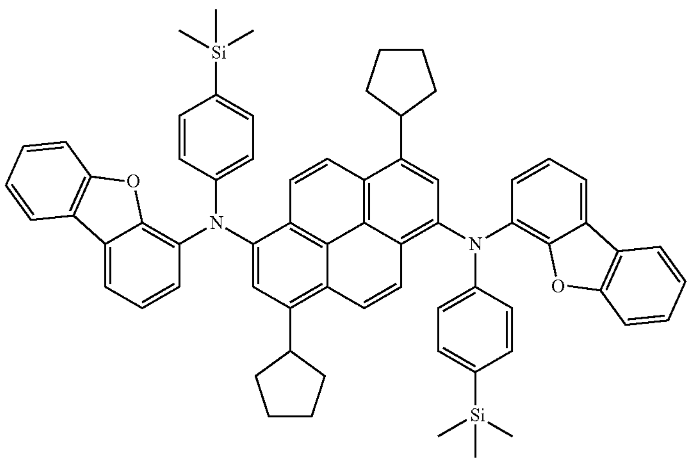
,
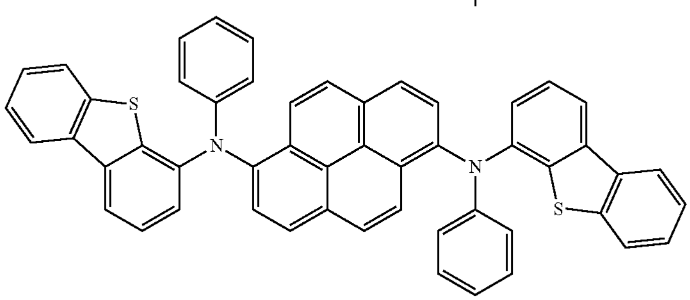
,
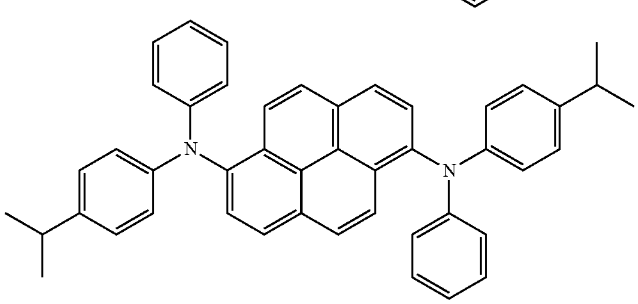
,
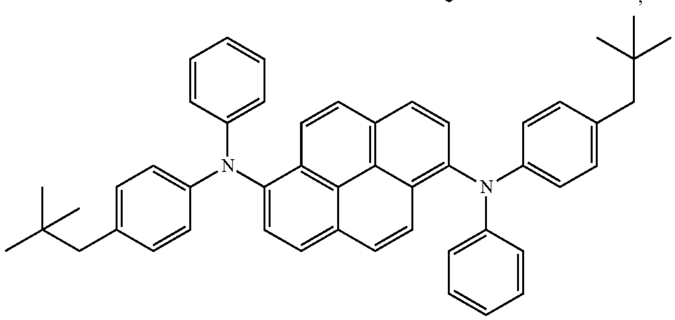
, -continued
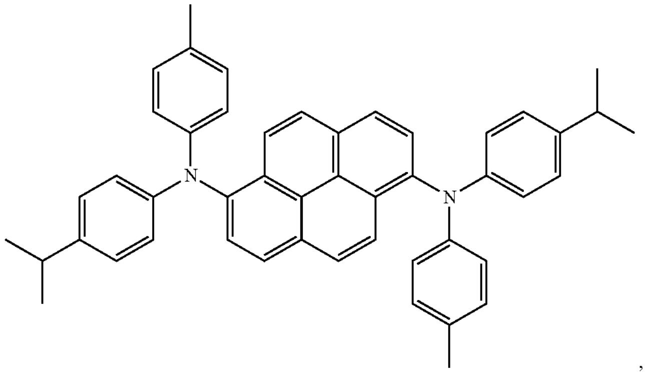
,
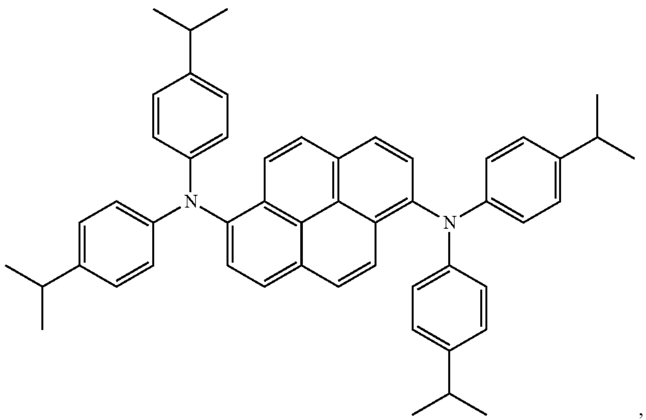
,
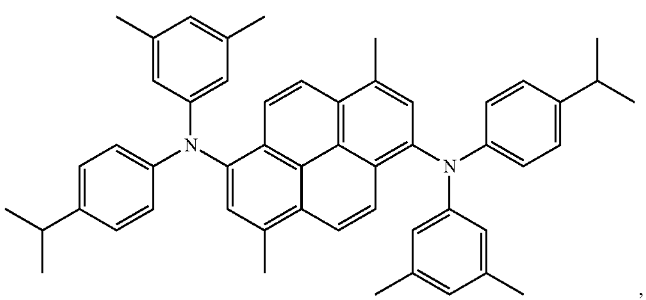
,
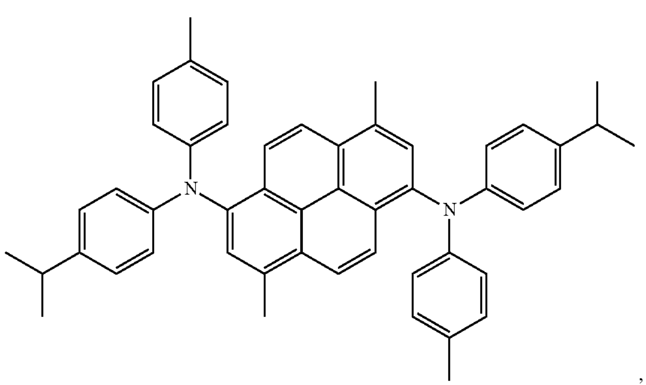
, -continued
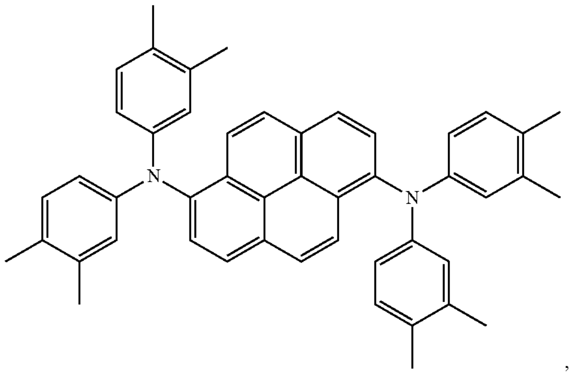
,
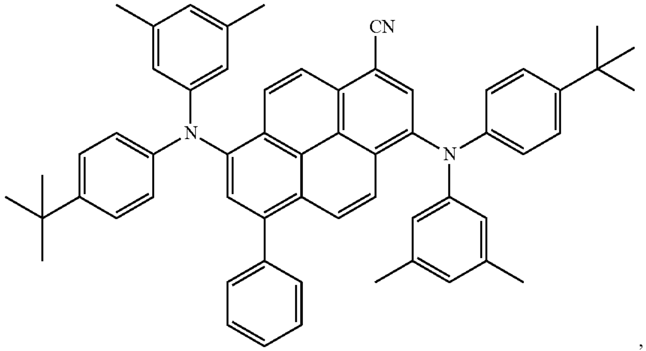
,
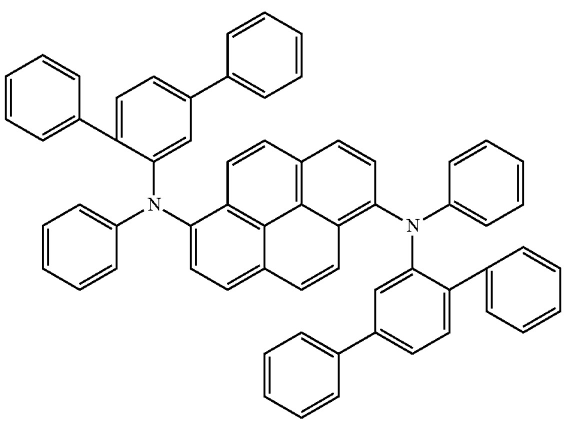
,
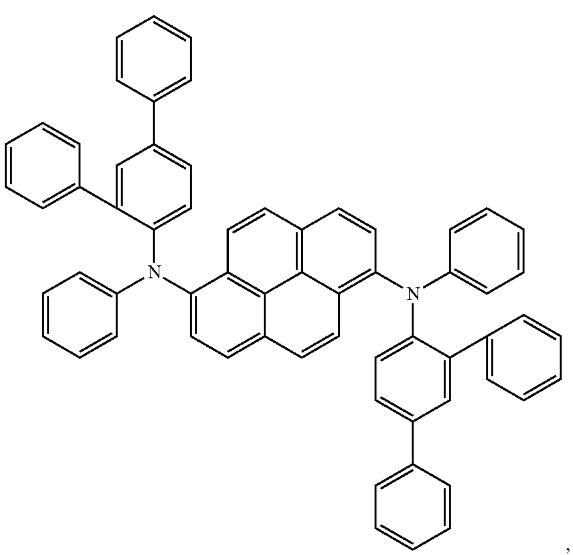
, -continued
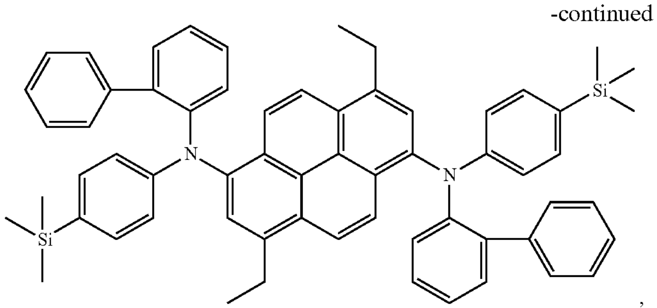
,
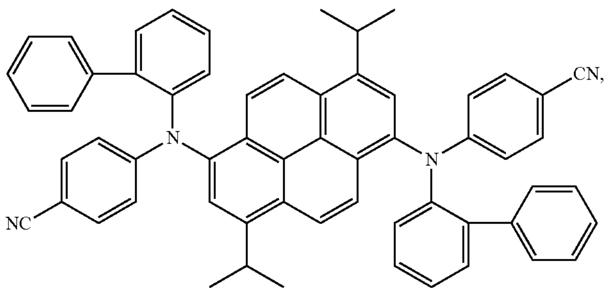
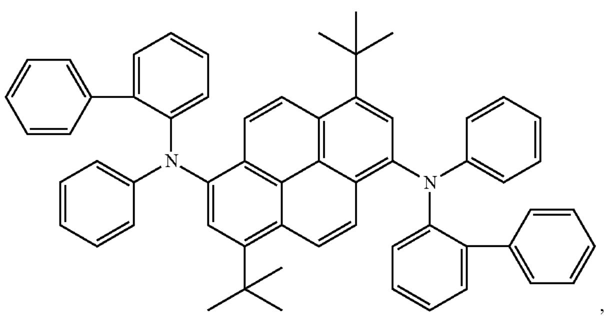
,
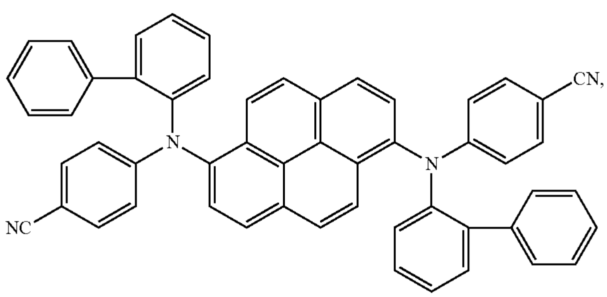
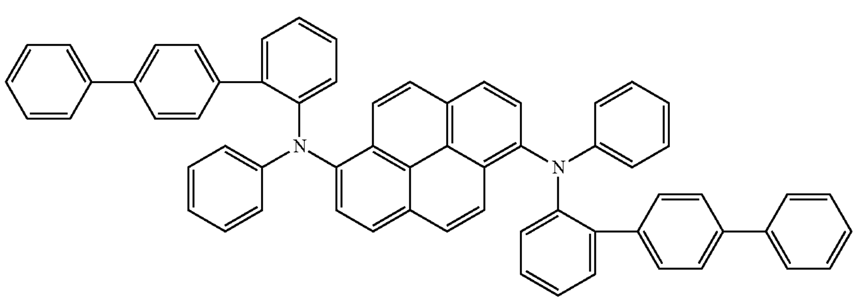
, -continued
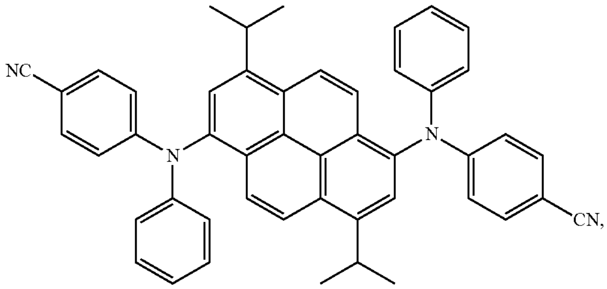
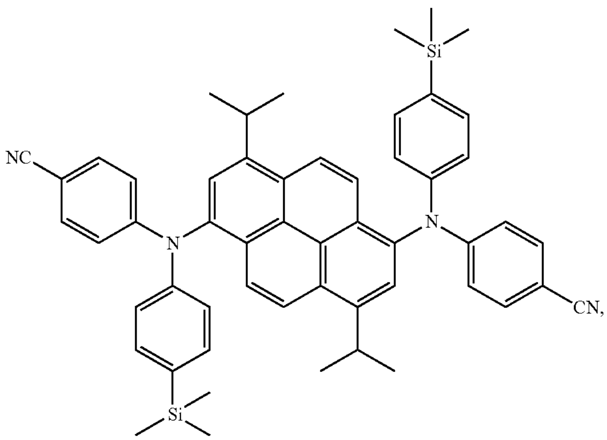
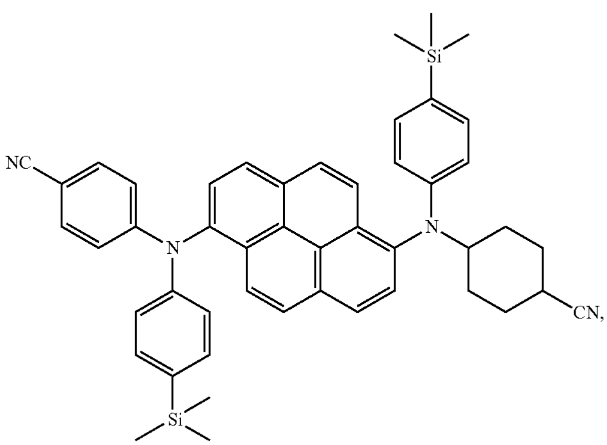
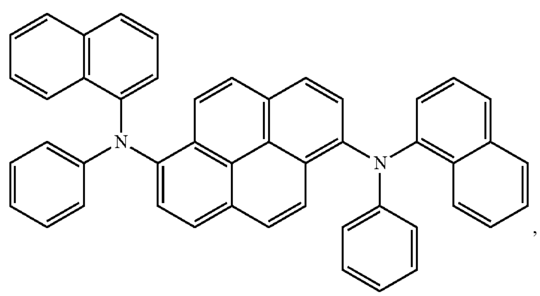
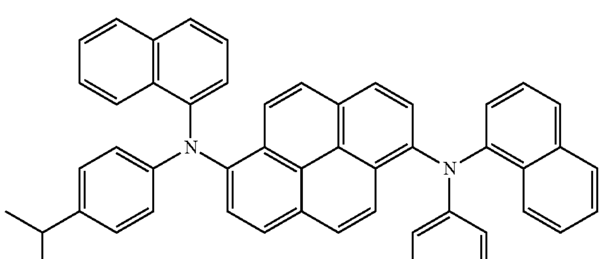
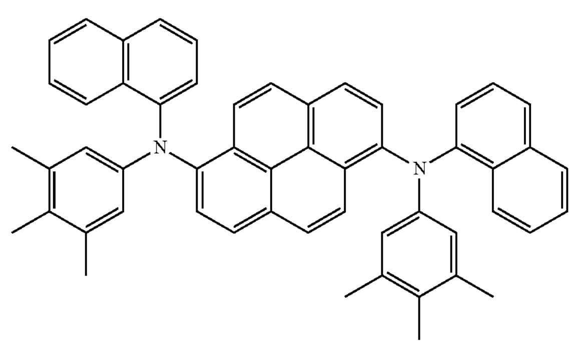

-continued
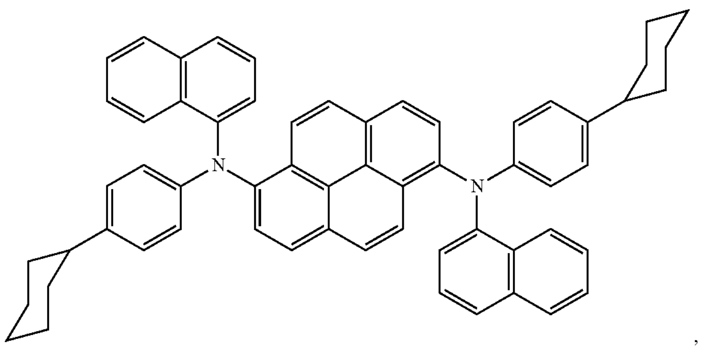,
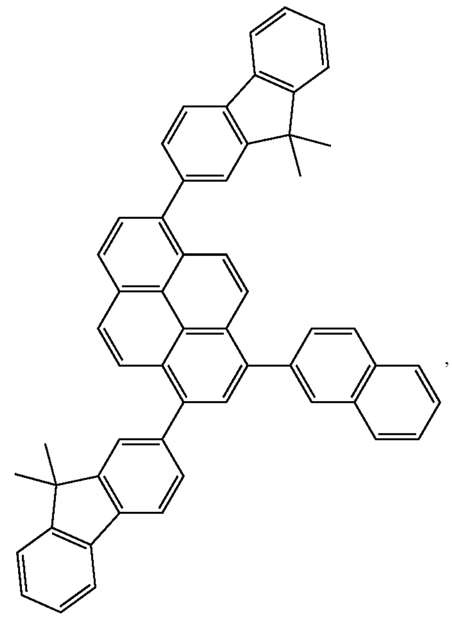,
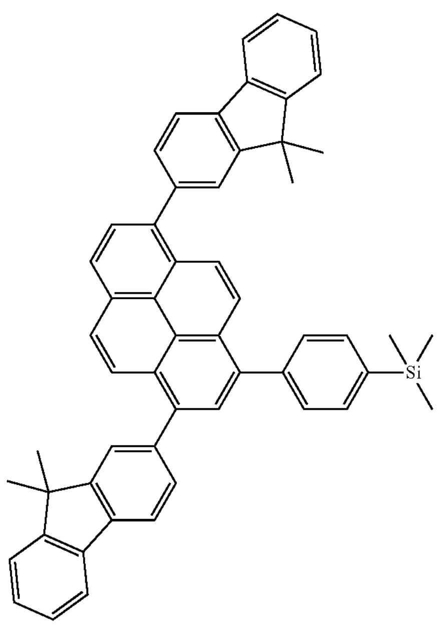,
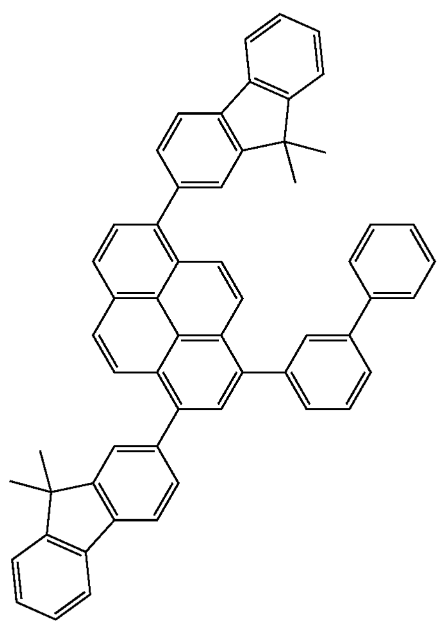,

-continued
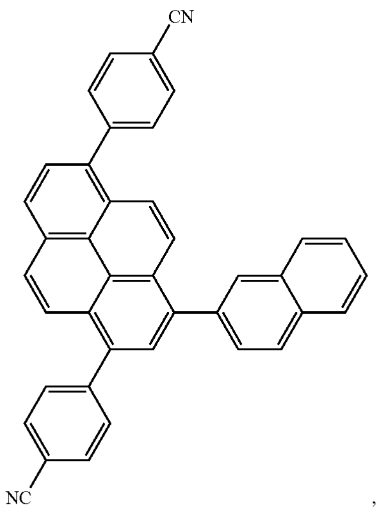
,
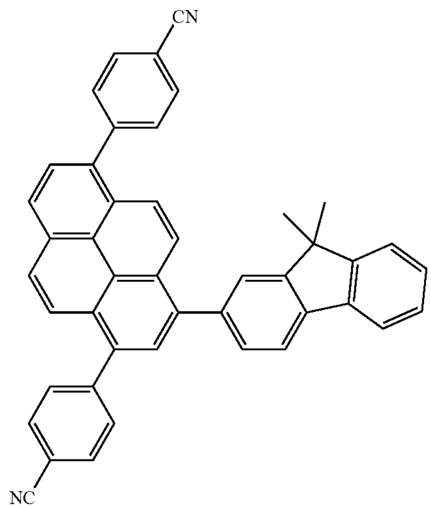
,
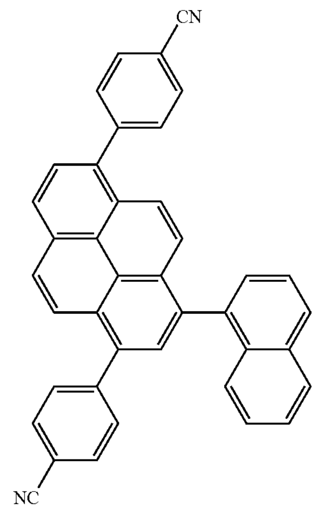
,
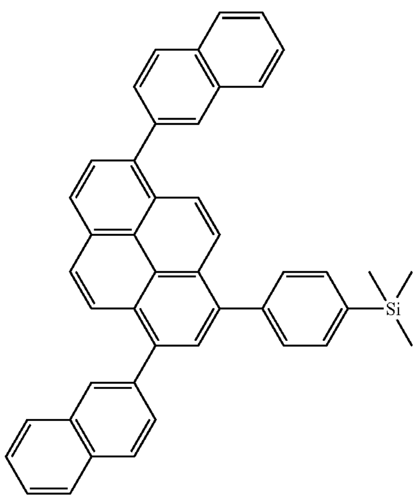
,
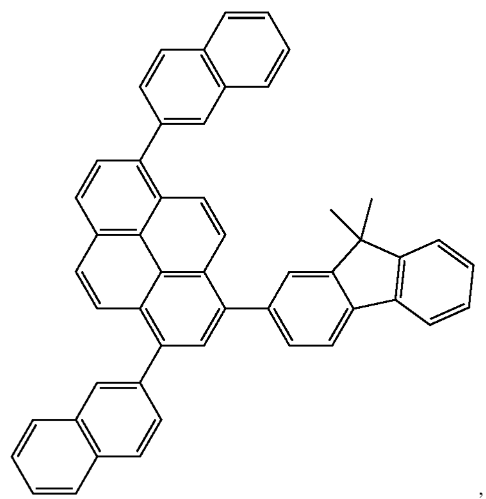
,
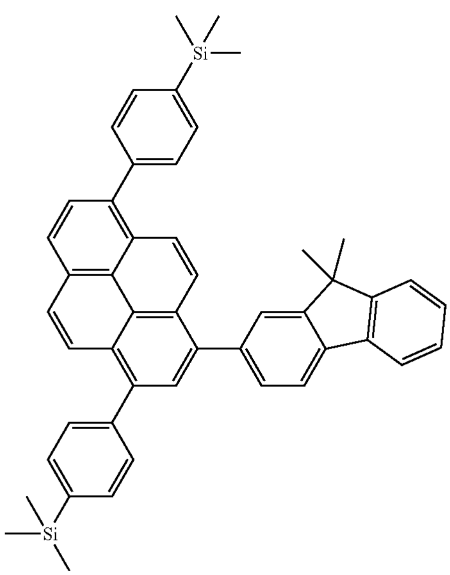
,
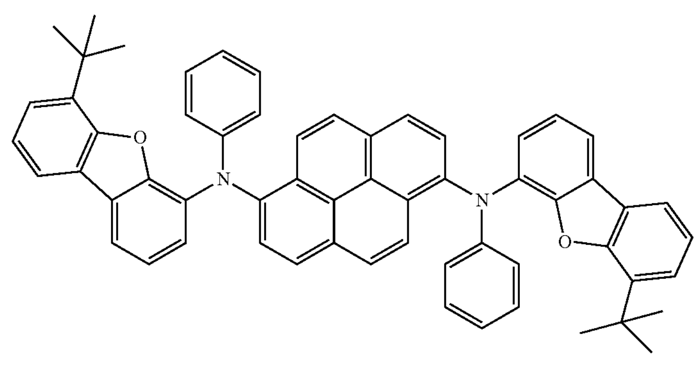
, -continued
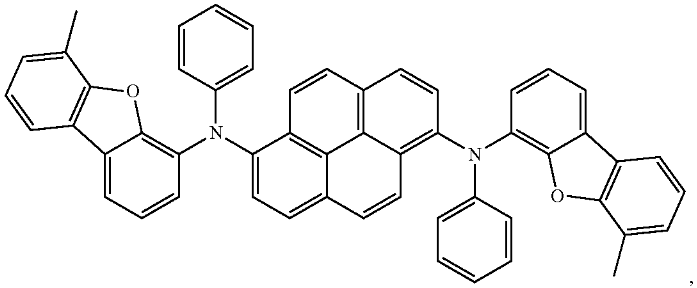
,
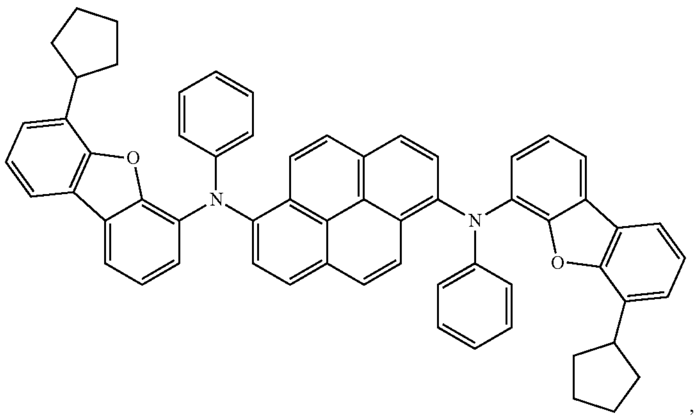
,
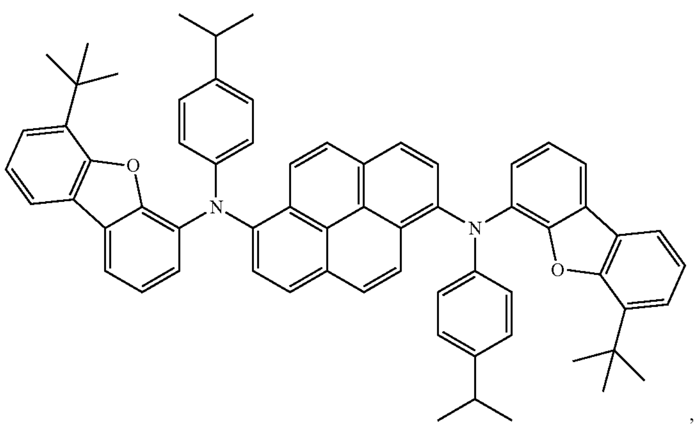
,
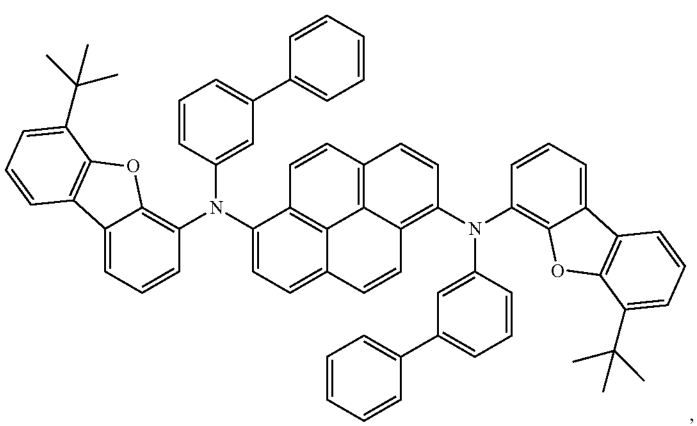
, -continued
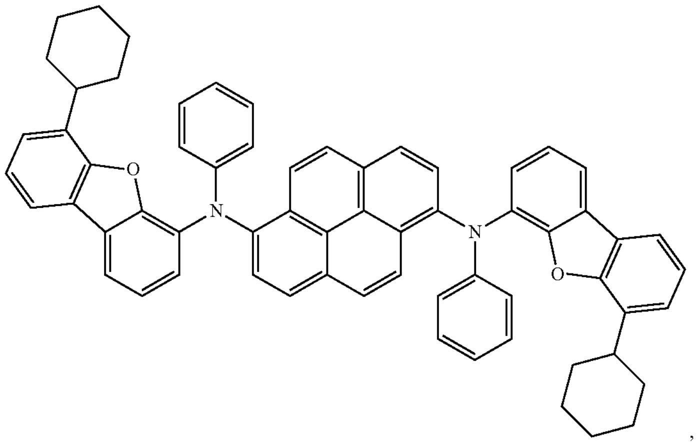
,
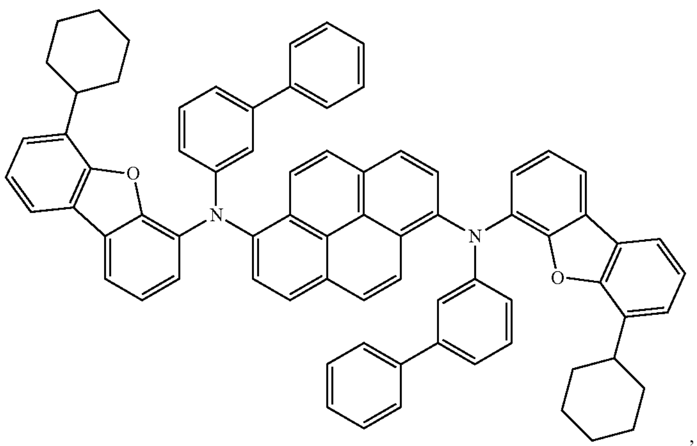
,
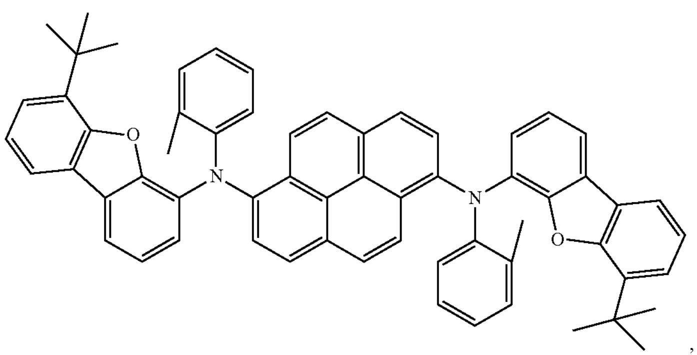
,
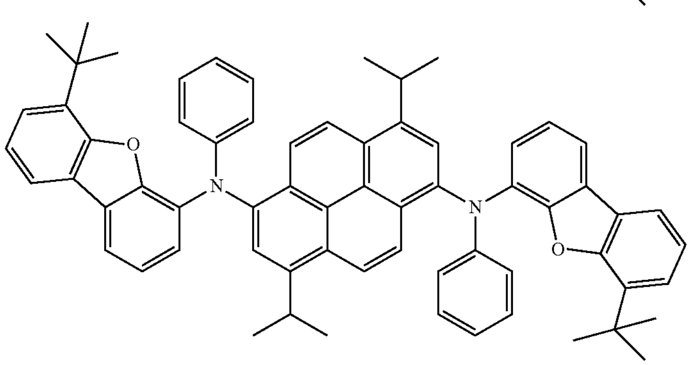
, -continued
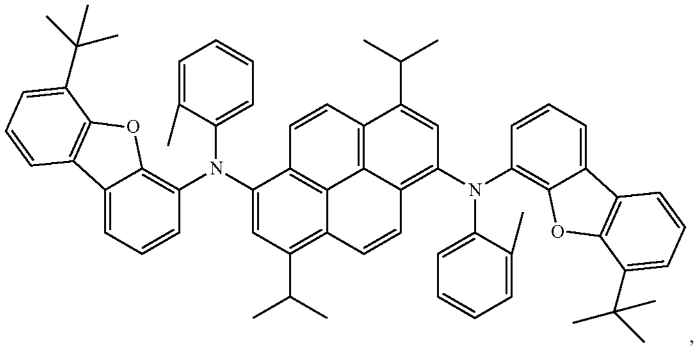
,
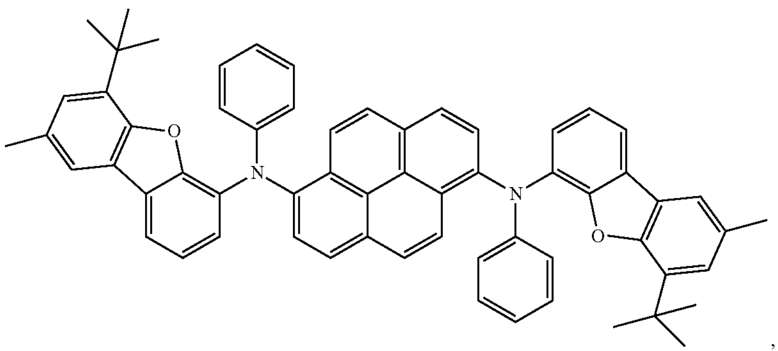
,
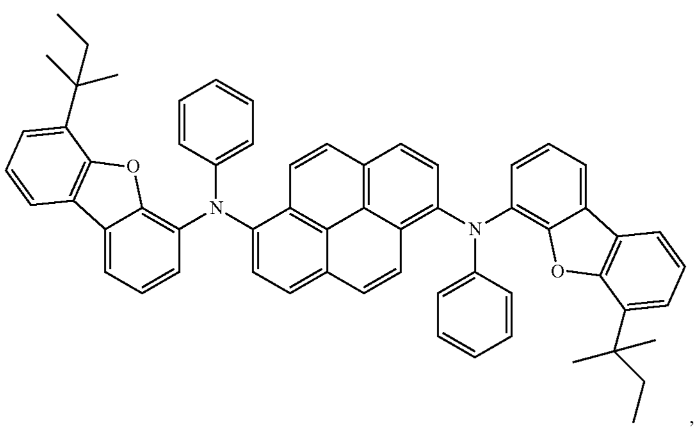
,
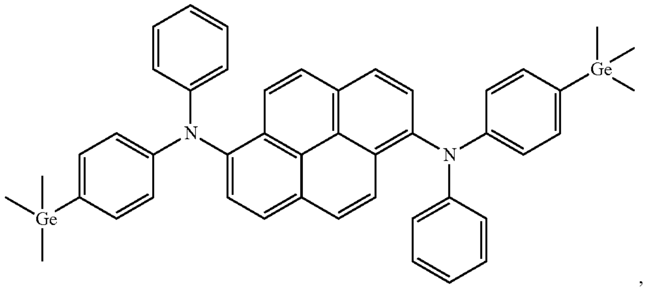
, -continued
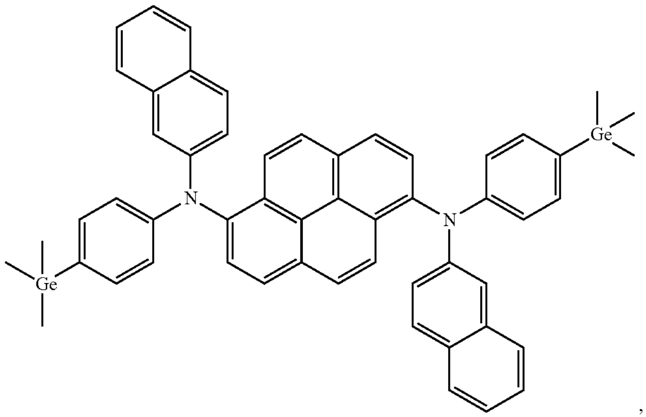
,
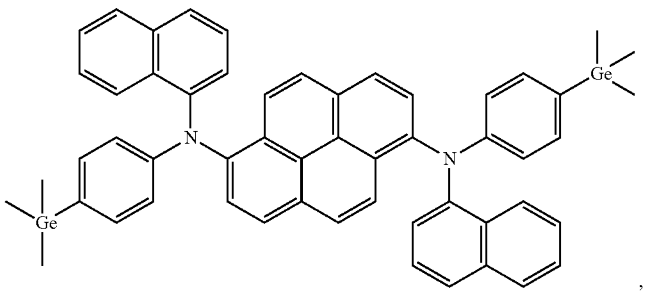
,
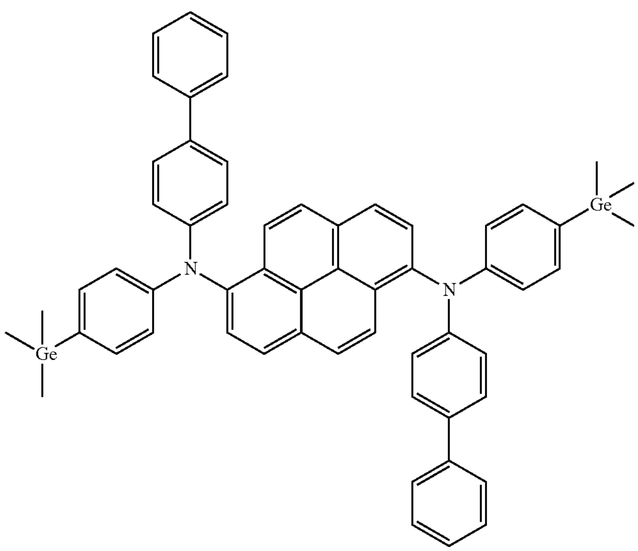
,
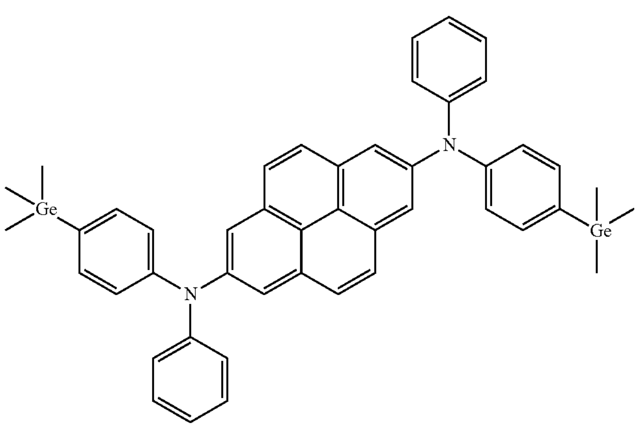
,
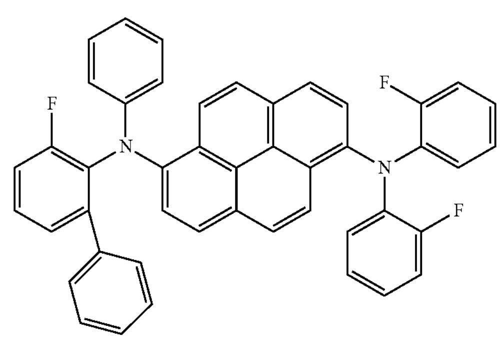
, -continued
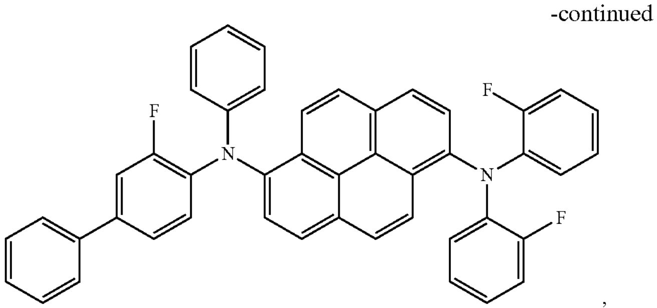
,
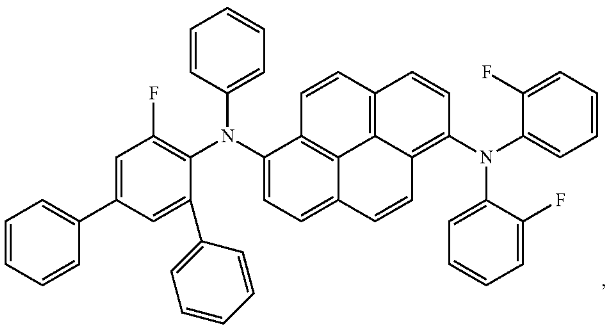
,
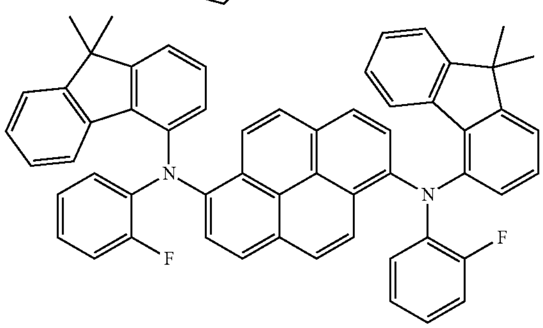
,
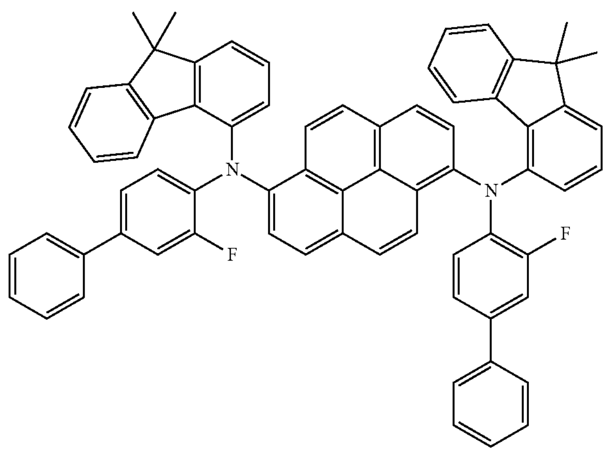
,
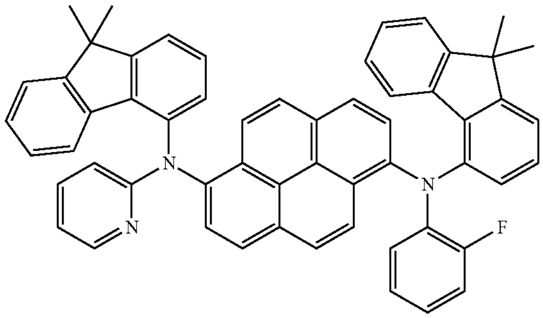
,
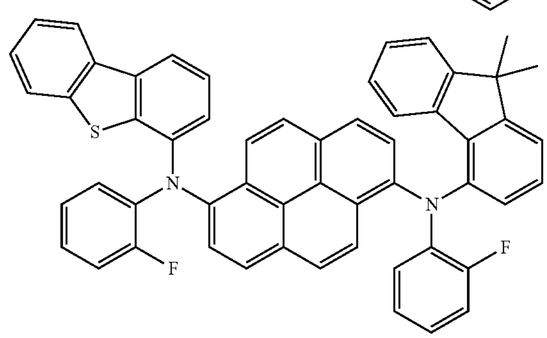
,
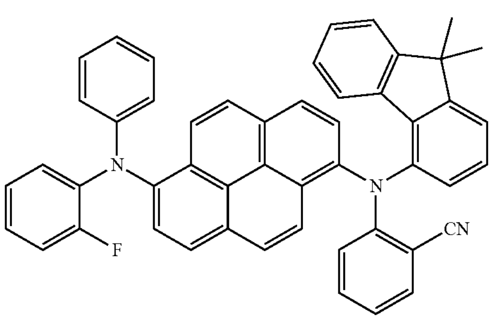
,
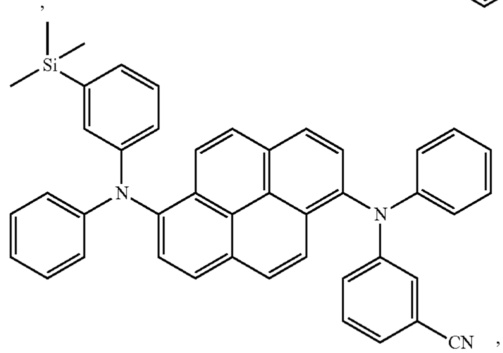
, -continued
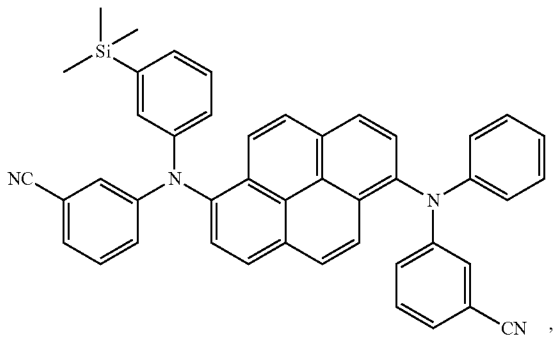
,
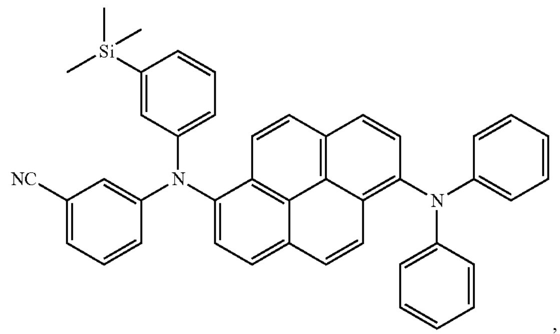
,
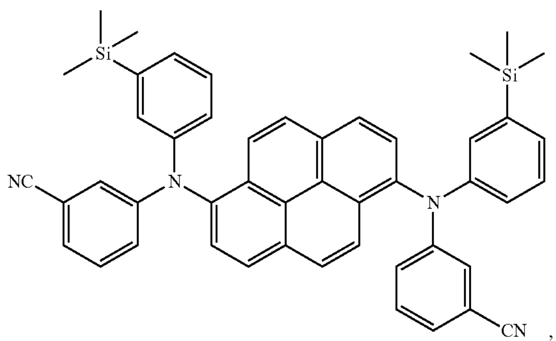
,
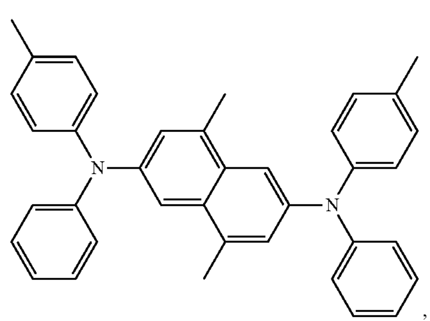
,
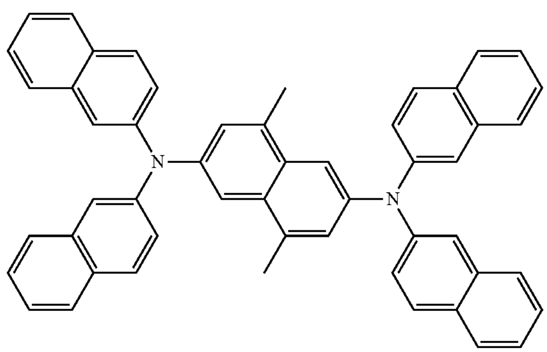
,
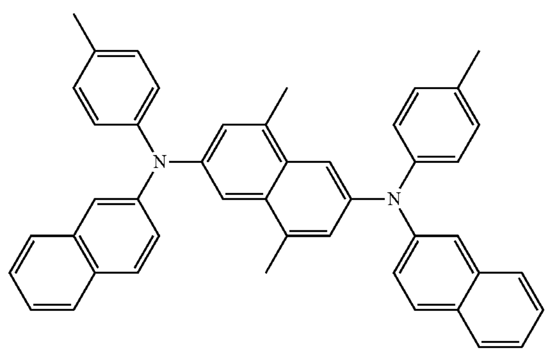
,
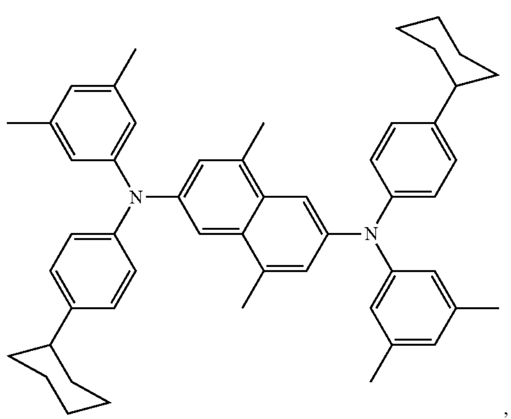
,
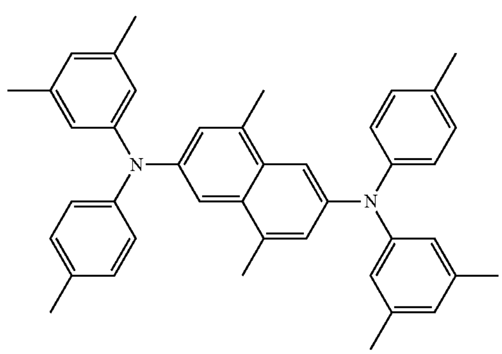
, -continued
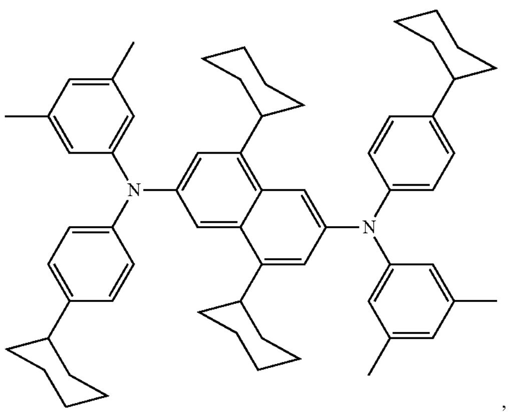
,
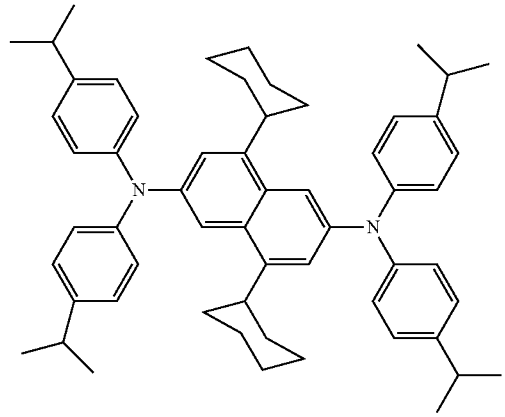
,
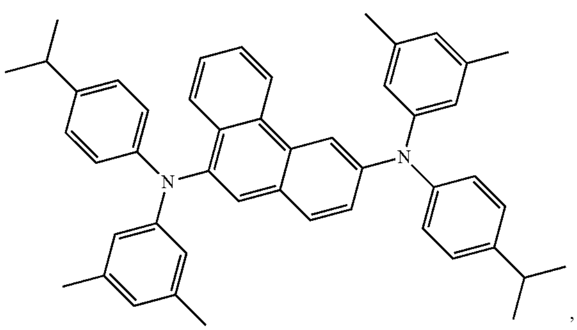
,
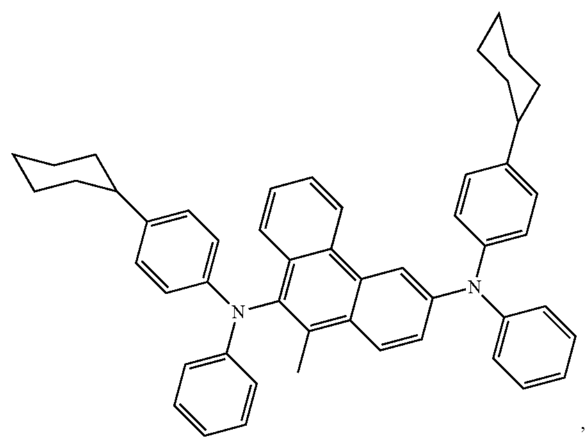
,
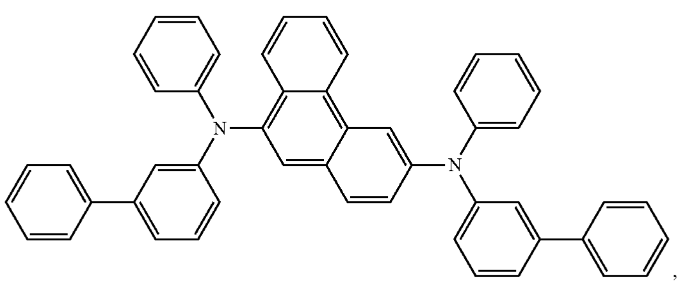
,
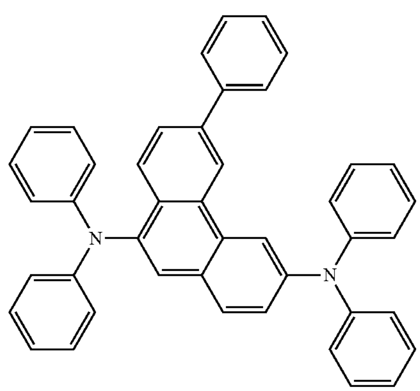
,
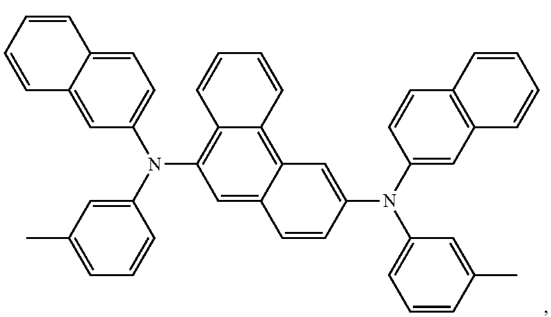
,
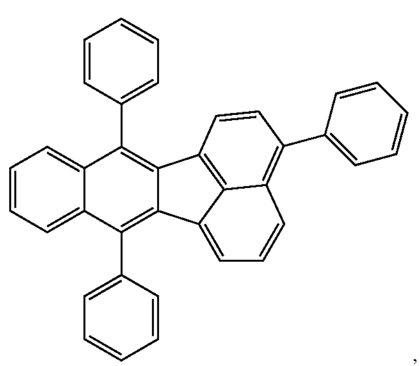
, -continued
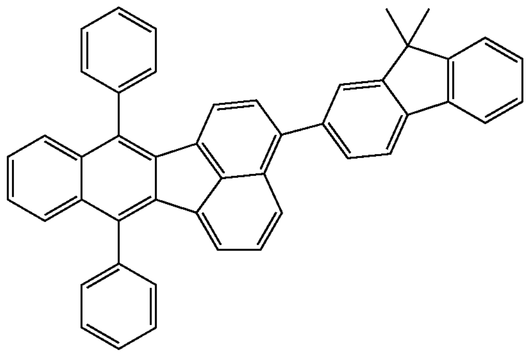
,
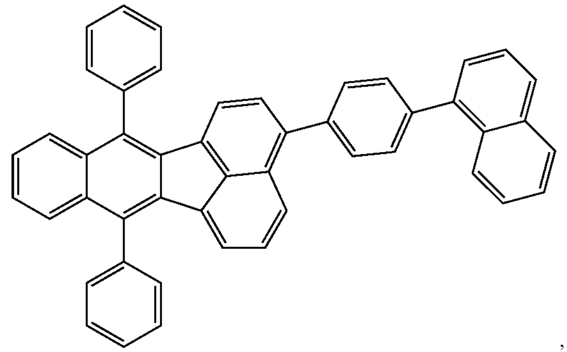
,
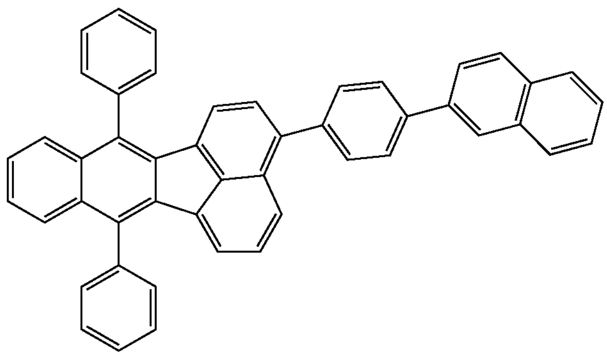
,
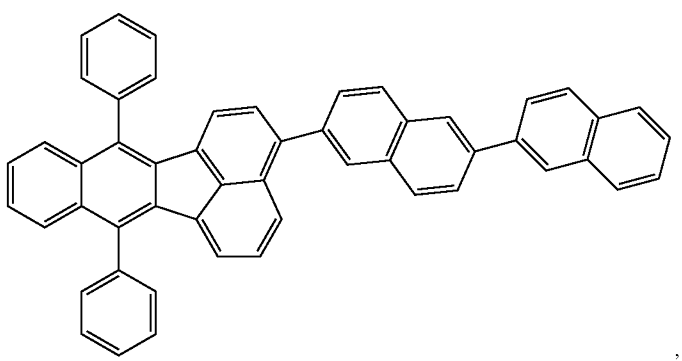
,
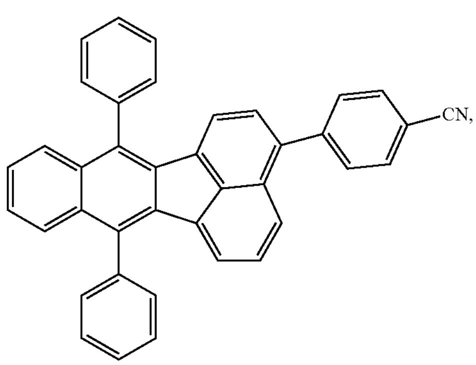
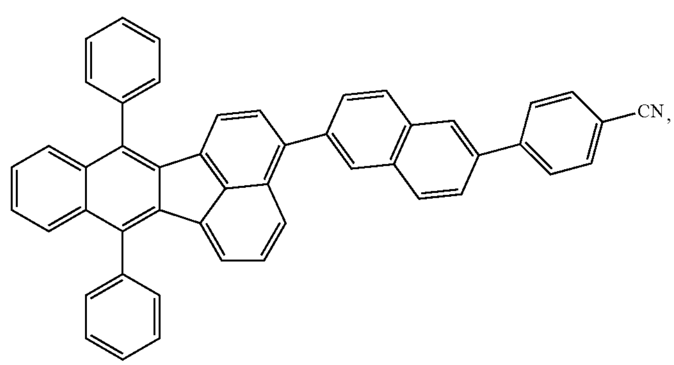

-continued

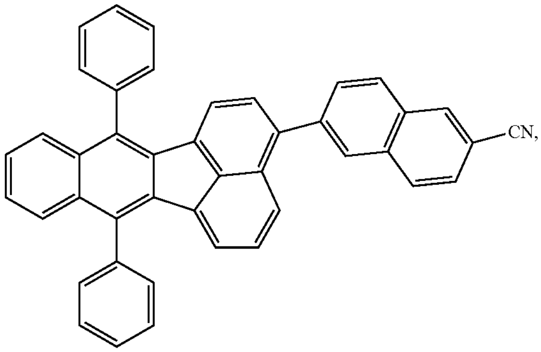

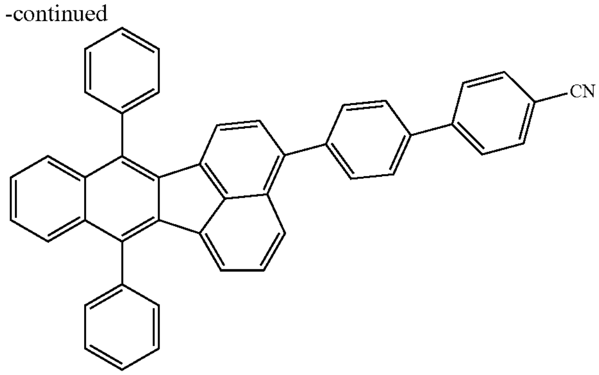
,

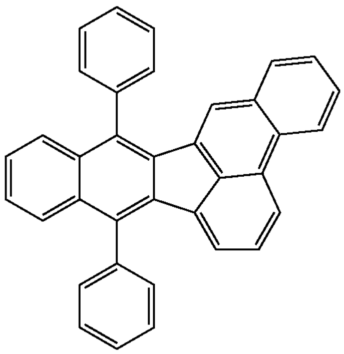
,

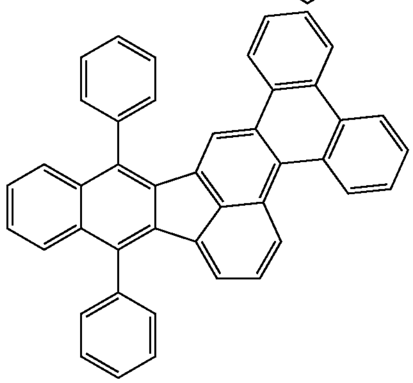
,

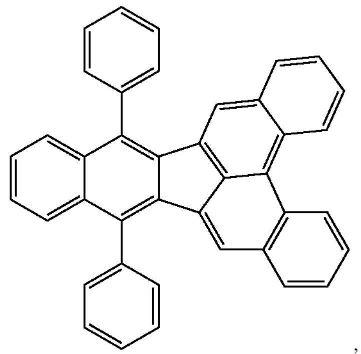
,

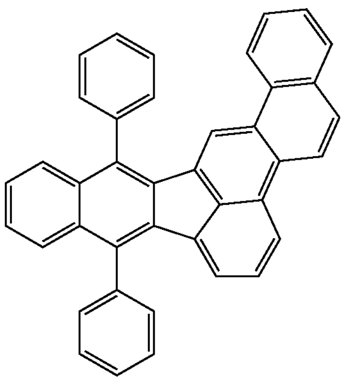
,

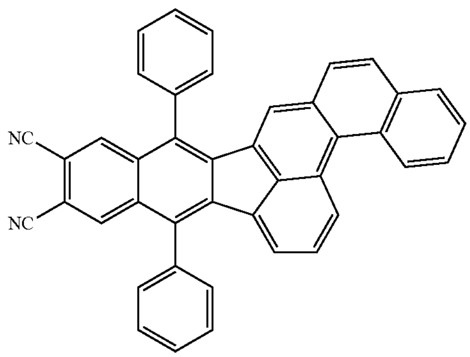

, and

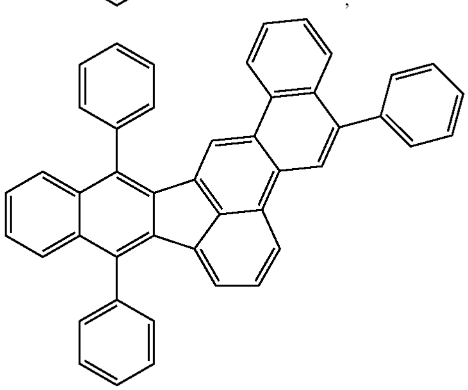
.

12. The compound of claim 1, wherein the acceptor group comprises at least 50 wt % of the total mass of the compound.

13. A device comprising an organic layer, wherein the organic layer comprises the compound of claim 1.

14. The device of claim 13, wherein the emitter group has a first triplet energy higher than the first triplet energy of the acceptor group.

15. The device of claim 13, wherein the radiation component from the singlet energy of the emitter group is between 400 nm to 500 nm.

16. The device of claim 13, wherein the device has an upconversion efficiency of at least 10%.

17. The device of claim 13, wherein the organic layer only contains the compound.

18. The device of claim 13, wherein the acceptor group comprises at least 50 wt % of the total mass of the compound.

19. The device of claim 13, comprising an organic light emitting device, wherein the organic layer is disposed adjacent to the organic light emitting device such that light emitted by the organic light emitting device provides the light incident on the organic layer.

20. A formulation comprising the compound of claim 1.

* * * * *